US012615906B2

(12) United States Patent
Watabe et al.

(10) Patent No.: US 12,615,906 B2
(45) Date of Patent: Apr. 28, 2026

(54) LIGHT-EMITTING DEVICE, DISPLAY APPARATUS, LIGHT- EMITTING APPARATUS, ELECTRONIC APPLIANCE, AND LIGHTING APPARATUS

(71) Applicant: SEMICONDUCTOR ENERGY LABORATORY CO., LTD., Atsugi (JP)

(72) Inventors: Takeyoshi Watabe, Kanagawa (JP); Nobuharu Ohsawa, Kanagawa (JP); Satoshi Seo, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 981 days.

(21) Appl. No.: 17/846,220

(22) Filed: Jun. 22, 2022

(65) Prior Publication Data

US 2023/0026341 A1 Jan. 26, 2023

(30) Foreign Application Priority Data

Jun. 25, 2021 (JP) ................................ 2021-105846
Oct. 18, 2021 (JP) ................................ 2021-170422

(51) Int. Cl.

| | |
|---|---|
| ***H10K 50/11*** | (2023.01) |
| ***H10K 59/80*** | (2023.01) |
| ***H10K 85/60*** | (2023.01) |

(52) U.S. Cl.

CPC ........... *H10K 50/11* (2023.02); *H10K 59/879* (2023.02); *H10K 85/615* (2023.02); *H10K 85/6572* (2023.02)

(58) Field of Classification Search

None

See application file for complete search history.

(56) References Cited

U.S. PATENT DOCUMENTS

| | | | |
|---|---|---|---|
| 5,953,985 | A | 9/1999 | Kobayashi |
| 6,120,338 | A | 9/2000 | Hirano et al. |
| 9,818,984 | B2 | 11/2017 | Mizuno |
| 2002/0072139 | A1 | 6/2002 | Kashiwabara |
| 2006/0027830 | A1 | 2/2006 | Kumaki et al. |
| 2007/0176161 | A1 | 8/2007 | Seo et al. |
| 2011/0148290 | A1 | 6/2011 | Oota |
| 2012/0205685 | A1 | 8/2012 | Seo et al. |
| 2012/0206036 | A1 | 8/2012 | Tanaka et al. |
| 2012/0223346 | A1 | 9/2012 | Ohsawa et al. |
| 2012/0256204 | A1 | 10/2012 | Yoshizumi et al. |
| 2012/0273804 | A1 | 11/2012 | Hatano |
| 2012/0273822 | A1 | 11/2012 | Ohsawa et al. |
| 2012/0276484 | A1 | 11/2012 | Izumi et al. |
| 2013/0084531 | A1 | 4/2013 | Hamaguchi et al. |
| 2013/0084664 | A1 | 4/2013 | Yoshitoku et al. |
| 2013/0084666 | A1 | 4/2013 | Oshige |
| 2013/0099210 | A1 | 4/2013 | Ikeda |
| 2013/0264549 | A1 | 10/2013 | Yamazaki et al. |
| 2013/0280839 | A1 | 10/2013 | Sonoda et al. |
| 2013/0295705 | A1 | 11/2013 | Sonoda et al. |
| 2014/0004640 | A1 | 1/2014 | Hamaguchi et al. |
| 2014/0004642 | A1 | 1/2014 | Otsuka et al. |
| 2014/0117339 | A1 | 5/2014 | Seo |
| 2014/0284642 | A1 | 9/2014 | Yamazaki et al. |
| 2015/0060826 | A1 | 3/2015 | Matsumoto. et al. |
| 2015/0069360 | A1 | 3/2015 | Sato |
| 2015/0076476 | A1 | 3/2015 | Odaka et al. |
| 2015/0311250 | A1 | 10/2015 | Seo et al. |
| 2015/0333229 | A1 | 11/2015 | Seo et al. |
| 2015/0348998 | A1 | 12/2015 | Koezuka et al. |
| 2016/0118625 | A1 | 4/2016 | Uesaka et al. |

(Continued)

FOREIGN PATENT DOCUMENTS

| | | | |
|---|---|---|---|
| JP | 2000-036385 | A | 2/2000 |
| JP | 2003-059663 | A | 2/2003 |
| JP | 2008-098106 | A | 4/2008 |
| JP | 2008-147072 | A | 6/2008 |
| JP | 2008-251270 | A | 10/2008 |
| JP | 2012-160473 | A | 8/2012 |
| JP | 2014-120218 | A | 6/2014 |
| JP | 2014-135251 | A | 7/2014 |
| JP | 2014-207356 | A | 10/2014 |
| JP | 2014-232568 | A | 12/2014 |
| JP | 2015-115178 | A | 6/2015 |

(Continued)

OTHER PUBLICATIONS

Liang, Xiao, et al. "Peripheral amplification of multi-resonance induced thermally activated delayed fluorescence for highly efficient OLEDs." Angewandte Chemie 130.35 (2018): 11486-11490. (Year: 2018).*

Lin, Hao-Wu, et al. "Pyridine-based electron transporting materials for highly efficient organic solar cells." Journal of Materials Chemistry A 1.5 (2013): 1770-1777. (Year: 2013).*

Liang, Xiao et al. "Peripheral Amplification of Multi-Resonance Induced Thermally Activated Delayed Fluorescence for Highly Efficient OLEDs" Angew. Chem. Int. Ed. 2018, 57, 11316-11320. (Year: 2018).*

(Continued)

*Primary Examiner* — Robert S Loewe
(74) *Attorney, Agent, or Firm* — Fish & Richardson P.C.

(57) ABSTRACT

An EL layer includes a low refractive index layer comprising an organic compound and a light-emitting layer comprising a light-emitting substance. The organic compound has an ordinary refractive index of 1.50 to 1.75 with respect to light at 455 nm to 465 nm, or an ordinary refractive index of 1.45 to 1.70 with respect to light at 633 nm. Given that a wavelength corresponding to an intensity 1/e times a maximum peak intensity in an emission spectrum of the light-emitting substance is $\lambda_n$, a shortest $\lambda_n$ in a range of wavelengths longer than a maximum peak wavelength $\lambda_{max}$ of the light-emitting substance is $\lambda_1$, and a longest $\lambda_n$ in a range of wavelengths shorter than $\lambda_{max}$ is $\lambda_2$, a difference between $\lambda_1$ and $\lambda_2$ is greater than or equal to 5 nm and less than or equal to 45 nm.

10 Claims, 38 Drawing Sheets

(56) References Cited

U.S. PATENT DOCUMENTS

| | | | |
|---|---|---|---|
| 2016/0172595 A1 | 6/2016 | Malinowski et al. | |
| 2016/0315133 A1 | 10/2016 | Sato | |
| 2017/0141167 A1 | 5/2017 | Naganuma | |
| 2017/0213876 A1 | 7/2017 | Ohsawa et al. | |
| 2017/0256754 A1 | 9/2017 | Defranco et al. | |
| 2017/0285404 A1 | 10/2017 | Kubota et al. | |
| 2017/0331065 A1 | 11/2017 | Seo et al. | |
| 2018/0190908 A1 | 7/2018 | Ke et al. | |
| 2020/0176692 A1 | 6/2020 | Watabe et al. | |
| 2020/0203662 A1 | 6/2020 | Mollard et al. | |
| 2021/0020868 A1 | 1/2021 | Ikeda et al. | |
| 2021/0234115 A1 | 7/2021 | Seo et al. | |
| 2021/0395245 A1 | 12/2021 | Watabe et al. | |
| 2022/0140250 A1 | 5/2022 | Kawano et al. | |
| 2022/0204438 A1* | 6/2022 | Kubota | C07C 211/54 |
| 2022/0278292 A1 | 9/2022 | Watabe et al. | |
| 2022/0320470 A1 | 10/2022 | Watabe et al. | |
| 2023/0320130 A1 | 10/2023 | Watabe et al. | |
| 2023/0422548 A1 | 12/2023 | Watabe et al. | |
| 2024/0349531 A1* | 10/2024 | Watabe | H05B 33/12 |

FOREIGN PATENT DOCUMENTS

| | | | |
|---|---|---|---|
| JP | 2016-197494 A | 11/2016 | |
| JP | 2019-179696 A | 10/2019 | |
| JP | 2020-160305 A | 10/2020 | |
| WO | WO-2019220276 A1 * | 11/2019 | C07C 211/54 |

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

* cited by examiner

LIGHT-EMITTING DEVICE, DISPLAY APPARATUS, LIGHT- EMITTING APPARATUS, ELECTRONIC APPLIANCE, AND LIGHTING APPARATUS

BACKGROUND OF THE INVENTION

1. Field of the Invention

One embodiment of the present invention relates to an organic compound, a light-emitting device, a display module, a lighting module, a display apparatus, a light-emitting apparatus, an electronic appliance, a lighting apparatus, and an electronic device. Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specific examples of the technical field of one embodiment of the present invention disclosed in this specification include a semiconductor device, a display apparatus, a liquid crystal display apparatus, a light-emitting apparatus, a lighting apparatus, a power storage device, a memory device, an imaging device, a driving method thereof, and a manufacturing method thereof.

2. Description of the Related Art

Light-emitting devices (organic EL devices) including organic compounds and utilizing electroluminescence (EL) have been put to more practical use. In the basic structure of such light-emitting devices, an organic compound layer containing a light-emitting material (an EL layer) is sandwiched between a pair of electrodes. Carriers are injected by application of voltage to the device, and recombination energy of the carriers is used, whereby light emission can be obtained from the light-emitting material.

Such light-emitting devices are of self-luminous type and thus have advantages over liquid crystal devices, such as high visibility and no need for backlight, when used in pixels of a display, and are particularly suitable for flat panel displays. Displays including such light-emitting devices are also highly advantageous in that they can be thin and lightweight. Such light-emitting devices also have a feature of extremely high response speed.

Since light-emitting layers of such light-emitting devices can be successively formed two-dimensionally, planar light emission can be achieved. This feature is difficult to achieve with point light sources typified by incandescent lamps and LEDs or linear light sources typified by fluorescent lamps; thus, the light-emitting devices also have great potential as planar light sources, which can be used for lighting apparatuses and the like.

Displays and lighting apparatuses including light-emitting devices are suitable for a variety of electronic appliances as described above, and research and development of light-emitting devices have progressed for more favorable characteristics.

Low outcoupling efficiency is often a problem in an organic EL device. In order to improve the outcoupling efficiency, a structure including a layer formed using a low refractive index material in an EL layer has been suggested (see Patent Document 1, for example).

REFERENCE

[Patent Document 1] United States Patent Application Publication No. 2020/0176692

SUMMARY OF THE INVENTION

An object of one embodiment of the present invention is to provide a light-emitting device with high emission efficiency. Another object of one embodiment of the present invention is to provide any of a light-emitting device, a light-emitting apparatus, an electronic appliance, a display apparatus, and an electronic device each having low power consumption.

It is only necessary that at least one of the above-described objects be achieved in the present invention.

One embodiment of the present invention is a light-emitting device including a first electrode, a second electrode, and an EL layer between the first electrode and the second electrode. The EL layer includes a low refractive index layer and a light-emitting layer. The low refractive index layer includes a first organic compound. The first organic compound has an ordinary refractive index greater-than or equal to 1.50 and less than or equal to 1.75 with respect to light at 455 nm to 465 nm, or an ordinary refractive index greater than or equal to 1.45 and less than or equal to 1.70 with respect to light at 633 nm. The light-emitting layer includes a light-emitting substance. Given that a maximum peak wavelength of the light-emitting substance is $\lambda_{max}$ (nm), a wavelength corresponding to an intensity 1/e times a maximum peak intensity in an emission spectrum of the light-emitting substance is $\lambda_n$(nm), a shortest $\lambda_n$ in a range of wavelengths longer than $\lambda_{max}$ is $\lambda_1$ (nm), and a longest $\lambda_n$ in a range of wavelengths shorter than $\lambda_{max}$ is $\lambda_2$ (nm), a difference between $\lambda_1$ and $\lambda_2$ is greater than or equal to 5 nm and less than or equal to 45 nm.

Another embodiment of the present invention is the light-emitting device having the above structure, in which the difference between $\lambda_1$ and $\lambda_2$ in the emission spectrum of the light-emitting substance is greater than or equal to 5 nm and less than or equal to 35 nm.

Another embodiment of the present invention is the light-emitting device having the above structure, in which the half width of the emission spectrum is greater than or equal to 5 nm and less than or equal to 25 nm.

Another embodiment of the present invention is a light-emitting device including a first electrode, a second electrode, and an EL layer between the first electrode and the second electrode. The EL layer includes a low refractive index layer and a light-emitting layer. The low refractive index layer includes a first organic compound. The first organic compound has an ordinary refractive index greater than or equal to 1.50 and less than or equal to 1.75 with respect to light at 455 nm to 465 nm, or an ordinary refractive index greater than or equal to 1.45 and less than or equal to 1.70 with respect to light at 633 nm. The light-emitting layer includes a light-emitting substance. Given that a wavelength corresponding to an intensity 1/e times a maximum peak intensity in an emission spectrum of the light-emitting substance is $\lambda_n$ (nm), a shortest $\lambda_n$ in a range of wavelengths longer than a maximum peak wavelength $\lambda_{max}$ (nm) of the light-emitting substance is $\lambda_1$ (nm), and a longest $\lambda_n$ in a range of wavelengths shorter than $\lambda_{max}$ is $\lambda_2$ (nm), an energy at a wavelength corresponding to a difference between $\lambda_1$ and $\lambda_2$ is greater than or equal to 0.03 eV and less than or equal to 0.27 eV.

Another embodiment of the present invention is the light-emitting device having the above structure, in which a value obtained by converting the half width of the emission spectrum into energy is greater than or equal to 0.03 eV and less than or equal to 0.15 eV.

Another embodiment of the present invention is the light-emitting device having the above structure, in which the emission spectrum of the light-emitting substance is a photoluminescence spectrum of the light-emitting substance in a solution state.

Another embodiment of the present invention is the light-emitting device having the above structure, in which a solvent of the solution is toluene.

Another embodiment of the present invention is the light-emitting device having the above structure, in which the light-emitting substance includes a condensed heteroaromatic ring including nitrogen in its molecular structure.

Another embodiment of the present invention is the light-emitting device having the above structure, in which the condensed heteroaromatic ring including nitrogen is a condensed ring with four or more rings.

Another embodiment of the present invention is a light-emitting device including a first electrode, a second electrode, and an EL layer between the first electrode and the second electrode. The EL layer includes a low refractive index layer and a light-emitting layer. The low refractive index layer includes a first organic compound. The first organic compound has an ordinary refractive index greater than or equal to 1.50 and less than or equal to 1.75 with respect to light at 455 nm to 465 nm, and an ordinary refractive index greater than or equal to 1.45 and less than or equal to 1.70 with respect to light at 633 nm. The light-emitting layer includes a light-emitting substance. The light-emitting substance includes a condensed heteroaromatic ring including nitrogen in a molecular structure. The condensed heteroaromatic ring including nitrogen is a condensed ring with four or more rings.

Another embodiment of the present invention is the light-emitting device having the above structure, in which the condensed heteroaromatic ring including nitrogen is a condensed heteroaromatic ring including nitrogen and boron.

Another embodiment of the present invention is the light-emitting device having the above structure, in which the condensed heteroaromatic ring including nitrogen includes a diaza-boranaphtho-anthracene skeleton.

Another embodiment of the present invention is the light-emitting device having the above structure, in which the condensed heteroaromatic ring including nitrogen includes an indolocarbazole skeleton.

Another embodiment of the present invention is the light-emitting device having the above structure, in which the low refractive index layer is positioned between the first electrode and the light-emitting layer.

Another embodiment of the present invention is the light-emitting device having the above structure, in which the EL layer further includes a high refractive index layer. The high refractive index layer includes a second organic compound. An ordinary refractive index of the second organic compound with respect to light at a given wavelength is higher than an ordinary refractive index of the first organic compound with respect to light at the wavelength.

Another embodiment of the present invention is the light-emitting device having the above structure, in which the ordinary refractive index of the second organic compound with respect to light at a given wavelength is higher than the ordinary refractive index of the first organic compound with respect to light at the wavelength by 0.20 or more.

Another embodiment of the present invention is the light-emitting device having the above structure, in which the ordinary refractive index of the second organic compound with respect to light at a given wavelength is higher than the ordinary refractive index of the first organic compound with respect to light at the wavelength by 0.3 or more.

Another embodiment of the present invention is the light-emitting device having the above structure, in which the second organic compound has an ordinary refractive index greater than or equal to 2.00 and less than or equal to 2.50 with respect to light at 455 nm to 465 nm, or an ordinary refractive index greater than or equal to 1.95 and less than or equal to 2.45 with respect to light at 633 nm.

Another embodiment of the present invention is the light-emitting device having the above structure, in which given that the light-emitting substance emits light with an emission peak wavelength of λ nm, the product of the thickness of the high refractory index layer and the ordinary refractive index of the second organic compound with respect to light with the wavelength of λ nm is greater than or equal to 70% and less than or equal to 130% of λ/4.

Another embodiment of the present invention is the light-emitting device having the above structure, in which the thickness of the high refractory index layer is greater than or equal to 20 nm and less than or equal to 80 nm.

Another embodiment of the present invention is the light-emitting device having the above structure, in which the first electrode includes a reflective electrode, the second electrode has properties of transmitting and reflecting visible light, and the low refractive index layer is positioned between the first electrode and the light-emitting layer.

Another embodiment of the present invention is the light-emitting device having the above structure, in which the first electrode further includes an electrode having a property of transmitting visible light, the visible-light-transmitting electrode is positioned between the reflective electrode and the EL layer, the low refractive index layer is in contact with the visible-light-transmitting electrode, and the thickness of the visible-light-transmitting electrode is greater than or equal to 3 nm and less than or equal to 10 nm.

Another embodiment of the present invention is the light-emitting device having the above structure, in which the high refractive index layer is positioned between the low refractive index layer and the light-emitting layer.

Another embodiment of the present invention is the light-emitting device having the above structure, in which the low refractive index layer is positioned between the high refractive index layer and the light-emitting layer.

Another embodiment of the present invention is the light-emitting device having the above structure, in which the low refractive index layer is in contact with the high refractive index layer.

Another embodiment of the present invention is the light-emitting device having the above structure, in which the EL layer further includes a second low refractive index layer containing a third organic compound, the third organic compound has an ordinary refractive index greater than or equal to 1.50 and less than or equal to 1.75 with respect to light at 455 nm to 465 nm and an ordinary refractive index greater than or equal to 1.45 and less than or equal to 1.70 with respect to light at 633 nm, and the second low refractive index layer is positioned between the high refractive index layer and the light-emitting layer.

Another embodiment of the present invention is the light-emitting device having the above structure, in which given that the light-emitting substance emits light with an emission peak wavelength of λ nm, the product of the thickness of the second low refractive index layer and the ordinary refractive index of the third organic compound with respect to light with the wavelength of λ nm is greater than or equal to 70% and less than or equal to 130% of λ/4.

Another embodiment of the present invention is the light-emitting device having the above structure, in which the thickness of the second low refractive index layer is greater than or equal to 20 nm and less than or equal to 80 nm.

Another embodiment of the present invention is the light-emitting device having the above structure, in which the EL layer further includes a third low refractive index layer containing a fourth organic compound, the fourth organic compound has an ordinary refractive index greater than or equal to 1.50 and less than or equal to 1.75 with respect to light at 455 nm to 465 nm and an ordinary refractive index greater than or equal to 1.45 and less than or equal to 1.70 with respect to light at 633 nm, and the third low refractive index layer is positioned between the light-emitting layer and the second electrode.

Another embodiment of the present invention is the light-emitting device having the above structure, in which given that the light-emitting substance emits light with an emission peak wavelength of λ nm, the product of the thickness of the third low refractive index layer and the ordinary refractive index of the fourth organic compound with respect to light with the wavelength of λ nm is greater than or equal to 70% and less than or equal to 130% of λ/4.

Another embodiment of the present invention is the light-emitting device having the above structure, in which the thickness of the third low refractive index layer is greater than or equal to 20 nm and less than or equal to 80 nm.

Another embodiment of the present invention is the light-emitting device having the above structure, in which the first electrode includes an anode and the second electrode includes a cathode.

Another embodiment of the present invention is the light-emitting device having the above structure, in which the first electrode includes a cathode and the second electrode includes an anode.

Another embodiment of the present invention is the light-emitting device having the above structure, in which given that the light-emitting substance emits light with an emission peak wavelength of λ nm, the product of the thickness of the low refractive index layer and the ordinary refractive index of the first organic compound with respect to light with the wavelength of λ nm is greater than or equal to 70% and less than or equal to 130% of λ/4.

Another embodiment of the present invention is the light-emitting device having the above structure, in which the thickness of the low refractive index layer is greater than or equal to 20 nm and less than or equal to 80 nm.

Another embodiment of the present invention is a display apparatus including any of the above light-emitting devices.

Another embodiment of the present invention is an electronic appliance including any of the above light-emitting devices, a sensor, an operation button, and at least one of a speaker and a microphone.

Another embodiment of the present invention is an electronic appliance including the above display apparatus, a sensor, an operation button, and at least one of a speaker and a microphone.

Another embodiment of the present invention is a light-emitting apparatus including any of the above light-emitting devices and at least one of a transistor and a substrate.

Another embodiment of the present invention is a lighting apparatus including any of the above light-emitting devices and a housing.

Note that the light-emitting apparatus in this specification includes, in its category, an image display device that uses a light-emitting device. The light-emitting apparatus may also include a module in which a light-emitting device is provided with a connector such as an anisotropic conductive film or a tape carrier package (TCP), a module in which a printed wiring board is provided at the end of a TCP, and a module in which an integrated circuit (IC) is directly mounted on a light-emitting device by a chip on glass (COG) method. Furthermore, a lighting apparatus or the like may include the light-emitting apparatus.

With one embodiment of the present invention, a light-emitting device with high emission efficiency can be provided. With one embodiment of the present invention, any of a light-emitting device, a light-emitting apparatus, an electronic appliance, a display apparatus, and an electronic device each having low power consumption can be provided.

Note that the description of these effects does not preclude the existence of other effects. One embodiment of the present invention does not necessarily have all these effects. Other effects will be apparent from and can be derived from the description of the specification, the drawings, the claims, and the like.

BRIEF DESCRIPTION OF THE DRAWINGS

In the accompanying drawings:

FIGS. 13A, 13B1, 13B2, and 13C illustrate electronic appliances;

DETAILED DESCRIPTION OF THE INVENTION

Embodiments of the present invention will be described in detail below with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

Note that in the case where light is incident on a material having optical anisotropy, light with a plane of vibration parallel to the optical axis is referred to as extraordinary light (rays) and light with a plane of vibration perpendicular to the optical axis is referred to as ordinary light (rays); the refractive index of the material with respect to ordinary light might differ from that with respect to extraordinary light. In such a case, the ordinary refractive index and the extraordinary refractive index can be separately calculated by anisotropy analysis. In the case where the measured material has both the ordinary refractive index and the extraordinary refractive index, the ordinary refractive index is used as an index in this specification.

Embodiment 1

Figures 1A, 1B, 1C:
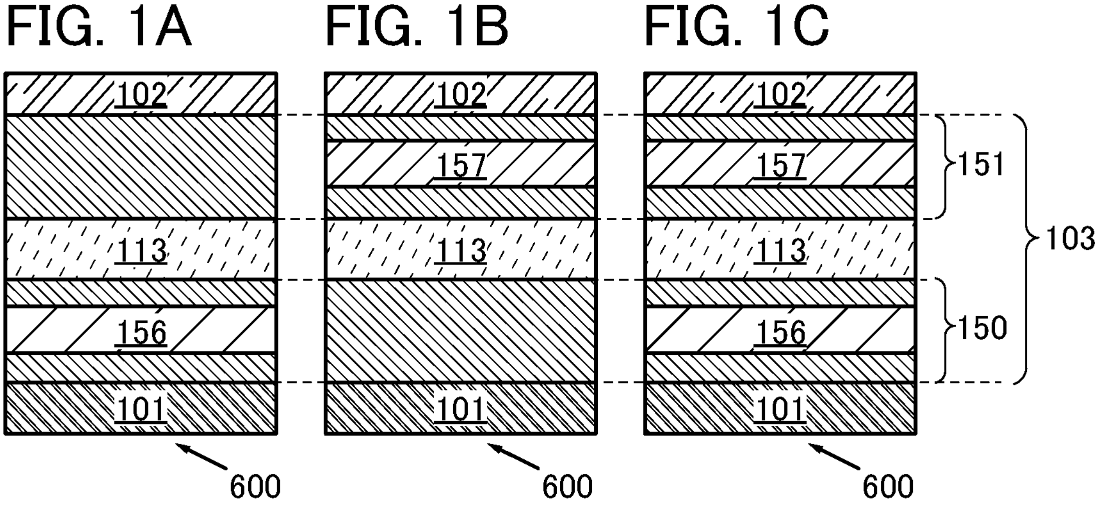
FIGS. 1A to 1C are schematic views of light-emitting devices.

FIGS. 1A to 1C each illustrate a light-emitting device 600 of one embodiment of the present invention. The light-emitting device illustrated in FIGS. 1A to 1C includes a first electrode 101, a second electrode 102, and an EL layer 103. The EL layer includes at least a light-emitting layer 113 and includes one or both of a low refractive index layer 156 and a low refractive index layer 157.

A region of the EL layer 103 between the light-emitting layer 113 and the first electrode 101 is a hole-transport region 150, and a region of the EL layer 103 between the light-emitting layer 113 and the second electrode 102 is an electron-transport region 151. The low refractive index layer 156 and the low refractive index layer 157 are provided in the hole-transport region 150 and the electron-transport region 151, respectively. The low refractive index layer (the low refractive index layers 156 and 157) contains an organic compound with a low refractive index, and its ordinary refractive index is smaller than that of a layer in the EL layer 103 other than the low refractive index layer (specifically the light-emitting layer 113). The ordinary refractive index of the low refractive index layer or the organic compound included in the low refractive index layer is preferably smaller than that of a layer in the EL layer 103 other than the low refractive index layer by 0.20 or more, preferably 0.3 or more.

The light-emitting layer 113 contains at least a light-emitting substance. The first electrode 101 includes an anode, and the second electrode 102 includes a cathode. One of the first electrode 101 and the second electrode 102 is a visible-light-transmitting electrode, and the other includes a reflective electrode.

In one embodiment of the present invention, the light-emitting substance contained in the light-emitting layer 113 preferably exhibits a narrow emission spectrum. Specifically, it is preferable to use a light-emitting substance exhibiting an emission spectrum where the distance between two points at an intensity corresponding to lie (e is the base of a natural logarithm) times the maximum peak intensity is greater than or equal to 5 nm and less than or equal to 45 nm, preferably greater than or equal to 5 nm and less than or equal to 35 nm.

In the light-emitting device of one embodiment of the present invention having such a structure, employing a microcavity structure enables efficient light amplification, resulting in favorable external quantum efficiency. In particular, in one embodiment of the present invention, using the low refractive index layer in combination with the above structure can significantly increase the amplification effect due to the microcavity structure.

Note that a half width is one of indices that are conventionally used to express the shape of the peak in an emission spectrum. Although the half width of the emission spectrum is represented by the distance between two points at the intensity corresponding to half the maximum peak intensity, the emission spectrum of an organic compound often has a plurality of emission components; hence, in some cases, the half width does not accurately reflect the influence of the peak shape in one embodiment of the present invention.

For example, in the case where light emitted from a light-emitting substance has a mix of emission components derived from two vibration levels and includes an emission component P1 having the highest intensity and an emission component P2 having a lower intensity than the emission component P1, the emission spectrum of the light-emitting material has a shape in which P1 and P2 are added. In this case, when the intensity of P2 is smaller than half the intensity of P1, the half width is less likely to reflect P2.

However, P2 has a broader spectrum than P1 in some cases; thus, when a light-emitting device containing a light-emitting substance that exhibits such an emission spectrum employs a microcavity structure using a low refractive index layer, a large amount of light might be attenuated. In this case, even in the case of using a light-emitting substance with a small half width, the effect of increasing the efficiency may be small because of the influence of P2; hence, there occurs a large difference in efficiency between light-emitting substances having similar half widths.

In one embodiment of the present invention, a light-emitting device with favorable external quantum efficiency is obtained by using a light-emitting substance with an emission spectrum having a small distance between two points at an intensity corresponding to 1/e times the maximum peak intensity (specifically a small difference between $\lambda_1$ and $\lambda_2$, where $\lambda_n$ (nm) represents a wavelength at the intensity corresponding to 1/e times the maximum peak intensity, $\lambda_1$ (nm) represents the shortest wavelength $\lambda_n$ in a range of wavelengths longer than the maximum peak wavelength $\lambda_{max}$ (nm) of the light-emitting substance, and $\lambda_2$ (nm) represents the longest wavelength $\lambda_n$ in a range of wavelengths shorter than $\lambda_{max}$). Specifically, it is preferable to use a light-emitting substance with an emission spectrum where the distance ($\lambda_1-\lambda_2$) between the two points at the intensity corresponding to 1/e times the maximum peak intensity is greater than or equal to 5 nm and less than or equal to 45 nm, preferably greater than or equal to 5 nm and less than or equal to 35 nm. It is further preferable to use a light-emitting substance with an emission spectrum where the distance between the two points at the intensity corresponding to 1/e times the maximum peak intensity is greater than or equal to 5 nm and less than or equal to 45 nm, preferably greater than or equal to 5 nm and less than or equal to 35 nm and the half width is greater than or equal to 5 nm and less than or equal to 25 nm.

Note that the width of the emission spectrum can also be represented by being converted into energy. That is, in a light-emitting substance that can be favorably used in one embodiment of the present invention, the difference in energies obtained by converting the two points at the intensity corresponding to 1/e times the maximum peak intensity of the emission spectrum is preferably greater than or equal to 0.03 eV and less than or equal to 0.27 eV. It is further preferable to use a light-emitting substance in which a value obtained by converting the distance between the two points at the intensity corresponding to 1/e times the maximum peak intensity into energy is greater than or equal to 0.03 eV and less than or equal to 0.27 eV and a value obtained by converting the half width into energy is greater than or equal to 0.03 eV and less than or equal to 0.15 eV.

As such a light-emitting substance, an organic compound containing a condensed heteroaromatic ring including nitrogen in its molecular structure is preferred.

In particular, in the organic compound, the condensed heteroaromatic ring including nitrogen is preferably a condensed ring with four or more rings, in which case the emission spectrum is narrow.

The condensed heteroaromatic ring including nitrogen preferably includes an indolocarbazole skeleton, in which case the distance ($\lambda_1-\lambda_2$) between the two points at the intensity corresponding to 1/e times the maximum peak intensity is narrower. The condensed heteroaromatic ring including nitrogen is particularly preferably a condensed heteroaromatic ring including nitrogen and boron, in which case the distance ($\lambda_1-\lambda_2$) between the two points at the intensity corresponding to 1/e times the maximum peak intensity is narrower, and further preferably includes a diaza-boranaphtho-anthracene skeleton.

Specifically, as the organic compound containing the condensed heteroaromatic ring including nitrogen, any of the following can be favorably used, for example: 5,9-diphenyl-5,9-diaza-13 b-boranaphtho[3,2,1-de]anthracene (abbreviation: DABNA1), 9-([1,1'-diphenyl]-3-yl)-N,N,5,11-tetraphenyl-5,9-dihydro-5,9-diaza-13b-boranaphtho[3,2,1-de]anthracene-3-amine (abbreviation: DABNA2), 2,12-di(tert-butyl)-5,9-di(4-tert-butylphenyl)-N,N-diphenyl-5H,9H-[1,4]benzazaborino[2,3,4-kl]phenazaborin-7-amine (abbreviation: DPhA-tBu4DABNA), 2,12-di(tert-butyl)-N,N,5,9-tetra(4-tert-butylphenyl)-5H,9H-[1, 4]benzazaborino[2,3,4-kl]phenazaborin-7-amine (abbreviation: tBuDPhA-tBu4DABNA), 2,12-di(tert-butyl)-5,9-di(4-tert-butylphenyl)-7-methyl-5H,9H-[1,4]benzazaborino[2,3,4-kl]phenazaborine (abbreviation: Me-tBu4DABNA), $N^7$,$N^7$,$N^{13}$,$N^{13}$,5,9,11,15-octaphenyl-5H,9H,11H,15H-[1,4]benzazaborino[2,3,4-*k*/][1,4]benzazaborino[4',3',2': 4,5][1,4]benzazaborino[3,2-b]phenazaborin-7,13-diamine (abbreviation: v-DABNA), and 2-(4-tert-butylphenyl)benz[5,6]indolo[3,2,1-jk]benzo[b]carbazole (abbreviation: tBuPBibc).

Note that the width of the emission spectrum can be calculated using a photoluminescence spectrum of a light-emitting substance in a solution state. The dielectric constant of the organic compound included in the EL layer of the light-emitting device is approximately 3; in order to minimize inconsistency with the emission spectrum in the case where the light-emitting substance is used in the light-emitting device, the dielectric constant of the solvent for the light-emitting substance is preferably greater than or equal to 1 and less than or equal to 10, further preferably greater than or equal to 2 and less than or equal to 5 at room temperature. Specific examples include hexane, benzene, toluene, diethyl ether, ethyl acetate, chloroform, chlorobenzene, and dichloromethane. A solvent that has a dielectric constant greater than or equal to 2 and less than or equal to 5 at room temperature, has high solubility, and is versatile is further preferable, and toluene or chloroform is preferred, for example.

The low refractive index layers 156 and 157 can be formed using an organic compound having a carrier-transport property whose ordinary refractive index at any wavelength in the range from 455 nm to 465 nm, preferably in the entire wavelength range from 455 nm to 465 nm is higher than or equal to 1.50 and lower than or equal to 1.75. Alternatively, the low refractive index layer layers 156 and 157 can be formed using a material having a carrier-transport property whose ordinary refractive index at any wavelength in the range from 500 nm to 650 nm, preferably in the entire wavelength range from 500 nm to 650 nm, for example, at a wavelength of 633 nm, is higher than or equal to 1.45 and lower than or equal to 1.70.

In the above manner, the refractive index of the low refractive index layer can be calculated using the refractive index of the material used. In this case, as the refractive index of the material, the refractive index of a film formed by a method similar to the method for forming the layer in the target light-emitting device is measured, and for example, the refractive index of an evaporation film of the material used in the light-emitting device fabricated by evaporation is measured.

The low refractive index layer 156 or the low refractive index layer 157 is preferably provided in the carrier-transport region (the hole-transport region 150 or the electron-transport region 151), which is a region between the light-emitting layer 113 and the visible-light-transmitting electrode, in which case the effect of improving emission efficiency is larger than in the case where the low refractive index layer is provided only in the region between the light-emitting layer 113 and the reflective electrode.

Given that λ (nm) represents an emission peak wavelength of the light-emitting substance contained in the light-emitting layer 113, the thickness of the low refractive index layer 156 is preferably such that the product of the thickness of the low refractive index layer 156 and the ordinary refractive index of the low refractive index layer 156 at the wavelength λ is greater than or equal to 70% and less than or equal to 130% of λ/4, in which case the effect of improving efficiency is adequately obtained. Similarly, the thickness of the low refractive index layer 157 is preferably such that the product of the thickness of the low refractive index layer 157 and the ordinary refractive index of the low refractive index layer 157 at the wavelength λ is greater than or equal to 70% and less than or equal to 130% of λ/4, in which case the effect of improving efficiency is adequately obtained. The low refractive index layers 156 and 157 preferably have a thickness greater than or equal to 20 nm and less than or equal to 80 nm because it is difficult to obtain the effect of improving efficiency when they are too thin and because a larger thickness would cause interference of light, resulting in lower efficiency.

In the case where the low refractive index layer 156 is in contact with the first electrode 101, which includes an electrode functioning as the anode, and the first electrode 101 includes the reflective electrode, the first electrode 101 preferably includes the visible-light-transmitting electrode on the low refractive index layer 156 side. Examples of a material for the visible-light-transmitting electrode are metal oxides such as indium oxide-tin oxide (ITO: indium tin oxide), indium oxide-tin oxide containing silicon or silicon oxide, indium oxide-zinc oxide, and indium oxide containing tungsten oxide and zinc oxide (IWZO). Note that such a metal oxide has a work function suitable for the anode; hence, forming the EL layer in contact with the metal oxide enables holes to be injected smoothly into the EL layer. Here, the thickness of the visible-light-transmitting electrode is preferably greater than or equal to 3 nm and less than or equal to 10 nm, in which case light extinction due to the evanescent mode derived from the reflective electrode is inhibited, the reflectivity of the reflective electrode is increased, and a reduction in efficiency due to interference of light caused at two interfaces of the light-transmitting electrode is suppressed.

The light-emitting device of one embodiment of the present invention may also include a high refractive index layer. The high refractive index layer contains an organic compound with a high refractive index. The high refractive index layer is provided in one or both of the hole-transport region 150 and the electron-transport region 151. The ordinary refractive index of the high refractive index layer or the organic compound contained in the high refractive index layer is preferably greater than or equal to 2.00 and less than or equal to 2.50 with respect to light at 455 nm to 465 nm, or greater than or equal to 1.95 and less than or equal to 2.45 with respect to light at 633 nm. The high refractive index layer or the organic compound in the high refractive index layer preferably has a higher ordinary refractive index with respect to light at a given wavelength than the low refractive index layers 156 and 157 by 0.20 or more, preferably 0.3 or more.

The organic compound with a high refractive index is preferably an organic compound having a condensed aromatic hydrocarbon ring or a condensed heteroaromatic ring. The condensed aromatic hydrocarbon ring preferably has a naphthalene ring structure, and for example, preferably includes a naphthalene ring, an anthracene ring, a phenanthrene ring, or a triphenylene ring. The condensed heteroaromatic ring preferably has a structure of a carbazole ring, a dibenzofuran ring, or a dibenzothiophene ring. For example, benzo[b]naphtho[1,2-d]furan is preferable because of having a structure of a dibenzofuran ring.

As the organic compound with a high refractive index, it is preferable to use an organic compound having one or more elements in the third and later periods, an organic compound having a terphenyl skeleton, an organic compound having both of them, or the like. For example, a biphenyl group substituted by a naphthyl group, or a phenyl group substituted by a dibenzofuranyl group can be said to have a terphenyl skeleton. Specifically, N,N-bis[4-(6-phenylbenzo[b]naphtho[1,2-d]furan-8-yl)phenyl]-4-amino-p-terphenyl (abbreviation: BnfBB1TP), 4,4'-bis[4-(2-naphthyl)phenyl]-4"-phenyltriphenylamine (abbreviation: βNBiB1BP), N,N-bis[4-(dibenzofuran-4-yl)phenyl]-4-amino-p-terphenyl (abbreviation: DBfBB1TP), 4-[4'-(carbazol-9-yl)biphenyl-4-yl]-4'-(2-naphthyl)-4"-phenyltriphenylamine (abbreviation: YGTBiβNB), 5,5'-diphenyl-2,2'-di-5H-[1]benzothieno[3,2-c]carbazole (abbreviation: BisBTc), or the like can be favorably used.

By including the high refractive index layer, the light-emitting device of one embodiment of the present invention can have higher emission efficiency.

Given that λ (nm) represents the emission peak wavelength of the light-emitting substance contained in the light-emitting layer 113, the thickness of the high refractive index layer is preferably such that the product of the thickness of the high refractive index layer and the ordinary refractive index of the high refractive index layer at the wavelength λ is greater than or equal to 70% and less than or equal to 130% of λ/4, in which case the effect of improving efficiency is adequately obtained. The high refractive index layer preferably has a thickness greater than or equal to 20 nm and less than or equal to 80 nm because too small a thickness makes it difficult to obtain the effect of improving efficiency and because a larger thickness would cause interference of light, resulting in lower efficiency.

Note that the high refractive index layer may be positioned between the light-emitting layer 113 and the refractive index layer 156 or the low refractive index layer 157, or positioned between the low refractive index layer 156 and the first electrode 101 or between the low refractive index layer 157 and the second electrode 102. The high refractive index layer is preferably in contact with the low refractive index layer 156 or the low refractive index layer 157, in which case the effect of increasing the efficiency is improved.

The hole-transport region 150 or the electron-transport region 151, which includes two layers of the low refractive index layer and the high refractive index layer, may further include a second low refractive index layer. The second low refractive index layer preferably has an ordinary refractive index greater than or equal to 1.50 and less than or equal to 1.75 with respect to light at 455 nm to 465 nm, and an ordinary refractive index greater than or equal to 1.45 and less than or equal to 1.70 with respect to light at 633 nm.

Given that λ (nm) represents the emission peak wavelength of the light-emitting substance contained in the light-emitting layer 113, the thickness of the second low refractive index layer is preferably such that the product of the thickness of the second low refractive index layer and the ordinary refractive index of the second low refractive index layer at the wavelength λ is greater than or equal to 70% and less than or equal to 130% of λ/4, in which case the effect of improving efficiency is adequately obtained. The second low refractive index layer preferably has a thickness greater than or equal to 20 nm and less than or equal to 80 nm because too small a thickness makes it difficult to obtain the effect of improving efficiency and because a larger thickness would cause interference of light, resulting in lower efficiency.

Figure 2:
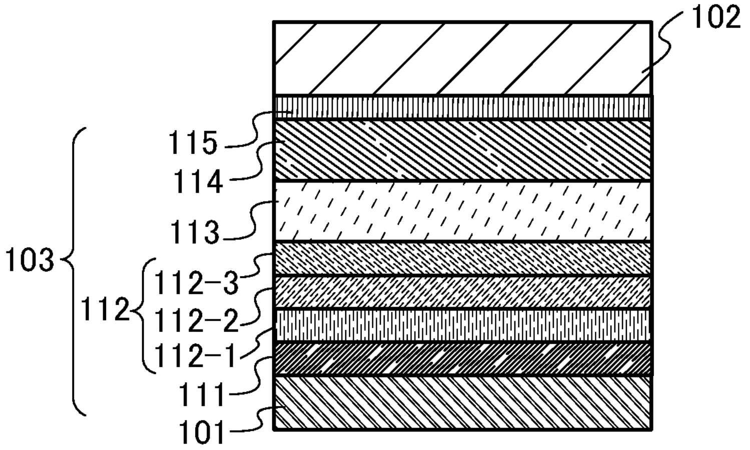
FIG. 2 is a schematic view of a light-emitting device.

The second low refractive index layer is preferably formed so that the high refractive index layer is sandwiched between the low refractive index layer and the second low refractive index layer. In the case where the low refractive index layer, the high refractive index layer, and the second low refractive index layer are provided, they are preferably provided in the hole-transport region 150, particularly a hole-transport layer 112. Preferably, as illustrated in FIG. 2, a first hole-transport layer 112-1, a second hole-transport layer 112-2, and a third hole-transport layer 112-3 are formed as the low refractive index layer, the high refractive index layer, and the second low refractive index layer, respectively, in the hole-transport layer 112.

The light-emitting device may further include a third low refractive index layer. The third low refractive index layer is preferably formed in the electron-transport region 151 when the second low refractive index layer is provided in the hole-transport region 150, and is preferably formed in the hole-transport region 150 when the second low refractive index layer is provided in the electron-transport region 151.

Given that λ (nm) represents the emission peak wavelength of the light-emitting substance contained in the light-emitting layer 113, the thickness of the third low refractive index layer is preferably such that the product of the thickness of the third low refractive index layer and the ordinary refractive index of the third low refractive index layer at the wavelength λ is greater than or equal to 70% and less than or equal to 130% of λ/4, in which case the effect of improving efficiency is adequately obtained. The third low refractive index layer preferably has a thickness greater than or equal to 20 nm and less than or equal to 80 nm because too small a thickness makes it difficult to obtain the effect of improving efficiency and because a larger thickness would cause interference of light, resulting in lower efficiency.

Next, materials included in the low refractive index layers are described in details. In the case where the low refractive index layer, the second low refractive index layer, or the third low refractive index layer is provided in the hole-transport region 150, it is formed as a layer containing a low refractive index material having a hole-transport property. The following substances can be given as examples of the low refractive index material having a hole-transport property and a refractive index in the above-described range. Note that substances other than those described below can also be used similarly as long as they are substances that can form a film with a hole mobility of $1\times10^{-7}$ $cm^2/Vs$ or higher and a refractive index in the above-described range.

An example of the low refractive index material having a hole-transport property is a monoamine compound including a first aromatic group, a second aromatic group, and a third aromatic group, in which the first aromatic group, the second aromatic group, and the third aromatic group are bonded to the same nitrogen atom.

In the monoamine compound, the proportion of carbon atoms each forming a bond by the $sp^3$ hybrid orbitals to the total number of carbon atoms in the molecule is preferably higher than or equal to 23% and lower than or equal to 55%. In addition, it is preferable that the integral value of signals at lower than 4 ppm exceed the integral value of signals at 4 ppm or higher in the results of $^1$H-NMR measurement conducted on the monoamine compound.

The monoamine compound preferably has at least one fluorene skeleton. One or more of the first aromatic group, the second aromatic group, and the third aromatic group are preferably a fluorene skeleton.

Another example of the low refractive index material having a hole-transport property is an arylamine compound that has at least one aromatic group having first to third benzene rings and at least three alkyl groups. Note that the first to third benzene rings are bonded in this order and the first benzene ring is directly bonded to nitrogen of amine.

The first benzene ring may further include a substituted or unsubstituted phenyl group and preferably includes an unsubstituted phenyl group. Furthermore, the second benzene ring or the third benzene ring may include a phenyl group substituted by an alkyl group.

Note that hydrogen is not directly bonded to carbon atoms at 1- and 3-positions in two or more of, preferably all of the first to third benzene rings, and the carbon atoms are bonded to any of the first to third benzene rings, the phenyl group substituted by the alkyl group, the at least three alkyl groups, and the nitrogen of the amine.

It is preferable that the arylamine compound further include a second aromatic group. It is preferable that the second aromatic group have an unsubstituted monocyclic ring or a substituted or unsubstituted bicyclic or tricyclic condensed ring; in particular, it is further preferable that the second aromatic group be a group having a substituted or unsubstituted bicyclic or tricyclic condensed ring where the number of carbon atoms forming the ring is 6 to 13. It is still further preferable that the second aromatic group be a group including a fluorene ring. Note that a dimethylfluorenyl group is preferable as the second aromatic group.

It is preferable that the arylamine compound further include a third aromatic group. The third aromatic group is a group having 1 to 3 substituted or unsubstituted benzene rings.

It is preferable that the at least three alkyl groups and the alkyl group substituted for the phenyl group be each a chain alkyl group having 2 to 5 carbon atoms. In particular, the alkyl group is preferably a chain alkyl group having a branch formed of 3 to 5 carbon atoms, and is further preferably a t-butyl group.

In the case where the low refractive index layer, the second low refractive index layer, and the third low refractive index layer are provided in the electron-transport region 151, they are formed as layers containing a low refractive index material having an electron-transport property. The following substances can be given as examples of the low refractive index material having an electron-transport property and a refractive index in the above-described range. Note that substances other than those described below can also be used similarly as long as they are substances that can form a film with an electron mobility of $1\times10^{-7}$ $cm^2/Vs$ or higher and a refractive index in the above-described range.

An example of the low refractive index material having an electron-transport property is an organic compound that includes at least one six-membered heteroaromatic ring having 1 to 3 nitrogen atoms, a plurality of aromatic hydrocarbon rings each of which has 6 to 14 carbon atoms forming a ring and at least two of which are benzene rings, and a plurality of hydrocarbon groups forming a bond by $sp^3$ hybrid orbitals.

In the above organic compound, carbon atoms forming a bond by $sp^3$ hybrid orbitals preferably account for higher than or equal to 10% and lower than or equal to 60%, further preferably higher than or equal to 10% and lower than or equal to 50% of total carbon atoms in molecules of the organic compound. Alternatively, when the above organic compound is subjected to $^1$H-NMR measurement, the integral value of signals at lower than 4 ppm is preferably ½ or more of the integral value of signals at 4 ppm or higher.

The molecular weight of the organic compound having an electron-transport property is preferably greater than or equal to 500 and less than or equal to 2000. It is preferable that all the hydrocarbon groups forming a bond by $sp^3$ hybrid orbitals in the above organic compound be bonded to the aromatic hydrocarbon rings each having 6 to 14 carbon atoms forming a ring.

Note that in the low refractive index layer 156, a mixed material of the organic compound and a metal complex of an alkali metal or an alkaline earth metal is preferably used as the low refractive index material having an electron-transport property. A heterocyclic compound having a diazine skeleton, a heterocyclic compound having a triazine skeleton, and a heterocyclic compound having a pyridine skeleton are preferable in terms of driving lifetime because they are likely to form an exciplex with an organometallic complex of an alkali metal with stable energy (the emission wavelength of the exciplex easily becomes longer). In particular, the heterocyclic compound having a diazine skeleton and the heterocyclic compound having a triazine skeleton have a deep LUMO level and thus are preferred for stabilization of energy of an exciplex.

Note that the organometallic complex of an alkali metal is preferably a metal complex of sodium or lithium. Alternatively, the organometallic complex of an alkali metal preferably has a ligand having a quinolinol skeleton. Further preferably, the organometallic complex of an alkali metal is a lithium complex having an 8-quinolinolato structure or a derivative thereof. The derivative of a lithium complex having an 8-quinolinolato structure is preferably a lithium complex having an 8-quinolinolato structure having an alkyl group, and further preferably has a methyl group.

Note that 8-quinolinolato-lithium having an alkyl group can be a metal complex with a low refractive index. Specifically, the ordinary refractive index of the metal complex in a thin film state with respect to light with a wavelength in the range from 455 nm to 465 nm can be higher than or equal to 1.45 and lower than or equal to 1.70, and the ordinary refractive index thereof with respect to light with a wavelength of 633 nm can be higher than or equal to 1.40 and lower than or equal to 1.65.

Specific examples of the metal complex include 8-hydroxyquinolinato-lithium (abbreviation: Liq) and 8-hydroxyquinolinato-sodium (abbreviation: Naq). In particular, a complex of a monovalent metal ion, especially a complex of lithium is preferable, and Liq is further preferable. Note that in the case where the 8-hydroxyquinolinato structure is included, a methyl-substituted product (e.g., a 2-methyl-substituted product, a 5-methyl-substituted product, or 6-methyl-substituted product) thereof is also preferably used, for example. In particular, the use of an alkali metal complex having an 8-quinolinolato structure having an alkyl group at the 6 position results in lowering the driving voltage of a light-emitting device.

Note that the light-emitting device 600 preferably includes the low refractive index layer in each of the hole-transport region 150 and the electron-transport region 151 as illustrated in FIG. 1C. The existence of the low refractive index layers 156 and 157 enables the light-emitting device to have higher emission efficiency.

In the case of calculating the refractive index of a layer formed of a mixed material, it may be directly measured or can be calculated by multiplying the ordinary refractive indices of films that are formed of only the individual materials by their respective percentages in the mixed material and summing up the products. Note that in the case where precise percentages cannot be obtained, a value obtained by dividing each of the ordinary refractive indices by the number of compositional components and summing up the quotients may be used.

Embodiment 2

In this embodiment, a structure in which a cap layer 155 is formed using an organic compound with a high refractive index over a visible-light-transmitting electrode of a light-emitting device will be described with reference to FIG. 3.

Figure 3:
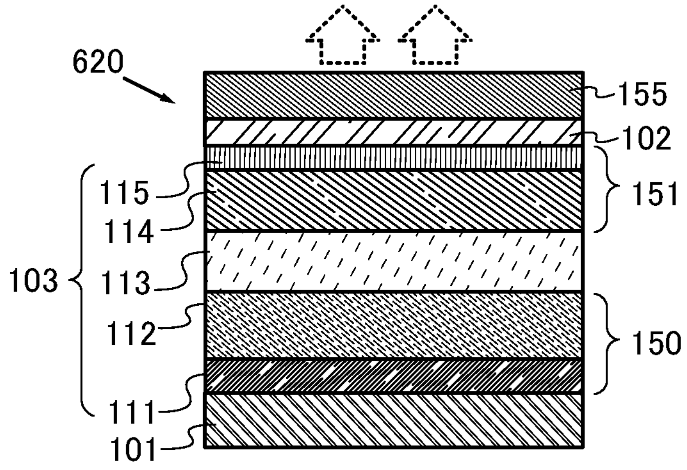
FIG. 3 is a schematic view of a light-emitting device.

In FIG. 3, the cap layer 155 is provided in a light-emitting device 620 in which the second electrode 102 has a property of transmitting visible light. The cap layer 155 is formed using an organic compound with a high refractive index. The ordinary refractive index of the cap layer 155 or the organic compound with a high refractive index included in the cap layer 155 is preferably greater than or equal to 2.00 and less than or equal to 2.50 with respect to light at 455 nm to 465 nm, or greater than or equal to 1.95 and less than or equal to 2.45 with respect to light at 633 nm. Specifically, any of the organic compounds that can be used in the high refractive index layer in Embodiment 1 can be similarly used.

The light-emitting device 620 having such a structure has higher outcoupling efficiency and can further suppress loss of light, resulting in favorable emission efficiency.

In the light-emitting layer 113, a light-emitting substance with a narrow emission spectrum is preferably used. A light-emitting device with favorable external quantum efficiency is obtained by using a light-emitting substance with a narrow emission spectrum, specifically, with an emission spectrum having a small distance between two points at the intensity corresponding to 1/e times the maximum peak intensity (specifically a small difference between $\lambda_1$ and $\lambda_2$, where $\lambda_n$ (nm) represents a wavelength at the intensity corresponding to 1/e times the maximum peak intensity, $\lambda_1$ (nm) represents the shortest wavelength $\lambda_n$ in a range of wavelengths longer than the maximum peak wavelength $\lambda_{max}$ (nm) of the light-emitting substance, and $\lambda_2$ (nm) represents the longest wavelength $\lambda_n$ in a range of wavelengths shorter than $\lambda_{max}$). Specifically, it is preferable to use a light-emitting substance with an emission spectrum where the distance ($\lambda_1-\lambda_2$) between the two points at the intensity corresponding to 1/e times the maximum peak intensity is greater than or equal to 5 nm and less than or equal to 45 nm, preferably greater than or equal to 5 nm and less than or equal to 35 nm. It is further preferable to use a light-emitting substance with an emission spectrum where the distance between the two points at the intensity corresponding to 1/e times the maximum peak intensity is greater than or equal to 5 nm and less than or equal to 45 nm, preferably greater than or equal to 5 nm and less than or equal to 35 nm and the half width is greater than or equal to 5 nm and less than or equal to 25 nm.

Note that the width of the emission spectrum can also be represented by being converted into energy. That is, in a light-emitting substance that can be favorably used in one embodiment of the present invention, a value obtained by converting the distance ($\lambda_1-\lambda_2$) between the two points at the intensity corresponding to 1/e times the maximum peak intensity of the emission spectrum into energy is preferably greater than or equal to 0.03 eV and less than or equal to 0.27 eV. It is further preferable to use a light-emitting substance in which a value obtained by converting the distance between the two points at the intensity corresponding to 1/e times the maximum peak intensity into energy is greater than or equal to 0.03 eV and less than or equal to 0.27 eV and a value obtained by converting the half width into energy is greater than or equal to 0.03 eV and less than or equal to 0.15 eV. Specifically, any of the organic compounds that are given as light-emitting substances with a narrow emission spectrum in Embodiment 1 can be used.

The structure in which a light-emitting substance with a narrow emission spectrum is used as the light-emitting substance in the light-emitting device 620 including the cap layer 155 is preferable because light interference due to reflection caused at the interface of the cap layer 155 improves the outcoupling efficiency.

The EL layer 103 preferably includes a low refractive index layer, and the light-emitting device can have higher emission efficiency by employing the structure described in Embodiment 1.

Embodiment 3

Next, examples of other structures and materials of the light-emitting device 600 of one embodiment of the present invention will be described with reference to FIGS. 4A to 4D. The light-emitting device of one embodiment of the present invention includes, as in Embodiment 1, the EL layer 103 including a plurality of layers between a pair of electrodes, which are the first electrode 101 and the second electrode 102, and the EL layer 103 includes at least the light-emitting layer 113 containing a light-emitting substance and a low refractive index layer. The light-emitting device may include the cap layer 155 as in Embodiment 2. The first electrode 101 includes an electrode functioning as the anode, and the second electrode 102 includes an electrode functioning as the cathode.

The anode is preferably formed using any of metals, alloys, and conductive compounds with a high work function (specifically, higher than or equal to 4.0 eV), mixtures thereof, and the like. Specific examples include indium oxide-tin oxide (ITO: indium tin oxide), indium oxide-tin oxide containing silicon or silicon oxide, indium oxide-zinc oxide, and indium oxide containing tungsten oxide and zinc oxide (IWZO). Such conductive metal oxide films are usually formed by a sputtering method, but may be formed by application of a sol-gel method or the like. In an example of the formation method, a film of indium oxide-zinc oxide is formed by a sputtering method using a target obtained by adding 1 wt % to 20 wt % of zinc oxide to indium oxide. Furthermore, a film of indium oxide containing tungsten oxide and zinc oxide (IWZO) can be formed by a sputtering method using a target in which tungsten oxide and zinc oxide are added to indium oxide at 0.5 wt % to 5 wt % and 0.1 wt % to 1 wt %, respectively. Alternatively, gold (Au), platinum (Pt), nickel (Ni), tungsten (W), chromium (Cr), molybdenum (Mo), iron (Fe), cobalt (Co), copper (Cu), palladium (Pd), a nitride of a metal material (e.g., titanium nitride), or the like can be used as a material of the first electrode 101. Graphene can also be used as a material of the anode. Note that when a composite material described later is used for a layer that is in contact with the anode in the EL layer 103 (the layer is typically a hole-injection layer 111), an electrode material can be selected regardless of the work function.

As a substance of the cathode, any of metals, alloys, and electrically conductive compounds with a low work function (specifically, lower than or equal to 3.8 eV), mixtures thereof, and the like is preferably used. Specific examples of such a cathode material include elements belonging to Groups 1 and 2 of the periodic table, such as alkali metals (e.g., lithium (Li) and cesium (Cs)), magnesium (Mg), calcium (Ca), and strontium (Sr), alloys containing these elements (e.g., MgAg and AlLi), rare earth metals such as europium (Eu) and ytterbium (Yb), and alloys containing these rare earth metals. When an electron-injection layer is provided between the cathode and an electron-transport layer, any of a variety of conductive materials such as Al, Ag, ITO, and indium oxide-tin oxide containing silicon or silicon oxide can be used for the cathode regardless of the work function.

One of the first electrode 101 and the second electrode 102 includes a light-transmitting electrode, and the other electrode includes an electrode having a property of reflecting visible light. A stack of the reflective electrode and a light-transmitting electrode may be used.

Films of these conductive materials can be formed by a dry process such as a vacuum evaporation method or a sputtering method, an ink-jet method, a spin coating method, or the like. Alternatively, a wet process using a sol-gel method or a wet process using a paste of a metal material may be employed.

It is preferable that the EL layer 103 have a stacked-layer structure. Except for the above-described light-emitting layer 113, there is no particular limitation on the stacked-layer structure, and various functional layers such as a hole-injection layer, a hole-transport layer, an electron-transport layer, an electron-injection layer, a carrier-blocking layer (e.g., a hole-blocking layer and an electron-blocking layer), an exciton-blocking layer, an intermediate layer, and a charge-generation layer can be used. It should be noted that any of the layers or part of any of the layers is a low refractive index layer in one embodiment of the present invention. Alternatively, a plurality of low refractive index layers may be provided.

Figure 4A:
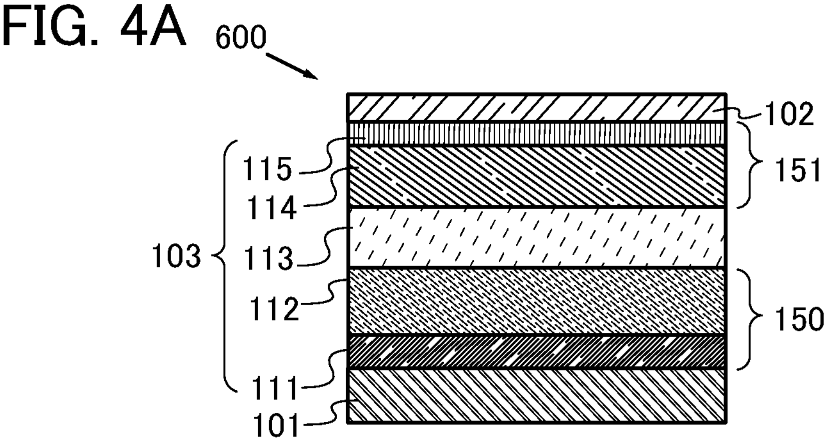
FIG. 4A to FIG. 4D are schematic views of light-emitting devices.

FIG. 4A illustrates an example in which the hole-transport region 150 (the hole-injection layer 111 and the hole-transport layer 112), the light-emitting layer 113, and the electron-transport region 151 (an electron-transport layer 114 and an electron-injection layer 115) are stacked as the EL layer 103.

In addition to the layers illustrated in FIG. 4A, the hole-transport region 150 may also include an electron-blocking layer or the like, and the electron-transport region 151 may also include a hole-blocking layer or the like.

The hole-injection layer 111 is provided in contact with the anode and has a function of facilitating injection of holes into the EL layer 103. The hole-injection layer can be formed using a phthalocyanine-based complex compound such as phthalocyanine (abbreviation: $H_2Pc$) or copper phthalocyanine (abbreviation: CuPc), an aromatic amine compound such as 4,4'-bis[N-(4-diphenylaminophenyl)-N-phenylamino]biphenyl (abbreviation: DPAB) or 4,4'-bis(N-{4-[N-(3-methylphenyl)-N-phenylamino]phenyl}-N-phenylamino)biphenyl (abbreviation: DNTPD), or a high molecular compound such as poly(3,4-ethylenedioxythiophene)/poly(styrenesulfonic acid) (PEDOT/PSS).

The hole-injection layer may be formed using a substance having an acceptor property. Examples of the substance having an acceptor property include organic compounds having an electron-withdrawing group (a halogen group or a cyano group), such as 7,7,8,8-tetracyano-2,3,5,6-tetrafluoroquinodimethane (abbreviation: F4-TCNQ), chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), and 2-(7-dicyanomethylene-1,3,4,5,6,8,9,10-octafluoro-7H-pyren-2-ylidene)malononitrile. A compound in which electron-withdrawing groups are bonded to a condensed aromatic ring having a plurality of heteroatoms, such as HAT-CN, is particularly preferable because it is thermally stable. A [3]radialene derivative having an electron-withdrawing group (in particular, a cyano group, a halogen group such as a fluoro group, or the like) has a very high electron-accepting property and thus is preferable. Specific examples include α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], and α,α',α"-1,2,3-cyclopropanetriylidenetris[2,3,4,5,6-pentafluorobenzeneacetonitrile]. As the substance having an acceptor property, molybdenum oxide, vanadium oxide, ruthenium oxide, tungsten oxide, manganese oxide, or the like can be used other than the above-described organic compounds. The substance having an acceptor property can extract electrons from an adjacent hole-transport layer (or hole-transport material) by the application of voltage between the electrodes.

The hole-injection layer may be formed using a composite material containing any of the aforementioned materials having an acceptor property and a material having a hole-transport property. As the hole-transport material used in the composite material, any of a variety of organic compounds such as aromatic amine compounds, heteroaromatic compounds, aromatic hydrocarbons, and high molecular compounds (e.g., oligomers, dendrimers, and polymers) can be used. Note that the hole-transport material used in the composite material preferably has a hole mobility of $1\times10^{-6}$ $cm^2/Vs$ or higher. The material having a hole-transport property used in the composite material is preferably a compound having a condensed aromatic hydrocarbon ring or a π-electron rich heteroaromatic ring. As the condensed aromatic hydrocarbon ring, an anthracene ring, a naphthalene ring, or the like is preferable. As the π-electron rich heteroaromatic ring, a condensed aromatic ring having at least one of a pyrrole skeleton, a furan skeleton, and a thiophene skeleton is preferable; specifically, a carbazole ring, a dibenzothiophene ring, or a ring in which an aromatic ring or a heteroaromatic ring is further condensed to the carbazole ring or the dibenzothiophene ring is preferable.

The hole-transport material further preferably has any of a carbazole skeleton, a dibenzofuran skeleton, a dibenzothiophene skeleton, and an anthracene skeleton. In particular, an aromatic amine having a substituent that includes a dibenzofuran ring or a dibenzothiophene ring, an aromatic monoamine that includes a naphthalene ring, or an aromatic monoamine in which a 9-fluorenyl group is bonded to nitrogen of amine through an arylene group may be used. Note that the hole-transport material having an N,N-bis(4-biphenyl)amino group is preferable because a light-emitting device having a long lifetime can be fabricated. Specific examples of the material having a hole-transport property include N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4"-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II)(4)), N,N-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4,4'-diphenyl-4"-(6;1'-binaphthyl-2-yl)triphenylamine (abbreviation: BBAαNβNB), 4,4'-diphenyl-4"-(7;1'-binaphthyl-2-yl)triphenylamine (abbreviation: BBAαNβNB-03), 4,4'-diphenyl-4"-(7-phenyl)naphthyl-2-yl)triphenylamine (abbreviation: BBAPβNB-03), 4,4'-diphenyl-4"-(6;2'-binaphthyl-2-yl)triphenylamine (abbreviation: BBA(βN2)B), 4,4'-diphenyl-4"-(7;2'-binaphthyl-2-yl)triphenylamine (abbreviation: BBA(βN2)B-03), 4,4'-diphenyl-4"-(4;2'-binaphthyl-1-yl)triphenylamine (abbreviation: BBAβNαNB), 4,4'-diphenyl-4"-(5;2'-binaphthyl-1-yl)triphenylamine (abbreviation: BBAβNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-phenyl-4'-(1-naphthyl)triphenylamine (abbreviation: αNBA1BP), 4,4'-bis(1-naphthyl)triphenylamine (abbreviation: αNBB1BP), 4,4'-diphenyl-4"44'-(carbazol-9-yl)biphenyl-4-yl)triphenylamine (abbreviation: YGTBi1BP), 4'-[4-(3-phenyl-9H-carbazol-9-yl)phenyl]tris(1,1'-biphenyl-4-yl)amine (abbreviation: YGTBi1BP-02), 4-[4'-(carbazol-9-yl)biphenyl-4-yl]-4'-(2-naphthyl)-4"-phenyltriphenylamine (abbreviation: YGTBiβNB), N-[4-(9-phenyl-9H-carbazol-3-yl)phenyl]-N-

[4-(1-naphthyl)phenyl]-9,9'-spirobi[9H-fluoren]-2-amine (abbreviation: PCBNBSF), N,N-bis([1,1 '-biphenyl]-4-yl)-9,9'-spirobi[9H-fluoren]-2-amine (abbreviation: BBASF), N,N-bis([1,1'-biphenyl]-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spirobi[9H-fluoren]-4-amine (abbreviation: oFBiSF), N-(4-biphenyl)-N-(9,9-dimethyl-9H-fluoren-2-yl)dibenzofuran-4-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl]triphenylamine (abbreviation: BPAFLBi), 4-phenyl-4'-(9-phenyl-9H-carbazol-3-yl)triphenylamine (abbreviation: PCBA1BP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), N-phenyl-N-[4-(9-phenyl-9H-carbazol-3-yl)phenyl]-9,9'-spirobi[9H-fluoren]-2-amine (abbreviation: PCBASF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), N,N-bis(9,9-dimethyl-9H-fluoren-2-yl)-9,9'-spirobi-9H-fluoren-4-amine, N,N-bis(9,9-dimethyl-9H-fluoren-2-yl)-9,9'-spirobi-9H-fluoren-3-amine, N,N-bis(9,9-dimethyl-9H-fluoren-2-yl)-9,9'-spirobi-9H-fluoren-2-amine, and N,N-bis(9,9-dimethyl-9H-fluoren-2-yl)-9,9'-spirobi-9H-fluoren-1-amine.

As the material having a hole-transport property, the following aromatic amine compounds can also be used, for example: N,N-di(p-tolyl)-N,N-diphenyl-p-phenylenediamine (abbreviation: DTDPPA), 4,4'-bis[N-(4-diphenylaminophenyl)-N-phenylamino]biphenyl (abbreviation: DPAB), 4,4'-bis(N-{4-[N'-(3-methylphenyl)-N-phenylamino]phenyl}-N-phenylamino)biphenyl (abbreviation: DNTPD), and 1,3,5-tris[N-(4-diphenylaminophenyl)-N-phenylamino]benzene (abbreviation: DPA3B).

As the material having a hole-transport property, any of the low refractive index materials having a hole-transport property described in Embodiment 1 can be used as well. In this case, the hole-injection layer can be a low refractive index layer, specifically the low refractive index layer 156 or a fourth low refractive index layer described later.

Note that it is further preferable that the hole-transport material used in the composite material have a relatively deep HOMO level higher than or equal to −5.7 eV and lower than or equal to −5.4 eV. Using the hole-transport material with a relatively deep HOMO level in the composite material makes it easy to inject holes into the hole-transport layer 112 and to obtain a light-emitting device having a long lifetime. In addition, when the hole-transport material used in the composite material has a relatively deep HOMO level, induction of holes can be inhibited properly so that the light-emitting device can have a longer lifetime.

Note that mixing the above composite material with a fluoride of an alkali metal or an alkaline earth metal (the proportion of fluorine atoms in a layer using the mixed material is preferably higher than or equal to 20%) can lower the refractive index of the layer. Also in this case, the hole-injection layer can be a low refractive index layer.

The formation of the hole-injection layer 111 can improve the hole-injection property, which allows the light-emitting device to be driven at a low voltage.

Among substances having an acceptor property, an organic compound having an acceptor property is easy to use because it is easily deposited by vapor deposition.

The hole-transport layer 112 is formed using a material having a hole-transport property. The material having a hole-transport property preferably has a hole mobility higher than or equal to $1\times10^{-6}$ $cm^2/Vs$. The hole-transport layer 112 can be formed of a single layer or a plurality of layers using any of the aforementioned hole-transport materials that can be used in the composite material of the hole-injection layer.

As the hole-transport material, any of the low refractive index materials having a hole-transport property described in Embodiment 1 can be used as well. In this case, a layer containing the low refractive index material can be a low refractive index layer (e.g., the low refractive index layer, the second low refractive index layer, or the third low refractive index layer).

As the hole-transport material, any of the high refractive index materials having a hole-transport property described in Embodiment 1 can be used as well. In this case, a layer containing the high refractive index material can be a high refractive index layer.

The hole-transport layer 112 preferably has a stacked-layer structure of a low refractive index layer and a high refractive index layer. When the hole-transport layer has a stacked-layer structure of a low refractive index layer and a high refractive index layer, the effect of amplifying light can be further improved.

When the hole-transport layer 112 includes three layers that are the first hole-transport layer 112-1, the second hole-transport layer 112-2, and the third hole-transport layer 112-3 as illustrated in FIG. 2 and are formed as the low refractive index layer, the high refractive index layer, and the second low refractive index layer, the light-emitting device can have extremely high emission efficiency. In this case, the hole-injection layer 111 is preferably the fourth low refractive index layer, in which case the effect of amplifying light is improved. By using a low refractive index material as the organic compound having a hole-transport property in the hole-injection layer 111, the hole-injection layer 111 can be the fourth low refractive index layer. Note that the low refractive index material used in the hole-injection layer 111 and the low refractive index material used in the hole-transport layer 112 (a layer in contact with the hole-injection layer 111 in the case where the hole-transport layer 112 includes a plurality of layers) are preferably the same; in this case, the hole-injection layer 111 and the hole-transport layer 112 (the layer in contact with the hole-injection layer 111 in the case where the hole-transport layer 112 includes a plurality of layers) can be collectively regarded as one low refractive index layer.

An electron-blocking layer may be provided between the hole-transport layer 112 and the light-emitting layer 113. For the electron-blocking layer, it is preferable to use a substance having a LUMO level higher than a host material of the light-emitting layer 113 by 0.25 eV or more among the above-described materials that can be used as the material having a hole-transport property in the hole-transport layer.

The light-emitting layer 113 preferably includes a light-emitting substance and a host material. The light-emitting layer 113 may additionally include another material. Alternatively, the light-emitting layer 113 may be a stack of two layers with different compositions.

As the light-emitting substance, fluorescent substances, phosphorescent substances, substances exhibiting thermally activated delayed fluorescence (TADF), or other light-emitting substances can be used. In one embodiment of the present invention, a light-emitting device with favorable external quantum efficiency is obtained by using a light-emitting substance with an emission spectrum having a small distance between two points at the intensity corresponding to 1/e times the maximum peak intensity (specifically a small difference between $\lambda_1$ and $\lambda_2$, where $\lambda_n$ (nm) represents a wavelength at the intensity corresponding to 1/e times the maximum peak intensity, $\lambda_1$ (nm) represents the shortest wavelength $\lambda$ in a range of wavelengths longer than the maximum peak wavelength $\lambda_{max}$ (nm) of the light-emitting substance, and $\lambda_2$ (nm) represents the longest wavelength $\lambda$ in a range of wavelengths shorter than $\lambda_{max}$).

Specifically, it is preferable to use a light-emitting substance with an emission spectrum where the distance ($\lambda_1$—$\lambda_2$) between the two points at the intensity corresponding to 1/e times the maximum peak intensity is greater than or equal to 5 nm and less than or equal to 45 nm, preferably greater than or equal to 5 nm and less than or equal to 35 nm. It is further preferable to use a light-emitting substance with an emission spectrum where the distance between the two points at the intensity corresponding to 1/e times the maximum peak intensity is greater than or equal to 5 nm and less than or equal to 45 nm, preferably greater than or equal to 5 nm and less than or equal to 35 nm and the half width is greater than or equal to 5 nm and less than or equal to 25 nm.

Note that the width of the emission spectrum can also be represented by being converted into energy. That is, in a light-emitting substance that can be favorably used in one embodiment of the present invention, a value obtained by converting the distance ($\lambda_1$—$\lambda_2$) between the two points at the intensity corresponding to 1/e times the maximum peak intensity of the emission spectrum into energy is preferably greater than or equal to 0.03 eV and less than or equal to 0.27 eV. It is further preferable to use a light-emitting substance in which a value obtained by converting the distance between the two points at the intensity corresponding to 1/e times the maximum peak intensity into energy is greater than or equal to 0.03 eV and less than or equal to 0.27 eV and a value obtained by converting the half width into energy is greater than or equal to 0.03 eV and less than or equal to 0.15 eV.

As such a light-emitting substance with a narrow emission spectrum, an organic compound containing a condensed heteroaromatic ring including nitrogen in its molecular structure is preferred. In particular, in the organic compound, the condensed heteroaromatic ring including nitrogen is preferably a condensed ring with four or more rings, in which case the emission spectrum is narrow.

The skeleton of the condensed heteroaromatic ring including nitrogen is preferably an indolocarbazole skeleton because coupling between a stretching vibration and the S1-S0 transition, which is involved in light emission, is suppressed. In particular, the condensed heteroaromatic ring including nitrogen is preferably a condensed heteroaromatic ring including nitrogen and boron because coupling between a stretching vibration and the S1-S0 transition, which is involved in light emission, is suppressed and thus the width of the emission spectrum is narrowed, and is further preferably a diaza-boranaphtho-anthracene skeleton.

Specifically, as the organic compound containing the condensed heteroaromatic ring including nitrogen, any of the following can be favorably used, for example: 5,9-diphenyl-5,9-diaza-13b-boranaphtho[3,2,1-de]anthracene (abbreviation: DABNA1), 9-([1,1'-diphenyl]-3-yl)-N,N,5,11-tetraphenyl-5,9-dihydro-5,9-diaza-13b-boranaphtho[3,2,1-de]anthracene-3-amine (abbreviation: DABNA2), 2,12-di(tert-butyl)-5,9-di(4-tert-butylphenyl)-N,N-diphenyl-5H,9H-[1,4]benzazaborino[2,3,4-kl]phenazaborin-7-amine (abbreviation: DPhA-tBu4DABNA), 2,12-di(tert-butyl)-N,N,5,9-tetra(4-tert-butylphenyl)-5H,9H-[1, 4]benzazaborino[2,3,4-k/]phenazaborin-7-amine (abbreviation: tBuDPhA-tBu4DABNA), 2,12-di(tert-butyl)-5,9-di(4-tert-butylphenyl)-7-methyl-5H,9H-[1,4]benzazaborino[2,3,4-k/]phenazaborine (abbreviation: Me-tBu4DABNA), $N^7$,$N^7$,$N^{13}$,$N^{13}$,5,9, 11,15-octaphenyl-5H,9H, 11H,1 5H-[1,4]benzazaborino[2,3,4-kl][1,4]benzazaborino[4',3',2':4,5][1,4]benzazaborino[3,2-b]phenazaborin-7,13-diamine (abbreviation: v-DABNA), and 2-(4-tert-butylphenyl)benz[5,6]indolo[3,2,1-jk]benzo[b]carbazole (abbreviation: tBuPBibc).

Alternatively, it is preferable to use, for example, 9,10,11-tris[3,6-bis(1,1-dimethylethyl)-9H-carbazole-9-yl]-2,5,15,18-tetrakis (1,1-dimethylethyl)-indolo[3,2,1-de]indolo[3',2',1': 8,1][1,4]benzazaborino[2,3,4-kl]phenazaborine (abbreviation: BBCz-G), 9,11-bis[3,6-bis(1,1-dimethylethyl)-9H-carbazole-9-yl]-2,5,15,18-tetrakis(1,1-dimethylethyl)-indolo[3,2,1-de]indolo[3',2',1':8,1][1,4]benzazaborino[2,3,4-kl]phenazaborine (abbreviation: BBCz-Y), [2-[3-(2,3-dihydro-3-phenyl-1H-imidazol-1-yl-κ$C^2$)phenoxy-κ$C^2$]-9-(2-pyridinyl-1(N)-9H-carbazolato(4-)-κ$C^1$]platinum (II) (abbreviation: Pt(dpimOczpy)), [2'-(1H-pyrazole-1-yl)-9-(pyridine-2-yl)-9H-2,9'-dicarbazole]platinum(II) (abbreviation: PtN1N), or (3,7-diethyl-4,6-nonanedionato-κ$O^4$,κ$O^6$)bis[2,4-dimethyl-6-[5-(1-methylethyl)-2-quinolinyl-0/]phenyl-κC]-iridium.

One embodiment of the present invention, which has an effect of improving the blue chromaticity and thus results in a significant improvement in the blue index, can be favorably employed particularly when the light-emitting layer 113 exhibits blue fluorescent light emission. Note that the blue index (BI) is a value obtained by dividing current efficiency (cd/A) by chromaticity y, and is one of the indicators of characteristics of blue light emission. As the chromaticity y is smaller, the color purity of blue light emission tends to be higher. With high color purity, a wide range of blue can be expressed even with a small number of luminance components; hence, using blue light emission with high color purity reduces the luminance needed for expressing blue, leading to lower power consumption. Thus, BI that is based on chromaticity y, which is one of the indicators of color purity of blue, is suitably used as a means for showing efficiency of blue light emission. The light-emitting device with higher BI can be regarded as a blue light-emitting device having higher efficiency for a display.

When the above-described light-emitting substance with a narrow emission spectrum is not used as the light-emitting substance, any of the following light-emitting substances can be used.

Examples of the material that can be used as a fluorescent substance in the light-emitting layer 113 are as follows. Other fluorescent substances can also be used.

The examples include 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N-diphenyl-N,N-bis[4-(9-phenyl-9H-fluoren-9-yl)phenyl]pyrene-1,6-diamine (abbreviation: 1,6FLPAPm), N,N-bis(3-methylphenyl)-N,N-bis[3-(9-phenyl-9H-fluoren-9-yl)phenyl]pyrene-1,6-di amine (abbreviation: 1, 6mMemFLPAPrn), N,N-bis[4-(9H-carbazol-9-yl)phenyl]-N,N-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl) perylene (abbreviation: TBP), 4-(10-phenyl-9-anthryl)-4'-(9-phenyl-9H-carbazol-3-yl)triphenylamine (abbreviation: PCBAPA), N,N'-(2-tert-butylanthracene-9,10-diyldi-4,1-phenylene)bis[N,N',N"-triphenyl-1,4-phenylene di amine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N"-triphenyl-1,4-phenylenediamine (abbreviation: 2DPAPPA), N,N,N',N',N",N",N"',N"'-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N"-triphenyl-1,4-phenylenediamine (abbreviation: 2DPAPA), N-[9,10-bis(1,1'-biphenyl-2-yl)-2-anthryl]-N,N',N"-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N',N",N-tetrakis(4-methylphenyl)tetracene-5,11-diamine (abbreviation: p-mPhTD), 7,14-diphenyl-N,N',N",N-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo quinolizin-9-yl)ethenyl]-4H-pyran-4-ylidene}propanedinitrile (abbreviation: BisDCJTM), N,N-diphenyl-N,N'-(1,6-pyrene-diyl)bis[(6-phenylbenzo[b]naphtho[1,2-d]furan)-8-amine](abbreviation: 1,6BnfAPrn-03), 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02), and 3,10-bis[N-(dibenzofuran-3-yl)-N-phenylamino]naphtho[2,3-b;6,7-H]bisbenzofuran (abbreviation: 3,10FrA2Nbf(IV)-02). Condensed aromatic diamine compounds typified by pyrenediamine compounds such as 1,6FLPAPrn, 1,6mMemFLPAPm, and 1,6BnfAPrn-03 are particularly preferable because of their high hole-trapping properties, high emission efficiency, and high reliability.

Examples of the material that can be used when a phosphorescent substance is used as the light-emitting substance in the light-emitting layer 113 are as follows.

The examples include organometallic iridium complexes having a 4H-triazole skeleton, such as tris {2-[5-(2-methylphenyl)-4-(2,6-dimethylphenyl)-4H-1,2,4-triazol-3-yl-κ$N^2$]phenyl-κC}iridium(III) (abbreviation: [Ir(mpptz-dmp)$_3$]) and tris(5-methyl-3,4-diphenyl-4H-1,2,4-triazolato) iridium(III) (abbreviation: [Ir(Mptz)$_3$]); organometallic iridium complexes having a 1H-triazole skeleton, such as tris[3-methyl-1-(2-methylphenyl)-5-phenyl-1H-1,2,4-triazolato]iridium(III) (abbreviation: [Ir(Mptzl-mP)$_3$]) and tris(1-methyl-5-phenyl-3-propyl-1H-1,2,4-triazolato)iridium (III) (abbreviation: [Ir(Prptzl-Me)$_3$]); organometallic iridium complexes having an imidazole skeleton, such as fac-tris[1-(2,6-diisopropylphenyl)-2-phenyl-1H-imidazole] iridium(III) (abbreviation: [Ir(iPrpmi)$_3$]), tris[3-(2,6-dimethylphenyl)-7-methylimidazo[1,2-f]phenanthridinato]iridium (III) (abbreviation: [Ir(dmpimpt-Me)$_3$]), and tris(2-[1-{2,6-bis(1-methylethyl)phenyl}-1H-imidazol-2-yl-κ$N^3$]-4-cyanophenyl-κC) (abbreviation: CNImIr); organometallic complexes having a benzimidazolidine skeleton, such as tris[6-tert-butyl-3-phenyl-2H-imidazo[4,5-b]pyrazin-1-yl-κ$C^2$)phenyl-κC]iridium(III) (abbreviation: [Ir(cb)$_3$]); and organometallic iridium complexes in which a phenylpyridine derivative having an electron-withdrawing group is a ligand, such as bis[2-(4',6'-difluorophenyl)pyridinato-N,$C^2$]iridium(III) tetrakis(1-pyrazolyl)borate (abbreviation: FIr6), bis[2-(4',6'-difluorophenyl)pyridinato-N,$C^2$]iridium (III) picolinate (abbreviation: FIrpic), bis{2-[3',5'-bis(trifluoromethyl)phenyl]pyridinato-N,$C^{2'}$}iridium(III) picolinate (abbreviation: [Ir($CF_3$ppy)$_2$(pic)]), and bis[2-(4',6'-difluorophenyl)pyridinato-N,$C^2$]iridium(III) acetylacetonate (abbreviation: FIr(acac)). These compounds exhibit blue phosphorescence and have an emission peak in the wavelength range from 440 nm to 520 nm.

Other examples include organometallic iridium complexes having a pyrimidine skeleton, such as tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir(mppm)$_2$(acac)]), (acetylacetonato)bis(6-tert-butyl-4-phenylpyrimidinato)iridium(III) (abbreviation: [Ir(tBuppm)$_2$(acac)]), (acetylacetonato)bis[6-(2-norbornyl)-4-phenylpyrimidinato]iridium(III) (abbreviation: [Ir(nbppm)$_2$(acac)]), (acetylacetonato)bis[5-methyl-6-(2-methylphenyl)-4-phenylpyrimidinato]iridium(III) (abbreviation: [Ir(mpmppm)$_2$(acac)]), and (acetylacetonato) bis(4,6-diphenylpyrimidinato)iridium(III) (abbreviation: [Ir(dppm)$_2$(acac)]); organometallic iridium complexes having a pyrazine skeleton, such as (acetylacetonato)bis(3,5-dimethyl-2-phenylpyrazinato)iridium(III) (abbreviation: [Ir(mppr-Me)$_2$(acac)]) and (acetylacetonato)bis(5-isopropyl-3-methyl-2-phenylpyrazinato)iridium(III) (abbreviation: [Ir(mppr-iPr)$_2$(acac)]); organometallic iridium complexes having a pyridine skeleton, such as tris(2-phenylpyridinato-N,$C^{2'}$)iridium(III) (abbreviation: [Ir(ppy)$_3$]), bis(2-phenylpyridinato-N,$C^{2'}$)iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), tris(benzo[h]quinolinato)iridium(III) (abbreviation: [Ir(bzq)$_3$]), tris(2-phenyl quinolinato-N, $C^{2'}$)iridium(III) (abbreviation: [Ir(pq)$_3$]), bis(2-phenylquinolinato-N,$C^{2'}$)iridium(III) acetylacetonate (abbreviation: [Ir(pq)$_2$(acac)]), [2-d3-methyl-8-(2-pyridinyl-κN)benzofuro[2,3-b]pyridine-κC]bis[2-(5-d3-methyl-2-pyridinyl-κ$N^2$)phenyl-κC]iridium(III) (abbreviation: [Ir(5mppy-d3)$_2$(mbfpypy-d3)]), [2-(methyl-d3)-8-[4-(1-methylethyl-1-d)-2-pyridinyl-κN]benzofuro[2,3-b]pyridin-7-yl-κC]bis[5-(methyl-d3)-2-[5-(methyl-d3)-2-pyridinyl-κN]phenyl-κC]iridium(III) (abbreviation: Ir(5mtpy-d6)$_2$(mbfpypy-iPr-d4)), [2-d3-methyl-(2-pyridinyl-κN)benzofuro[2,3-b]pyridine-κC]bis[2-(2-pyridinyl-κN)phenyl-κC]iridium(III) (abbreviation: [Ir(ppy)$_2$(mbfpypy-d3)]), [2-(4-methyl-5-phenyl-2-pyridinyl-κN) phenyl-κC]bis[2-(2-pyridinyl-κN)phenyl-κC]iridium(III) (abbreviation: [Ir(ppy)$_2$(mdppy)]), [2-(4-d3-methyl-5-phenyl-2-pyridinyl-κ$N^2$)phenyl-κC]bis[2-(5-d3-methyl-2- pyridinyl-κ$N^2$)phenyl-κC]iridium(III) (abbreviation: [Ir(5mppy-d3)$_2$(mdppy-d3)]), [2-d3-methyl-(2-pyridinyl-κN)benzofuro[2,3-b]pyridine-κC]bis[2-(2-pyridinyl-κN)phenyl-κC]iridium(III) (abbreviation: [Ir(ppy)$_2$(mbfpypy)]), and [2-(4-methyl-5-phenyl-2-pyridinyl-1N)phenyl-κC]bis[2-(2-pyridinyl-κN)phenyl-κC]iridium (abbreviation: [Ir(ppy)$_2$(mdppy)]); and rare earth metal complexes such as tris(acetylacetonato)(monophenanthroline)terbium(III) (abbreviation: [Tb(acac)$_3$(Phen)]). These are mainly compounds that exhibit green phosphorescence and have an emission peak in the wavelength range from 500 nm to 600 nm. Note that organometallic iridium complexes having a pyrimidine skeleton have distinctively high reliability and emission efficiency and thus are particularly preferable.

Other examples include organometallic iridium complexes having a pyrimidine skeleton, such as (diisobutyrylmethanato)bis[4,6-bis(3-methylphenyl)pyrimidinato]iridium(III) (abbreviation: [Ir(5mdppm)$_2$(dibm)]), bis[4,6-bis(3-methylphenyl)pyrimidinato](dipivaloylmethanato)iridium(III) (abbreviation: [Ir(5mdppm)$_2$(dpm)]), and bis[4,6-di(naphthalen-1-yl)pyrimidinato](dipivaloylmethanato)iridium(III) (abbreviation: [Ir(dlnpm)$_2$(dpm)]); organometallic iridium complexes having a pyrazine skeleton, such as (acetylacetonato)bis(2,3,5-triphenylpyrazinato)iridium(III) (abbreviation: [Ir(tppr)$_2$(acac)]), bis(2,3,5-triphenylpyrazinato)(dipivaloylmethanato)iridium(III) (abbreviation: [Ir(tppr)$_2$(dpm)]), and (acetylacetonato)bis[2,3-bis(4-fluorophenyl)quinoxalinato]iridium(III) (abbreviation: [Ir(Fdpq)$_2$(acac)]); organometallic iridium complexes having a pyridine skeleton, such as tris(1-phenylisoquinolinato-N,$C^{2'}$)iridium(III) (abbreviation: [Ir(piq)$_3$]), bis(1-phenylisoquinolinato-N, $C^{2'}$)iridium(III) acetylacetonate (abbreviation: [Ir(pi q)$_2$(acac)]), (3,7-diethyl-4,6-nonanedionato-κ$O^4$,κ$O^6$)bis[2,4-dimethyl-6-[7-(1-methylethyl)-1-isoquinolinyl-κN]phenyl-κC]iridium(III), and (3,7-diethyl-4,6-nonanedionato-κ$O^4$,κ$O^6$)bis[2,4-dimethyl-6-[5-(1-methylethyl)-2-quinolinyl-κN]phenyl-κC]iridium(III); platinum complexes such as 2,3,7,8,12,13,17,18-octaethyl-21H,23H-porphyrinplatinum(II) (abbreviation: PtOEP); and rare earth metal complexes such as tris(1,3-diphenyl-1,3-propanedionato)(monophenanthroline)europium(III) (abbreviation: [Eu(DBM)$_3$(Phen)]) and tris[1-(2-thenoyl)-3,3,3-trifluoroacetonato](monophenanthroline)europium(III) (abbreviation: [Eu(TTA)$_3$(Phen)]). These compounds exhibit red phosphorescence and have an emission peak in the wavelength range from 600 nm to 700 nm. Furthermore, the organometallic iridium complexes having a pyrazine skeleton can provide red light emission with favorable chromaticity.

Besides the above phosphorescent compounds, known phosphorescent compounds may be selected and used.

Examples of the TADF material include a fullerene, a derivative thereof, an acridine, a derivative thereof, and an eosin derivative. Furthermore, a metal-containing porphyrin, such as a porphyrin containing magnesium (Mg), zinc (Zn), cadmium (Cd), tin (Sn), platinum (Pt), indium (In), or palladium (Pd), can be given. Examples of the metal-containing porphyrin include a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), and an octaethylporphyrin-platinum chloride complex ($PtCl_2OEP$), which are represented by the following structural formulae.

[Chemical Formula 1]

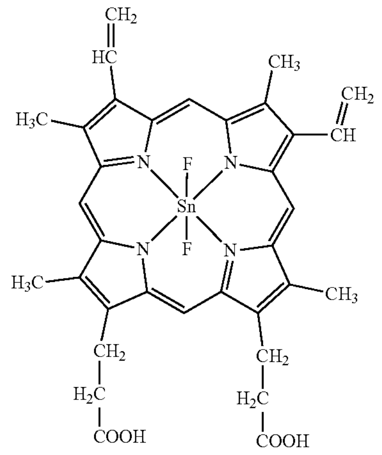

$SnF_2$(Proto IX)

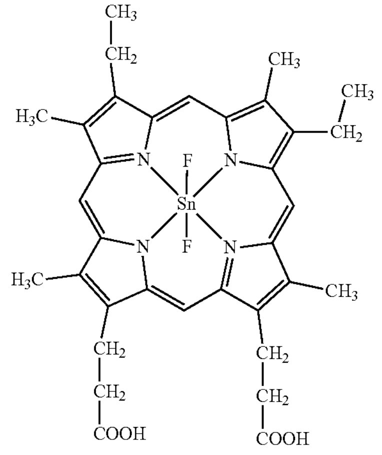

$SnF_2$(Meso IX)

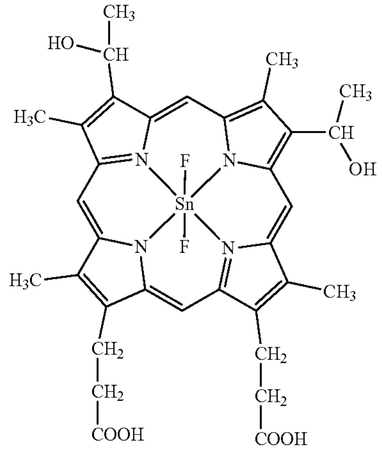

$SnF_2$(Hemato IX)

-continued

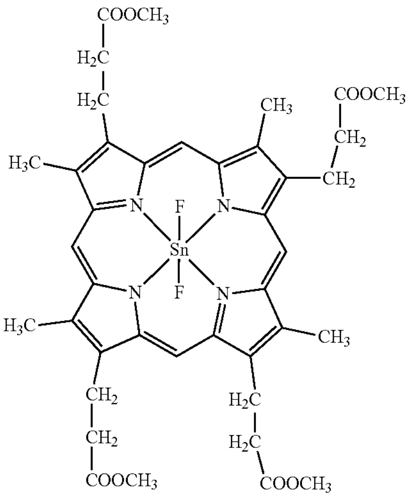

SnF$_2$(Copro III-4Me)

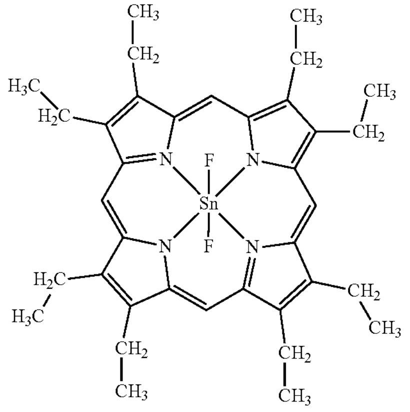

SnF$_2$(OEP)

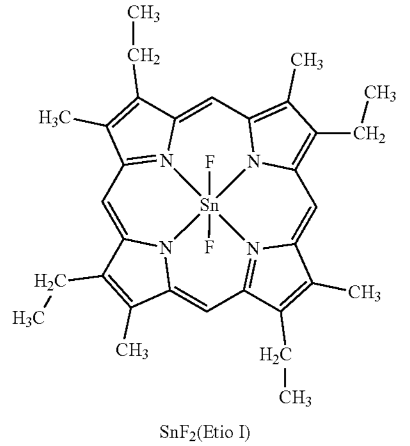

SnF$_2$(Etio I)

-continued

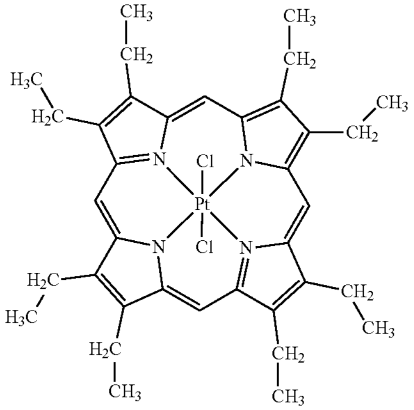

PtCl$_2$OEP

Alternatively, it is possible to use a heterocyclic compound having one or both of a π-electron rich heteroaromatic ring and a π-electron deficient heteroaromatic ring that is represented by the following structural formulae, such as 2-(biphenyl-4-yl)-4,6-bis(12-phenylindolo[2,3-a]carbazol-11-yl)-1,3,5-triazine (abbreviation: PIC-TRZ), 9-(4,6-diphenyl-1,3,5-triazin-2-yl)-9'-phenyl-9H,9'H-3,3'-bicarbazole (abbreviation: PCCzTzn), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA). Such a heterocyclic compound is preferable because of having excellent electron-transport and hole-transport properties owing to a π-electron rich heteroaromatic ring and a π-electron deficient heteroaromatic ring. Among skeletons having the π-electron deficient heteroaromatic ring, a pyridine skeleton, a diazine skeleton (a pyrimidine skeleton, a pyrazine skeleton, and a pyridazine skeleton), and a triazine skeleton are preferred because of their high stability and reliability. In particular, a benzofuropyrimidine skeleton, a benzothienopyrimidine skeleton, a benzofuropyrazine skeleton, and a benzothienopyrazine skeleton are preferred because of their high acceptor properties and high reliability. Among skeletons having the π-electron rich heteroaromatic ring, an acridine skeleton, a phenoxazine skeleton, a phenothiazine skeleton, a furan skeleton, a thiophene skeleton, and a pyrrole skeleton have high stability and reliability; thus, at least one of these skeletons is preferably included. A dibenzofuran skeleton is preferable as a furan skeleton, and a dibenzothiophene skeleton is preferable as a thiophene skeleton. As a pyrrole skeleton, an indole skeleton, a carbazole skeleton, an indolocarbazole skeleton, a bicarbazole skeleton, and a 3-(9-phenyl-9H-carbazol-3-yl)-9H-carbazole skeleton are particularly preferable. Note that a substance in which the π-electron rich heteroaromatic ring is directly bonded to the π-electron deficient heteroaromatic ring is particularly preferred because the electron-donating property of the π-electron rich heteroaromatic ring and the electron-accepting property of the π-electron deficient heteroaromatic ring are both improved, the energy difference between the S1 level and the T1 level becomes small, and thus thermally activated delayed fluorescence can be obtained with high efficiency. Note that an aromatic ring to which an electron-withdrawing group such as a cyano group is bonded may be used instead of the π-electron deficient heteroaromatic ring. As a π-electron rich skeleton, it is possible to use an aromatic amine skeleton, a phenazine skeleton, or the like. As a π-electron deficient skeleton, it is possible to use a xanthene skeleton, a thioxanthene dioxide skeleton, an oxadiazole skeleton, a triazole skeleton, an imidazole skeleton, an anthraquinone skeleton, a skeleton containing boron such as phenylborane or boranthrene, an aromatic ring or a heteroaromatic ring having a cyano group or a nitrile group such as benzonitrile or cyanobenzene, a carbonyl skeleton such as benzophenone, a phosphine oxide skeleton, a sulfone skeleton, or the like. As described above, a π-electron deficient skeleton and a π-electron rich skeleton can be used instead of at least one of the π-electron deficient heteroaromatic ring and the π-electron rich heteroaromatic ring.

[Chemical Formula 2]

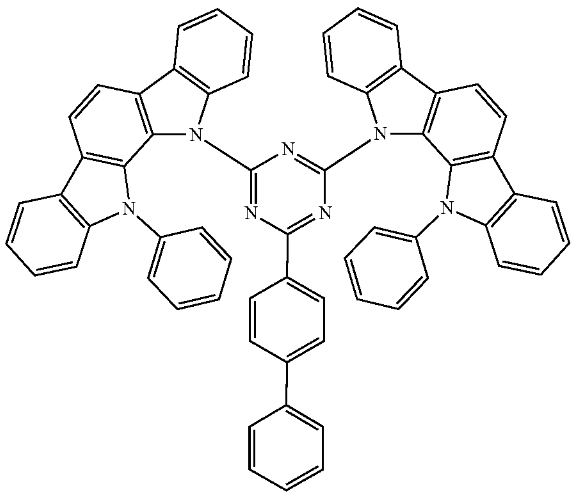

PIC-TRZ

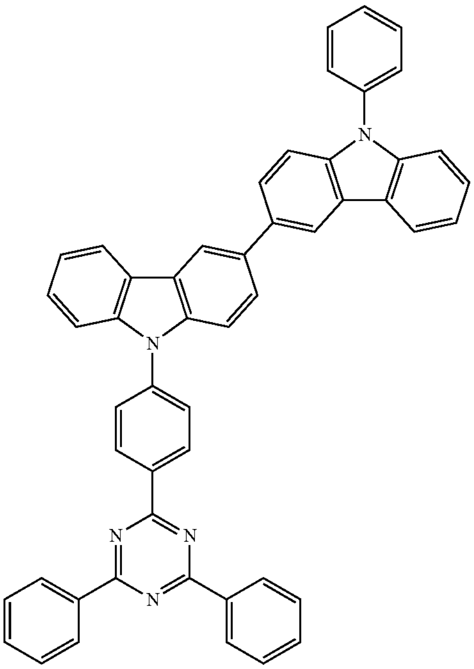

PCCzPTzn

-continued

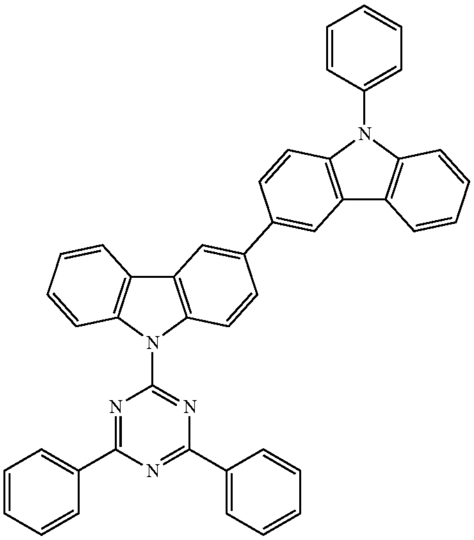

PCCzTzn

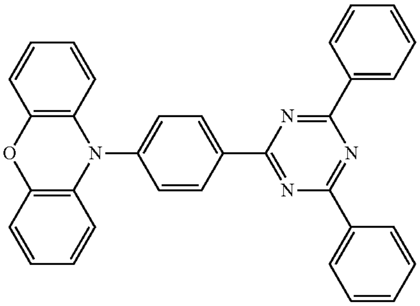

PXZ-TRZ

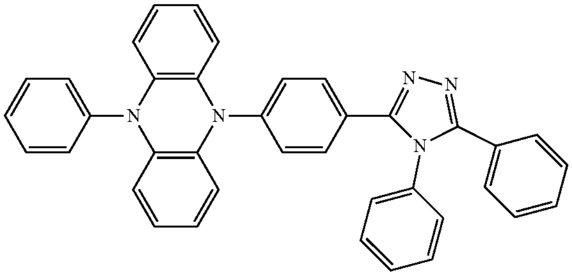

PPZ-3TPT

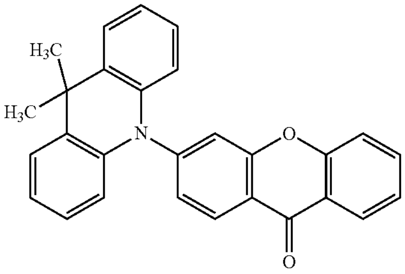

ACRXTN

-continued

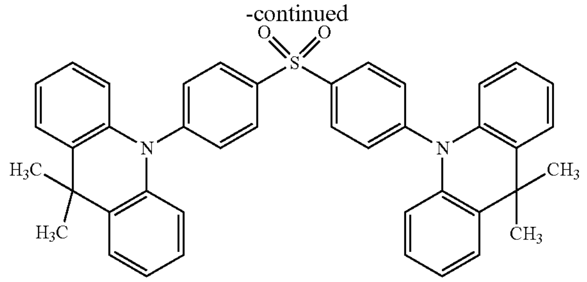

DMAC-DPS

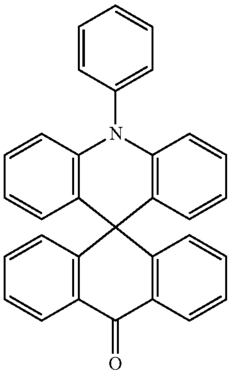

ACRSA

Alternatively, a TADF material whose singlet excited state and triplet excited state are in a thermal equilibrium state may be used. Since such a TADF material has a short emission lifetime (excitation lifetime), it inhibits a reduction in the efficiency of a light-emitting device in a high-luminance region. Specifically, a material having the following molecular structure can be used.

[Chemical Formula 3]

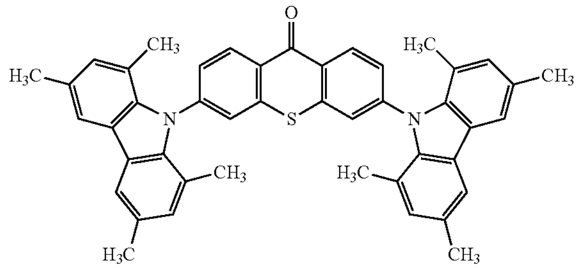

Note that a TADF material is a material having a small difference between the S1 level and the T1 level and a function of converting triplet excitation energy into singlet excitation energy by reverse intersystem crossing. Thus, a TADF material can upconvert triplet excitation energy into singlet excitation energy (i.e., reverse intersystem crossing) using a small amount of thermal energy and efficiently generate a singlet excited state. In addition, the triplet excitation energy can be converted into luminescence.

An exciplex whose excited state is formed of two kinds of substances has an extremely small difference between the S1 level and the T1 level and functions as a TADF material capable of converting triplet excitation energy into singlet excitation energy.

A phosphorescent spectrum observed at a low temperature (e.g., 77 K to 10 K) is used for an index of the T1 level. When the level of energy with a wavelength of the line obtained by extrapolating a tangent to the fluorescent spectrum at a tail on the short wavelength side is the S1 level and the level of energy with a wavelength of the line obtained by extrapolating a tangent to the phosphorescent spectrum at a tail on the short wavelength side is the T1 level, the difference between the S1 level and the T1 level of the TADF material is preferably smaller than or equal to 0.3 eV, further preferably smaller than or equal to 0.2 eV.

When a TADF material is used as the light-emitting substance, the S1 level of the host material is preferably higher than that of the TADF material. In addition, the T1 level of the host material is preferably higher than that of the TADF material.

As the host material in the light-emitting layer, various carrier-transport materials such as materials having an electron-transport property, materials having a hole-transport property, and the TADF materials can be used.

The material having a hole-transport property is preferably an organic compound having an amine skeleton or a π-electron rich heteroaromatic ring skeleton, for example. Examples of the material include compounds having an aromatic amine skeleton, such as 4,4'-bis[N-(1-naphthyl)-N-phenylamino]biphenyl (abbreviation: NPB), N,N-bis(3-methylphenyl)-N,N-diphenyl-[1,1'-biphenyl]-4,4'-di amine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBilBP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), and N-phenyl-N-[4-(9-phenyl-9H-carbazol-3-yl)phenyl]-9,9'-spirobi[9H-fluoren]-2-amine (abbreviation: PCBASF); compounds having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), and 3,3'-bis(9-phenyl-9H-carbazole) (abbreviation: PCCP); compounds having a thiophene skeleton, such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having a furan skeleton, such as 4,4',4"-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II). Among the above materials, the compound having an aromatic amine skeleton and the compound having a carbazole skeleton are preferable because these compounds are highly reliable and have high hole-transport properties to contribute to a reduction in driving voltage. It is also possible to use the organic compounds given as examples of the material having a hole-transport property for the hole-transport layer 112 (except the low refractory index materials).

As the material having an electron-transport property, it is preferable to use, for example, a metal complex such as bis(10-hydroxybenzo[h]quinolinato)beryllium(II) (abbreviation: $BeBq_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ); or an organic compound having a π-electron deficient heteroaromatic ring. Examples of the organic compound having a π-electron deficient heteroaromatic ring include organic compounds having an azole skeleton, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2''-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), and 4,4'-bis(5-methylbenzoxazol-2-yl)stilbene (abbreviation: BzOs); organic compounds having a heteroaromatic ring having a pyridine skeleton, such as 3,5-bis[3-(9H-carbazol-9-yl)phenyl]pyridine (abbreviation: 35DCzPPy), 1,3,5-tri[3-(3-pyridyl)phenyl]benzene (abbreviation: TmPyPB), bathophenanthroline (abbreviation: BPhen), bathocuproine (abbreviation: BCP), and 2,9-di(naphthalen-2-yl)-4,7-diphenyl-1,10-phenanthroline (abbreviation: NBPhen); organic compounds having a diazine skeleton, such as 2-[3-(dibenzothiophen-4-yl)phenyl]di benzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4'-(9-phenyl-9H-carbazol-3-yl)-3,1'-biphenyl-1-yl]dibenzo[f,h]quinoxaline (abbreviation: 2mpPCBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), 9-[(3'-dibenzothiophen-4-yl)biphenyl-3-yl]naphtho[1',2': 4,5]furo[2,3-b]pyrazine (abbreviation: 9mDBtBPNfpr), 9-[3'-dibenzothiophen-4-yl)bipheny-4-yl]naphtho[1',2': 4,5]furo[2,3-b]pyrazine (abbreviation: 9pmDBtBPNfpr), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 4,6-bis[3-(9H-carbazol-9-yl)phenyl]pyrimidine (abbreviation: 4,6mCzP2Pm), 9,9'-[pyrimidine-4,6-diylbis(biphenyl-3,3 '-diyl)]bis(9H-carbazole) (abbreviation: 4,6mCzBP2Pm), 8-(1,1'-biphenyl-4-yl)-4-[3-(dibenzothiophen-4-yl)phenyl]-[1]benzofuro[3,2-d]pyrimidine (abbreviation: 8BP-4mDBtPBfpm), 3,8-bis[3-(dibenzothiophen-4-yl)phenyl]benzofuro[2,3-b]pyrazine (abbreviation: 3,8mDBtP2Bfpr), 4,8-bis[3-(dibenzothiophen-4-yl)phenyl]-[1] benzofuro[3,2-d] pyrimidine (abbreviation: 4,8mDBtP2Bfpm), 8-[3 '-(dibenzothiophen-4-yl)(1,1'-biphenyl-3-yl)]naphtho[1',2':4,5]furo[3,2-d]pyrimidine (abbreviation: 8mDBtBPNfpm), 8-[(2,2'-binaphthalen)-6-yl)]-4-[3-(dibenzothiophen-4-yl)phenyl]-[1]benzofuro[3,2-d]pyrimidine (abbreviation: 8(βN2)-4mDBtPBfpm), 2,2'-(pyridine-2,6-diyl)bis(4-phenylbenzo[h]quinazoline) (abbreviation: 2,6(P-Bqn)2Py), 2,2'-(pyridine-2,6-diyl)bis 4-[4-(2-naphthyl)phenyl]-6-phenylpyrimidine (abbreviation: 2,6(NP-PPm)2Py), 6-(1,1'-biphenyl-3-yl)-4-[3,5-bis(9H-carbazol-9-yl)phenyl]-2-phenylpyrimidine (abbreviation: 6mBP-4Cz2PPm), 2,6-bis(4-naphthalen-1-ylphenyl)-4-[4-(3-pyridyl)phenyl]pyrimidine (abbreviation: 2,4NP-6PyPPm), 4-[3,5-bis(9H-carbazol-9-yl)phenyl]-2-phenyl-6-(1,1'-biphenyl-4-yl)pyrimidine (abbreviation: 6BP-4Cz2PPm), and 7-[4-(9-phenyl-9H-carbazol-2-yl)quinazolin-2-yl]-7H-dibenzo[c,g]carbazol (abbreviation: PC-cgDBCzQz); and organic compounds having a heteroaromatic ring having a triazine skeleton, such as 2-[(1,1'-biphenyl)-4-yl]-4-phenyl-6-[9,9'-spirobi (9H-fluoren)-2-yl]-1,3,5-triazine (abbreviation: BP-SFTzn), 2-{3-[3-(benzo[b]naphtho[1,2-d]furan-8-yl)phenyl]phenyl}-4,6-diphenyl-1,3,5-triazine (abbreviation: mBnfBPTzn), 2-{3-[3-(benzo[b]naphtho[1,2-d]furan-6-yl)phenyl]phenyl}-4,6-diphenyl-1,3,5-triazine (abbreviation: mBnfBPTzn-02), 2-{4-[3-(N-phenyl-9H-carbazol-3-yl)-9H-carbazol-9-yl]phenyl}-4,6-diphenyl-1,3,5-triazine (abbreviation: PCCzPTzn), 9-[3-(4,6-diphenyl-1,3,5-triazin-2-yl)phenyl]-9'-phenyl-2,3'-bi-9H-carbazole (abbreviation: mPCCzPTzn-02), 2-[3'-(9,9-dimethyl-9H-fluoren-2-yl)-1,1'-biphenyl-3-yl]-4,6-diphenyl-1,3,5-triazine (abbreviation: mFBPTzn), 5-[3-(4,6-diphenyl-1,3,5-triazin-2-yl)phenyl]-7,7-dimethyl-5H,7H-indeno[2,1-b]carbazole (abbreviation: mINcOOPTzn), 2-{3 [3-(dibenzothiophen-4-yl)phenyl]phenyl}-4,6-diphenyl-1,3,5-triazine (abbreviation: mDBtBPTzn), 2,4,6-tris[3'-(pyridin-3-yl)biphenyl-3-yl]-1,3,5-triazine (abbreviation: TmPPPyTz), 2-[3-(2,6-dimethyl-3-pyridinyl)-5-(9-phenanthrenyl)phenyl]-4,6-diphenyl-1,3,5-triazine (abbreviation: mPn-mDMePyPTzn), 11-(4-[1,1'-biphenyl]-4-yl)-6-phenyl-1,3,5-triazin-2-yl)-11,12-dihydro-12-phenyl-indolo[2,3-*a*]carbazole (abbreviation: BP-Icz(II)Tzn), 2-[3'-(triphenylen-2-yl)-1,1'-biphenyl-3-yl]-4,6-diphenyl-1,3,5-triazine (abbreviation: mTpBPTzn), 9-[4-(4,6-diphenyl-1,3,5-triazin-2-yl)-2-dibenzothiophenyl]-2-phenyl-9H-carbazole (abbreviation: PCDBfTzn), and 2-[1,1'-biphenyl]-3-yl-4-phenyl-6(8-[1,1': 4',1''-terphenyl]-4-yl-1-dibenzofuranyl)-1,3,5-triazine (abbreviation: mBP-TPDBfTzn). Among the above materials, the organic compound having a heteroaromatic ring having a diazine skeleton, the organic compound having a heteroaromatic ring having a pyridine skeleton, and the organic compound having a heteroaromatic ring having a triazine skeleton have high reliability and thus are preferable. In particular, the organic compound having a heteroaromatic ring having a diazine (pyrimidine or pyrazine) skeleton and the organic compound having a heteroaromatic ring having a triazine skeleton have a high electron-transport property to contribute to a reduction in driving voltage.

As the TADF material that can be used as the host material, the above materials mentioned as the TADF material can also be used. When the TADF material is used as the host material, triplet excitation energy generated in the TADF material is converted into singlet excitation energy by reverse intersystem crossing and transferred to the light-emitting substance, whereby the emission efficiency of the light-emitting device can be increased. Here, the TADF material functions as an energy donor, and the light-emitting substance functions as an energy acceptor.

This is very effective in the case where the light-emitting substance is a fluorescent substance. In that case, in order to achieve high emission efficiency, the S1 level of the TADF material is preferably higher than that of the fluorescent substance. Furthermore, the T1 level of the TADF material is preferably higher than the S1 level of the fluorescent substance. Therefore, the T1 level of the TADF material is preferably higher than that of the fluorescent substance.

It is also preferable to use a TADF material that emits light whose wavelength overlaps the wavelength on a lowest-energy-side absorption band of the fluorescent substance. This enables smooth transfer of excitation energy from the TADF material to the fluorescent substance and accordingly enables efficient light emission, which is preferable.

In addition, in order to efficiently generate singlet excitation energy from the triplet excitation energy by reverse intersystem crossing, carrier recombination preferably occurs in the TADF material. It is also preferable that the triplet excitation energy generated in the TADF material not be transferred to the triplet excitation energy of the fluorescent substance. For that reason, the fluorescent substance preferably has a protective group around a luminophore (a skeleton that causes light emission) of the fluorescent substance. As the protective group, a substituent having no π bond and a saturated hydrocarbon are preferably used. Specific examples include an alkyl group having 3 to 10 carbon atoms, a substituted or unsubstituted cycloalkyl group having 3 to 10 carbon atoms, and a trialkylsilyl group having 3 to 10 carbon atoms. It is further preferable that the fluorescent substance have a plurality of protective groups. The substituents having no π bond are poor in carrier transport performance, whereby the TADF material and the luminophore of the fluorescent substance can be made away from each other with little influence on carrier transportation or carrier recombination. Here, the luminophore refers to an atomic group (skeleton) that causes light emission in a fluorescent substance. The luminophore is preferably a skeleton having a π bond, further preferably includes an aromatic ring, and still further preferably includes a condensed aromatic ring or a condensed heteroaromatic ring. Examples of the condensed aromatic ring or the condensed heteroaromatic ring include a phenanthrene skeleton, a stilbene skeleton, an acridone skeleton, a phenoxazine skeleton, and a phenothiazine skeleton. Specifically, a fluorescent substance having any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferred because of its high fluorescence quantum yield.

In the case where a fluorescent substance is used as the light-emitting substance, a material having an anthracene skeleton is suitably used as the host material. The use of a substance having an anthracene skeleton as the host material for the fluorescent substance makes it possible to obtain a light-emitting layer with high emission efficiency and high durability. Among the substances having an anthracene skeleton, a substance having a diphenylanthracene skeleton, in particular, a substance having a 9,10-diphenylanthracene skeleton, is chemically stable and thus is preferably used as the host material. The host material preferably has a carbazole skeleton because the hole-injection and hole-transport properties are improved; further preferably, the host material has a benzocarbazole skeleton in which a benzene ring is further condensed to carbazole because the HOMO level thereof is shallower than that of carbazole by approximately 0.1 eV and thus holes enter the host material easily. In particular, the host material preferably has a dibenzocarbazole skeleton because the HOMO level thereof is shallower than that of carbazole by approximately 0.1 eV so that holes enter the host material easily, the hole-transport property is improved, and the heat resistance is increased. Accordingly, a substance that has both a 9,10-diphenylanthracene skeleton and a carbazole skeleton (or a benzocarbazole or dibenzocarbazole skeleton) is further preferable as the host material. Note that in terms of the hole-injection and hole-transport properties described above, instead of a carbazole skeleton, a benzofluorene skeleton or a dibenzofluorene skeleton may be used. Examples of such a substance include 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)biphenyl-4'-yl}anthracene (abbreviation: FLPPA), 9-(1-naphthyl)-10-[4-(2-naphthyl)phenyl]anthracene (abbreviation: aN-βNPAnth), 9-(1-naphthyl)-10-(2-naphthyl)anthracene (abbreviation: a, β-ADN), 2-(10-phenylanthracen-9-yl)dibenzofuran, 2-(10-phenyl-9-anthracenyl)-benzo[b]naphtho[2,3-d]furan (abbreviation: Bnf(II)PhA), 9-(2-naphthyl)-10-[3-(2-naphthyl)phenyl]anthracene (abbreviation: βN-mβNPAnth), and 1-[4-(10-[1,1'-biphenyl]-4-yl-9-anthracenyl)phenyl]-2-ethyl-1H-benzimidazole (abbreviation: EtBImPBPhA). In particular, CzPA, cgDBCzPA, 2mBnfPPA, and PCzPA have excellent characteristics and thus are preferably selected.

Note that the host material may be a mixture of a plurality of kinds of substances; in the case of using a mixed host material, it is preferable to mix a material having an electron-transport property with a material having a hole-transport property. By mixing the material having an electron-transport property with the material having a hole-transport property, the transport property of the light-emitting layer 113 can be easily adjusted and a recombination region can be easily controlled. The weight ratio of the content of the material having a hole-transport property to the content of the material having an electron-transport property can be 1:19 to 19:1.

Note that a phosphorescent substance can be used as part of the mixed material. When a fluorescent substance is used as the light-emitting substance, a phosphorescent substance can be used as an energy donor for supplying excitation energy to the fluorescent substance.

An exciplex may be formed of these mixed materials. These mixed materials are preferably selected so as to form an exciplex that exhibits light emission whose wavelength overlaps the wavelength on a lowest-energy-side absorption band of the light-emitting substance, in which case energy can be transferred smoothly and light emission can be obtained efficiently. The use of such a structure is preferable because the driving voltage can also be lowered.

Note that at least one of the materials forming an exciplex may be a phosphorescent substance. In this case, triplet excitation energy can be efficiently converted into singlet excitation energy by reverse intersystem crossing.

Combination of a material having an electron-transport property and a material having a hole-transport property whose HOMO level is higher than or equal to that of the material having an electron-transport property is preferable for forming an exciplex efficiently. In addition, the LUMO level of the material having a hole-transport property is preferably higher than or equal to that of the material having an electron-transport property. Note that the LUMO levels and the HOMO levels of the materials can be derived from the electrochemical characteristics (the reduction potentials and the oxidation potentials) of the materials that are measured by cyclic voltammetry (CV).

The formation of an exciplex can be confirmed by a phenomenon where the emission spectrum of the mixed film in which the material having a hole-transport property and the material having an electron-transport property are mixed is shifted to the longer wavelength side than the emission spectra of each of the materials (or has another peak on the longer wavelength side) observed by comparison of the emission spectra of the material having a hole-transport property, the material having an electron-transport property, and the mixed film of these materials, for example. Alternatively, the formation of an exciplex can be confirmed by a difference in transient response, such as a phenomenon where the transient photoluminescence (PL) lifetime of the mixed film has longer lifetime components or has a larger proportion of delayed components than that of each of the materials, observed by comparison of transient PL of the material having a hole-transport property, the material having an electron-transport property, and the mixed film of these materials. The transient PL can be rephrased as transient electroluminescence (EL). That is, the formation of an exciplex can also be confirmed by a difference in transient response observed by comparison of the transient EL of the material having a hole-transport property, the material having an electron-transport property, and the mixed film of these materials.

The electron-transport layer 114 is provided between the light-emitting layer 113 and the cathode and contains a material having an electron-transport property. The material having an electron-transport property preferably has an electron mobility higher than or equal to $1\times10^{-6}$ $cm^2/Vs$ in the case where the square root of the electric field strength [V/cm] is 600. Note that any other substance can also be used as long as the substance has an electron-transport property higher than a hole-transport property. An organic compound having a π-electron deficient heteroaromatic ring is preferable as the above organic compound. The organic compound having a π-electron deficient heteroaromatic ring is preferably one or more of an organic compound having a heteroaromatic ring having a polyazole skeleton, an organic compound having a heteroaromatic ring having a pyridine skeleton, an organic compound having a heteroaromatic ring having a diazine skeleton, and an organic compound having a heteroaromatic ring having a triazine skeleton.

Specific examples of the material having an electron-transport property that can be used for the electron-transport layer include organic compounds having an azole skeleton, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis [5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2"-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), and 4,4'-bis(5-methylbenzoxazol-2-yl)stilbene (abbreviation: BzOs); organic compounds having a heteroaromatic ring having a pyridine skeleton, such as 3,5-bis[3-(9H-carbazol-9-yl)phenyl]pyridine (abbreviation: 35DCzPPy), 1,3,5-tri[3-(3-pyridyl)phenyl]benzene (abbreviation: TmPyPB), bathophenanthroline (abbreviation: BPhen), bathocuproine (abbreviation: BCP), and 2,9-di(naphthalen-2-yl)-4,7-diphenyl-1,10-phenanthroline (abbreviation: NBPhen); organic compounds having a diazine skeleton, such as 2-[3-(dibenzothiophen-4-yl)phenyl]di benzo[f,h]quinoxaline (abbreviation: 2mDBTPDBq-II), 2-[3 '-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl] dibenzo[f,h]quinoxaline (abbreviation: 2mCzBPDBq), 2-[4'-(9-phenyl-9H-carbazol-3-yl)-3,1'-biphenyl-1-yl] dibenzo[f,h]quinoxaline (abbreviation: 2mpPCBPDBq), 2-[4-(3,6-diphenyl-9H-carbazol-9-yl)phenyl]dibenzo[f,h] quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), 9-[(3'-dibenzothiophen-4-yl)biphenyl-3-yl]naphtho[1',2': 4,5]furo[2,3-b]pyrazine (abbreviation: 9mDBtBPNfpr), 9-[3'-dibenzothiophen-4-yl)bipheny-4-yl]naphtho[1',2': 4,5] furo[2,3-b]pyrazine (abbreviation: 9pmDBtBPNfpr), 4,6-bis [3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 4,6-bis[3-(9H-carbazol-9-yl)phenyl]pyrimidine (abbreviation: 4,6mCzP2Pm), 9,9'-[pyrimidine-4,6-diylbis(biphenyl-3,3 '-diyl)]bis(9H-carbazole) (abbreviation: 4,6mCzBP2Pm), 8-(1,1'-biphenyl-4-yl)-4-[3-(dibenzothiophen-4-yl)phenyl]-[1]benzofuro[3,2-d]pyrimidine (abbreviation: 8BP-4mDBtPBfpm), 3,8-bis[3-(dibenzothiophen-4-yl)phenyl] benzofuro[2,3-b]pyrazine (abbreviation: 3,8mDBtP2B fpr), 4,8-bis[3-(dibenzothiophen-4-yl)phenyl]-[1]benzofuro[3,2-d]pyrimidine (abbreviation: 4,8mDBtP2Bfpm), 8-[3 '-(dibenzothiophen-4-yl)(1,1'-biphenyl-3-yl)]naphtho[1',2': 4,5]furo[3,2-d]pyrimidine (abbreviation: 8mDBtBPNfpm), 8-[(2,2'-binaphthalen)-6-yl)]-4-[3-(dibenzothiophen-4-yl) phenyl]-[1]benzofuro[3,2-d]pyrimidine (abbreviation: 8(βN2)-4mDBtPBfpm), 2,2'-(pyridine-2,6-diyl)bis(4-phenylbenzo[h]quinazoline) (abbreviation: 2,6(P-Bqn)2Py), 2,2'-(pyridine-2,6-diyl)bis 4-[4-(2-naphthyl)phenyl]-6-phenylpyrimidine (abbreviation: 2,6(NP-PPm)2Py), 6-(1,1'-biphenyl-3-yl)-4-[3,5-bis(9H-carbazol-9-yl)phenyl]-2-phenylpyrimidine (abbreviation: 6mBP-4Cz2PPm), 2,6-bis(4-naphthalen-1-ylphenyl)-4-[4-(3-pyridyl)phenyl]pyrimidine (abbreviation: 2,4NP-6PyPPm), 4-[3,5-bis(9H-carbazol-9-yl)phenyl]-2-phenyl-6-(1,1'-biphenyl-4-yl)pyrimidine (abbreviation: 6BP-4Cz2PPm), and 7-[4-(9-phenyl-9H-carbazol-2-yl)quinazolin-2-yl]-7H-dibenzo[c,g]carbazol (abbreviation: PC-cgDBCzQz); and organic compounds having a triazine skeleton, such as 2-[(1,1'-biphenyl)-4-yl]-4-phenyl-6-[9,9'-spirobi(9H-fluoren)-2-yl]-1,3,5-triazine (abbreviation: BP-SFTzn), 2-{3-[3-(benzo[b]naphtho[1,2-d] furan-8-yl)phenyl]phenyl}-4,6-diphenyl-1,3,5-triazine (abbreviation: mBnfBPTzn), 2-{3-[3-(benzo[b]naphtho[1,2-d] furan-6-yl)phenyl]phenyl}-4,6-diphenyl-1,3,5-triazine (abbreviation: mBnfBPTzn-02), 2-{4-[3-(N-phenyl-9H-carbazol-3-yl)-9H-carbazol-9-yl]phenyl}-4,6-diphenyl-1,3,5-triazine (abbreviation: PCCzPTzn), 9-[3-(4,6-diphenyl-1,3,5-triazin-2-yl)phenyl]-9'-phenyl-2,3'-bi-9H-carbazole (abbreviation: mPCCzPTzn-02), 2-[3'-(9,9-dimethyl-9H-fluoren-2-yl)-1,1'-biphenyl-3-yl]-4,6-diphenyl-1,3,5-triazine (abbreviation: mFBPTzn), 5-[3-(4,6-diphenyl-1,3,5-triazin-2-yl)phenyl]-7,7-dimethyl-5H,7H-indeno[2,1-b] carbazole (abbreviation: mINc(II)PTzn), 2-{3-[3-(dibenzothiophen-4-yl)phenyl]phenyl}-4,6-diphenyl-1,3,5-triazine (abbreviation: mDBtBPTzn), 2,4,6-tris[3'-(pyridin-3-yl)biphenyl-3-yl]-1,3,5-triazine (abbreviation: TmPPPyTz), 2-[3-(2,6-dimethyl-3-pyridinyl)-5-(9-phenanthrenyl)phenyl]-4,6-diphenyl-1,3,5-triazine (abbreviation: mPn-mDMePyPTzn), 11-(4-[1,1'-biphenyl]-4-yl)-6-phenyl-1,3,5-triazin-2-yl)-11,12-dihydro-12-phenyl-indolo[2,3-a]carbazole (abbreviation: BP-Icz(II)Tzn), 2-[3'-(triphenylen-2-yl)-1,1'-biphenyl-3-yl]-4,6-diphenyl-1,3,5-triazine (abbreviation: mTpBPTzn), 9-[4-(4,6-diphenyl-1,3,5-triazin-2-yl)-2-dibenzothiophenyl]-2-phenyl-9H-carbazole (abbreviation: PCDBfTzn), and 2-[1,1'-biphenyl]-3-yl-4-phenyl-6-(8-[1,1 ': 4', 1"-terphenyl]-4-yl-1-dibenzofuranyl)-1,3,5-triazine (abbreviation: mBP-TPDBfTzn). Among the above materials, the organic compound having a heteroaromatic ring having a diazine skeleton, the organic compound having a heteroaromatic ring having a pyridine skeleton, and the organic compound having a heteroaromatic ring having a triazine skeleton have high reliability and thus are preferable.

In particular, the organic compound having a heteroaromatic ring having a diazine (pyrimidine or pyrazine) skeleton and the organic compound having a heteroaromatic ring having a triazine skeleton have a high electron-transport property to contribute to a reduction in driving voltage.

Note that a mixed material of the material having an electron-transport property and a metal complex of an alkali metal or an alkaline earth metal is preferably used in the electron-transport layer. A heterocyclic compound having a diazine skeleton, a heterocyclic compound having a triazine skeleton, and a heterocyclic compound having a pyridine skeleton are preferable in terms of driving lifetime because they are likely to form an exciplex with an organometallic complex of an alkali metal with stable energy (the emission wavelength of the exciplex easily becomes longer). In particular, the heterocyclic compound having a diazine skeleton and the heterocyclic compound having a triazine skeleton have a deep LUMO level and thus are preferred for stabilization of energy of an exciplex.

Note that the organometallic complex of an alkali metal is preferably a metal complex of sodium or lithium. Alternatively, the organometallic complex of an alkali metal preferably has a ligand having a quinolinol skeleton. Further preferably, the organometallic complex of an alkali metal is a lithium complex having an 8-quinolinolato structure or a derivative thereof. The derivative of a lithium complex having an 8-quinolinolato structure is preferably a lithium complex having an 8-quinolinolato structure having an alkyl group, and further preferably has a methyl group.

Specific examples of the metal complex include 8-hydroxyquinolinato-lithium (abbreviation: Liq) and 8-hydroxyquinolinato-sodium (abbreviation: Naq). In particular, a complex of a monovalent metal ion, especially a complex of lithium is preferable, and Liq is further preferable. Note that in the case where the 8-hydroxyquinolinato structure is included, a methyl-substituted product (e.g., a 2-methyl-substituted product, a 5-methyl-substituted product, or 6-methyl-substituted product) thereof is also preferably used, for example. In particular, the use of an alkali metal complex having an 8-quinolinolato structure having an alkyl group at the 6 position results in lowering the driving voltage of a light-emitting device.

As the material having an electron-transport property, any of the above-described low refractive index materials having an electron-transport property can be used as well. In this case, the electron-transport layer 114 can be a low refractive index layer (the low refractive index layer 157 or the third low refractive index layer).

The electron mobility of the electron-transport layer 114 in the case where the square root of the electric field strength [V/cm] is 600 is preferably higher than or equal to $1\times10^{-7}$ $cm^2/Vs$ and lower than or equal to $5\times10^{-5}$ $cm^2/Vs$. The amount of electrons injected into the light-emitting layer can be controlled by the reduction in the electron-transport property of the electron-transport layer 114, whereby the light-emitting layer can be prevented from having excess electrons. It is particularly preferable to employ this structure when the hole-injection layer is formed using a composite material that includes a material having a hole-transport property with a relatively deep HOMO level of −5.7 eV or higher and −5.4 eV or lower, in which case a long lifetime can be achieved. In this case, the material having an electron-transport property preferably has a HOMO level of −6.0 eV or higher.

A layer including an alkali metal, an alkaline earth metal, a compound thereof, or a complex thereof, such as lithium fluoride (LiF), cesium fluoride (CsF), calcium fluoride ($CaF_2$), or 8-hydroxyquinolinato-lithium (Liq), may be provided as the electron-injection layer 115 between the electron-transport layer 114 and the second electrode 102. An electride or a layer that is formed using a substance having an electron-transport property and that includes an alkali metal, an alkaline earth metal, or a compound thereof can be used as the electron-injection layer 115. Examples of the electride include a substance in which electrons are added at high concentration to calcium oxide-aluminum oxide.

Note that as the electron-injection layer 115, it is possible to use a layer containing a substance that has an electron-transport property (preferably an organic compound having a bipyridine skeleton) and contains a fluoride of the alkali metal or the alkaline earth metal at a concentration higher than that at which the electron-injection layer 115 has a microcrystalline state (50 wt % or higher). Since the layer has a low refractive index, the electron-injection layer can be a low refractive index layer; thus, a light-emitting device including the layer can have higher external quantum efficiency.

Figure 4B:
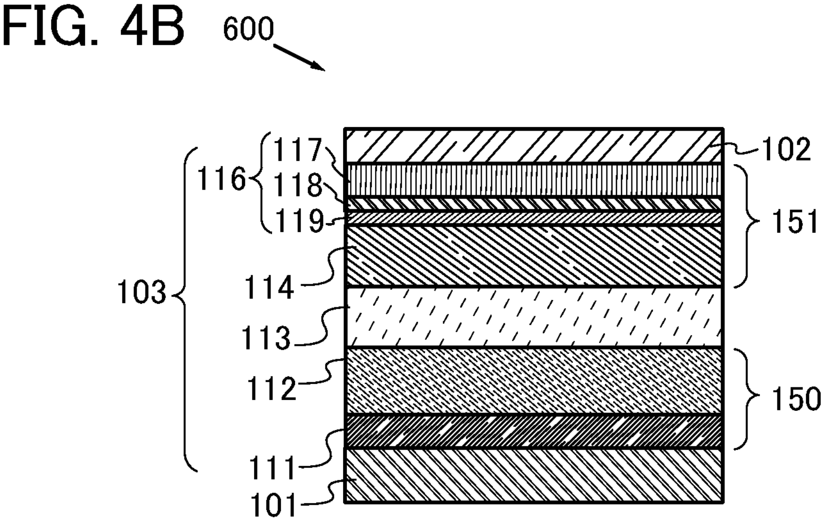

Instead of the electron-injection layer 115 in FIG. 4A, a charge-generation layer 116 may be provided (FIG. 4B). The charge-generation layer 116 refers to a layer capable of injecting holes into a layer in contact with the cathode side of the charge-generation layer 116 and injecting electrons into a layer in contact with the anode side thereof when a potential is applied. The charge-generation layer 116 includes at least a p-type layer 117. The p-type layer 117 is preferably formed using any of the composite materials given above as examples of materials that can be used for the hole-injection layer 111. The p-type layer 117 may be formed by stacking a film containing the acceptor material described above as a material included in the composite material and a film containing a hole-transport material. When a potential is applied to the p-type layer 117, electrons are injected into the electron-transport layer 114 and holes are injected into the second electrode 102 which is the cathode; thus, the light-emitting device operates.

Note that the charge-generation layer 116 preferably includes an electron-relay layer 118 and/or an electron-injection buffer layer 119 in addition to the p-type layer 117.

The electron-relay layer 118 includes at least a substance having an electron-transport property and has a function of preventing an interaction between the electron-injection buffer layer 119 and the p-type layer 117 and smoothly transferring electrons. The LUMO level of the substance having an electron-transport property contained in the electron-relay layer 118 is preferably between the LUMO level of the acceptor substance in the p-type layer 117 and the LUMO level of a substance contained in a layer of the electron-transport layer 114 that is in contact with the charge-generation layer 116. As a specific value of the energy level, the LUMO level of the substance having an electron-transport property in the electron-relay layer 118 is preferably higher than or equal to −5.0 eV, further preferably higher than or equal to −5.0 eV and lower than or equal to −3.0 eV. Note that as the substance having an electron-transport property in the electron-relay layer 118, a phthalocyanine-based material or a metal complex having a metal-oxygen bond and an aromatic ligand is preferably used.

A substance having a high electron-injection property can be used for the electron-injection buffer layer 119. For example, it is possible to use an alkali metal, an alkaline earth metal, a rare earth metal, or a compound thereof, such as an alkali metal compound (including an oxide such as lithium oxide, a halide, and a carbonate such as lithium carbonate and cesium carbonate), an alkaline earth metal compound (including an oxide, a halide, and a carbonate), or a rare earth metal compound (including an oxide, a halide, and a carbonate).

In the case where the electron-injection buffer layer 119 contains the substance having an electron-transport property and a donor substance, an organic compound such as tetrathianaphthacene (abbreviation: TTN), nickelocene, or decamethylnickelocene can be used as the donor substance, as well as an alkali metal, an alkaline earth metal, a rare earth metal, or a compound thereof (e.g., an alkali metal compound (including an oxide such as lithium oxide, a halide, and a carbonate such as lithium carbonate and cesium carbonate), an alkaline earth metal compound (including an oxide, a halide, and a carbonate), or a rare earth metal compound (including an oxide, a halide, and a carbonate)).

As the substance having an electron-transport property, a material similar to the above-described material for the electron-transport layer 114 can be used. Since the above-described material is an organic compound having a low refractive index, the use of the material for the electron-injection buffer layer 119 can offer a light-emitting device with high external quantum efficiency.

Any of a variety of methods can be used to form the EL layer 103, regardless of a dry method or a wet method. For example, a vacuum evaporation method, a gravure printing method, an offset printing method, a screen printing method, an ink-jet method, or a spin coating method can be used.

Different methods may be used to form the electrodes or the layers described above.

In order to suppress transfer of energy from an exciton generated in the light-emitting layer, the hole-transport layer and the electron-transport layer that are in contact with the light-emitting layer 113, particularly a carrier-transport layer closer to the recombination region in the light-emitting layer 113, are preferably formed using a substance having a wider band gap than the light-emitting material of the light-emitting layer or the light-emitting material included in the light-emitting layer.

Figure 4C:
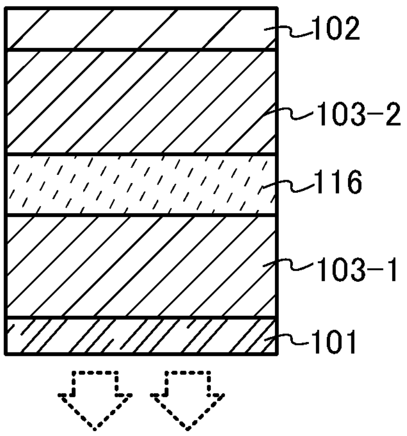
Figure 4D:
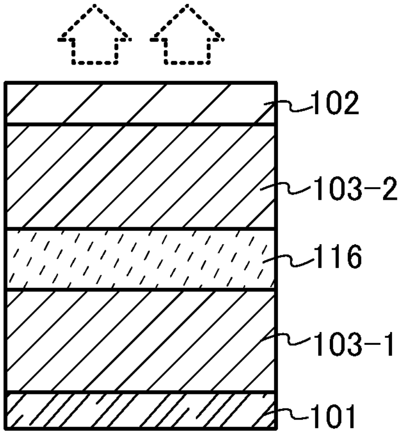

Next, an embodiment of a light-emitting device in which a plurality of light-emitting units are stacked (this type of light-emitting device is also referred to as a stacked or tandem device) is described with reference to FIGS. 4C and 4D. This light-emitting device includes a plurality of light-emitting units between the anode and the cathode. One light-emitting unit has substantially the same structure as the EL layer 103 illustrated in FIG. 4A. In other words, the light-emitting device illustrated in FIG. 4A includes a single light-emitting unit, and the tandem device includes a plurality of light-emitting units.

In the tandem device, a first light-emitting unit 103-1 and a second light-emitting unit 103-2 are stacked between the anode and the cathode, and the charge-generation layer 116 is provided between the first light-emitting unit 103-1 and the second light-emitting unit 103-2. The first light-emitting unit 103-1 and the second light-emitting unit 103-2 may have the same structure or different structures.

The charge-generation layer in the tandem device has a function of injecting electrons into one of the light-emitting units and injecting holes into the other of the light-emitting units when voltage is applied between the anode and the cathode. That is, the charge-generation layer injects electrons into the first light-emitting unit 103-1 and injects holes into the second light-emitting unit 103-2 when voltage is applied such that the potential of the anode becomes higher than the potential of the cathode.

The charge-generation layer preferably has a structure similar to that of the charge-generation layer 116 described with reference to FIG. 4B. A composite material of an organic compound and a metal oxide has an excellent carrier-injection property and an excellent carrier-transport property; thus, low-voltage driving and low-current driving can be achieved. In the case where the anode-side surface of a light-emitting unit is in contact with the charge-generation layer, the charge-generation layer can also function as a hole-injection layer of the light-emitting unit; therefore, a hole-injection layer is not necessarily provided in the light-emitting unit.

In the case where the charge-generation layer of the tandem device includes the electron-injection buffer layer 119, the electron-injection buffer layer 119 functions as an electron-injection layer in the light-emitting unit on the anode side; thus, an electron-injection layer is not necessarily formed in the light-emitting unit on the anode side.

The tandem device having two light-emitting units is described above; one embodiment of the present invention can also be applied to a tandem device in which three or more light-emitting units are stacked. With a plurality of light-emitting units partitioned by the charge-generation layer between a pair of electrodes, it is possible to provide a longer-life device that can emit light with high luminance at a low current density. A light-emitting apparatus that can be driven at a low voltage and has low power consumption can be provided.

When the emission colors of the light-emitting units are different from each other, light emission of a desired color can be obtained from the light-emitting device as a whole. For example, in a light-emitting device having two light-emitting units, the emission colors of the first light-emitting unit 103-1 may be red and green and the emission color of the second light-emitting unit 103-2 may be blue, so that the light-emitting device can emit white light as a whole.

The electrodes and the layers such as the EL layer 103, the first light-emitting unit 103-1, the second light-emitting unit 103-2, and the charge-generation layer 116 can be formed, for example, by an evaporation method (including a vacuum evaporation method), a droplet discharge method (also referred to as an ink-jet method), a coating method, or a gravure printing method. A low molecular material, a middle molecular material (including an oligomer and a dendrimer), or a high molecular material may be included in the layers and electrodes.

This embodiment can be freely combined with any of the other embodiments.

Embodiment 4

In this embodiment, a light-emitting apparatus including the light-emitting device described in any of Embodiments 1 to 3 will be described.

Figure 5A:
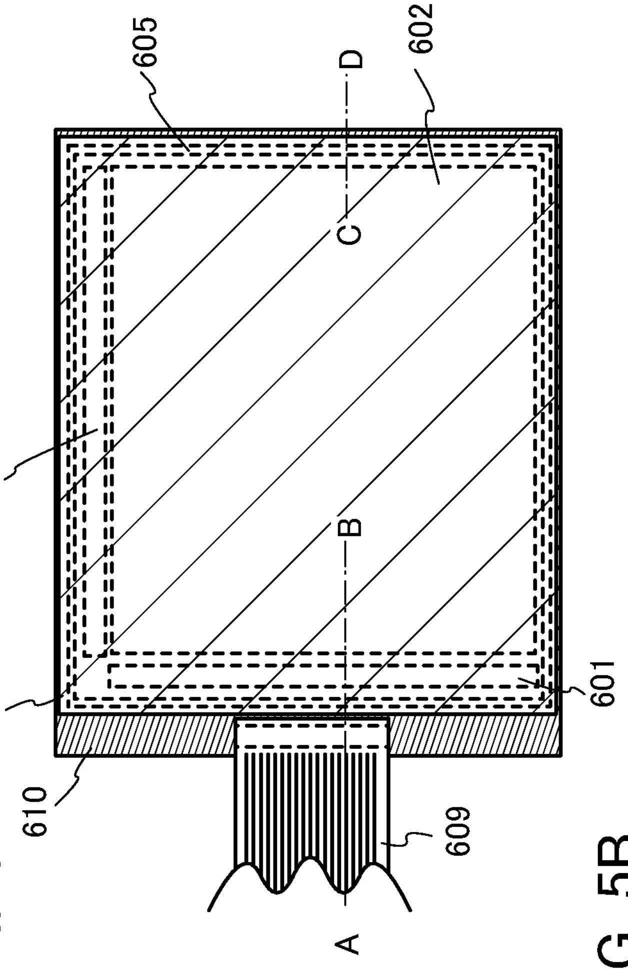
FIGS. 5A and 5B illustrate an active matrix light-emitting apparatus.
Figure 5B:
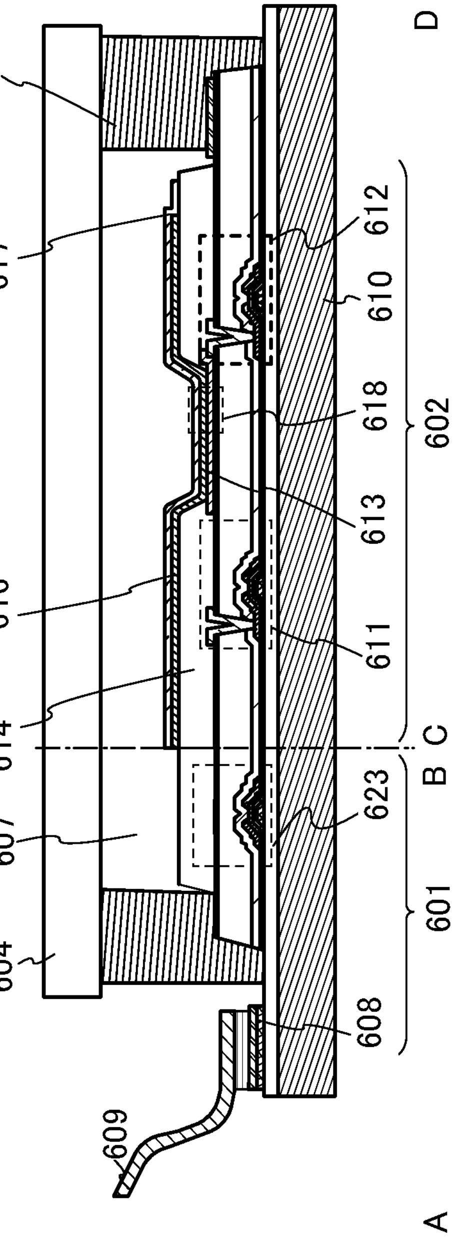

In this embodiment, a light-emitting apparatus manufactured using the light-emitting device described in any of Embodiments 1 to 3 is described with reference to FIGS. 5A and 5B. FIG. 5A is a top view of the light-emitting apparatus, and FIG. 5B is a cross-sectional view along the dashed-dotted lines A-B and C-D in FIG. 5A. This light-emitting apparatus includes a driver circuit portion (source line driver circuit) 601, a pixel portion 602, and a driver circuit portion (gate line driver circuit) 603 that are to control light emission of a light-emitting device and illustrated with dotted lines. Reference numeral 604 denotes a sealing substrate; 605, a sealing material; and 607, a space surrounded by the sealing material 605.

Reference numeral 608 denotes a lead wiring for transmitting signals to be input to the source line driver circuit 601 and the gate line driver circuit 603 and receiving signals such as a video signal, a clock signal, a start signal, and a reset signal from a flexible printed circuit (FPC) 609 serving as an external input terminal. Although only the FPC is illustrated here, a printed wiring board (PWB) may be attached to the FPC. A light-emitting apparatus in this specification includes, in its category, not only a light-emitting apparatus itself but also a light-emitting apparatus provided with an FPC or a PWB.

Next, a cross-sectional structure is described with reference to FIG. 5B. The driver circuit portions and the pixel portion are formed over an element substrate 610; here, the source line driver circuit 601, which is a driver circuit portion, and one pixel in the pixel portion 602 are illustrated.

The element substrate 610 can be a substrate containing glass, quartz, an organic resin, a metal, an alloy, or a semiconductor or a plastic substrate formed of fiber reinforced plastics (FRP), poly(vinyl fluoride) (PVF), polyester, an acrylic resin, or the like.

There is no particular limitation on the structure of transistors used in the pixels and driver circuits. For example, inverted staggered transistors or staggered transistors may be used. Furthermore, top-gate transistors or bottom-gate transistors may be used. A semiconductor material used for the transistors is not particularly limited, and for example, silicon, germanium, silicon carbide, or gallium nitride can be used. Alternatively, an oxide semiconductor containing at least one of indium, gallium, and zinc, such as an In-Ga-Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. It is preferable to use a semiconductor having crystallinity, in which case deterioration of the transistor characteristics can be suppressed.

Here, an oxide semiconductor is preferably used for semiconductor devices such as the transistors provided in the pixels and driver circuits, transistors used for touch sensors described later, and the like. In particular, an oxide semiconductor having a wider band gap than silicon is preferably used. When an oxide semiconductor having a wider band gap than silicon is used, the off-state current of the transistors can be reduced.

The oxide semiconductor preferably contains at least indium (In) or zinc (Zn). Further preferably, the oxide semiconductor contains an oxide represented by an In-M-Zn-based oxide (M represents a metal such as Al, Ti, Ga, Ge, Y, Zr, Sn, La, Ce, or Hf).

As a semiconductor layer, it is particularly preferable to use an oxide semiconductor film including a plurality of crystal parts whose c-axes are aligned perpendicular to a surface on which the semiconductor layer is formed or the top surface of the semiconductor layer and in which the adjacent crystal parts have no grain boundary.

The use of such materials for the semiconductor layer makes it possible to provide a highly reliable transistor in which a change in the electrical characteristics is suppressed.

Charge accumulated in a capacitor through a transistor including the above-described semiconductor layer can be held for a long time because of the low off-state current of the transistor. When such a transistor is used in a pixel, operation of a driver circuit can be stopped while a gray scale of an image displayed in each display region is maintained. As a result, an electronic appliance with extremely low power consumption can be obtained.

For stable characteristics or the like of the transistor, a base film is preferably provided. The base film can be formed with a single-layer structure or a stacked-layer structure using an inorganic insulating film such as a silicon oxide film, a silicon nitride film, a silicon oxynitride film, or a silicon nitride oxide film. The base film can be formed by a sputtering method, a chemical vapor deposition (CVD) method (e.g., a plasma CVD method, a thermal CVD method, or a metal organic CVD (MOCVD) method), an atomic layer deposition (ALD) method, a coating method, a printing method, or the like. Note that the base film is not necessarily provided.

An FET 623 is illustrated as a transistor formed in the driver circuit portion 601. The driver circuit is formed with any of a variety of circuits such as a CMOS circuit, a PMOS circuit, and an NMOS circuit. Although a driver integrated type in which the driver circuit is formed over the substrate is illustrated in this embodiment, the driver circuit is not necessarily formed over the substrate, and the driver circuit can be formed outside.

The pixel portion 602 includes a plurality of pixels each including a switching FET 611, a current controlling FET 612, and a first electrode 613 electrically connected to a drain of the current controlling FET 612. One embodiment of the present invention is not limited to this structure. Each pixel in the pixel portion 602 may include three or more FETs and a capacitor in combination.

An insulator 614 is formed to cover an end portion of the first electrode 613. Here, the insulator 614 can be formed using a positive photosensitive acrylic resin film.

In order to improve coverage with an EL layer or the like that is formed later, the insulator 614 is formed to have a curved surface with curvature at its upper or lower end portion. For example, in the case where a positive photosensitive acrylic resin is used as a material of the insulator 614, only the upper end portion of the insulator 614 preferably has a curved surface with a curvature radius (0.2 μm to 3 μm). As the insulator 614, either a negative photosensitive resin or a positive photosensitive resin can be used.

An EL layer 616 and a second electrode 617 are formed over the first electrode 613. Here, the first electrode 613 serves as an anode. A material having a high work function is preferably used as a material of the anode. For example, it is possible to employ a single-layer film of an ITO film, an indium tin oxide film containing silicon, an indium oxide film containing zinc oxide at 2 wt % to 20 wt %, a titanium nitride film, a chromium film, a tungsten film, a Zn film, a Pt film, or the like; a stack of any of these films and a film containing silver as its main component; a stack of a titanium nitride film and a film containing aluminum as its main component; or a stack of three layers of a titanium nitride film, a film containing aluminum as its main component, and a titanium nitride film. The stacked-layer structure enables low wiring resistance, favorable ohmic contact, and a function of an anode.

The EL layer 616 is formed by any of a variety of methods such as an evaporation method using an evaporation mask, an ink-jet method, and a spin coating method. The EL layer 616 has the structure described in any of Embodiments 1 to 3.

As a material used for the second electrode 617, which is formed over the EL layer 616, a material having a low work function (e.g., Al, Mg, Li, and Ca, or an alloy or a compound thereof, such as MgAg, MgIn, and AlLi) is preferably used. In the case where light generated in the EL layer 616 passes through the second electrode 617, a stack of a thin metal or alloy film and a transparent conductive film (e.g., ITO, indium oxide containing zinc oxide at 2 wt % to 20 wt %, indium tin oxide containing silicon, or zinc oxide (ZnO)) is preferably used for the second electrode 617.

Note that the light-emitting device is formed with the first electrode 613, the EL layer 616, and the second electrode 617. The light-emitting device is the light-emitting device described in any of Embodiments 1 to 3. In the light-emitting apparatus of this embodiment, the pixel portion, which includes a plurality of light-emitting devices, may include both the light-emitting device described in any of Embodiments 1 to 3 and a light-emitting device having a different structure. In that case, in the light-emitting apparatus of one embodiment of the present invention, a common hole-transport layer can be used for light-emitting devices that emit light with different wavelengths, allowing the light-emitting apparatus to be manufactured in a simple process at low costs.

The sealing substrate 604 is attached to the element substrate 610 with the sealing material 605, so that a light-emitting device 618 is provided in the space 607 surrounded by the element substrate 610, the sealing substrate 604, and the sealing material 605. The space 607 is filled with a filler and may be filled with an inert gas (such as nitrogen or argon) or the sealing material. It is preferable that the sealing substrate be provided with a recessed portion and a drying agent be provided in the recessed portion, in which case degradation due to influence of moisture can be suppressed.

An epoxy-based resin or glass frit is preferably used for the sealing material 605. It is preferable that such a material transmit moisture or oxygen as little as possible. As the sealing substrate 604, a glass substrate, a quartz substrate, or a plastic substrate formed of fiber reinforced plastics (FRP), poly(vinyl fluoride) (PVF), polyester, an acrylic resin, or the like can be used.

Although not illustrated in FIGS. 5A and 5B, a protective film may be provided over the cathode. As the protective film, an organic resin film or an inorganic insulating film can be formed. The protective film may be formed so as to cover an exposed portion of the sealing material 605. Moreover, the protective film can be provided so as to cover surfaces and side surfaces of the pair of substrates and exposed side surfaces of a sealing layer, an insulating layer, and the like.

The protective film can be formed using a material through which impurities such as water do not permeate easily. Thus, diffusion of impurities such as water from the outside into the inside can be effectively suppressed.

As a material of the protective film, an oxide, a nitride, a fluoride, a sulfide, a ternary compound, a metal, a polymer, or the like can be used. For example, it is possible to use a material that contains aluminum oxide, hafnium oxide, hafnium silicate, lanthanum oxide, silicon oxide, strontium titanate, tantalum oxide, titanium oxide, zinc oxide, niobium oxide, zirconium oxide, tin oxide, yttrium oxide, cerium oxide, scandium oxide, erbium oxide, vanadium oxide, indium oxide, aluminum nitride, hafnium nitride, silicon nitride, tantalum nitride, titanium nitride, niobium nitride, molybdenum nitride, zirconium nitride, gallium nitride, a nitride containing titanium and aluminum, an oxide containing titanium and aluminum, an oxide containing aluminum and zinc, a sulfide containing manganese and zinc, a sulfide containing cerium and strontium, an oxide containing erbium and aluminum, an oxide containing yttrium and zirconium, or the like.

The protective film is preferably formed using a deposition method with favorable step coverage. One such method is an atomic layer deposition (ALD) method. A material that can be formed by an ALD method is preferably used for the protective film. A dense protective film having reduced defects such as cracks or pinholes or a uniform thickness can be formed by an ALD method. Furthermore, damage caused to a process member in forming the protective film can be reduced.

By an ALD method, a uniform protective film with few defects can be formed even on, for example, a surface with a complex uneven shape or upper, side, and rear surfaces of a touch panel.

As described above, the light-emitting apparatus using the light-emitting device described in any of Embodiments 1 to 3 can be fabricated.

The light-emitting apparatus in this embodiment includes the light-emitting device described in any of Embodiments 1 to 3 and thus can have favorable characteristics. Specifically, since the light-emitting device described in any of Embodiments 1 to 3 has high emission efficiency, the light-emitting apparatus achieves low power consumption.

Figure 6A:
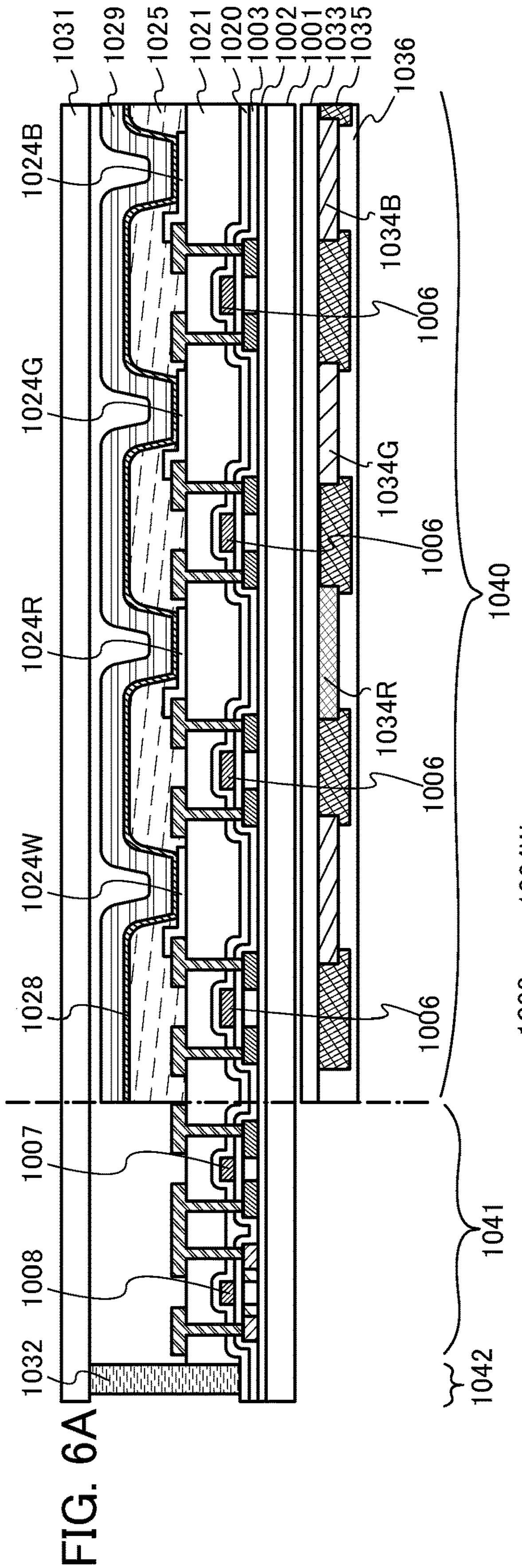
FIGS. 6A and 6B each illustrate an active matrix light-emitting apparatus.
Figure 6B:
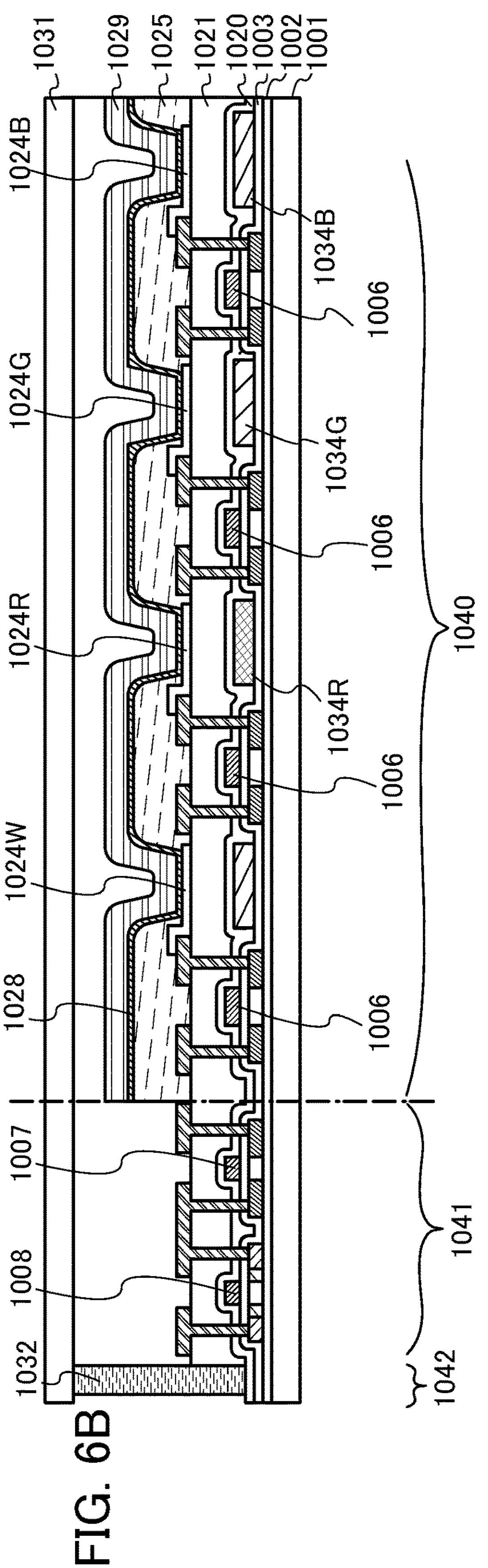

FIGS. 6A and 6B each illustrate an example of a light-emitting apparatus that includes coloring layers (color filters) and the like to improve color purity. FIG. 6A illustrates a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024W, 1024R, 1024G, and 1024B of light-emitting devices, a partition 1025, an EL layer 1028, a second electrode 1029 of the light-emitting devices, a sealing substrate 1031, a sealing material 1032, and the like.

In FIG. 6A, coloring layers (a red coloring layer 1034R, a green coloring layer 1034G, and a blue coloring layer 1034B) are provided on a transparent base material 1033. A black matrix 1035 may be additionally provided. The transparent base material 1033 provided with the coloring layers and the black matrix is aligned and fixed to the substrate 1001. Note that the coloring layers and the black matrix 1035 are covered with an overcoat layer 1036.

FIG. 6B shows an example in which the coloring layers (the red coloring layer 1034R, the green coloring layer 1034G, and the blue coloring layer 1034B) are provided between the gate insulating film 1003 and the first interlayer insulating film 1020. As in the structure, the coloring layers may be provided between the substrate 1001 and the sealing substrate 1031.

Figure 7:
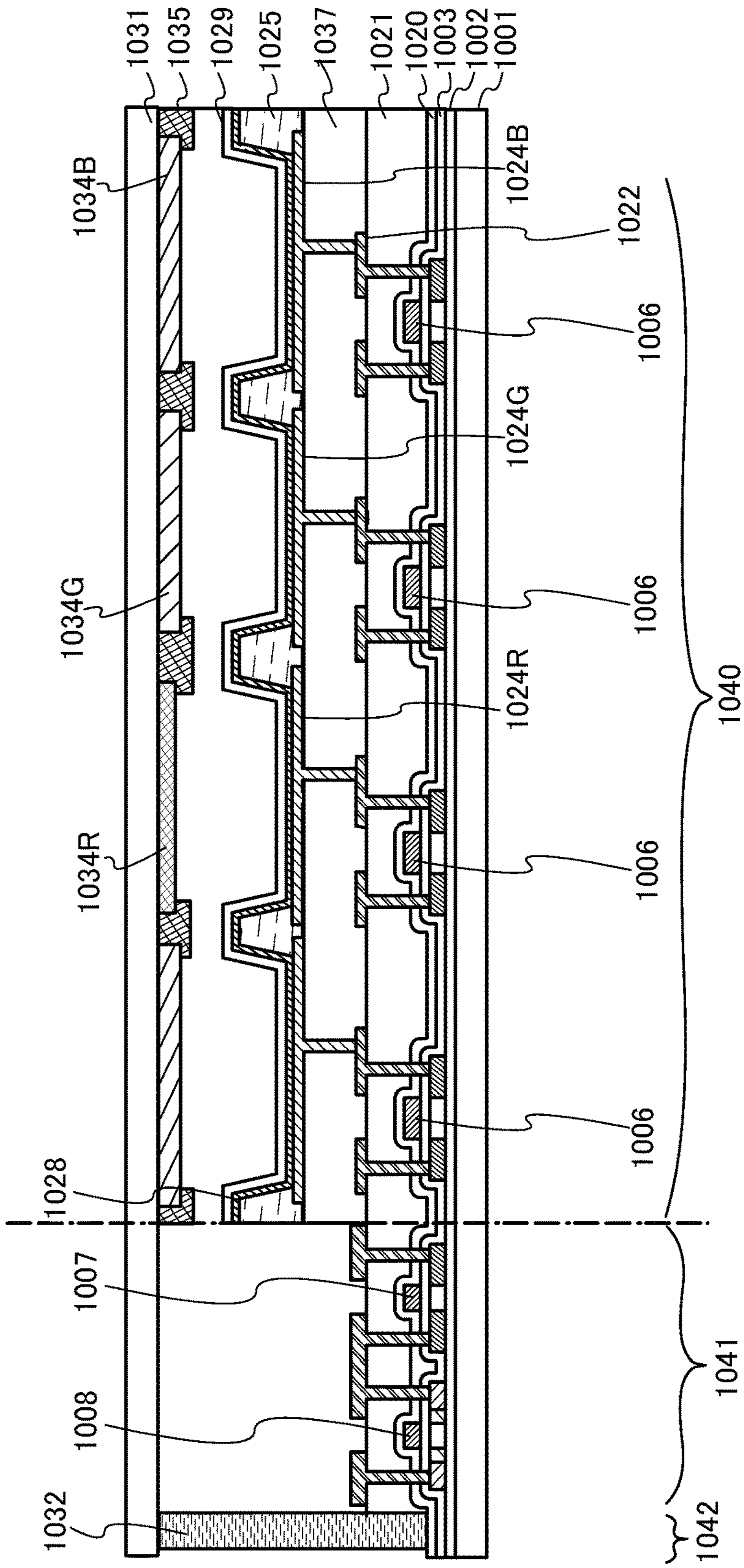
FIG. 7 illustrates an active matrix light-emitting apparatus.

The above-described light-emitting apparatuses have a structure in which light is extracted from the substrate 1001 side where FETs are formed (a bottom emission structure); however, a light-emitting apparatus may have a structure in which light is extracted from a sealing substrate 1031 side (a top emission structure). FIG. 7 is a cross-sectional view of a light-emitting apparatus having a top emission structure. In this case, a substrate that does not transmit light can be used as the substrate 1001. The process up to the step of forming a connection electrode that connects the FET and the anode of the light-emitting device is performed in a manner similar to that of the light-emitting apparatus having a bottom emission structure. Then, a third interlayer insulating film 1037 is formed to cover an electrode 1022. This insulating film may have a planarization function. The third interlayer insulating film 1037 can be formed using a material similar to that of the second interlayer insulating film 1021, and can alternatively be formed using any of other known materials.

The first electrodes 1024R, 1024G, and 1024B of the light-emitting devices each serve as an anode here, but may alternatively serve as a cathode. Furthermore, in a light-emitting apparatus having a top emission structure as illustrated in FIG. 7, the anodes are preferably reflective electrodes. The EL layer 1028 is formed to have a structure similar to the structure of the EL layer 103 described in Embodiment 1.

In the case of a top emission structure as illustrated in FIG. 7, sealing can be performed with the sealing substrate 1031 on which the coloring layers (the red coloring layer 1034R, the green coloring layer 1034G, and the blue coloring layer 1034B) are provided. The sealing substrate 1031 may be provided with the black matrix 1035 which is positioned between pixels. The coloring layers (the red coloring layer 1034R, the green coloring layer 1034G, and the blue coloring layer 1034B) and the black matrix 1035 may be covered with an overcoat layer (not illustrated). Note that a light-transmitting substrate is used as the sealing substrate 1031.

In the light-emitting apparatus having a top emission structure, a microcavity structure can be suitably employed. A light-emitting device with a microcavity structure is formed with the use of an electrode including a reflective electrode as one of the electrodes and a transflective electrode as the other electrode. At least an EL layer is positioned between the reflective electrode and the transflective electrode, and the EL layer includes at least a light-emitting layer serving as a light-emitting region.

Note that the reflective electrode has a visible light reflectivity of 40% to 100%, preferably 70% to 100%, and a resistivity of $1\times10^{-2}$ Ωcm or lower. In addition, the transflective electrode has a visible light reflectivity of 20% to 80%, preferably 40% to 70%, and a resistivity of $1\times10^{-2}$ Ωcm or lower.

Light emitted from the light-emitting layer included in the EL layer is reflected and resonated by the reflective electrode and the transflective electrode.

In the light-emitting device, by changing thicknesses of the transparent conductive film, the composite material, the carrier-transport material, and the like, the optical path length between the reflective electrode and the transflective electrode can be changed. Thus, light with a wavelength that is resonated between the reflective electrode and the transflective electrode can be intensified while light with a wavelength that is not resonated therebetween can be attenuated.

Note that light that is reflected back by the reflective electrode (first reflected light) considerably interferes with light that directly enters the transflective electrode from the light-emitting layer (first incident light). For this reason, the optical path length between the reflective electrode and the light-emitting layer is preferably adjusted to $(2n-1)\lambda/4$ (n is a natural number of 1 or larger and λ is a wavelength of light to be amplified). By adjusting the optical path length, the phases of the first reflected light and the first incident light can be aligned with each other and the light emitted from the light-emitting layer can be further amplified.

Note that in the above structure, the EL layer may include a plurality of light-emitting layers or a single light-emitting layer. The tandem light-emitting device described above may be combined with a plurality of EL layers; for example, a light-emitting device may have a structure in which a plurality of EL layers are provided, a charge-generation layer is provided between the EL layers, and each EL layer includes a plurality of light-emitting layers or a single light-emitting layer.

With the microcavity structure, emission intensity with a specific wavelength in the front direction can be increased, whereby power consumption can be reduced. Note that a light-emitting apparatus that displays images with subpixels of four colors, red, yellow, green, and blue can have favorable characteristics because the luminance can be increased owing to yellow light emission and each subpixel can employ a microcavity structure suitable for wavelengths of the corresponding color.

The light-emitting apparatus in this embodiment includes the light-emitting device described in any of Embodiments 1 to 3 and thus can have favorable characteristics. Specifically, since the light-emitting device described in any of Embodiments 1 to 3 has high emission efficiency, the light-emitting apparatus achieves low power consumption.

Figure 8A:
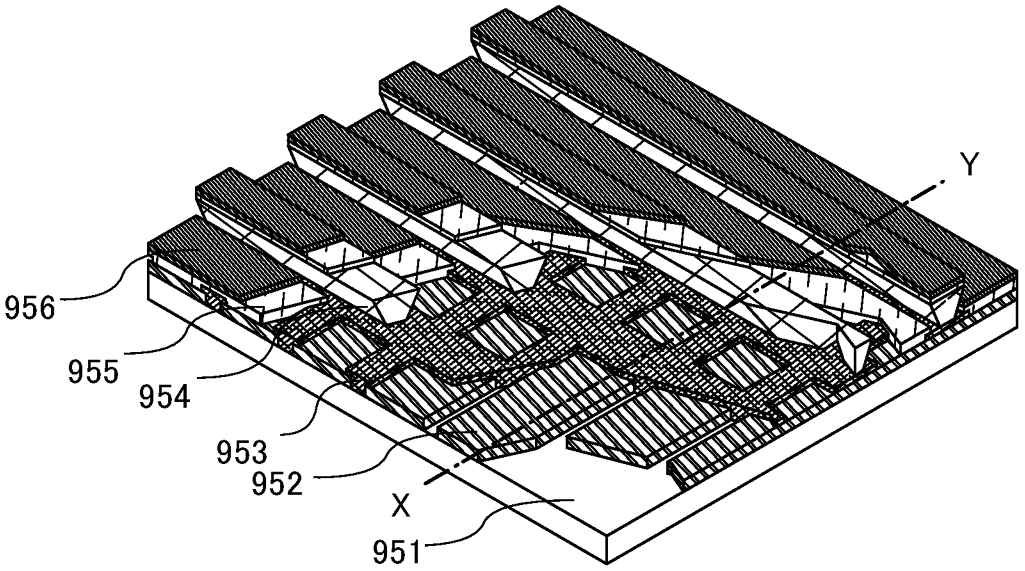
FIGS. 8A and 8B illustrate a passive matrix light-emitting apparatus.
Figure 8B:
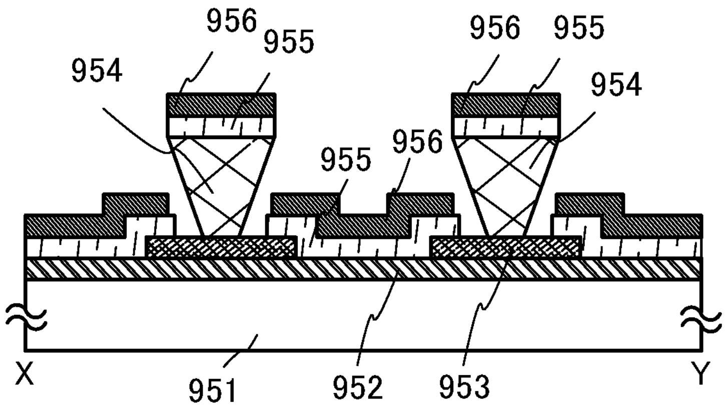

The active matrix light-emitting apparatuses are described above, whereas a passive matrix light-emitting apparatus is described below. FIGS. 8A and 8B illustrate a passive matrix light-emitting apparatus manufactured according to the present invention. FIG. 8A is a perspective view of the light-emitting apparatus, and FIG. 8B is a cross-sectional view along the dashed-dotted line X-Y in FIG. 8A. In FIGS. 8A and 8B, over a substrate 951, an EL layer 955 is provided between an electrode 952 and an electrode 956. An end portion of the electrode 952 is covered with an insulating layer 953. A partition layer 954 is provided over the insulating layer 953. The sidewalls of the partition layer 954 are aslope such that the distance between both sidewalls is gradually narrowed toward the surface of the substrate. In other words, a cross section of the partition layer 954 in the direction along its short side is trapezoidal, and the lower side (a side of the trapezoid that is parallel to the surface of the insulating layer 953 and is in contact with the insulating layer 953) is shorter than the upper side (a side of the trapezoid that is parallel to the surface of the insulating layer 953 and is not in contact with the insulating layer 953). The partition layer 954 thus provided can prevent defects in the light-emitting device due to static electricity or the like. The passive matrix light-emitting apparatus also includes the light-emitting device described in any of Embodiments 1 to 3; thus, the light-emitting apparatus can have high reliability or low power consumption.

Since a large number of minute light-emitting devices arranged in a matrix can be controlled individually in the light-emitting apparatus described above, the light-emitting apparatus can be suitably used as a display apparatus for displaying images.

This embodiment can be freely combined with any of the other embodiments.

Embodiment 5

[Light-Emitting Apparatus]

Another example of the light-emitting apparatus of one embodiment of the present invention using the light-emitting device described in any of Embodiments 1 to 3 and a manufacturing method thereof will be described below.

Figure 9A:
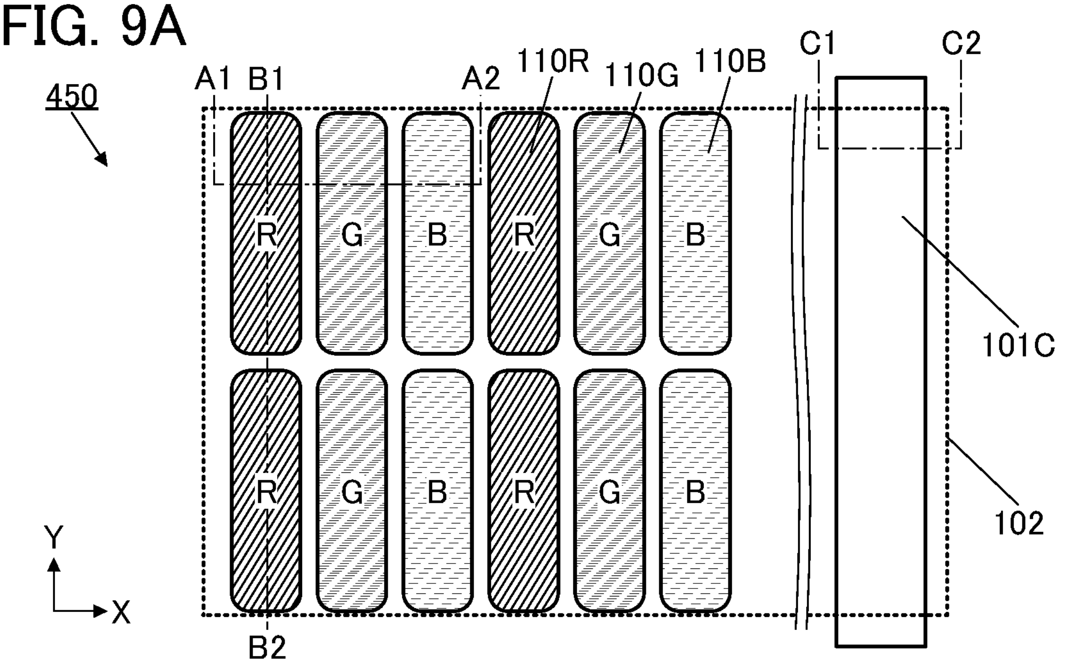
FIGS. 9A to 9D each illustrate a structure example of a display apparatus.

FIG. 9A is a top schematic view of a light-emitting apparatus 450 of one embodiment of the present invention. The light-emitting apparatus 450 includes a plurality of light-emitting devices 110R that emit red light, a plurality of light-emitting devices 110G that emit green light, and a plurality of light-emitting devices 110B that emit blue light.

In FIG. 9A, light-emitting regions of the light-emitting devices are denoted by R, G, and B to easily differentiate the light-emitting devices.

The light-emitting devices 110R, the light-emitting devices 110G, and the light-emitting devices 110B are arranged in a matrix. FIG. 9A shows what is called a stripe arrangement, in which the light-emitting devices of the same color are arranged in one direction. Note that the arrangement of the light-emitting devices is not limited thereto; another arrangement such as a delta, zigzag, or PenTile pattern may also be used.

The light-emitting device 110R, the light-emitting device 110G, and the light-emitting device 110B are arranged in the X direction. The light-emitting devices of the same color are arranged in the Y direction intersecting with the X direction.

The light-emitting device 110R, the light-emitting device 110G, and the light-emitting device 110B have the above-described structure.

Figure 9B:
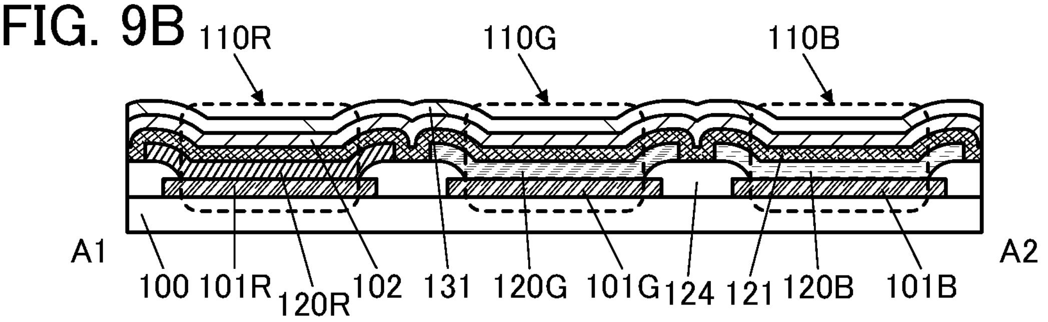
Figure 9C:
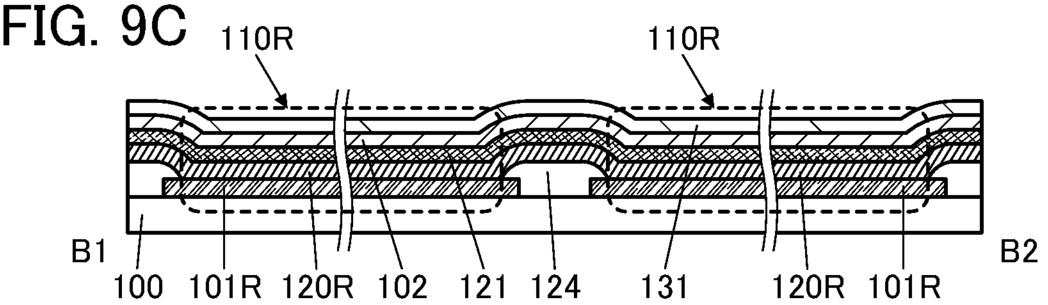

FIG. 9B is a cross-sectional schematic view along the dashed-dotted line A1-A2 in FIG. 9A. FIG. 9C is a cross-sectional schematic view along the dashed-dotted line B1-B2 in FIG. 9A.

FIG. 9B shows cross sections of the light-emitting devices 110R, 110G, and 110B. The light-emitting device 110R includes a first electrode 101R, an EL layer 120R, an EL layer 121, and the second electrode 102. The light-emitting device 110G includes a first electrode 101G, an EL layer 120G, the EL layer (electron-injection layer) 115, and the second electrode 102. The light-emitting device 110B includes a first electrode 101B, an EL layer 120B, the EL layer 121, and the second electrode 102. The EL layer 121 and the second electrode 102 are provided in common to the light-emitting devices 110R, 110G, and 110B. The EL layer 121 can also be referred to as a common layer.

The EL layer 120R included in the light-emitting device 110R contains a light-emitting organic compound that emits light with intensity at least in a red wavelength range. The EL layer 120G included in the light-emitting device 110G contains a light-emitting organic compound that emits light with intensity at least in a green wavelength range. The EL layer 120B included in the light-emitting device 110B contains a light-emitting organic compound that emits light with intensity at least in a blue wavelength range. At least one of the light-emitting devices 110R, 110G, and 110B is the light-emitting device of one embodiment of the present invention, and the light-emitting device of one embodiment of the present invention is preferably the light-emitting device 110B.

Each of the EL layers 120R, 120G, and 120B includes at least a light-emitting layer and a hole-transport layer, and may further include one or more of an electron-injection layer, an electron-transport layer, a hole-injection layer, a carrier-blocking layer, an exciton-blocking layer, and the like. The EL layer 121 does not necessarily include the light-emitting layer. The EL layer 121 is preferably an electron-injection layer. In the case where surfaces of the EL layers 120R, 120G, and 120B that are on the second electrode 102 side have a function of an electron-injection layer, the EL layer 121 does not have to be provided.

The first electrode 101R, the first electrode 101G, and the first electrode 101B are provided for the respective light-emitting devices. The second electrode 102 and the EL layer 121 are each provided as a layer common to the light-emitting devices. The hole-transport layers in the EL layers 120R, 120G, and 120B, which are separated between the light-emitting devices with different emission colors, preferably have the same structure.

A conductive film that transmits visible light is used for either the first electrode 101 or the second electrode 102, and a reflective conductive film is used for the other. When the first electrode 101 is a light-transmitting electrode and the second electrode 102 is a reflective electrode, a bottom-emission display apparatus is obtained. When the first electrode 101 is a reflective electrode and the second electrode 102 is a light-transmitting electrode, a top-emission display apparatus is obtained. Note that when both the first electrode 101 and the second electrode 102 transmit light, a dual-emission display apparatus is obtained. The light-emitting device of one embodiment of the present invention is suitable for a top-emission light-emitting device.

An insulating layer 124 is provided to cover end portions of the first electrodes 101R, 101G, and 101B. The end portions of the insulating layer 124 are preferably tapered. Note that the insulating layer 124 is not necessarily provided.

Each of the EL layers 120R, 120G, and 120B includes a region in contact with a top surface of the pixel electrode (the corresponding one of the first electrodes 101R, 101G, and 101B) and a region in contact with a surface of the insulating layer 124. End portions of the EL layers 120R, 120G, and 120B are positioned over the insulating layer 124.

Figure 40:
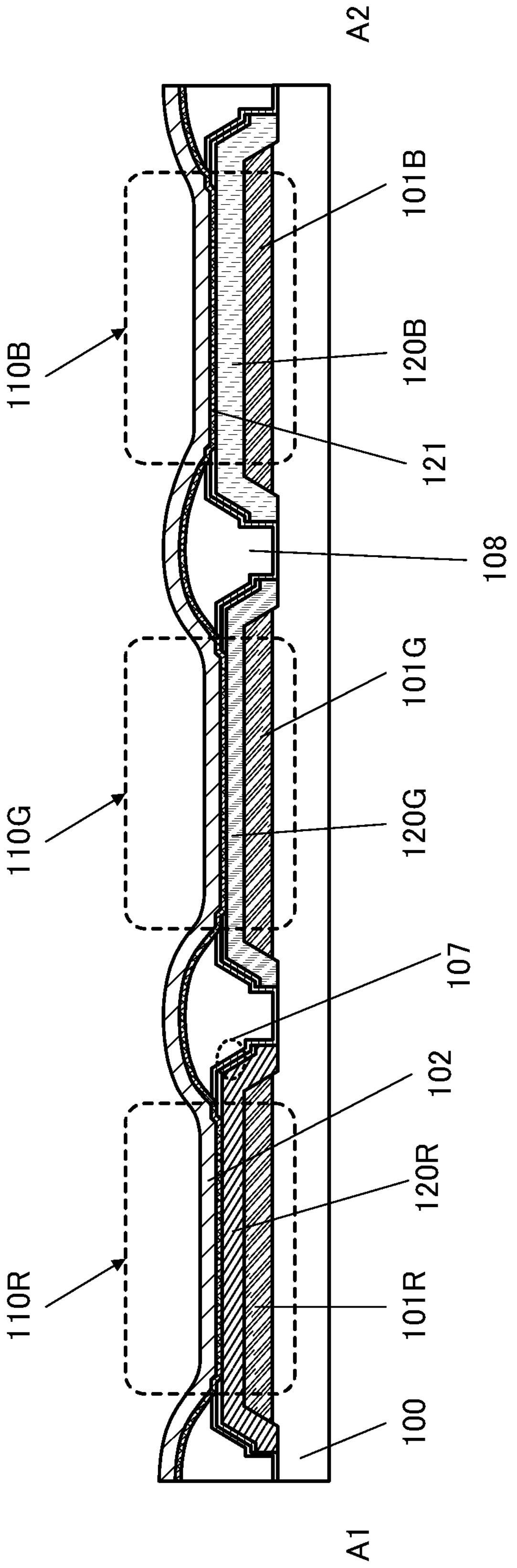
FIG. 40 illustrates a structure example of a display apparatus.

FIG. 40 shows a variation example of FIG. 9B. In FIG. 40, the end portions of the first electrodes 101R, 101G, and 101B have a tapered shape that extends toward the substrate, resulting in improvement in the coverage of the first electrodes 101R, 101G, and 101B with a film formed thereover. The end portions of the first electrode 101R, the first electrode 101G, and the first electrode 101B are covered with the EL layer 120R, the EL layer 120G, and the EL layer 120B, respectively. A sacrificial layer 107 is formed to cover the EL layers. The sacrificial layer 107 has a function of preventing the EL layers from being damaged in etching by a photolithography method. Insulating layers 108 are provided between the light-emitting devices 110R, 110G, and 110B. End portions of the insulating layers 108 have a gentle tapered shape, thereby suppressing disconnection of the EL layer 121 and the second electrode 102, which are formed later.

As illustrated in FIG. 9B and FIG. 40, there is a gap between two EL layers in the light-emitting devices of different colors. The EL layers 120R, 120G, and 120B are thus preferably provided so as not to be in contact with each other. This effectively prevents unintentional light emission from being caused by current flowing through two adjacent EL layers. As a result, the contrast can be increased to achieve a display apparatus with high display quality.

FIG. 9C shows an example in which the EL layer 120R is formed in a band shape so as to be continuous in the Y direction. When the EL layer 120R and the like are formed in a band shape, no space for dividing the layers is needed and thus a non-light-emitting area between the light-emitting devices is reduced, resulting in a higher aperture ratio. FIG. 9C shows the cross section of the light-emitting devices 110R as an example; the light-emitting devices 110G and the light-emitting devices 110B can have a similar shape. Note that the EL layer may be divided for the light-emitting devices in the Y direction.

A protective layer 131 is provided over the second electrode 102 so as to cover the light-emitting devices 110R, 110G, and 110B. The protective layer 131 has a function of preventing diffusion of impurities such as water into the light-emitting devices from the above.

The protective layer 131 can have, for example, a single-layer structure or a stacked-layer structure at least including an inorganic insulating film. Examples of the inorganic insulating film include an oxide film and a nitride film such as a silicon oxide film, a silicon oxynitride film, a silicon nitride oxide film, a silicon nitride film, an aluminum oxide film, an aluminum oxynitride film, and a hafnium oxide film. Alternatively, a semiconductor material such as indium gallium oxide or indium gallium zinc oxide may be used for the protective layer 131.

As the protective layer 131, a stack of an inorganic insulating film and an organic insulating film can be used. For example, a structure in which an organic insulating film is sandwiched between a pair of inorganic insulating films is preferable. Furthermore, it is preferable that the organic insulating film function as a planarization film. With this structure, the top surface of the organic insulating film can be flat, and accordingly, coverage of the organic insulating film with the inorganic insulating film thereover is improved, leading to an improvement in barrier properties. Moreover, this structure is preferable because when a component (e.g., a color filter, an electrode of a touch sensor, or a lens array) is provided above the protective layer 131, the flat top surface of the protective layer 131 allows the component to be less affected by an uneven shape caused by the lower components.

FIG. 9A also illustrates a connection electrode 101C that is electrically connected to the second electrode 102. The connection electrode 101C is supplied with a potential (e.g., an anode potential or a cathode potential) that is to be supplied to the second electrode 102. The connection electrode 101C is provided outside a display region where the light-emitting devices 110R and the like are arranged. In FIG. 9A, the second electrode 102 is denoted by a dashed line.

The connection electrode 101C can be provided along the outer periphery of the display region. For example, the connection electrode 101C may be provided along one side of the outer periphery of the display region or two or more sides of the outer periphery of the display region. That is, in the case where the display region has a rectangular top surface, the top surface of the connection electrode 101C can have a band shape, an L shape, a square bracket shape, a quadrangular shape, or the like.

Figure 9D:
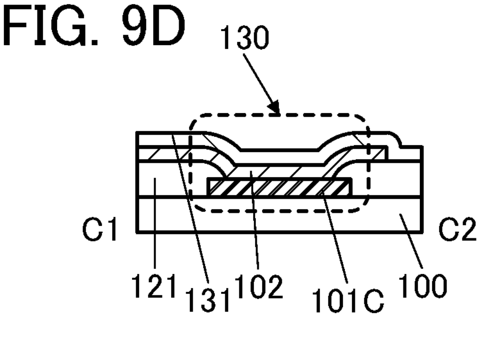

FIG. 9D is a cross-sectional schematic view along the dashed-dotted line C1-C2 in FIG. 9A. FIG. 9D illustrates a connection portion 130 at which the connection electrode 101C is electrically connected to the second electrode 102. In the connection portion 130, the second electrode 102 is provided on and in contact with the connection electrode 101C, and the protective layer 131 is provided to cover the second electrode 102. In addition, the insulating layer 124 is provided to cover end portions of the connection electrode 101C.

[Manufacturing Method Example]

Figure 10A:
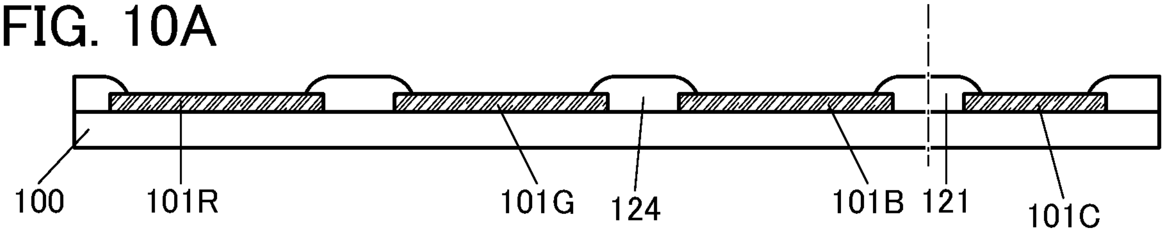
FIGS. 10A to 10F illustrate an example of a method for manufacturing a display apparatus.

An example of a method for manufacturing the display apparatus of one embodiment of the present invention will be described below with reference to drawings. Here, description is made with use of the light-emitting apparatus 450 shown in the above structure example. FIGS. 10A to 10F and FIGS. 11A to 11F are cross-sectional schematic views of steps in a method for manufacturing the display apparatus described below. In FIG. 10A and the like, cross-sectional schematic views of the connection portion 130 and the periphery thereof are also illustrated on the right side.

Note that thin films included in the display apparatus (e.g., insulating films, semiconductor films, and conductive films) can be formed by any of a sputtering method, a chemical vapor deposition (CVD) method, a vacuum evaporation method, a pulsed laser deposition (PLD) method, an atomic layer deposition (ALD) method, and the like. Examples of the CVD method include a plasma-enhanced chemical vapor deposition (PECVD) method and a thermal CVD method. An example of a thermal CVD method is a metal organic CVD (MOCVD) method.

Alternatively, thin films included in the display apparatus (e.g., insulating films, semiconductor films, and conductive films) can be formed by a method such as spin coating, dipping, spray coating, ink-jetting, dispensing, screen printing, offset printing, doctor blade coating, slit coating, roll coating, curtain coating, or knife coating.

Thin films included in the display apparatus can be processed by a photolithography method or the like. Besides, a nanoimprinting method, a sandblasting method, a lift-off method, or the like may be used to process thin films. Alternatively, island-shaped thin films may be directly formed by a film formation method using a shielding mask such as a metal mask.

There are two typical examples of photolithography methods. In one of the methods, a resist mask is formed over a thin film that is to be processed, the thin film is processed by etching or the like, and then the resist mask is removed. In the other method, a photosensitive thin film is formed and then processed into a desired shape by light exposure and development.

As light for exposure in a photolithography method, it is possible to use light with the i-line (wavelength: 365 nm), light with the g-line (wavelength: 436 nm), light with the h-line (wavelength: 405 nm), or light in which the i-line, the g-line, and the K-line are mixed. Alternatively, ultraviolet light, KrF laser light, ArF laser light, or the like can be used. Exposure may be performed by liquid immersion exposure technique. As the light for exposure, extreme ultraviolet (EUV) light or X-rays may also be used. Furthermore, instead of the light used for exposure, an electron beam can be used. It is preferable to use EUV, X-rays, or an electron beam because extremely minute processing can be performed. Note that a photomask is not needed when light exposure is performed by scanning with a beam such as an electron beam.

For etching of thin films, a dry etching method, a wet etching method, a sandblast method, or the like can be used.

In this specification and the like, a device formed using a metal mask or a fine metal mask (FMM) may be referred to as a device having a metal mask (MM) structure. In this specification and the like, a device formed without using a metal mask or an FMM may be referred to as a device having a metal maskless (MML) structure.

[Preparation for Substrate 100]

A substrate that has heat resistance high enough to withstand at least heat treatment performed later can be used as the substrate 100. When an insulating substrate is used as the substrate 100, a glass substrate, a quartz substrate, a sapphire substrate, a ceramic substrate, an organic resin substrate, or the like can be used. Alternatively, a semiconductor substrate can be used. For example, a single crystal semiconductor substrate or a polycrystalline semiconductor substrate of silicon, silicon carbide, or the like; a compound semiconductor substrate of silicon germanium or the like; an SOI substrate; or the like can be used.

As the substrate 100, it is particularly preferable to use the above-described semiconductor substrate or insulating substrate where a semiconductor circuit including a semiconductor element such as a transistor is formed. The semiconductor circuit preferably forms a pixel circuit, a gate line driver circuit (a gate driver), a source line driver circuit (a source driver), or the like. In addition to the above, an arithmetic circuit, a memory circuit, or the like may be formed.

[Formation of First Electrodes 101R, 101G, and 101B and Connection Electrode 101C]

Next, the first electrodes 101R, 101G, and 101B and the connection electrode 101C are formed over the substrate 100. First, a conductive film to be an anode (a pixel electrode) is formed, a resist mask is formed by a photolithography method, and an unnecessary portion of the conductive film is removed by etching. After that, the resist mask is removed to form the first electrodes 101R, 101G, and 101B.

In the case where a conductive film that reflects visible light is used as the pixel electrodes, it is preferable to use a material having as high a reflectivity as possible in the entire wavelength range of visible light (e.g., silver or aluminum). This can increase both outcoupling efficiency and color reproducibility of the light-emitting devices. In the case where a conductive film that reflects visible light is used as the pixel electrodes, a top-emission light-emitting apparatus in which light is extracted in the direction opposite to the substrate is obtained. In the case where a conductive film that transmits light is used as the pixel electrodes, a bottom-emission light-emitting apparatus in which light is extracted in the direction of the substrate is obtained.

[Formation of Insulating Layer 124]

Then, the insulating layer 124 is provided to cover end portions of the first electrodes 101R, 101G, and 101B (FIG. 10A). An organic insulating film or an inorganic insulating film can be used as the insulating layer 124. The end portions of the insulating layer 124 are preferably tapered to improve step coverage with EL films to be formed later. In particular, when an organic insulating film is used, a photosensitive material is preferably used so that the shape of the end portions can be easily controlled by the conditions of light exposure and development. In the case where the insulating layer 124 is not provided, the distance between the light-emitting devices can be further reduced to offer a light-emitting apparatus with higher resolution.

[Formation of EL Film 120R*b*]

Subsequently, an EL film 120R*b* that is to be the EL layer 120R is formed over the first electrode 101R, the first electrode 101G, the first electrode 101B, and the insulating layer 124.

The EL film 120R*b* includes at least a light-emitting layer containing a light-emitting material and a hole-transport layer. The EL film 120R*b* may have a structure in which one or more films functioning as an electron-injection layer, an electron-transport layer, a charge-generation layer, and a hole-injection layer are further stacked. The EL film 120R*b* can be formed by, for example, an evaporation method, a sputtering method, or an ink-jet method. Without limitation to this, the above-described film-formation method can be used as appropriate.

For example, the EL film 120R*b* is preferably a stack in which a hole-injection layer, a hole-transport layer, a light-emitting layer, and an electron-transport layer are stacked in this order. In this case, a film including an electron-injection layer can be used as the EL layer 121 formed later. In the light-emitting apparatus of one embodiment of the present invention, the electron-transport layer is provided to cover the light-emitting layer, which can inhibit the light-emitting layer from being damaged by a subsequent photolithography step or the like, so that a highly reliable light-emitting device can be fabricated.

The EL film 120R*b* is preferably formed so as not to be positioned over the connection electrode 101C. For example, in the case where the EL film 120R*b* is formed by an evaporation method (or a sputtering method), it is preferable that the EL film 120R*b* be formed using a shielding mask so as not to be formed over the connection electrode 101C, or that the EL film 120R*b* over the connection electrode 101C be removed in a later etching step.

[Formation of Sacrificial Film 144*a*]

Then, a sacrificial film 144*a* is formed to cover the EL film 120R*b*. The sacrificial film 144*a* is provided in contact with the top surface of the connection electrode 101C.

As the sacrificial film 144*a*, it is possible to use a film highly resistant to etching treatment performed on various EL films such as the EL film 120R*b*, i.e., a film having high etching selectivity with respect to the EL films. Furthermore, as the sacrificial film 144*a*, it is possible to use a film having high etching selectivity with respect to a protective film such as a protective film 146*a* described later. Moreover, as the sacrificial film 144*a*, it is possible to use a film that can be removed by a wet etching method, which is less likely to cause damage to the EL films.

The sacrificial film 144*a* can be formed using an inorganic film such as a metal film, an alloy film, a metal oxide film, a semiconductor film, or an inorganic insulating film, for example. The sacrificial film 144*a* can be formed by any of a variety of film formation methods such as a sputtering method, an evaporation method, a CVD method, and an ALD method.

The sacrificial film 144*a* can be formed using a metal material such as gold, silver, platinum, magnesium, nickel, tungsten, chromium, molybdenum, iron, cobalt, copper, palladium, titanium, aluminum, yttrium, zirconium, or tantalum or an alloy material containing the metal material. It is particularly preferable to use a low-melting-point material such as aluminum or silver.

Alternatively, the sacrificial film 144*a* can be formed using a metal oxide such as indium-gallium-zinc oxide (In-Ga-Zn oxide, also referred to as IGZO). It is also possible to use indium oxide, indium zinc oxide (In-Zn oxide), indium tin oxide (In-Sn oxide), indium titanium oxide (In-Ti oxide), indium tin zinc oxide (In-Sn-Zn oxide), indium titanium zinc oxide (In-Ti-Zn oxide), indium gallium tin zinc oxide (In-Ga-Sn-Zn oxide), or the like. Indium tin oxide containing silicon can also be used, for example.

An element M (M is one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used instead of gallium. In particular, M is preferably one or more of gallium, aluminum, and yttrium.

Alternatively, the sacrificial film 144*a* can be formed using an inorganic insulating material such as aluminum oxide, hafnium oxide, or silicon oxide.

The sacrificial film 144*a* is preferably formed using a material that can be dissolved in a solvent chemically stable with respect to at least the uppermost film of the EL film 120R*b*. Specifically, a material that will be dissolved in water or alcohol can be suitably used for the sacrificial film 144*a*. In formation of the sacrificial film 144*a*, it is preferable that application of such a material dissolved in a solvent such as water or alcohol be performed by a wet process and followed by heat treatment for evaporating the solvent. At this time, the heat treatment is preferably performed in a reduced-pressure atmosphere, in which case the solvent can be removed at a low temperature in a short time and thermal damage to the EL film 120R*b* can be reduced accordingly.

Examples of a wet film formation method that can be used to form the sacrificial film 144*a* include spin coating, dipping, spray coating, ink-jetting, dispensing, screen printing, offset printing, doctor blade coating, slit coating, roll coating, curtain coating, and knife coating.

The sacrificial film 144*a* can be formed using an organic material such as polyvinyl alcohol (PVA), polyvinylbutyral, polyvinylpyrrolidone, polyethylene glycol, polyglycerin, pullulan, water-soluble cellulose, or an alcohol-soluble polyamide resin.

[Formation of Protective Film 146*a*]

Figure 10B:
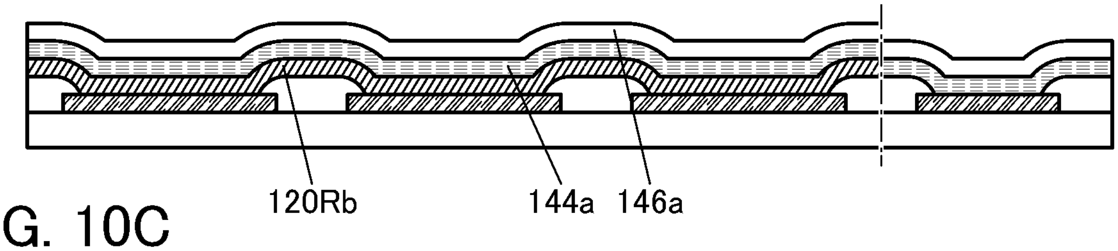

Next, the protective film 146*a* is formed over the sacrificial film 144*a* (FIG. 10B).

The protective film 146*a* is a film used as a hard mask when the sacrificial film 144*a* is etched later. In a later step of processing the protective film 146*a*, the sacrificial film 144*a* is exposed. Hence, the combination of films having high etching selectivity therebetween is selected for the sacrificial film 144*a* and the protective film 146*a*. It is thus possible to select a film that can be used as the protective film 146*a* depending on an etching condition of the sacrificial film 144*a* and an etching condition of the protective film 146*a*.

For example, in the case where dry etching using a gas containing fluorine (also referred to as a fluorine-based gas) is performed for the etching of the protective film 146*a*, the protective film 146*a* can be formed using silicon, silicon nitride, silicon oxide, tungsten, titanium, molybdenum, tantalum, tantalum nitride, an alloy containing molybdenum and niobium, an alloy containing molybdenum and tungsten, or the like. Here, a metal oxide film using IGZO, ITO, or the like is given as a film having high etching selectivity (i.e., enabling a low etching rate) in dry etching using the fluorine-based gas, and such a film can be used as the sacrificial film 144*a*.

Without being limited to the above, a material of the protective film 146*a* can be selected from a variety of materials depending on etching conditions of the sacrificial film 144*a* and the protective film 146*a*. For example, any of the films that can be used as the sacrificial film 144*a* can be used.

As the protective film 146*a*, a nitride film can be used, for example. Specifically, it is possible to use a nitride such as silicon nitride, aluminum nitride, hafnium nitride, titanium nitride, tantalum nitride, tungsten nitride, gallium nitride, or germanium nitride.

As the protective film 146*a*, an oxide film can also be used. Typically, it is possible to use a film of an oxide or an oxynitride such as silicon oxide, silicon oxynitride, aluminum oxide, aluminum oxynitride, hafnium oxide, or hafnium oxynitride.

As the protective film 146*a*, an organic film that can be used for the EL film 120R*b* or the like can be used. For example, the protective film 146*a* can be formed using the organic film that is used for the EL film 120R*b*, an EL film 120G*b*, or an EL film 120B*b*. The use of such an organic film is preferable because the same film-formation apparatus can be used for formation of the EL film 120R*b* or the like.

[Formation of Resist Mask 143*a*]

Figure 10C:
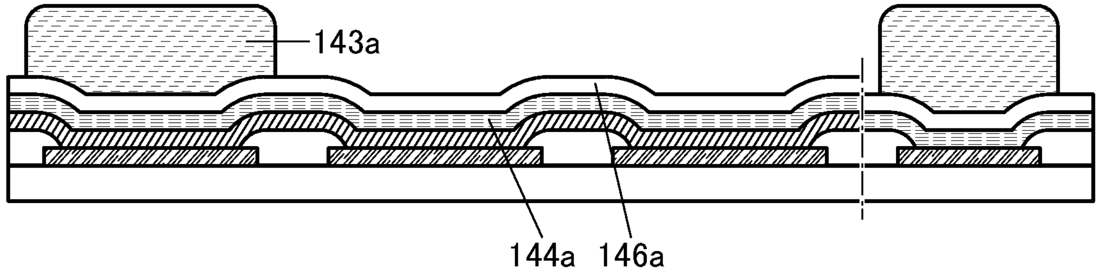

Then, a resist mask 143*a* is formed at positions that are over the protective film 146*a* and overlap the first electrode 101R and the connection electrode 101C (FIG. 10C).

For the resist mask 143*a*, a resist material containing a photosensitive resin such as a positive-type resist material or a negative-type resist material can be used.

On the assumption that the resist mask 143*a* is formed over the sacrificial film 144*a* without the protective film 146*a* therebetween, there is a risk of dissolving the EL film 120R*b* due to a solvent of the resist material if a defect such as a pinhole exists in the sacrificial film 144*a*. Such a defect can be prevented by using the protective film 146*a*.

In the case where a film in which a defect such as a pinhole is less likely to occur is used as the sacrificial film 144*a*, the resist mask 143*a* may be formed directly on the sacrificial film 144*a* without the protective film 146*a* therebetween.

[Etching of Protective Film 146*a*]

Next, part of the protective film 146*a* that is not covered with the resist mask 143*a* is removed by etching, so that a band-shaped protective layer 147*a* is formed. At this time, the protective layer 147*a* is formed also over the connection electrode 101C.

In the etching of the protective film 146*a*, an etching condition with high selectively is preferably employed so that the sacrificial film 144*a* is not removed by the etching. Either wet etching or dry etching can be performed for the etching of the protective film 146*a*. With use of dry etching, a shrinkage of the pattern of the protective film 146*a* can be inhibited.

[Removal of Resist Mask 143*a*]

Figure 10D:
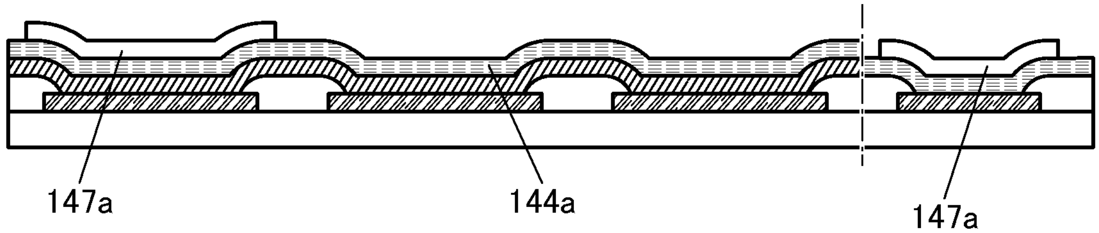

Then, the resist mask 143*a* is removed (FIG. 10D).

The resist mask 143*a* can be removed by wet etching or dry etching. It is particularly preferable to remove the resist mask 143*a* by dry etching using an oxygen gas as an etching gas (also referred to as plasma ashing).

At this time, the removal of the resist mask 143*a* is performed in a state where the EL film 120R*b* is covered with the sacrificial film 144*a*; thus, the EL film 120R*b* is less likely to be affected by the removal. In particular, if the EL film 120R*b* is exposed to oxygen, the electrical characteristics of the light-emitting device are adversely affected in some cases. Therefore, it is preferable that the EL film 120R*b* be covered by the sacrificial film 144*a* when etching using an oxygen gas, such as plasma ashing, is performed.

[Etching of Sacrificial Film 144*a*]

Figure 10E:
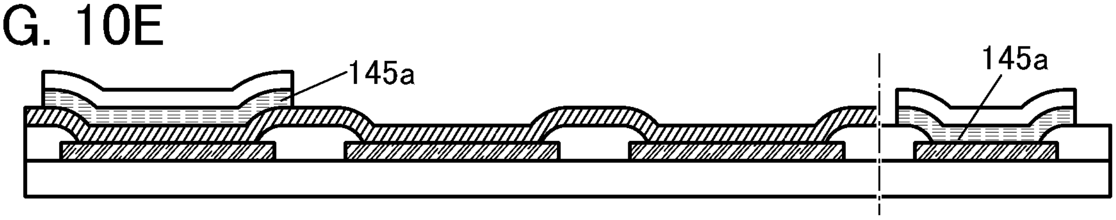

Next, part of the sacrificial film 144*a* that is not covered with the protective layer 147*a* is removed by etching with use of the protective layer 147*a* as a mask, so that a band-shaped sacrificial layer 145*a* is formed (FIG. 10E). At this time, the sacrificial layer 145*a* is formed also over the connection electrode 101C.

Either wet etching or dry etching can be performed for the etching of the sacrificial film 144*a*. The use of dry etching is preferable, in which case a shrinkage of the pattern of the sacrificial film 144*a* can be inhibited.

[Etching of EL Film 120R*b* and Protective Layer 147*a*]

Figure 10F:
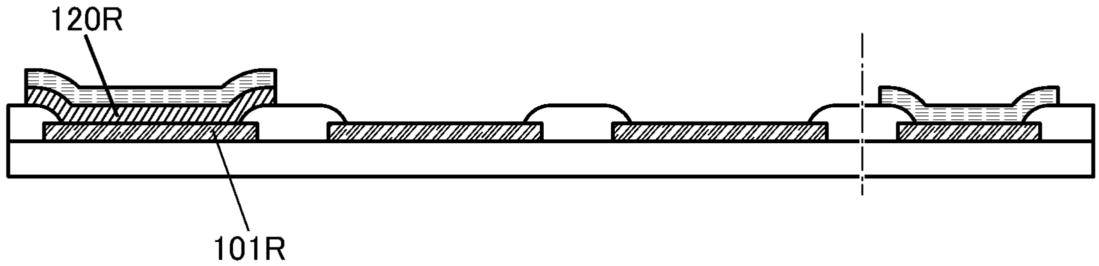

Then, the protective layer 147*a* and part of the EL film 120R*b* that is not covered with the sacrificial layer 145*a* are removed by etching at the same time, so that the band-shaped EL layer 120R is formed (FIG. 10F). At this time, the protective layer 147*a* over the connection electrode 101C is also removed.

The EL film 120R*b* and the protective layer 147*a* are preferably etched by the same treatment so that the process can be simplified to reduce the fabrication cost of the display apparatus.

For the etching of the EL film 120R*b*, it is particularly preferable to perform dry etching using an etching gas that does not contain oxygen as its main component. This is because a change in properties of the EL film 120R*b* is inhibited, and a highly reliable display apparatus is achieved. Examples of the etching gas that does not contain oxygen as its main component include $CF_4$, $C_4F_8$, $SF_6$, $CHF_3$, $Cl_2$, $H_2O$, $BCl_3$, and a rare gas such as $H_2$ and He.

Alternatively, a mixed gas of the above gas and a dilution gas that does not contain oxygen can be used as the etching gas.

Note that the etching of the EL film 120R*b* and the etching of the protective layer 147*a* may be performed separately. In that case, either the etching of the EL film 120R*b* or the etching of the protective layer 147*a* may be performed first.

At this step, the EL layer 120R and the connection electrode 101C are covered with the sacrificial layer 145*a*.

[Formation of EL Film 120G*b*]

Subsequently, the EL film 120G*b* that is to be the EL layer 120G is formed over the sacrificial layer 145*a*, the insulating layer 124, the first electrode 101G, and the first electrode 101B. At this time, similarly to the EL film 120R*b*, the EL film 120G*b* is preferably not provided over the connection electrode 101C.

The above description of the EL film 120R*b* can be referred to for the formation method of the EL film 120G*b*.

[Formation of Sacrificial Film 144*b*]

Then, a sacrificial film 144*b* is formed over the EL film 120G*b*. The sacrificial film 144*b* can be formed in a manner similar to that for the sacrificial film 144*a*. In particular, the sacrificial film 144*b* and the sacrificial film 144*a* are preferably formed using the same material.

At this time, the sacrificial film 144*a* is formed also over the connection electrode 101C so as to cover the sacrificial layer 145*a*.

[Formation of Protective Film 146*b*]

Next, a protective film 146*b* is formed over the sacrificial film 144*b*. The protective film 146*b* can be formed in a manner similar to that for the protective film 146*a*. In particular, the protective film 146*b* and the protective film 146*a* are preferably formed using the same material.

[Formation of Resist Mask 143*b*]

Figure 11A:
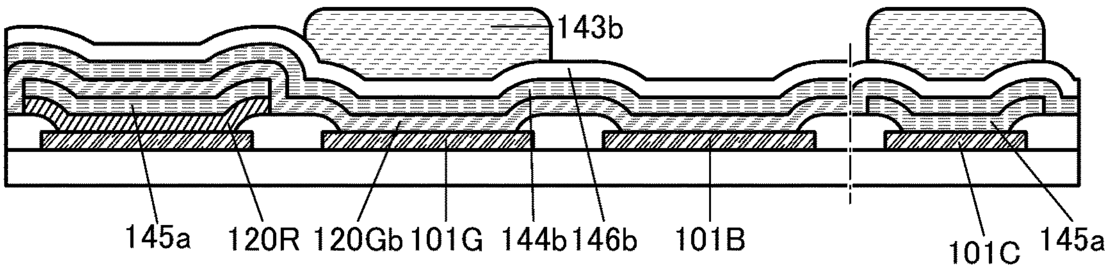
FIGS. 11A to 11F illustrate an example of a method for manufacturing a display apparatus.

Then, a resist mask 143*b* is formed in regions that are over the protective film 146*b* and overlap the first electrode 101G and the connection electrode 101C (FIG. 11A).

The resist mask 143*b* can be formed in a manner similar to that for the resist mask 143*a*.

[Etching of Protective Film 146*b*]

Figure 11B:
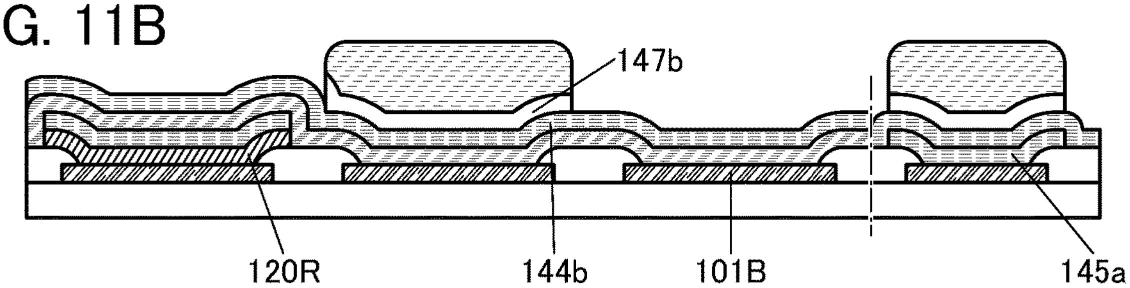

Next, part of the protective film 146*b* that is not covered with the resist mask 143*b* is removed by etching, so that a band-shaped protective layer 147*b* is formed (FIG. 11B). At this time, the protective layer 147*b* is formed also over the connection electrode 101C.

The above description of the protective film 146*a* can be referred to for the etching of the protective film 146*b*.

[Removal of Resist Mask 143*b*]

Then, the resist mask 143*b* is removed. The above description of the resist mask 143*a* can be referred to for the etching of the resist mask 143*b*.

[Etching of Sacrificial Film 144*b*]

Next, part of the sacrificial film 144*b* that is not covered with the protective layer 147*b* is removed by etching with use of the protective layer 147*b* as a mask, so that a band-shaped sacrificial layer 145*b* is formed. At this time, the sacrificial layer 145*b* is formed also over the connection electrode 101C. The sacrificial layer 145*a* and the sacrificial layer 145*b* are stacked over the connection electrode 101C.

The above description of the sacrificial film 144*a* can be referred to for the etching of the sacrificial film 144*b*.

[Etching of EL Film 120G*b* and Protective Layer 147*b*]

Figure 11C:
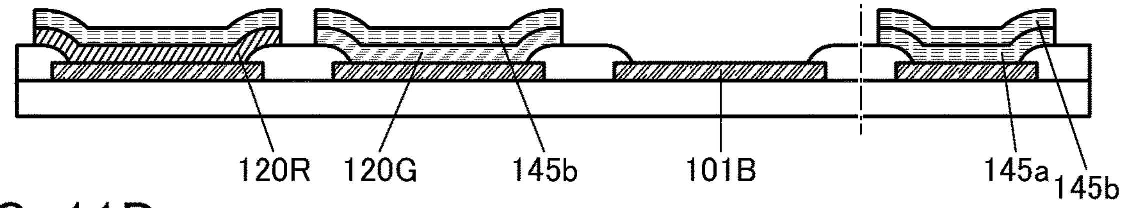

Next, the protective layer 147*b* and part of the EL film 120G*b* that is not covered with the sacrificial layer 145*b* are removed by etching at the same time, so that the band-shaped EL layer 120G is formed (FIG. 11C). At this time, the protective layer 147*b* over the connection electrode 101C is also removed.

The above description of the EL film 120R*b* and the protective layer 147*a* can be referred to for the etching of the EL film 120G*b* and the protective layer 147*b*.

At this time, the EL layer 120R is protected by the sacrificial layer 145*a*, and thus can be prevented from being damaged in the etching step of the EL film 120G*b*.

In the above manner, the band-shaped EL layer 120R and the band-shaped EL layer 120G can be separately formed with high alignment accuracy.

[Formation of EL Layer 120B]

Figure 11D:
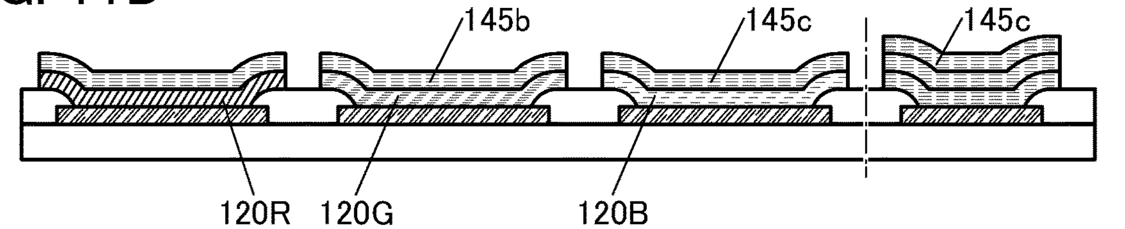

The above steps are performed on the EL film 120B*b* (not illustrated), whereby the island-shaped EL layer 120B and an island-shaped sacrificial layer 145*c* can be formed (FIG. 11D).

That is, after the EL layer 120G is formed, the EL film 120B*b*, a sacrificial film 144*c*, a protective film 146*c*, and a resist mask 143*c* (each of which is not illustrated) are sequentially formed. After that, the protective film 146*c* is etched to form a protective layer 147*c* (not illustrated); then, the resist mask 143*c* is removed. Subsequently, the sacrificial film 144*c* is etched to form the sacrificial layer 145*c*. Then, the protective layer 147*c* and the EL film 120B*b* are etched to form the band-shaped EL layer 120B.

After the EL layer 120B is formed, the sacrificial layer 145*c* is also formed over the connection electrode 101C. The sacrificial layer 145*a*, the sacrificial layer 145*b*, and the sacrificial layer 145*c* are stacked over the connection electrode 101C.

[Removal of Sacrificial Layers]

Figure 11E:
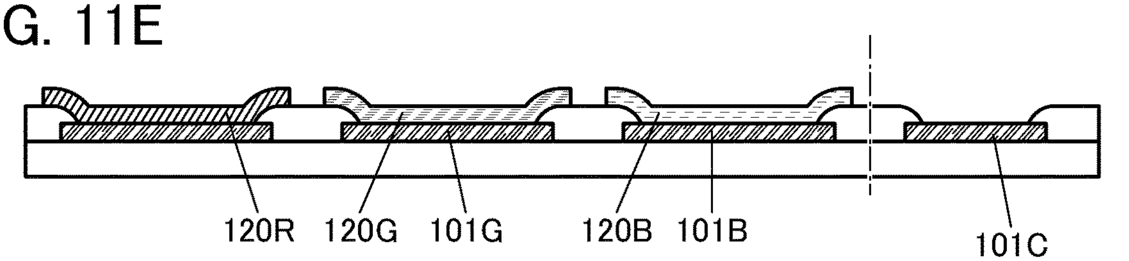

Next, the sacrificial layer 145*a*, the sacrificial layer 145*b*, and the sacrificial layer 145*c* are removed, whereby the top surfaces of the EL layer 120R, the EL layer 120G, and the EL layer 120B are exposed (FIG. 11E). At this time, the top surface of the connection electrode 101C is also exposed.

The sacrificial layers 145*a*, 145*b*, and 145*c* can be removed by wet etching or dry etching. At this time, a method that causes as little damage as possible to the EL layers 120R, 120G, and 120B is preferably employed. In particular, a wet etching method is preferably used. For example, wet etching using a tetramethyl ammonium hydroxide (TMAH) solution, diluted hydrofluoric acid, oxalic acid, phosphoric acid, acetic acid, nitric acid, or a mixed solution thereof is preferably performed.

Alternatively, the sacrificial layers 145*a*, 145*b*, and 145*c* are preferably removed by being dissolved in a solvent such as water or alcohol. Examples of the alcohol in which the sacrificial layers 145*a*, 145*b*, and 145*c* can be dissolved include ethyl alcohol, methyl alcohol, isopropyl alcohol (IPA), and glycerin.

After the sacrificial layers 145*a*, 145*b*, and 145*c* are removed, drying treatment is preferably performed in order to remove water contained in the EL layers 120R, 120G, and 120B and water adsorbed on the surfaces of the EL layers 120R, 120G, and 120B. For example, heat treatment is preferably performed in an inert gas atmosphere or a reduced-pressure atmosphere. The heat treatment can be performed with a substrate temperature higher than or equal to 50° C. and lower than or equal to 200° C., preferably higher than or equal to 60° C. and lower than or equal to 150° C., further preferably higher than or equal to 70° C. and lower than or equal to 120° C. The heat treatment is preferably performed in a reduced-pressure atmosphere because drying at a lower temperature is possible.

In the above manner, the EL layer 120R, the EL layer 120G, and the EL layer 120B can be separately formed.

[Formation of EL Layer 121]

Then, the EL layer 121 is formed to cover the EL layer 120R, the EL layer 120G, and the EL layer 120B.

The EL layer 121 can be formed in a manner similar to that for the EL film 120R*b* and the like. In the case where the EL layer 121 is formed by an evaporation method, the EL layer 121 is preferably formed using a shielding mask so as not to be formed over the connection electrode 101C.

[Formation of Second Electrode 102]

Figure 11F:
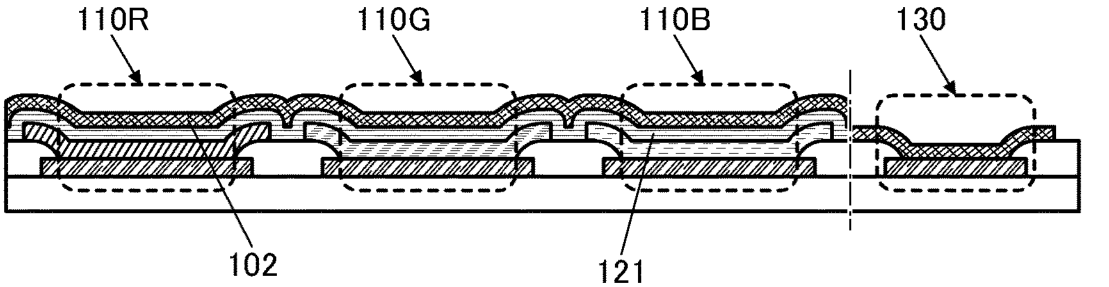

Next, the second electrode 102 is formed to cover the EL layer 121 and the connection electrode 101C (FIG. 11F).

The second electrode 102 can be formed by a film formation method such as an evaporation method or a sputtering method. Alternatively, a film formed by an evaporation method and a film formed by a sputtering method may be stacked. At this time, the second electrode 102 is preferably formed so as to cover a region where the electron-injection layer 115 is formed. That is, a structure in which end portions of the electron-injection layer 115 are overlapped by the second electrode 102 can be obtained. The second electrode 102 is preferably formed using a shielding mask.

The second electrode 102 is electrically connected to the connection electrode 101C outside the display region.

[Formation of Protective Layer]

Then, a protective layer is formed over the second electrode 102. An inorganic insulating film used for the protective layer is preferably formed by a sputtering method, a PECVD method, or an ALD method. In particular, an ALD method is preferable because a film deposited by ALD has good step coverage and is less likely to cause a defect such as pinhole. An organic insulating film is preferably formed by an ink-jet method because a uniform film can be formed in a desired area.

In the above manner, the light-emitting apparatus of one embodiment of the present invention can be manufactured.

Although the second electrode 102 and the electron-injection layer 115 are formed so as to have different top surface shapes, they may be formed in the same region.

Embodiment 6

Figure 12A:
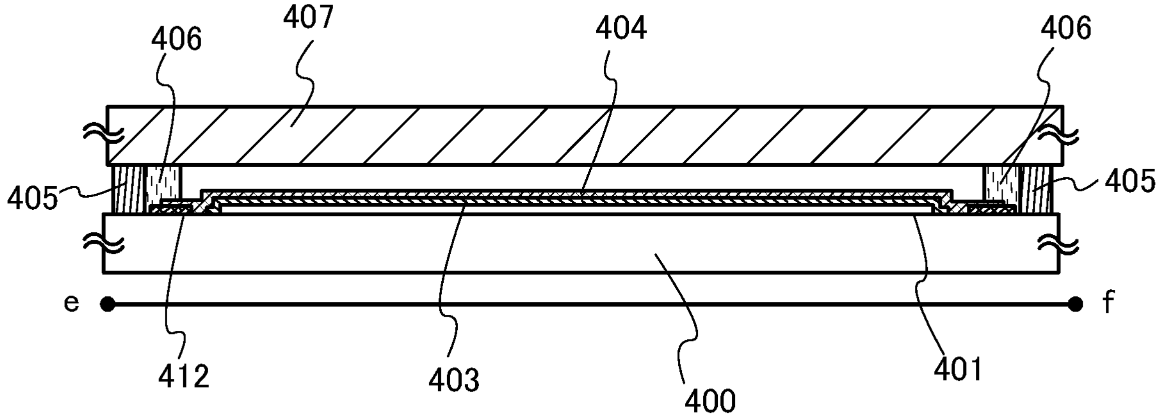
FIGS. 12A and 12B illustrate a lighting apparatus.
Figure 12B:
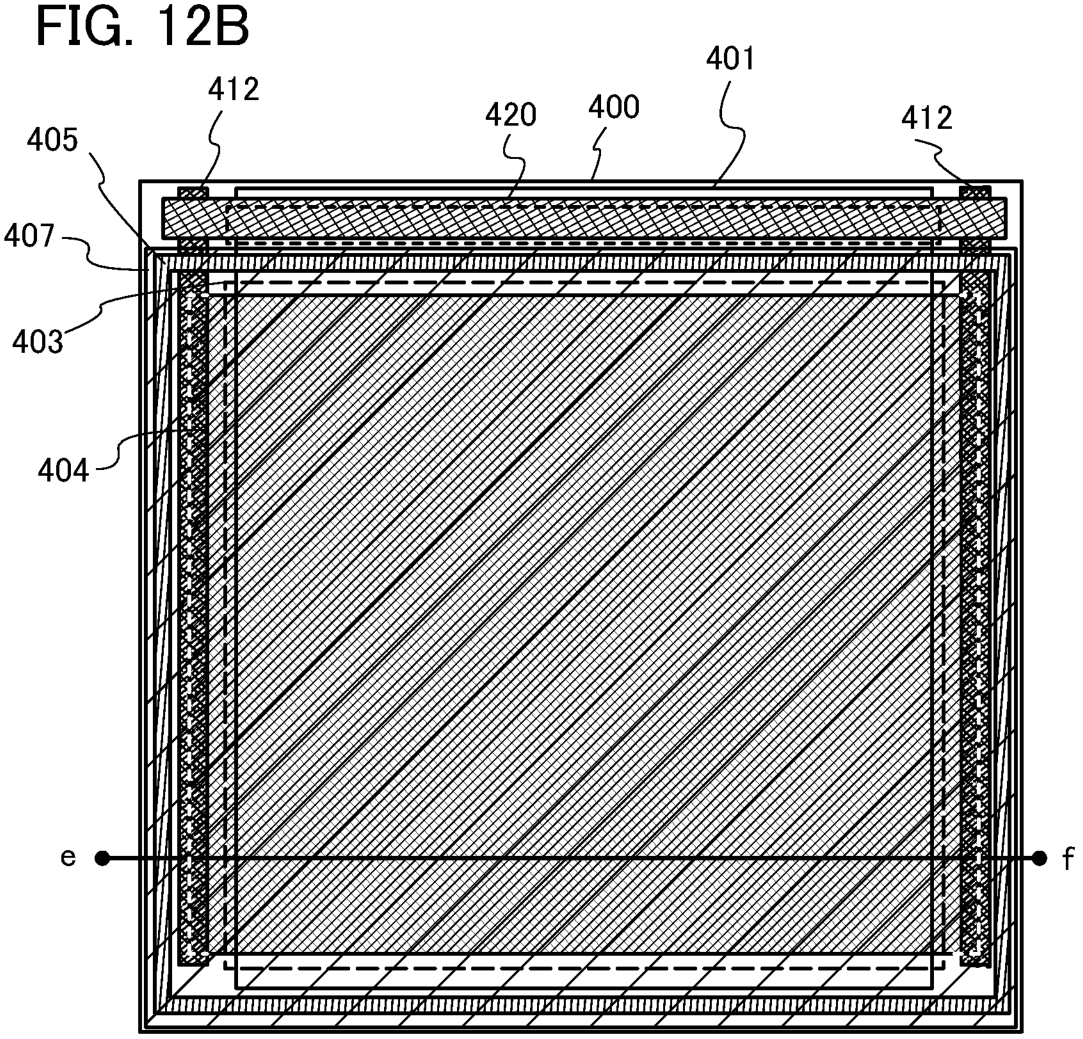

In this embodiment, an example in which the light-emitting device described in Embodiments 1 to 3 is used in a lighting apparatus will be described with reference to FIGS. 12A and 12B. FIG. 12B is a top view of the lighting apparatus, and FIG. 12A is a cross-sectional view along the line e-f in FIG. 12B.

In the lighting apparatus in this embodiment, an anode 401 is formed over a substrate 400 that is a support and has a light-transmitting property. The anode 401 corresponds to the first electrode 101 in Embodiment 1. When light is extracted through the anode 401, the anode 401 is formed using a material having a light-transmitting property.

A pad 412 for supplying voltage to a cathode 404 is provided over the substrate 400.

An EL layer 403 is formed over the anode 401. The structure of the EL layer 403 corresponds to, for example, the structure of the EL layer 103 in Embodiment 1. The corresponding description can be referred to for the structure.

The cathode 404 is formed to cover the EL layer 403. The cathode 404 corresponds to the second electrode 102 in Embodiment 1. The cathode 404 is formed using a material having high reflectivity when light is extracted through the anode 401. The cathode 404 is connected to the pad 412, thereby receiving voltage.

As described above, the lighting apparatus described in this embodiment includes a light-emitting device including the anode 401, the EL layer 403, and the cathode 404. Since the light-emitting device has high emission efficiency, the lighting apparatus in this embodiment can have low power consumption.

The substrate 400 provided with the light-emitting device having the above structure and a sealing substrate 407 are fixed and sealed with sealing materials 405 and 406, whereby the lighting apparatus is completed. It is possible to use only either the sealing material 405 or the sealing material 406. The inner sealing material 406 (not illustrated in FIG. 12B) can be mixed with a desiccant that enables moisture to be adsorbed, which increases reliability.

When parts of the pad 412 and the anode 401 are extended to the outside of the sealing materials 405 and 406, the extended parts can serve as external input terminals. An IC chip 420 mounted with a converter or the like may be provided over the external input terminals.

The lighting apparatus described in this embodiment includes the light-emitting device described in Embodiments 1 to 3 as an EL element; thus, the lighting apparatus can consume less power.

This embodiment can be freely combined with any of the other embodiments.

Embodiment 7

In this embodiment, examples of electronic appliances each including the light-emitting device described in any of Embodiments 1 to 3 will be described. The light-emitting device described in any of Embodiments 1 to 3 has high emission efficiency and low power consumption. As a result, the electronic appliances described in this embodiment can each include a light-emitting portion with low power consumption.

Examples of the electronic appliance including the above light-emitting device include television devices (also referred to as TVs or television receivers), monitors for computers and the like, digital cameras, digital video cameras, digital photo frames, cellular phones (also referred to as mobile phones or mobile phone devices), portable game machines, portable information terminals, audio playback devices, and large game machines such as pachinko machines. Specific examples of these electronic appliances are shown below.

Figure 13A:
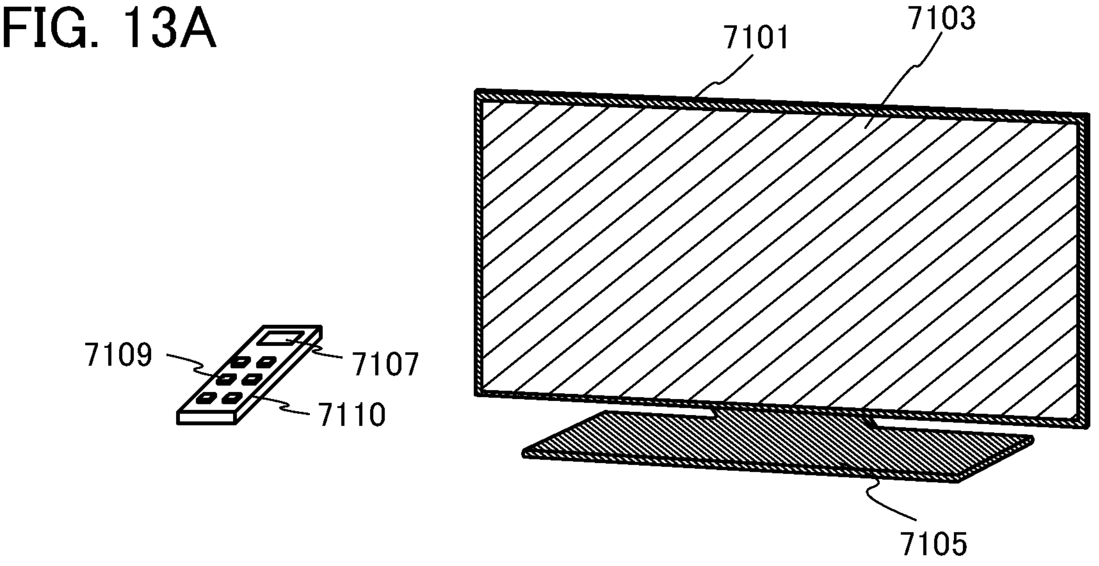
Figure 13A:
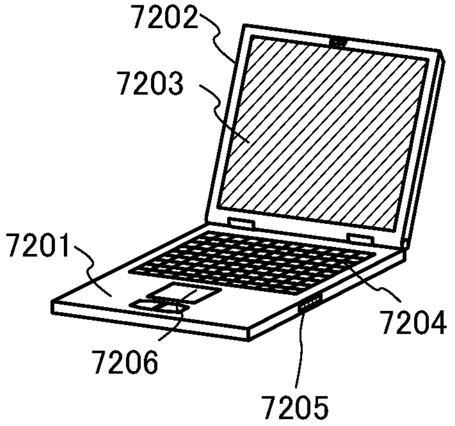
Figure 13A:
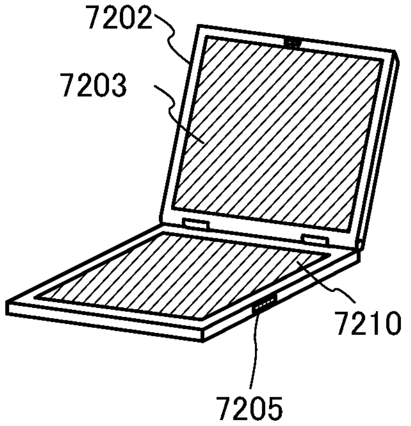

FIG. 13A illustrates an example of a television device. In the television device, a display portion 7103 is incorporated in a housing 7101. Here, the housing 7101 is supported by a stand 7105. Images can be displayed on the display portion 7103, and in the display portion 7103, the light-emitting devices described in any of Embodiments 1 to 3 are arranged in a matrix.

The television device can be operated with an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110. The light-emitting devices described in any of Embodiments 1 to 3 can also be arranged in a matrix in the display portion 7107.

Note that the television device is provided with a receiver, a modem, and the like. With the use of the receiver, a general television broadcast can be received. Moreover, when the television device is connected to a communication network with or without wires via the modem, one-way (from a sender to a receiver) or two-way (between a sender and a receiver or between receivers) data communication can be performed.

FIG. 13B1 illustrates a computer that includes a main body 7201, a housing 7202, a display portion 7203, a keyboard 7204, an external connection port 7205, a pointing device 7206, and the like. Note that this computer is manufactured using the light-emitting devices that are described in any of Embodiments 1 to 3 and arranged in a matrix in the display portion 7203. The computer illustrated in FIG. 13B1 may have a structure illustrated in FIG. 13B2. The computer in FIG. 13B2 is provided with a display portion 7210 instead of the keyboard 7204 and the pointing device 7206. The display portion 7210 is a touch panel, and input operation can be performed by touching display for input on the display portion 7210 with a finger or a dedicated pen. The display portion 7210 can also display images other than the display for input. The display portion 7203 may also be a touch panel. Connecting the two screens with a hinge can prevent troubles; for example, the screens can be prevented from being cracked or broken while the computer is being stored or carried.

Figure 13C:
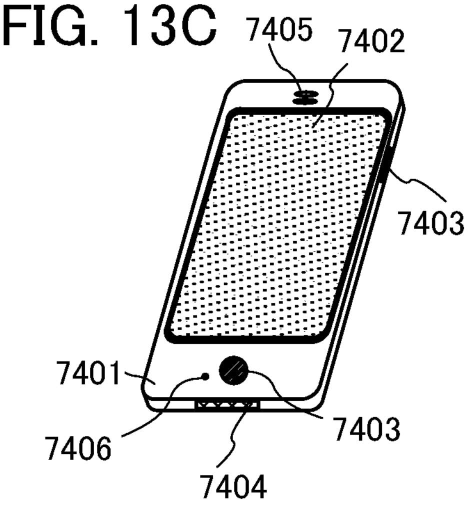

FIG. 13C illustrates an example of a portable terminal. A mobile phone is provided with a display portion 7402 incorporated in a housing 7401, operation buttons 7403, an external connection port 7404, a speaker 7405, a microphone 7406, and the like. Note that the mobile phone has the display portion 7402 in which the light-emitting devices described in any of Embodiments 1 to 3 are arranged in a matrix.

The portable terminal illustrated in FIG. 13C can be configured such that data can be input by touching the display portion 7402 with a finger or the like. In this case, operations such as making a call and creating an e-mail can be performed by touching the display portion 7402 with a finger or the like.

The display portion 7402 has mainly three screen modes. The first mode is a display mode mainly for displaying images. The second mode is an input mode mainly for inputting data such as text. The third mode is a display-and-input mode in which the two modes, the display mode and the input mode, are combined.

For example, in the case of making a call or creating an e-mail, the text input mode mainly for inputting text is selected for the display portion 7402 so that text displayed on the screen can be input. In this case, it is preferable to display a keyboard or number buttons on almost the entire screen of the display portion 7402.

When a sensing device including a sensor for detecting inclination, such as a gyroscope sensor or an acceleration sensor, is provided inside the portable terminal, display on the screen of the display portion 7402 can be automatically changed in direction by determining the orientation of the portable terminal (whether the portable terminal is placed horizontally or vertically).

The screen modes are switched by touching the display portion 7402 or operating the operation buttons 7403 of the housing 7401. Alternatively, the screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed for a certain period while a signal sensed by an optical sensor in the display portion 7402 is sensed, the screen mode may be controlled to be switched from the input mode to the display mode.

The display portion 7402 can also function as an image sensor. For example, an image of a palm print, a fingerprint, or the like is taken when the display portion 7402 is touched with the palm or the finger, whereby personal authentication can be performed. Furthermore, by providing a backlight or a sensing light source each of which emits near-infrared light in the display portion, an image of a finger vein, a palm vein, or the like can be taken.

Note that the structure described in this embodiment can be combined with any of the structures described in Embodiments 1 to 6 as appropriate.

As described above, the application range of the light-emitting apparatus including the light-emitting device described in any of Embodiments 1 to 3 is wide so that the light-emitting apparatus can be applied to electronic appliances in a variety of fields. By using the light-emitting device described in any of Embodiments 1 to 3, an electronic appliance with low power consumption can be obtained.

Figure 14A:
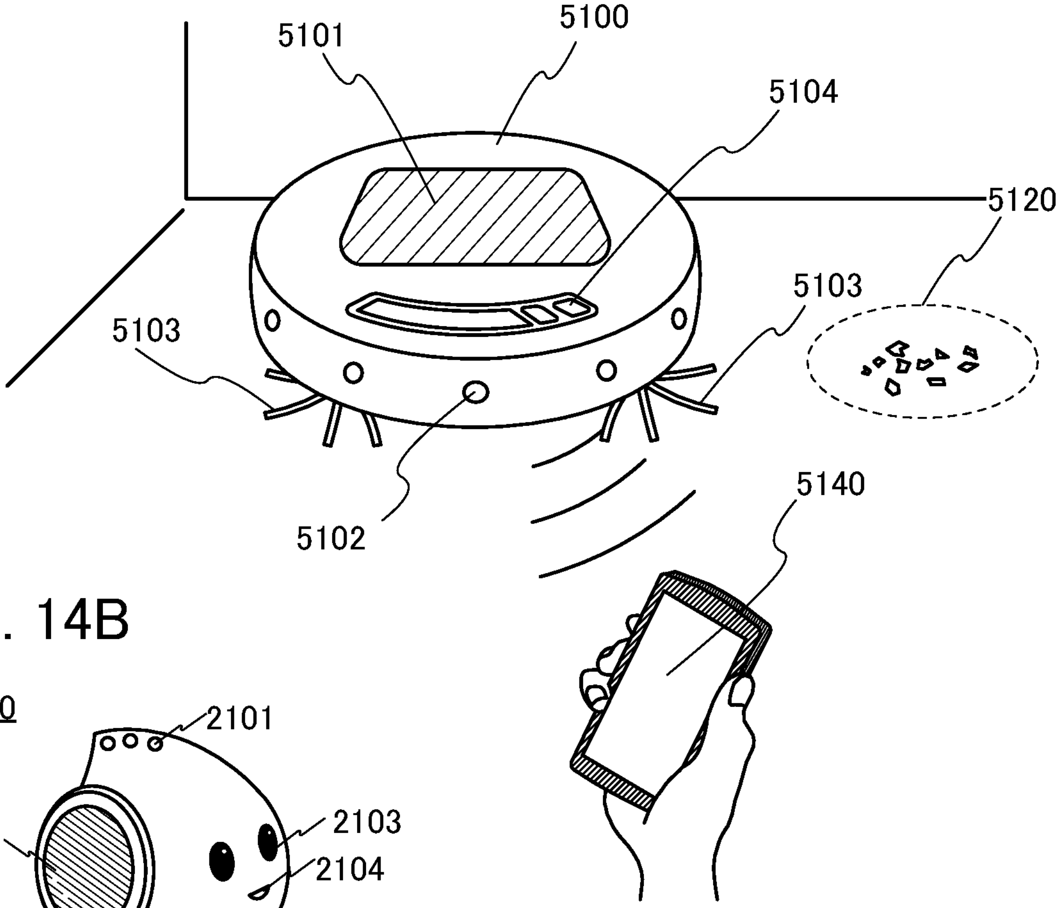
FIGS. 14A to 14C illustrate electronic appliances.

FIG. 14A is a schematic view illustrating an example of a cleaning robot.

A cleaning robot 5100 includes a display 5101 on its top surface, a plurality of cameras 5102 on its side surface, a brush 5103, and operation buttons 5104. Although not illustrated, the bottom surface of the cleaning robot 5100 is provided with a tire, an inlet, and the like. Furthermore, the cleaning robot 5100 includes various sensors such as an infrared sensor, an ultrasonic sensor, an acceleration sensor, a piezoelectric sensor, an optical sensor, and a gyroscope sensor. The cleaning robot 5100 has a wireless communication means.

The cleaning robot 5100 is self-propelled, detects dust 5120, and vacuums the dust through the inlet provided on the bottom surface.

The cleaning robot 5100 can determine whether there is an obstacle such as a wall, furniture, or a step by analyzing images taken by the cameras 5102. When the cleaning robot 5100 detects an object that is likely to be caught in the brush 5103 (e.g., a wire) by image analysis, the rotation of the brush 5103 can be stopped.

The display 5101 can display the remaining capacity of a battery, the amount of collected dust, and the like. The display 5101 may display a path on which the cleaning robot 5100 has run. The display 5101 may be a touch panel, and the operation buttons 5104 may be provided on the display 5101.

The cleaning robot 5100 can communicate with a portable electronic device 5140 such as a smartphone. Images taken by the cameras 5102 can be displayed on the portable electronic device 5140. Accordingly, an owner of the cleaning robot 5100 can monitor his/her room even when the owner is not at home. The owner can also check the display on the display 5101 by the portable electronic device 5140 such as a smartphone.

The light-emitting apparatus of one embodiment of the present invention can be used for the display 5101.

Figure 14B:
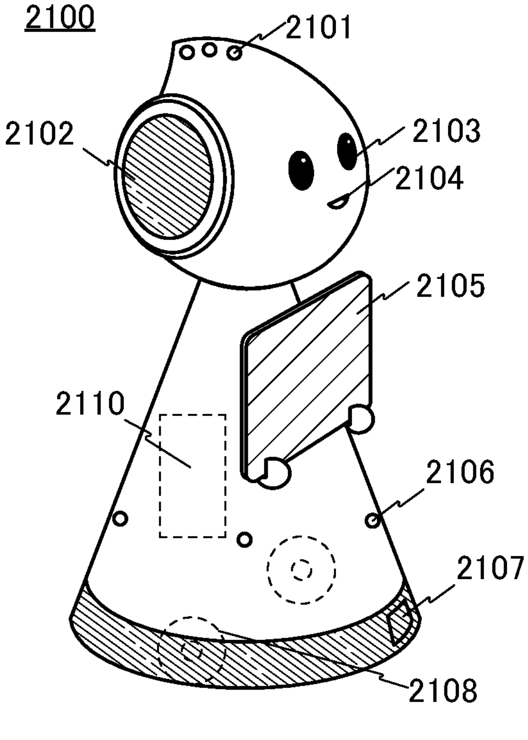

A robot 2100 illustrated in FIG. 14B includes an arithmetic device 2110, an illuminance sensor 2101, a microphone 2102, an upper camera 2103, a speaker 2104, a display 2105, a lower camera 2106, an obstacle sensor 2107, and a moving mechanism 2108.

The microphone 2102 has a function of detecting a speaking voice of a user, an environmental sound, and the like. The speaker 2104 has a function of outputting sound. The robot 2100 can communicate with a user by using the microphone 2102 and the speaker 2104.

The display 2105 has a function of displaying various kinds of information. The robot 2100 can display information desired by a user on the display 2105. The display 2105 may be provided with a touch panel. Moreover, the display 2105 may be a detachable information terminal, in which case charging and data communication can be performed when the display 2105 is set at the home position of the robot 2100.

The upper camera 2103 and the lower camera 2106 each have a function of taking an image of the surroundings of the robot 2100. The obstacle sensor 2107 can detect an obstacle in the direction where the robot 2100 advances with the moving mechanism 2108. The robot 2100 can move safely by recognizing the surroundings with the upper camera 2103, the lower camera 2106, and the obstacle sensor 2107. The light-emitting apparatus of one embodiment of the present invention can be used for the display 2105.

Figure 14C:
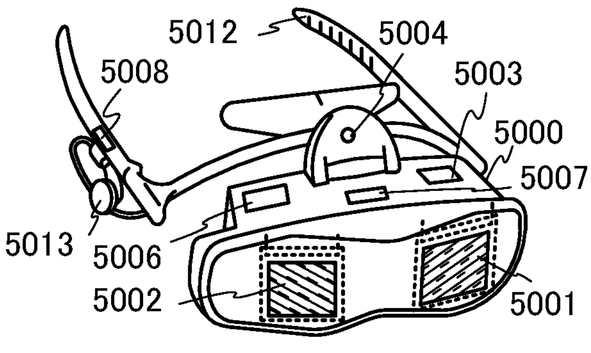

FIG. 14C illustrates an example of a goggle-type display. The goggle-type display includes, for example, a housing 5000, a display portion 5001, a speaker 5003, an LED lamp 5004, operation keys (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, a second display portion 5002, a support 5012, and an earphone 5013.

The light-emitting apparatus of one embodiment of the present invention can be used for the display portion 5001 and the second display portion 5002.

Figure 15:
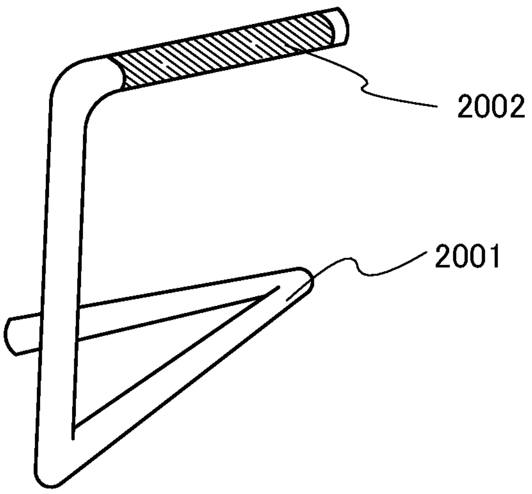
FIG. 15 illustrates a lighting apparatus.

FIG. 15 illustrates an example in which the light-emitting device described in any of Embodiments 1 to 3 is used in a table lamp which is a lighting apparatus. The table lamp illustrated in FIG. 15 includes a housing 2001 and a light source 2002, and the lighting apparatus described in Embodiment 6 may be used for the light source 2002.

Figure 16:
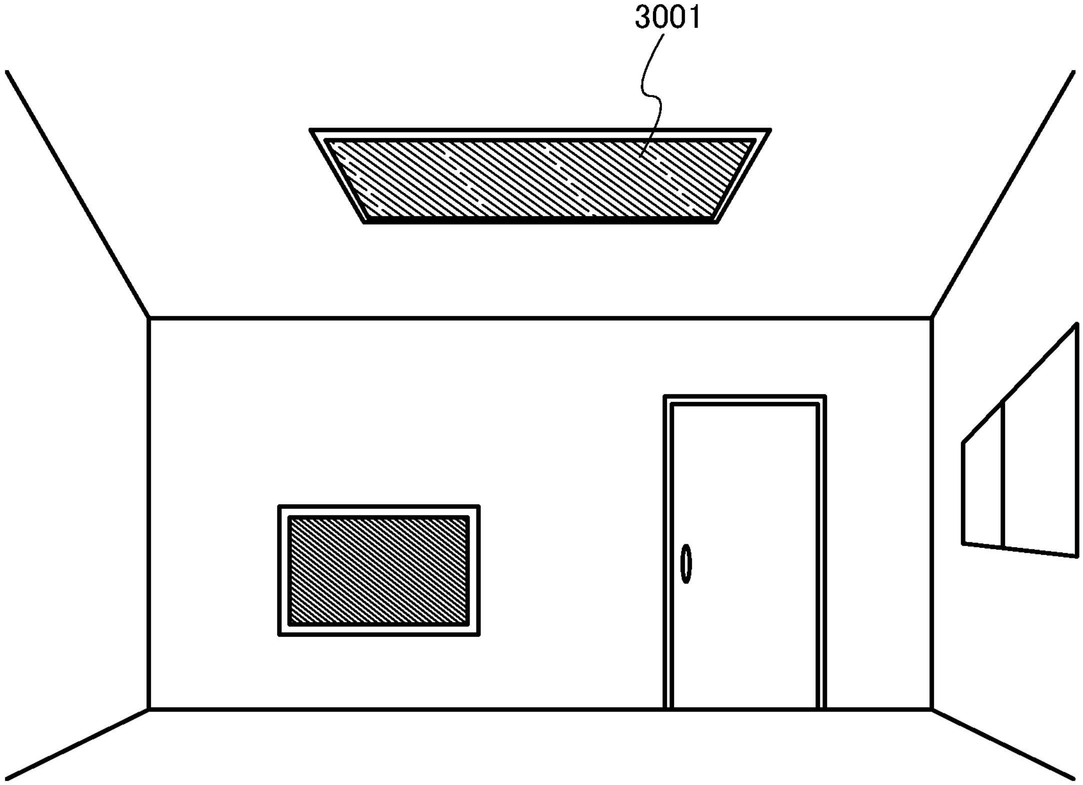
FIG. 16 illustrates a lighting apparatus.

FIG. 16 illustrates an example in which the light-emitting device described in any of Embodiments 1 to 3 is used for an indoor lighting apparatus 3001. Since the light-emitting device described in any one of Embodiments 1 to 3 has high emission efficiency, the lighting apparatus can have low power consumption. Furthermore, since the light-emitting device described in any of Embodiments 1 to 3 can have a large area, the light-emitting device can be used for a large-area lighting apparatus. Moreover, since the light-emitting device described in any of Embodiments 1 to 3 is thin, the light-emitting device can be used for a lighting apparatus having a reduced thickness.

Figure 17:
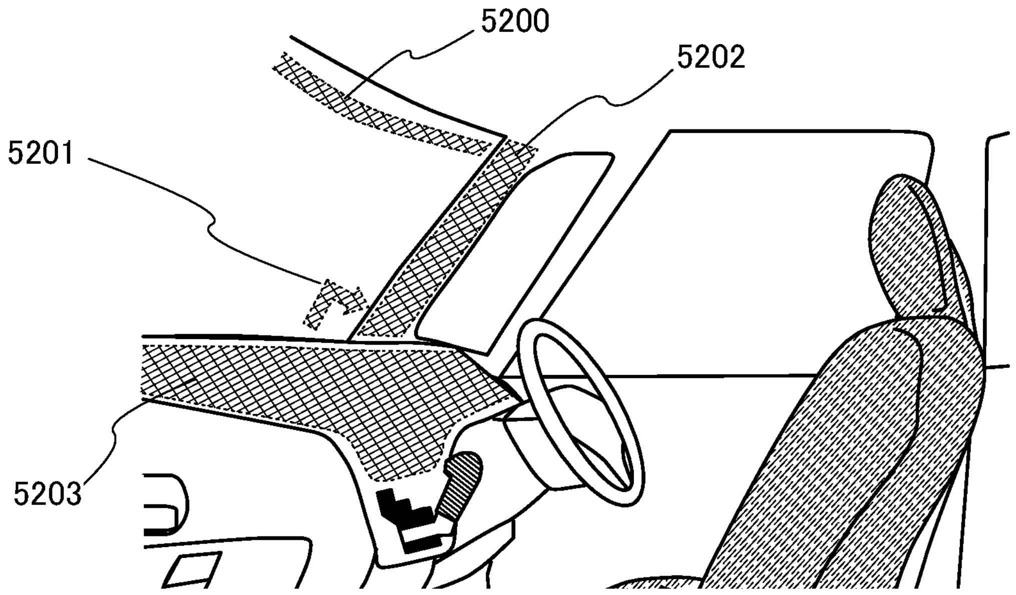
FIG. 17 illustrates in-vehicle display apparatuses and lighting apparatuses.

The light-emitting device described in any of Embodiments 1 to 3 can also be used for an automobile windshield and an automobile dashboard. FIG. 17 illustrates one mode in which the light-emitting devices described in any of Embodiments 1 to 3 are used for an automobile windshield and an automobile dashboard. Display regions 5200 to 5203 each include the light-emitting device described in any of Embodiments 1 to 3.

The display regions 5200 and 5201 are display apparatuses which are provided in the automobile windshield and in which the light-emitting devices described in any of Embodiments 1 to 3 are incorporated. When both the anode and the cathode are formed using electrodes having a light-transmitting property, the light-emitting devices described in any of Embodiments 1 to 3 can be used to form what is called a see-through display apparatus, through which the opposite side can be seen. Such see-through display apparatuses can be provided even in the automobile windshield without hindering the view. In the case where a driving transistor or the like is provided, a transistor having a light-transmitting property, such as an organic transistor including an organic semiconductor material or a transistor including an oxide semiconductor, is preferably used.

A display apparatus incorporating the light-emitting apparatus described in any one of Embodiments 1 to 3 is provided in the display region 5202 in a pillar portion. The display region 5202 can compensate for the view hindered by the pillar by displaying an image taken by an imaging unit provided in the car body. Similarly, the display region 5203 provided in the dashboard portion can compensate for the view hindered by the car body by displaying an image taken by an imaging unit provided on the outside of the automobile; thus, blind areas can be eliminated to enhance the safety. Images that compensate for the areas which a driver cannot see enable the driver to ensure safety easily and comfortably.

The display region 5203 can display a variety of kinds of information such as navigation data, the speed, the number of rotations, and air-condition setting. The content or layout of the display can be changed as appropriate according to the user's preference. Note that such information can also be displayed on the display regions 5200 to 5202. The display regions 5200 to 5203 can also be used as lighting apparatuses.

Figure 18A:
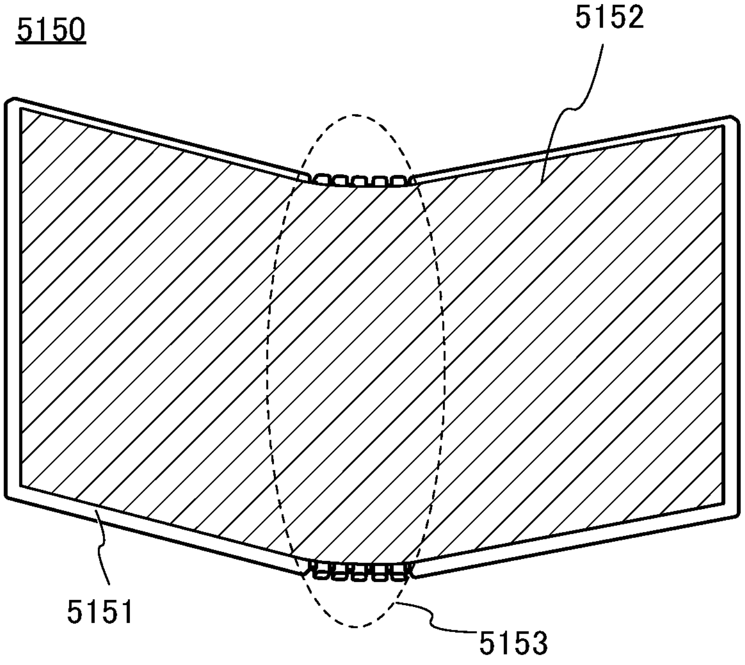
FIGS. 18A and 18B illustrate an electronic appliance.
Figure 18B:
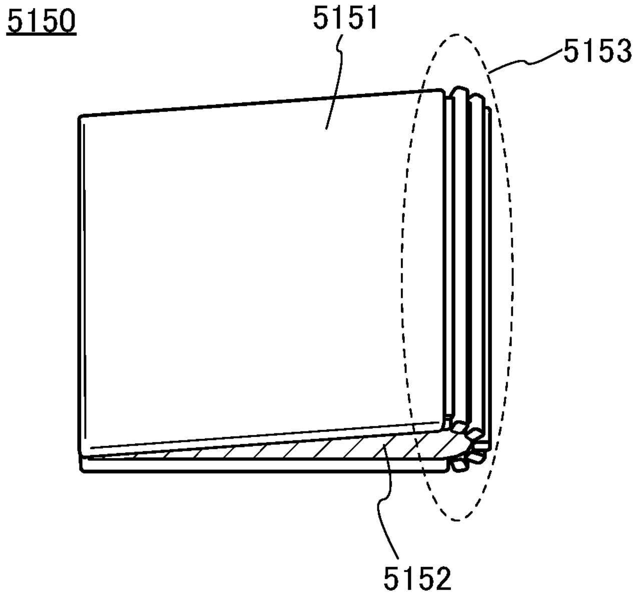

FIGS. 18A and 18B illustrate a foldable portable information terminal 5150. The foldable portable information terminal 5150 includes a housing 5151, a display region 5152, and a bend portion 5153. FIG. 18A illustrates the portable information terminal 5150 that is opened. FIG. 18B illustrates the portable information terminal 5150 that is folded. Despite its large display region 5152, the portable information terminal 5150 is compact in size and has excellent portability when folded.

The display region 5152 can be folded in half with the bend portion 5153. The bend portion 5153 includes a flexible member and a plurality of supporting members. When the display region is folded, the flexible member expands. The bend portion 5153 has a radius of curvature greater than or equal to 2 mm, preferably greater than or equal to 3 mm.

Note that the display region 5152 may be a touch panel (an input/output device) including a touch sensor (an input device). The light-emitting apparatus of one embodiment of the present invention can be used for the display region 5152.

Figure 19A:
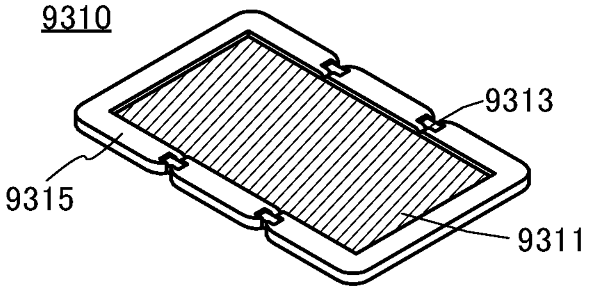
FIGS. 19A to 19C illustrate an electronic appliance.
Figure 19B:
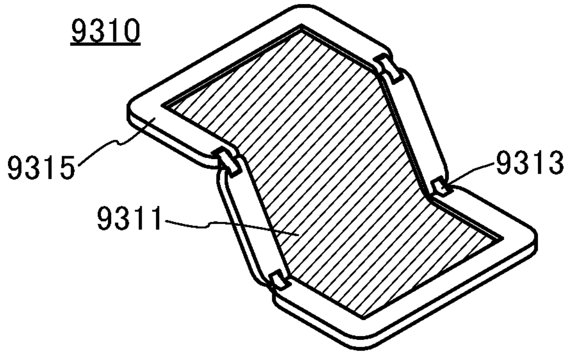
Figure 19C:
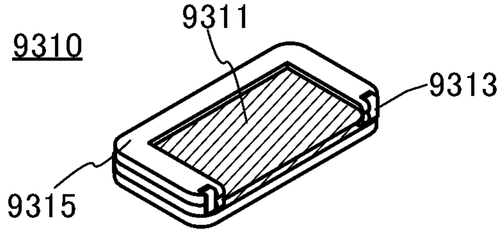

FIGS. 19A to 19C illustrate a foldable portable information terminal 9310. FIG. 19A illustrates the portable information terminal 9310 that is opened. FIG. 19B illustrates the portable information terminal 9310 that is being opened or being folded. FIG. 19C illustrates the portable information terminal 9310 that is folded. The portable information terminal 9310 is highly portable when folded. The portable information terminal 9310 is highly browsable when opened because of a seamless large display region.

A display panel 9311 is supported by three housings 9315 joined together by hinges 9313. Note that the display panel 9311 may be a touch panel (an input/output device) including a touch sensor (an input device). By folding the display panel 9311 at the hinges 9313 between two housings 9315, the portable information terminal 9310 can be reversibly changed in shape from the opened state to the folded state. The light-emitting apparatus of one embodiment of the present invention can be used for the display panel 9311.

Example 1

This example will describe a light-emitting device 1 of the light-emitting device of one embodiment of the present invention, and comparative light-emitting devices 1-1 to 1-3 for comparison. Structural formulae of organic compounds used in this example are shown below.

[Chemical Formula 4]

(i)

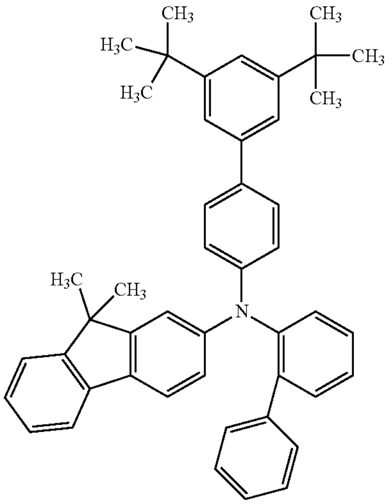

mmtBuBioFBi (ii)

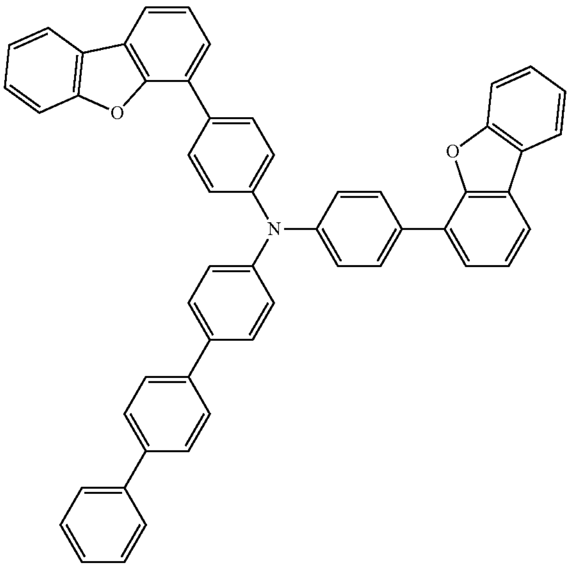

DBfBB1TP (iii)

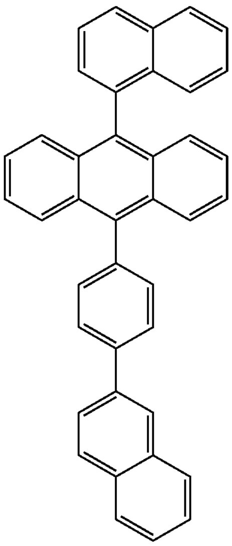

αN-βNPAnth (iv)

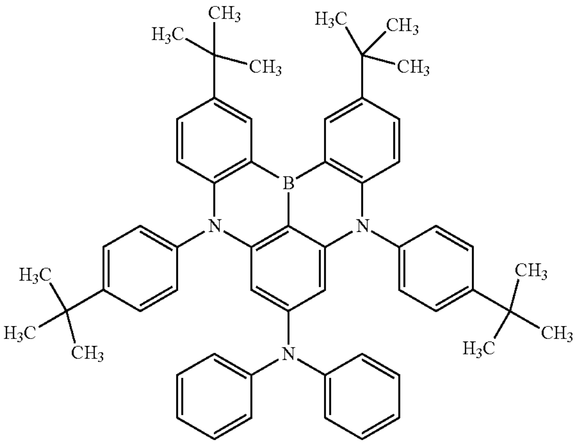

DPhA-tBu4DABNA

-continued
(v)
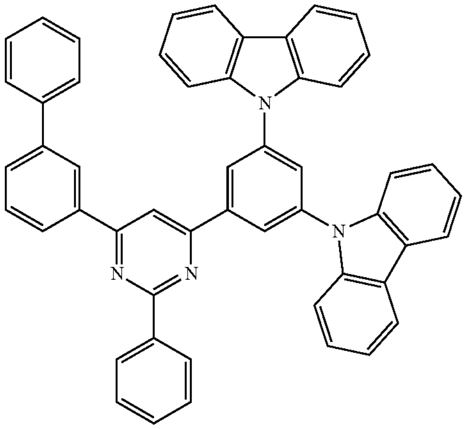
6mBP-4Cz2PPm
(vi)
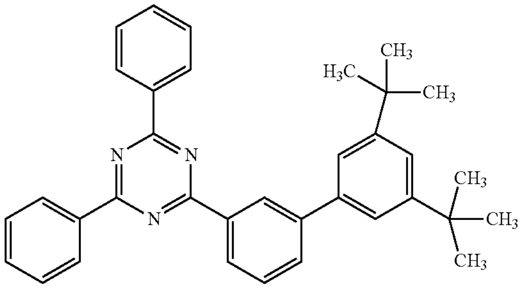
mmtBumBPTzn
(vii)
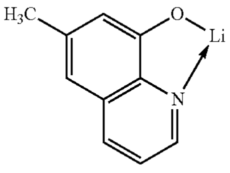
Li-6mq
(viii)
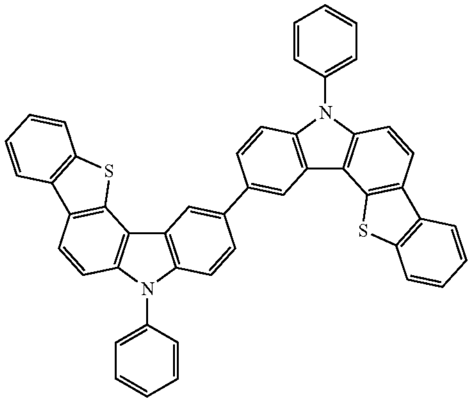
BisBTc
(ix)
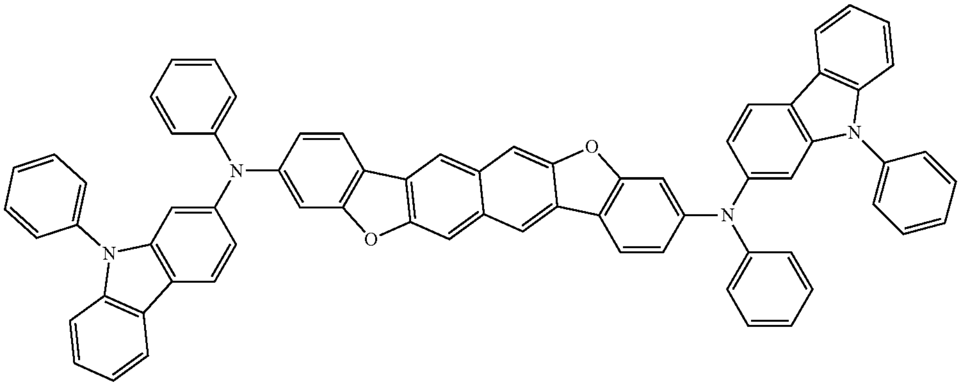
3, 10PCA2Nbf(IV)-02

-continued (x)

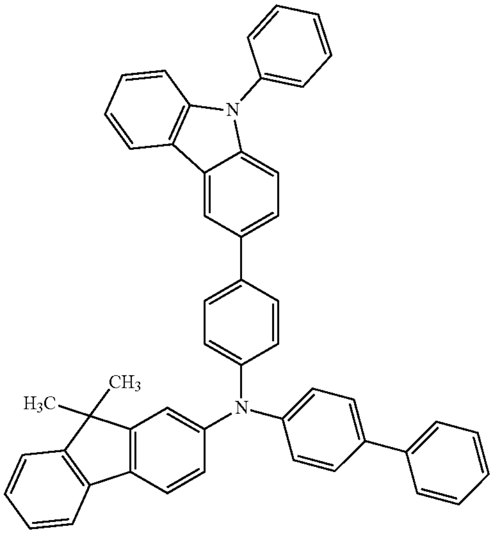

PCBBiF (xi)

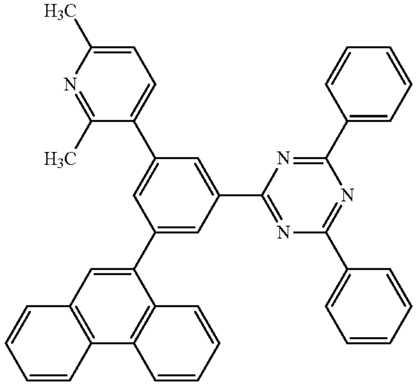

mPn-mDMePyPTzn (xii)

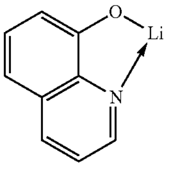

Liq (xiii)

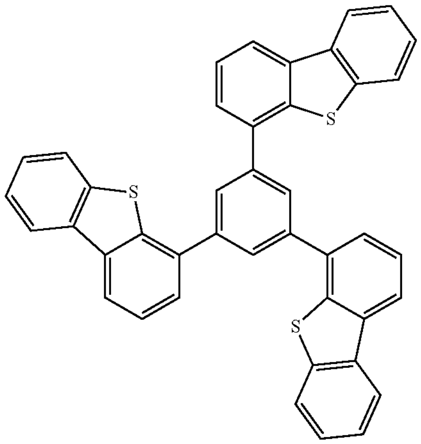

DBT3P-II (Method for Fabricating Light-Emitting Device 1)

First, as a reflective electrode, silver (Ag) was deposited over a glass substrate to a thickness of 100 nm by a sputtering method, and then, as a transparent electrode, indium tin oxide containing silicon oxide (ITSO) was deposited to a thickness of 5 nm by a sputtering method, whereby the first electrode 101 was formed. The electrode area was set to 4 $mm^2$ (2 mm×2 mm). Note that the transparent electrode functions as the anode, and the transparent electrode and the reflective electrode can be collectively regarded as the first electrode 101.

Next, in pretreatment for forming the light-emitting device over a substrate, a surface of the substrate was washed with water, baking was performed at 200° C. for one hour, and then UV ozone treatment was performed for 370 seconds.

After that, the substrate was transferred into a vacuum evaporation apparatus where the pressure was reduced to approximately 10' Pa, vacuum baking was performed at 170° C. for 30 minutes in a heating chamber of the vacuum evaporation apparatus, and then the substrate was cooled down for approximately 30 minutes.

Next, the substrate provided with the first electrode 101 was fixed to a substrate holder provided in the vacuum evaporation apparatus such that the surface on which the first electrode 101 was formed faced downward. Then, N-3',5'-ditertiarybutyl-1,1'-biphenyl-4-yl-N-1,1'-biphenyl-2-yl-9,9-dimethyl-9H-fluoren-2-amine (abbreviation: mmtBuBioFBi) represented by Structural Formula (i) above and a fluorine-containing electron acceptor material with a molecular weight of 672 (OCHD-003) were deposited on the first electrode 101 to a thickness of 10 nm by co-evaporation such that the weight ratio of mmtBuBioFBi to OCHD-003 was 1:0.05, whereby the hole-injection layer 111 was formed.

Over the hole-injection layer 111, mmtBuBioFBi was deposited to a thickness of 120 nm by evaporation, whereby the hole-transport layer 112 was formed.

Subsequently, over the hole-transport layer 112, N,N-bis [4-(dibenzofuran-4-yl)phenyl]-4-amino-p-terphenyl (abbreviation: DBfBB1TP) represented by Structural Formula (ii) was deposited to a thickness of 10 nm by evaporation, whereby an electron-blocking layer was formed.

Then, 9-(1-naphthyl)-10-[4-(2-naphthyl)phenyl]anthracene (abbreviation: αN-βNPAnth) represented by Structural Formula (iii) and 2,12-di(tert-butyl)-5,9-di(4-tert-butylphenyl)-N,N-diphenyl-5H, 9H-[1,4]benzazaborino[2,3,4-*kl*]

phenazaborin-7-amine (abbreviation: DPhA-tBu4DABNA) represented by Structural Formula (iv) were deposited to a thickness of 20 nm by co-evaporation such that the weight ratio of aN-βNPAnth to DPhA-tBu4DABNA was 1:0.015, whereby the light-emitting layer 113 was formed.

After that, 6-(1,1'-biphenyl-3-yl)-4-[3,5-bis(9H-carbazol-9-yl)phenyl]-2-phenylpyrimidine (abbreviation: 6mBP-4Cz2PPm) represented by Structural Formula (v) was deposited to a thickness of 10 nm by evaporation, whereby a hole-blocking layer was formed. Then, 2-{(3',5'-di-tert-butyl)-1,1'-biphenyl-3-yl}-4,6-diphenyl-1,3,5-triazine (abbreviation: mmtBumBPTzn) represented by Structural Formula (vi) and 6-methyl-8-quinolinolato-lithium (abbreviation: Li-6_mq_) represented by Structural Formula (vii) were deposited to a thickness of 20 nm by co-evaporation such that the weight ratio of mmtBumBPTzn to Li-6_mq_ was 1:1, whereby the electron-transport layer 114 was formed.

After the electron-transport layer 114 was formed, lithium fluoride (LiF) was deposited to a thickness of 1 nm by evaporation to form the electron-injection layer 115, and lastly silver (Ag) and magnesium (Mg) were deposited to a thickness of 15 nm by co-evaporation such that the volume ratio of Ag to Mg was 1:0.1 to form the second electrode 102, whereby the light-emitting device 1 was fabricated. The second electrode 102 is a transflective electrode having a function of reflecting light and a function of transmitting light; thus, the light-emitting device 1 is a top emission device in which light is extracted through the second electrode 102. Over the second electrode 102, 5,5'-diphenyl-2,2'-di-5H-[1]benzothieno[3,2-c]carbazole (abbreviation: BisBTc) represented by Structural Formula (viii) was deposited by evaporation to a thickness of 65 nm as a cap layer so that outcoupling efficiency can be improved.

(Method for Fabricating Comparative Light-Emitting Device 1-1)

The comparative light-emitting device 1-1 was fabricated in the same manner as the light-emitting device 1 except that the hole-transport layer 112 in the light-emitting device 1 was deposited to a thickness of 145 nm, and that 3,10-bis[N-(9-phenyl-9H-carbazol-2-yl)-N-phenylamino]naphtho[2,3-b;6,7-V]bisbenzofuran (abbreviation: 3,10PCA2Nbf(IV)-02) represented by Structural Formula (ix) was used instead of DPhA-tBu4DABNA in the light-emitting layer 113.

(Method for Fabricating Comparative Light-Emitting Device 1-2)

The comparative light-emitting device 1-2 was fabricated in the same manner as the comparative light-emitting device 1-1 except that mmtBuBioFBi in the hole-injection layer 111 and the hole-transport layer 112 of the comparative light-emitting device 1-1 was replaced with N-(1,1'-biphenyl-4-yl)-N-[4-(9-phenyl-9H-carbazol-3-yl)phenyl]-9,9-dimethyl-9H-fluoren-2-amine (abbreviation: PCBBiF) represented by Structural Formula (x); mmtBumBPTzn in the electron-transport layer 114 was replaced with 2-[3-(2,6-dimethyl-3-pyridinyl)-5-(9-phenanthrenyl)phenyl]-4,6-diphenyl-1,3,5-trizazine (abbreviation: mPn-mDMePyPTzn) represented by Structural Formula (xi) and Li-6_mq_ was replaced with 8-quinolinolato-lithium (abbreviation: Liq) represented by Structural Formula (xii); BisBTc in the cap layer was replaced with 4,4',4"-(benzene-1,3,5-triyl)tri(dibenzothiophene) (abbreviation: DBT3P-II) represented by Structural Formula (xiii); and the transparent electrode, the hole-transport layer 112, and the cap layer were deposited by evaporation to thicknesses of 10 nm, 105 nm, and 70 nm, respectively.

(Method for Fabricating Comparative Light-Emitting Device 1-3)

The comparative light-emitting device 1-3 was fabricated in the same manner as the comparative light-emitting device 1-2 except that 3,10PCA2Nbf(IV)-02 in the light-emitting layer 113 of the comparative light-emitting device 1-2 was replaced with DPhA-tBu4DABNA.

One of the reasons some layers have different thicknesses between the light-emitting devices is that as the light-emitting device 1 and the comparative light-emitting devices 1-1 to 1-3, a light-emitting device exhibiting the highest blue index (BI (cd/A/y)) is selected from several light-emitting devices that differ only in film thickness, in consideration of a deposition deviation due to an evaporation apparatus. Another reason is a difference in the refractive index between the materials used. In other words, in this example, influences of a difference in the refractive index and a deviation of the optical path length due to the evaporation apparatus are eliminated, and the light-emitting devices that exhibit the highest possible BI for the light-emitting substance in the target device structure are compared to each other.

The light-emitting device 1 includes a low refractive index layer and a light-emitting substance with a narrow emission spectrum. The comparative light-emitting device 1-1 includes a low refractive index layer and an ordinary light-emitting substance. The comparative light-emitting device 1-2 includes an ordinary EL layer and an ordinary light-emitting substance. The comparative light-emitting device 1-3 includes an ordinary EL layer and a light-emitting substance with a narrow emission spectrum.

The structures of the light-emitting device 1 and the comparative light-emitting devices 1-1 to 1-3 are listed in the following tables.

TABLE 1

| | Thickness | Device 1 | Comparative device 1-1 | Comparative device 1-2 | Comparative device 1-3 |
|---|---|---|---|---|---|
| Cap layer | *4 | BisBTc | | DBT3P-II | |
| Cathode | 15 nm | Ag:Mg (10:1) | | | |
| Electron-injection layer | 1 nm | LiF | | | |
| Electron-transport layer | 20 nm | mmtBumBPTzn:Li-6mq (1:1) | | mPn-mDMePyPTzn:Liq (1:1) | |
| Hole-blocking layer | 10 nm | 6mBP-4Cz2PPm | | | |
| Light-emitting layer | 20 nm | αN-βNPAnth: *3 (1:0.015) | | | |
| Electron-blocking | 10 nm | DBfBB1TP | | | |

TABLE 1-continued

| | Thickness | Device 1 | Comparative device 1-1 | Comparative device 1-2 | Comparative device 1-3 |
|---|---|---|---|---|---|
| Hole-transport | *2 | mmtBuBioFBi | | PCBBiF | |
| Hole-injection layer | 10 nm | mmtBuBioFBi:OCHD-003 (1:0.05) | | PCBBiF:OCHD-003 (1:0.05) | |
| Anode | *1 | ITSO | | | |
| Reflective electrode | 100 nm | Ag | | | |

TABLE 2

| | Device 1 | Comparative device 1-1 | Comparative device 1-2 | Comparative device 1-3 |
|---|---|---|---|---|
| *1 | 5 nm | | 10 nm | |
| *2 | 120 nm | 145 nm | 105 nm | |
| *3 | DPhA-tBu4DABNA | 3,10PCA2 Nbf(IV)-02 | | DPhA-tBu4DABNA |
| *4 | 65 nm | | 70 nm | |

Figure 20:
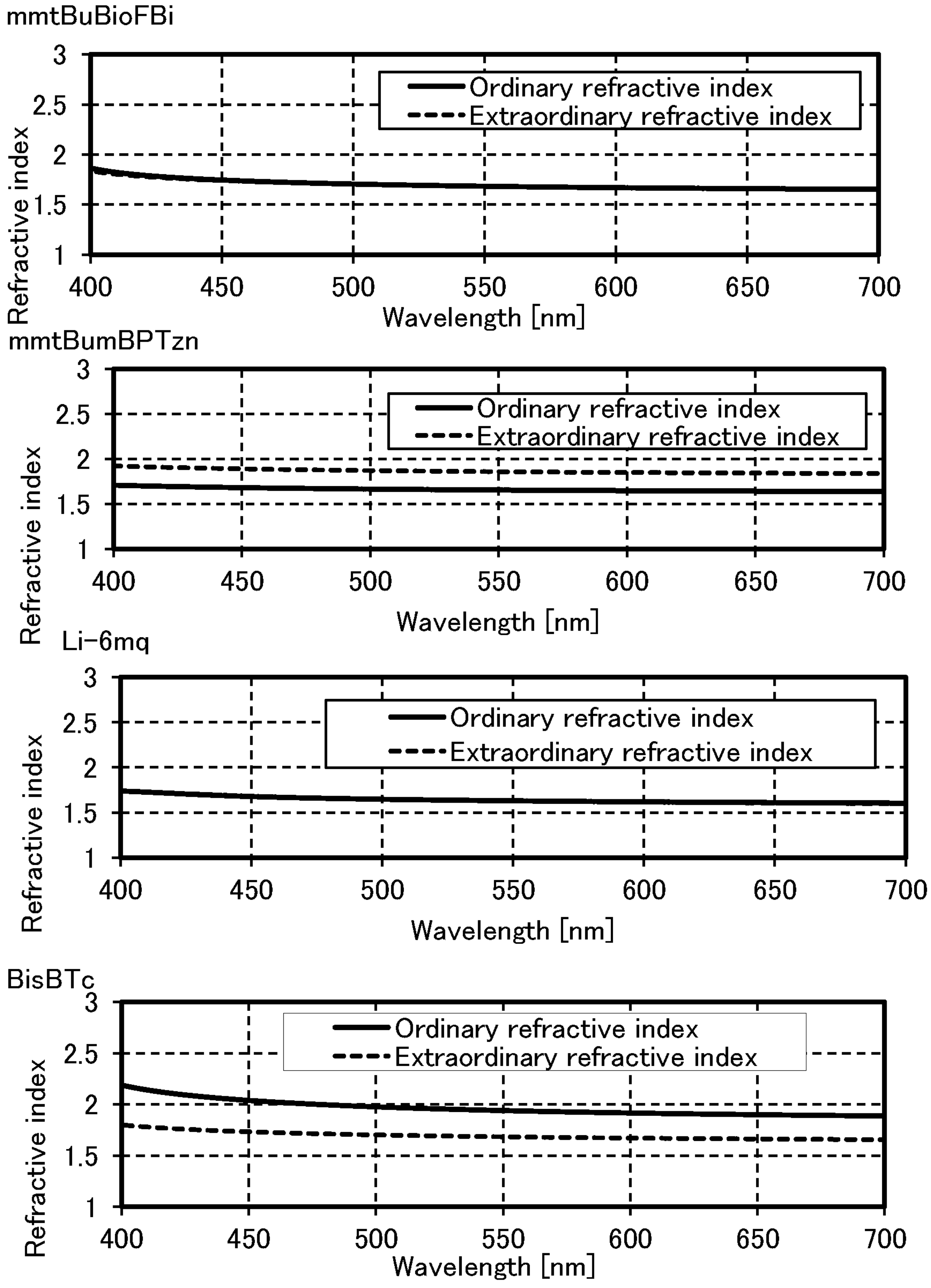
FIG. 20 shows the refractive indices of mmtBuBioFBi, mmtBumBPTzn, Li-6*mq*, and BisBTc.
Figure 21:
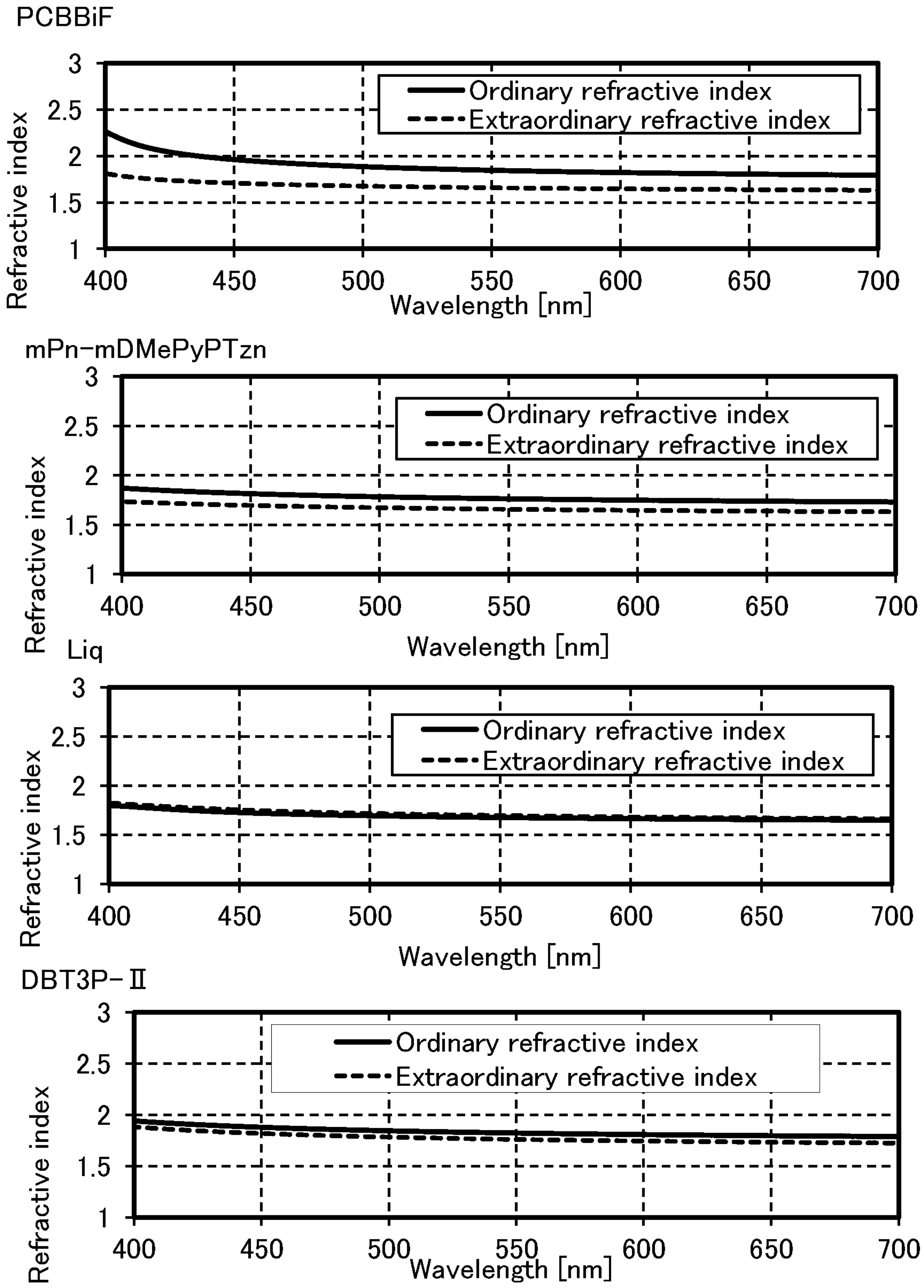
FIG. 21 shows the refractive indices of PCBBiF, mPn-mDMePyPTzn, Liq, and DBT3P-II.

FIG. 20 shows the results of measuring the refractive indices of mmtBuBioFBi, mmtBumBPTzn, Li-6mq, and BisBTc. FIG. 21 shows the results of measuring the 0433 refractive indices of PCBBiF, mPn-mDMePyPTzn, Liq, and DBT3P-II. The measurement was performed with an M-2000U spectroscopic ellipsometer manufactured by J. A. Woollam Japan Corp. To obtain films used as measurement samples, the material for each layer was deposited to a thickness of approximately 50 nm over a quartz substrate by a vacuum evaporation method.

From FIG. 20, mmtBuBioFBi and mmtBumBPTzn are low refractive index materials having an ordinary refractive index higher than or equal to 1.50 and lower than or equal to 1.75 in the entire wavelength range from 455 nm to 465 nm, and BisBTc is a high refractive index material having an ordinary refractive index higher than or equal to 1.90 and lower than or equal to 2.40 in the entire wavelength range from 455 nm to 465 nm. That is, the light-emitting device 1 and the comparative light-emitting devices 1-1 each include low refractive index layers in the EL layer and contain a high refractive index material in the cap layer.

From FIG. 21, mPn-mDMePyPTzn and DBT3P-II are materials having an ordinary refractive index, which are neither low refractive index materials nor high refractive index materials, and PCBBiF is a high refractive index material. That is, in the comparative light-emitting devices 1-2 and 1-3, the EL layer does not include a low refractive index layer and the cap layer is not a high refractive index layer. Note that Li-6mq and Liq are metal complexes and have a slightly lower refractive index than an organic compound. The refractive index of Li-6mq tends to be lower than that of Liq by approximately 0.04 to 0.05.

Figure 22:
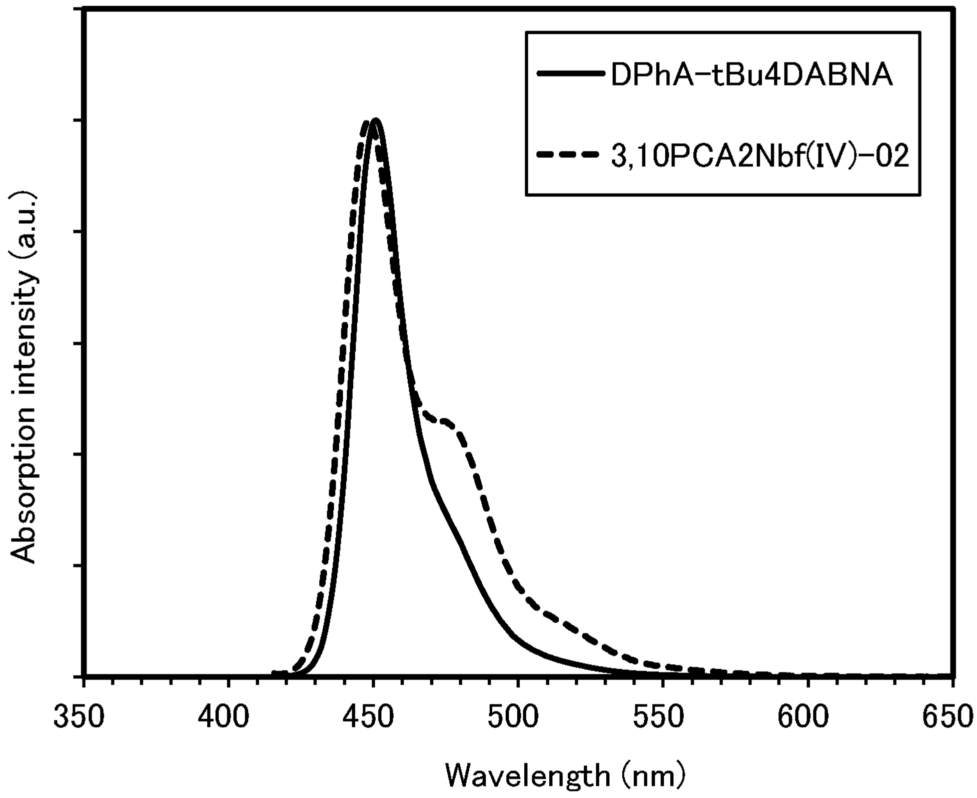
FIG. 22 shows the emission spectra of DPhA-tBu4DABNA and 3,10PCA2Nbf(IV)-02 in toluene solutions.

FIG. 22 shows the emission spectra of DPhA-tBu4DABNA and 3,10PCA2Nbf(IV)-02, which are light-emitting substances, in toluene solutions. According to FIG. 22, the half width of the emission spectrum of DPhA-tBu4DABNA is 22 nm, the spectral width at the intensity 1/e times the maximum peak intensity is 29 nm, and the values obtained by converting these widths into energy are respectively 0.13 eV and 0.17 eV, which means that DPhA-tBu4DABNA is a light-emitting substance that emits light with a narrow spectral width. In addition, the half width of the emission spectrum of 3,10PCA2Nbf(IV)-02 is 26 nm, the spectral width at the intensity 1/e times the maximum peak intensity is 49 nm, and the values obtained by converting these widths into energy are respectively 0.16 eV and 0.29 eV. Note that the light-emitting device 1 and the comparative light-emitting devices 1-1 to 1-3 emit blue light.

The light-emitting device 1 and the comparative light-emitting devices 1-1 to 1-3 were sealed using a glass substrate in a glove box containing a nitrogen atmosphere so as not to be exposed to the air. Specifically, a UV curable sealing material was applied to surround the devices, the sealing material was irradiated with UV, and heat treatment was performed at 80° C. under an atmospheric pressure for one hour. Then, the initial characteristics of the light-emitting devices were measured.

Figure 23:
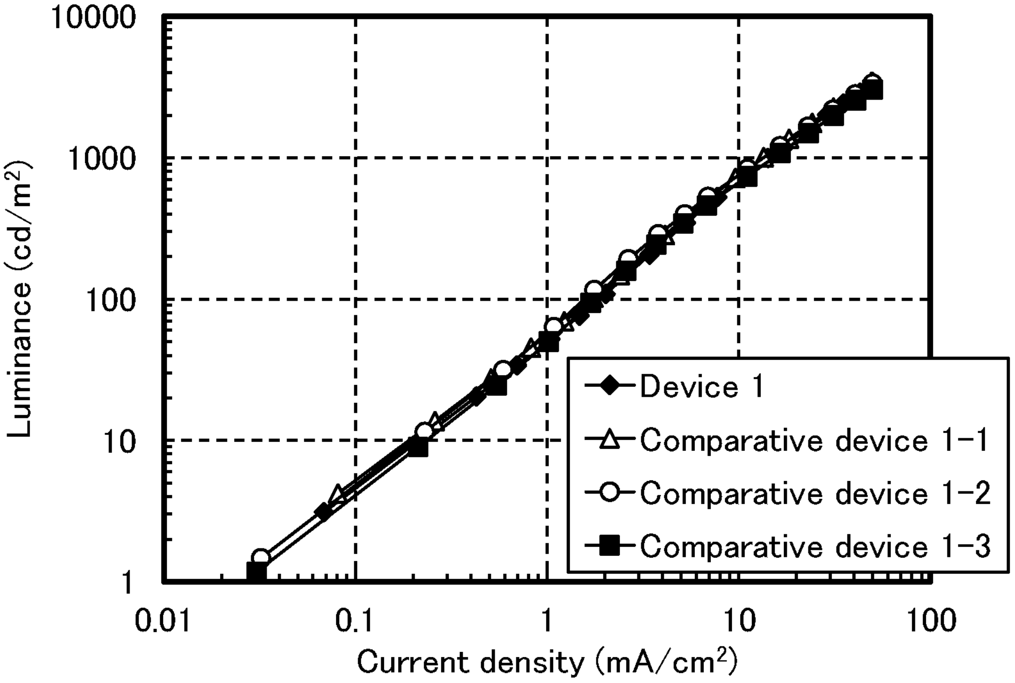
FIG. 23 shows the luminance—current density characteristics of a light-emitting device 1 and comparative light-emitting devices 1-1 to 1-3.
Figure 24:
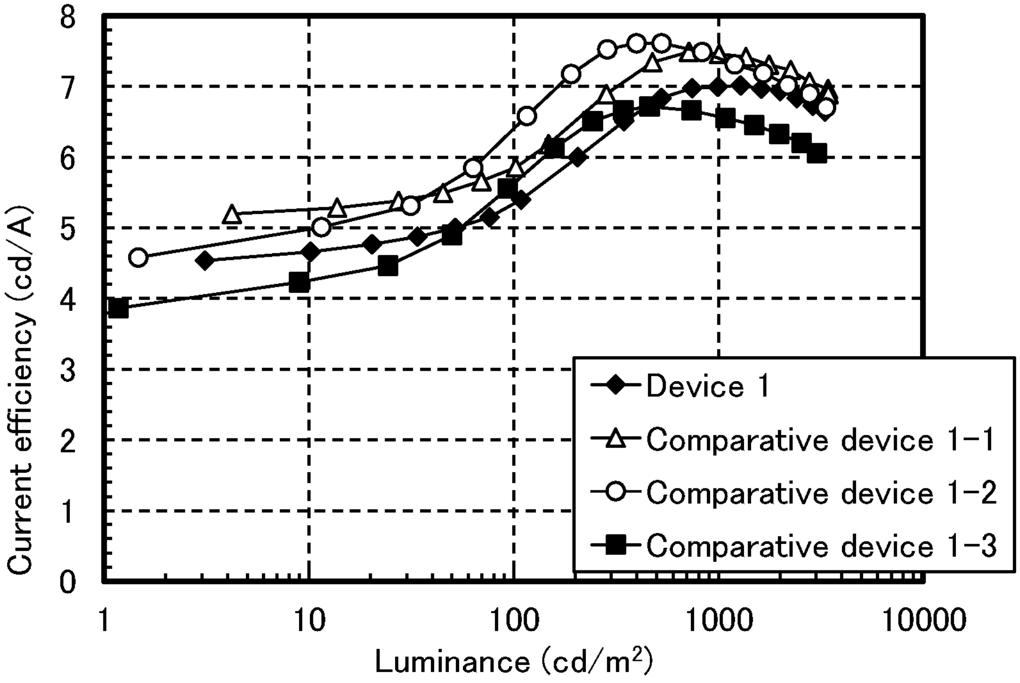
FIG. 24 shows the current efficiency—luminance characteristics of the light-emitting device 1 and the comparative light-emitting devices 1-1 to 1-3.
Figure 25:
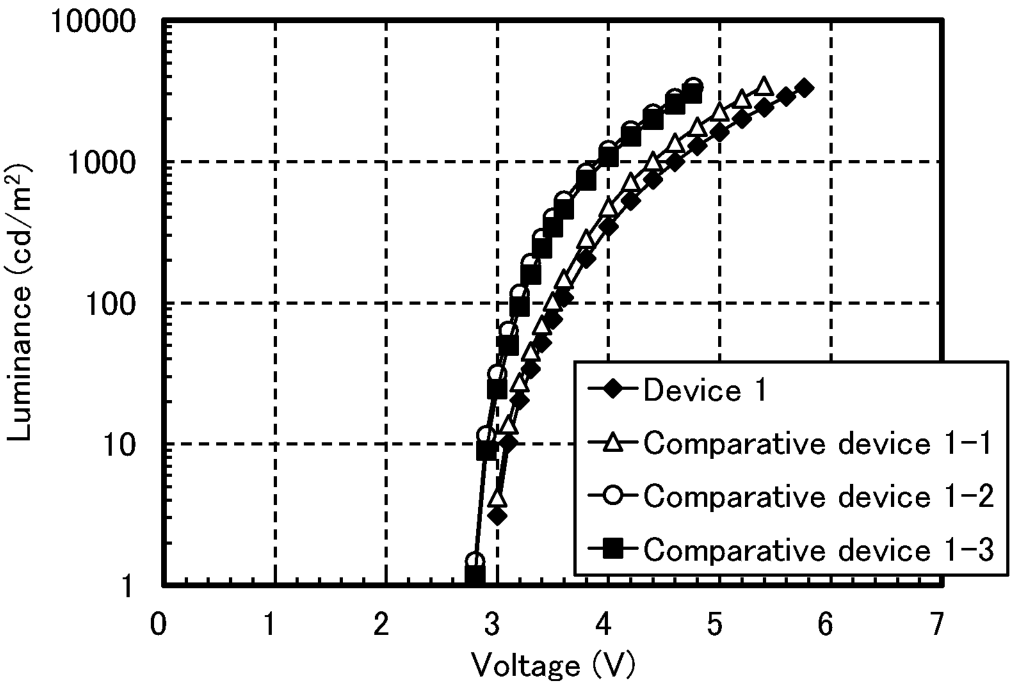
FIG. 25 shows the luminance—voltage characteristics of the light-emitting device 1 and the comparative light-emitting devices 1-1 to 1-3.
Figure 26:
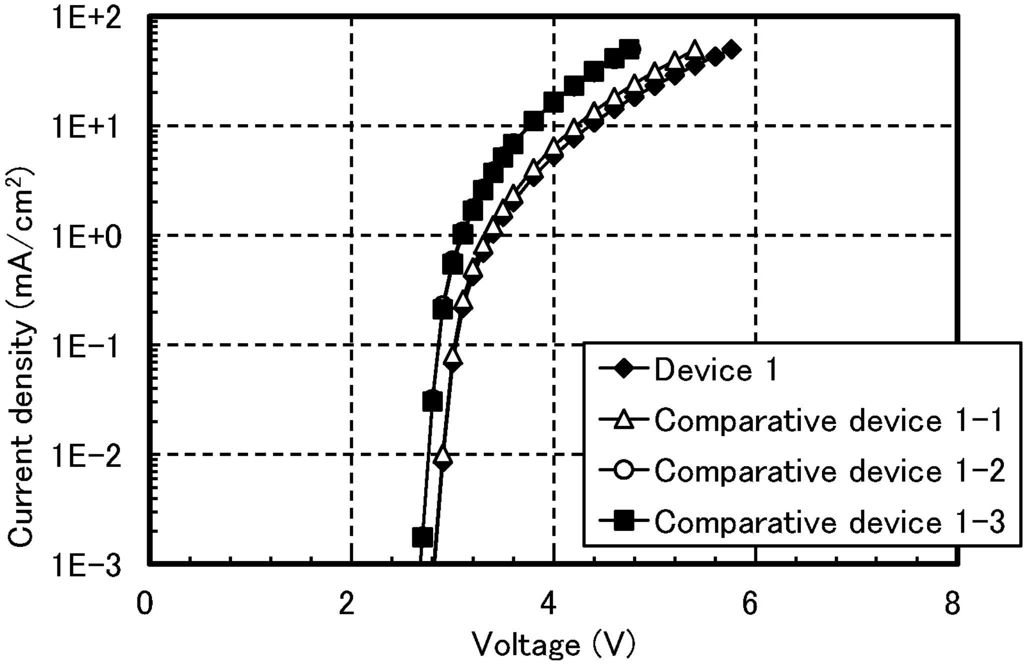
FIG. 26 shows the current density—voltage characteristics of the light-emitting device 1 and the comparative light-emitting devices 1-1 to 1-3.
Figure 27:
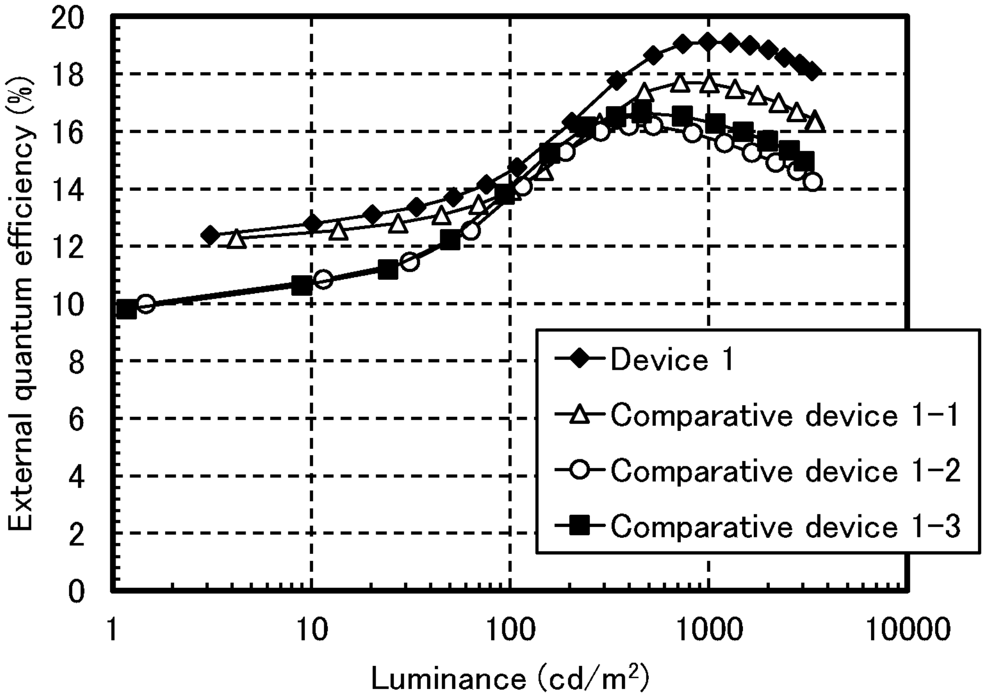
FIG. 27 shows the external quantum efficiency—luminance characteristics of the light-emitting device 1 and the comparative light-emitting devices 1-1 to 1-3.
Figure 28:
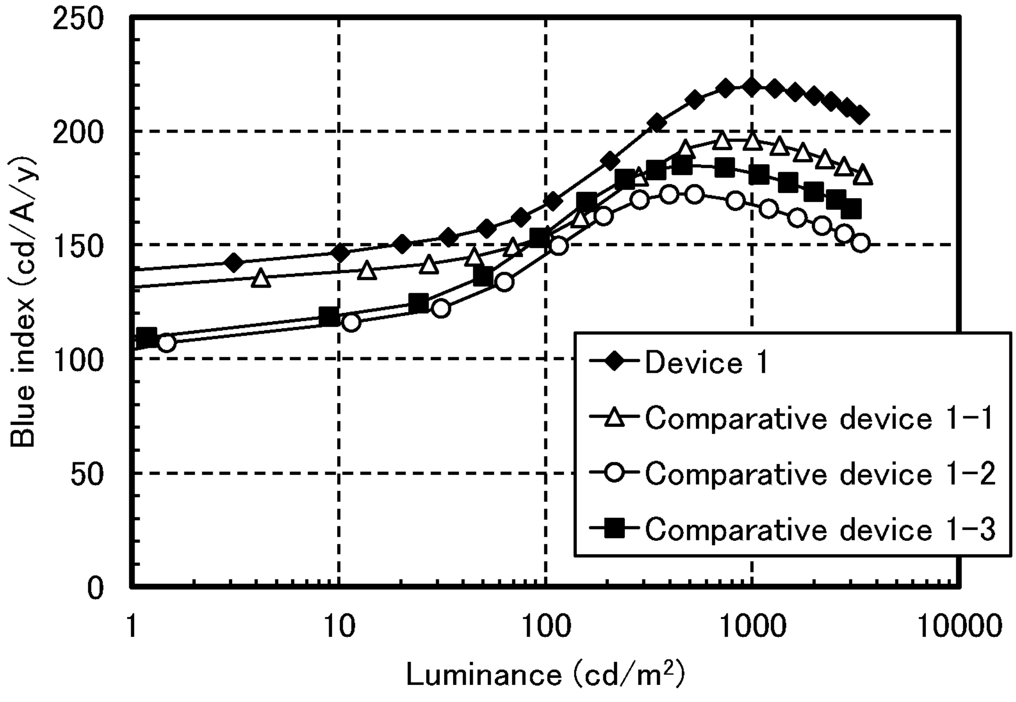
FIG. 28 shows the blue index—luminance characteristics of the light-emitting device 1 and the comparative light-emitting devices 1-1 to 1-3.
Figure 29:
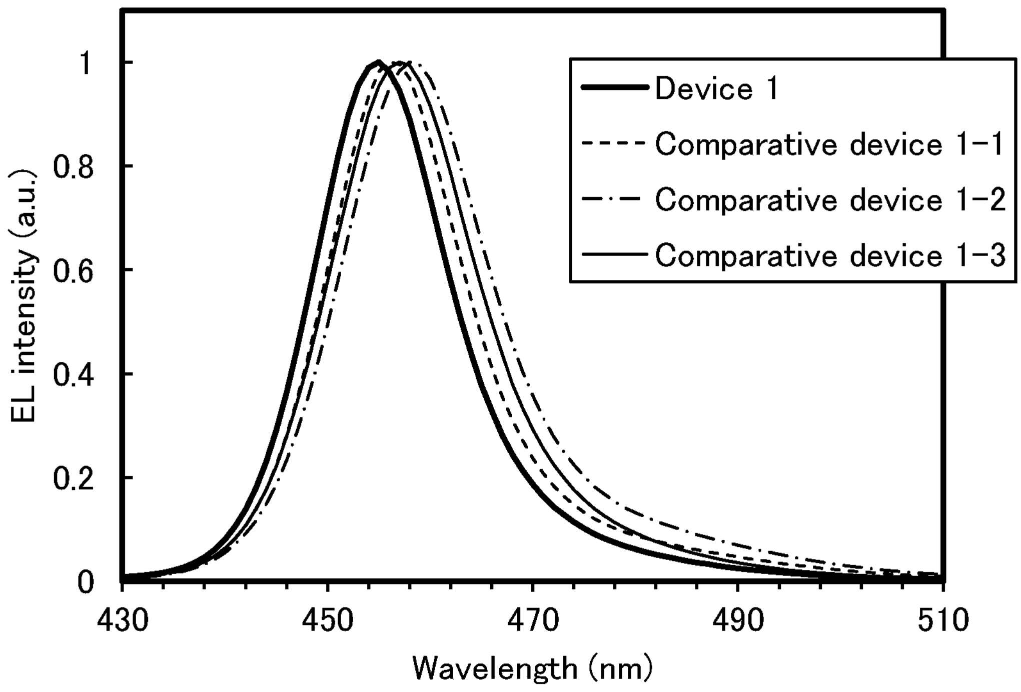
FIG. 29 shows the emission spectra of the light-emitting device 1 and the comparative light-emitting devices 1-1 to 1-3.

FIG. 23 shows the luminance—current density characteristics of the light-emitting device 1 and the comparative light-emitting device devices 1-1 to 1-3. FIG. 24 shows the current efficiency—luminance characteristics thereof. FIG. 25 shows the luminance—voltage characteristics thereof. FIG. 26 shows the current density—voltage characteristics thereof. FIG. 27 shows the external quantum efficiency—luminance characteristics thereof. FIG. 28 shows the blue index—luminance characteristics thereof. FIG. 29 shows the emission spectra thereof. Table 3 shows the main characteristics of the light-emitting devices at a current density of about 10 $mA/m^2$. Luminance, CIE chromaticity, and emission spectra were measured at normal temperature with a spectroradiometer (SR-UL1R manufactured by TOPCON TECHNOHOUSE CORPORATION).

TABLE 3

| | Voltage (V) | Current (mA) | Current density ($mA/cm^2$) | Chromaticity x | Chromaticity y | Current efficiency (cd/A) | External quantum efficiency (%) | BI (cd/A/y) |
|---|---|---|---|---|---|---|---|---|
| Device 1 | 4.4 | 0.43 | 10.7 | 0.15 | 0.03 | 7.0 | 19 | 219 |
| Comparative device 1-1 | 4.2 | 0.38 | 9.6 | 0.15 | 0.04 | 7.5 | 18 | 196 |

TABLE 3-continued

| | Voltage (V) | Current (mA) | Current density ($mA/cm^2$) | Chromaticity x | Chromaticity y | Current efficiency (cd/A) | External quantum efficiency (%) | BI (cd/A/y) |
|---|---|---|---|---|---|---|---|---|
| Comparative device 1-2 | 3.8 | 0.44 | 11.1 | 0.14 | 0.04 | 7.5 | 16 | 169 |
| Comparative device 1-3 | 3.8 | 0.44 | 11.1 | 0.14 | 0.04 | 6.7 | 17 | 184 |

FIGS. 23 to 29 and Table 3 show that the light-emitting device 1 of one embodiment of the present invention exhibits an extremely high blue index (BI) of 200 (cd/A/y) or more, with a maximum BI of 219 (cd/A/y). Thus, one embodiment of the present invention is particularly suitable for a light-emitting device used in a display.

Here, as described above, the light-emitting device 1 includes a low refractive index layer and a light-emitting substance with a narrow emission spectrum. The comparative light-emitting device 1-1 includes a low refractive index layer and an ordinary light-emitting substance. The comparative light-emitting device 1-2 includes an ordinary EL layer and an ordinary light-emitting substance. The comparative light-emitting device 1-3 includes an ordinary EL layer and a light-emitting substance with a narrow emission spectrum.

From FIG. 27, FIG. 28, and Table 3, as for the external quantum efficiency and BI of the four light-emitting devices, the light-emitting devices having one of the light-emitting substance with a narrow emission spectrum and the low refractive index layer exhibit higher external quantum efficiency and BI than the comparative light-emitting device 1-2 having neither of them, and the light-emitting device 1 having both of them exhibits the highest external quantum efficiency and BI.

The increase rates of external quantum efficiency (around 10 ($mA/cm^2$)) of the comparative light-emitting device 1-1 (including the low refractive index layer and the ordinary light-emitting substance) and the comparative light-emitting device 1-3 (including the ordinary EL layer and the light-emitting substance with a narrow emission spectrum) with respect to the comparative light-emitting device 1-2 (including the ordinary EL layer and the ordinary light-emitting substance) were 11% and 4%, respectively. Similarly, the increase rate of external quantum efficiency of the light-emitting device 1 (including the low refractive index layer and the light-emitting substance with a narrow emission spectrum) with respect to the comparative light-emitting device 1-2 was 19%.

Given that the increase rate of external quantum efficiency due to the use of the low refractive index layer is 11% and the increase rate thereof due to the use of the light-emitting substance with a narrow emission spectrum is 4%, the increase rate of external quantum efficiency of a light-emitting device including both the low refractive index layer and the light-emitting substance with a narrow emission spectrum is calculated to be approximately 15%. However, the actual increase rate in the light-emitting device 1 is 19%, which demonstrates significantly synergistic effects.

This is partly because, owing to the enhancement of the microcavity effect by the low refractive index layer, the effect of amplifying light with a target wavelength is enhanced and the amount of light with a wavelength to be attenuated is increased as well in the case of using an ordinary light-emitting substance; whereas such a loss can be significantly reduced in the case of using the light-emitting substance with a narrow emission spectrum.

Similarly, the increase rates of BI (around 10 ($mA/cm^2$)) of the comparative light-emitting device 1-1 (including the low refractive index layer and the ordinary light-emitting substance) and the comparative light-emitting device 1-3 (including the ordinary EL layer and the light-emitting substance with a narrow emission spectrum) with respect to the comparative light-emitting device 1-2 (including the ordinary EL layer and the ordinary light-emitting substance) were 16% and 9%, respectively. The increase rate of BI of the light-emitting device 1 (including the low refractive index layer and the light-emitting substance with a narrow emission spectrum) with respect to the comparative light-emitting device 1-2 was 29%.

Given that the increase rate of BI due to the use of the low refractive index layer is 16% and the increase rate of BI due to the use of the light-emitting substance with a narrow emission spectrum is 9%, the increase rate of BI of a light-emitting device including both the low refractive index layer and the light-emitting substance with a narrow emission spectrum is calculated to be approximately 25%. However, the actual increase rate in the light-emitting device 1 is 29%, meaning that the structure of the present invention has significantly synergistic effects also on BI.

In the above manner, the present invention has a larger and more significant effect on the increase rate of BI than on the increase rate of external quantum efficiency.

In the light-emitting device 1, a sharp spectrum due to the light-emitting substance with a narrow emission spectrum is further narrowed by the microcavity structure using the low refractive index layer; hence, the light-emitting device 1 can emit light with higher color purity. As a result, the chromaticity y of the CIE chromaticity coordinates of the light-emitting device 1 is smaller than that of the comparative light-emitting devices by approximately 0.004 to 0.012, which is probably why the light-emitting device 1 exhibits a higher BI.

As described above, when a light-emitting device including a low refractive index layer contains a light-emitting substance with a narrow emission spectrum (particularly at the intensity 1/e times the maximum peak intensity), large synergistic effects are obtained.

Example 2

This example will describe a light-emitting device 2 of one embodiment of the present invention and a comparative light-emitting device 2 for comparison. Structural formulae of organic compounds used in this example are shown below.

[Chemical Formula 5]
(i)
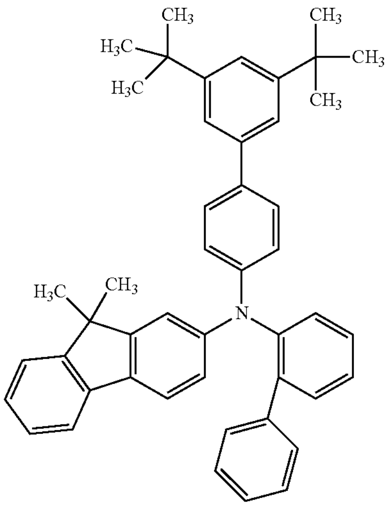
mmtBuBioFBi
(ii)
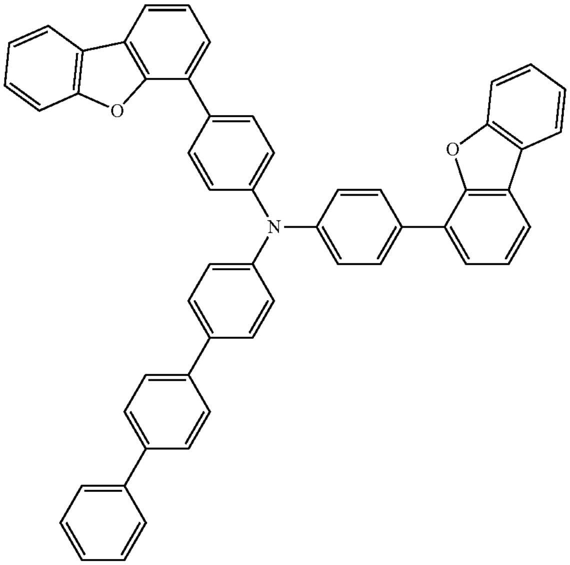
DBfBB1TP
(iii)
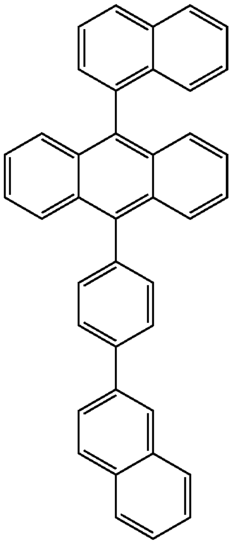
αN-βNPAnth
(iv)
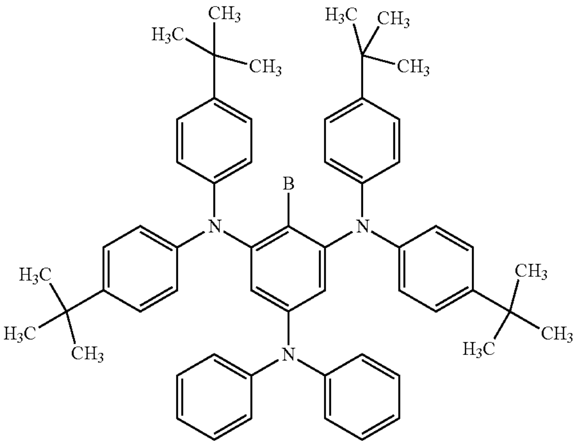
DPhA-tBu4DABNA -continued
(v)
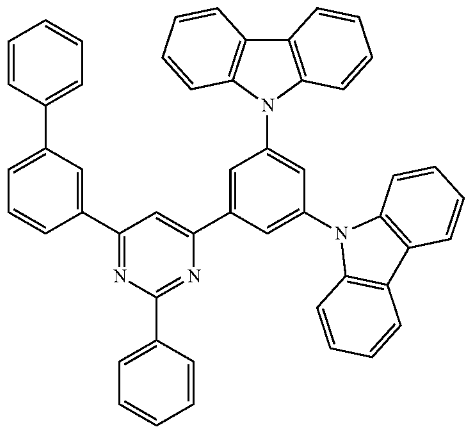
6mBP-4Cz2PPm
(vi)
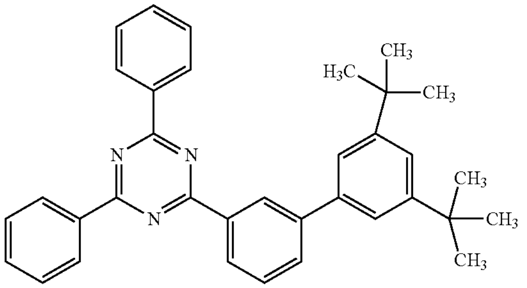
mmtBumBPTzn
(vii)
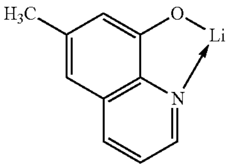
Li-6mq
(viii)
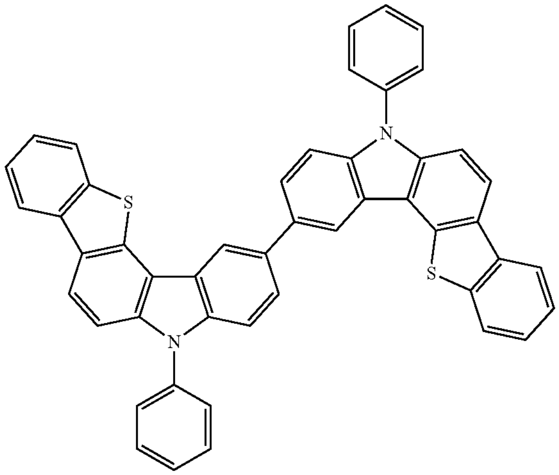
BisBTc
(ix)
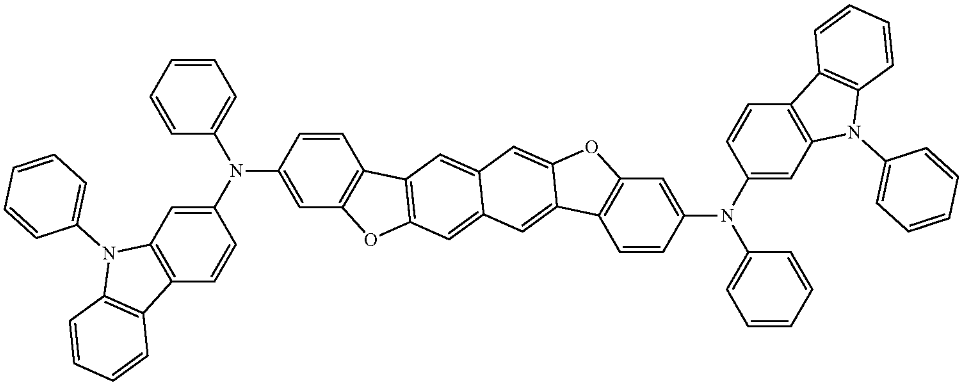
3,10PCA2Nbf(IV)-02

-continued (xiv)

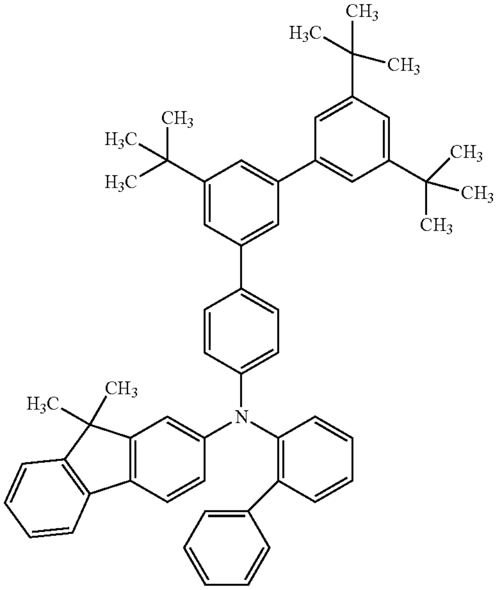

mmtBumTPoFBi-04

(xv)

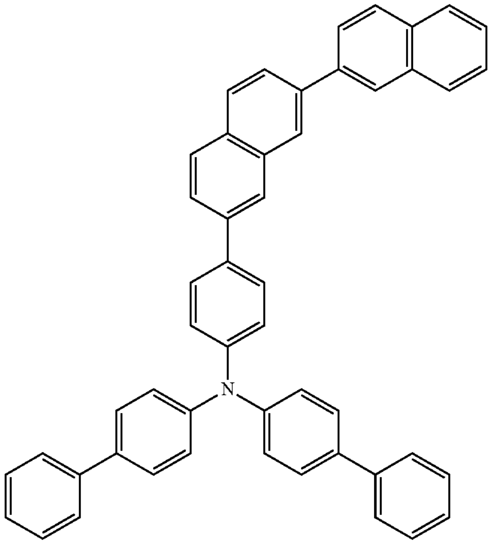

BBA(βN2)B-03

(Method for Fabricating Light-Emitting Device 2)

First, as a reflective electrode, silver (Ag) was deposited over a glass substrate to a thickness of 100 nm by a sputtering method, and then, as a transparent electrode, indium tin oxide containing silicon oxide (ITSO) was deposited to a thickness of 5 nm by a sputtering method, whereby the first electrode 101 was formed. The electrode area was set to 4 $mm^2$ (2 mm×2 mm). Note that the transparent electrode functions as the anode, and the transparent electrode and the reflective electrode can be collectively regarded as the first electrode 101.

Next, in pretreatment for forming the light-emitting device over a substrate, a surface of the substrate was washed with water, baking was performed at 200° C. for one hour, and then UV ozone treatment was performed for 370 seconds.

After that, the substrate was transferred into a vacuum evaporation apparatus where the pressure was reduced to approximately 10' Pa, vacuum baking was performed at 170° C. for 30 minutes in a heating chamber of the vacuum evaporation apparatus, and then the substrate was cooled down for approximately 30 minutes.

Next, the substrate provided with the first electrode 101 was fixed to a substrate holder provided in the vacuum evaporation apparatus such that the surface on which the first electrode 101 was formed faced downward. Then, N-(3",5',5"-tri-tert-butyl-1,1 ‘: 3’, 1"-terphenyl-4-yl)-N-(1,-biphenyl-2-yl)-9,9-dimethyl-9H-fluoren-2-amine (abbreviation: mmtBumTPoFBi-04) represented by Structural Formula (xiv) and a fluorine-containing electron acceptor material with a molecular weight of 672 (OCHD-003) were deposited on the first electrode 101 to a thickness of 10 nm by co-evaporation such that the weight ratio of mmtBumTPoFBi-04 to OCHD-003 was 1:0.1, whereby the hole-injection layer 111 was formed.

Over the hole-injection layer 111, mmtBumTPoFBi-04,4,4'-diphenyl-4"-(7;2'-binaphthyl-2-yl)triphenylamine (abbreviation: BBA(βN2)B-03) represented by Structural Formula (x), and N-3',5'-ditertiarybutyl-1,1'-biphenyl-4-yl-N-1,1'-biphenyl-2-yl-9,9-dimethyl-9H-fluoren-2-amine (abbreviation: mmtBuBioFBi) represented by Structural Formula (i) were deposited by evaporation to thicknesses of 55 nm, 50 nm, and 40 nm as a first layer, a second layer, and a third layer, respectively, whereby the hole-transport layer 112 was formed.

Subsequently, over the hole-transport layer 112, N,N-bis[4-(dibenzofuran-4-yl)phenyl]-4-amino-p-terphenyl (abbreviation: DBfBB1TP) represented by Structural Formula (ii) was deposited to a thickness of 10 nm by evaporation, whereby an electron-blocking layer was formed.

Then, 9-(1-naphthyl)-10-[4-(2-naphthyl)phenyl]anthracene (abbreviation: aN-βNPAnth) represented by Structural Formula (iii) and 2,12-di(tert-butyl)-5,9-di(4-tert-butylphenyl)-N,N-diphenyl-5H,9H-[1,4]benzazaborino[2,3,4-kl]phenazaborin-7-amine (abbreviation: DPhA-tBu4DABNA) represented by Structural Formula (iv) were deposited to a thickness of 20 nm by co-evaporation such that the weight ratio of aN-βNPAnth to DPhA-tBu4DABNA was 1:0.015, whereby the light-emitting layer 113 was formed.

After that, 6-(1,1'-biphenyl-3-yl)-4-[3,5-bis(9H-carbazol-9-yl)phenyl]-2-phenylpyrimidine (abbreviation: 6mBP-4Cz2PPm) represented by Structural Formula (v) was deposited to a thickness of 10 nm by evaporation, whereby a hole-blocking layer was formed. Then, 2-{(3',5'-di-tert-butyl)-1,1'-biphenyl-3-yl}-4,6-diphenyl-1,3,5-triazine (abbreviation: mmtBumBPTzn) represented by Structural Formula (vi) and 6-methyl-8-quinolinolato-lithium (abbreviation: Li-6*mq*) represented by Structural Formula (vii) were deposited to a thickness of 20 nm by co-evaporation such that the weight ratio of mmtBumBPTzn to Li-6*mq* was 4:6, whereby the electron-transport layer 114 was formed.

After the electron-transport layer 114 was formed, lithium fluoride (LiF) was deposited to a thickness of 1 nm by evaporation to form the electron-injection layer 115, and lastly silver (Ag) and magnesium (Mg) were deposited to a thickness of 15 nm by co-evaporation such that the volume ratio of Ag to Mg was 1:0.1 to form the second electrode 102, whereby the light-emitting device 2 was fabricated. Note that the second electrode 102 is a transflective electrode having a function of reflecting light and a function of transmitting light; thus, the light-emitting device 2 is a top-emission device in which light is extracted through the second electrode 102. Over the second electrode 102, 5,5'-diphenyl-2,2'-di-5H-[1]benzothieno[3,2-c]carbazole (abbreviation: BisBTc) represented by Structural Formula (viii) was deposited by evaporation to a thickness of 65 nm as a cap layer so that outcoupling efficiency can be improved.

(Method of Fabricating Comparative Light-Emitting Device 2)

The comparative light-emitting device 2 was fabricated in the same manner as the light-emitting device 2 except that the first layer in the hole-transport layer 112 of the light-emitting device 2 was deposited to a thickness of 47.5 nm, and that 3,10-bis[N-(9-phenyl-9H-carbazol-2-yl)-N-phenylamino]naphtho[2,3-b; 6,7-b']bisbenzofuran (abbreviation: 3,10PCA2Nbf(IV)-02) represented by Structural Formula (ix) was used instead of DPhA-tBu4DABNA, which is the light-emitting substance in the light-emitting layer 113. Note that the reason the thickness of the first layer is different from that in the light-emitting device 2 is that in consideration of a deposition deviation due to an evaporation apparatus, a light-emitting device exhibiting the highest blue index (BI (cd/A/y)) is selected as the comparative light-emitting device 2 from several light-emitting devices that differ only in film thickness. In other words, in this example, influences of a deviation of the optical path length due to the evaporation apparatus are eliminated, and the light-emitting devices that exhibit the highest possible BI for the light-emitting substance in the target device structure are compared to each other.

The structures of the light-emitting device 2 and the comparative light-emitting device 2 are listed in the following table.

TABLE 4

| | | Thickness | Device 2 | Comparative device 2 |
|---|---|---|---|---|
| Cap layer | | 65 nm | BisBTc | |
| Cathode | | 15 nm | Ag:Mg | |
| Electron-injection layer | | 1 nm | LiF | |
| Electron-transport layer | | 20 nm | mmtBumBPTzn:Li-6mq | |
| Hole-blocking layer | | 10 nm | 6mBP-4CzP2Pm | |
| Light-emitting layer | | 20 nm | αN-βNPAnth: *6 | |
| Electron-blocking layer | | 10 nm | DBfBB1TP | |
| Hole-transport layer | 3 | 40 nm | mmtBuBioFBi | |
| | 2 | 50 nm | BBA(βN2)B-03 | |
| | 1 | *5 | mmtBumTPoFBi-04 | |
| Hole-injection layer | | 10 nm | mmtBumTPoFBi-04:OCHD-003 | |
| Anode | | 5 nm | ITSO | |
| Reflective electrode | | 100 nm | Ag | |

*5 Device 2: 55 nm, Comparative device 2: 47.5 nm

*6 Device 2: DPhA-tBu4DABNA, Comparative device 2: 3,10PCA2Nbf(IV)-02

Figure 30:
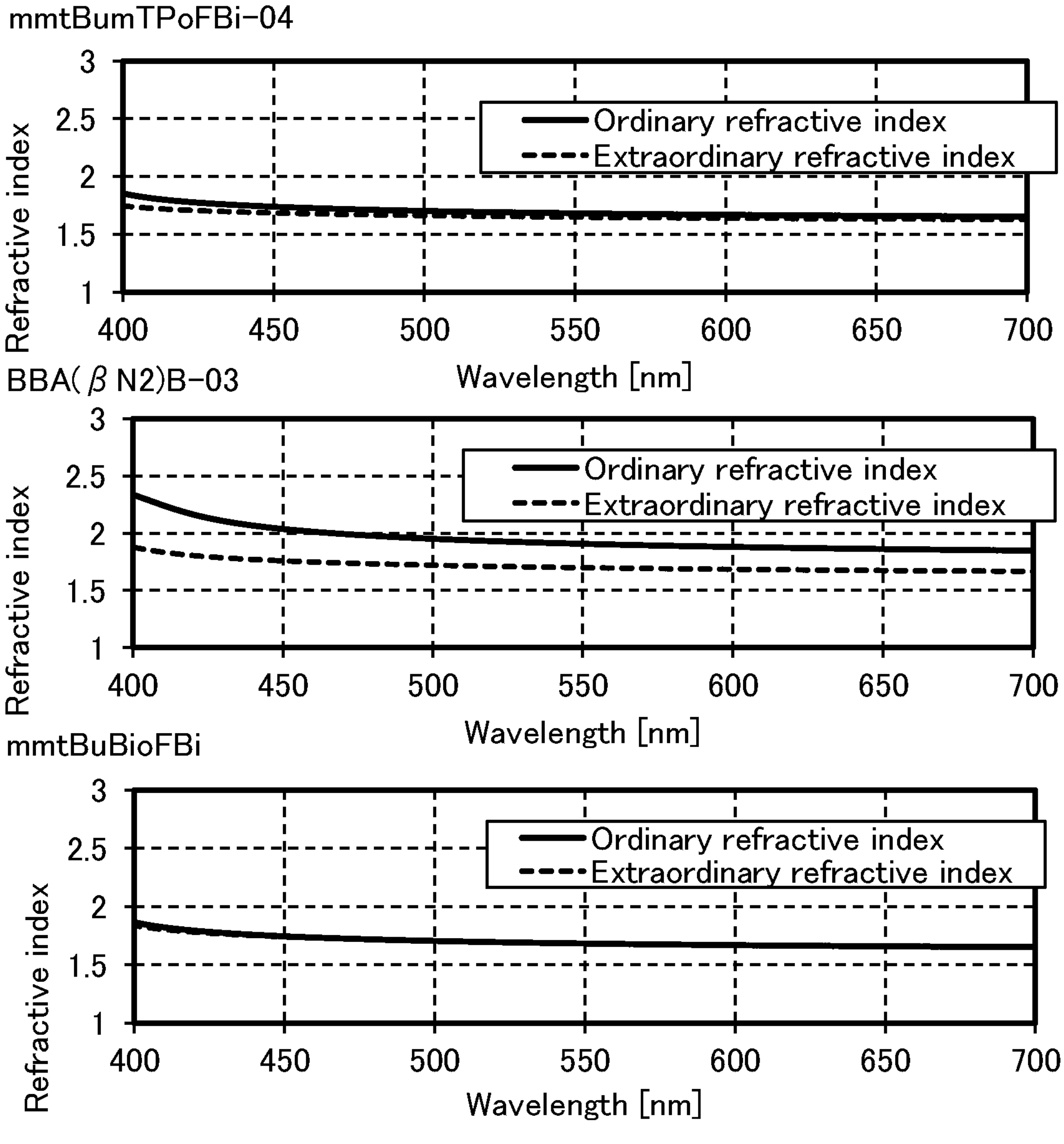
FIG. 30 shows the refractive indices of mmtBumTPoFBi-04, BBAβN2)B-03, and mmtBuBioFBi.
Figure 31:
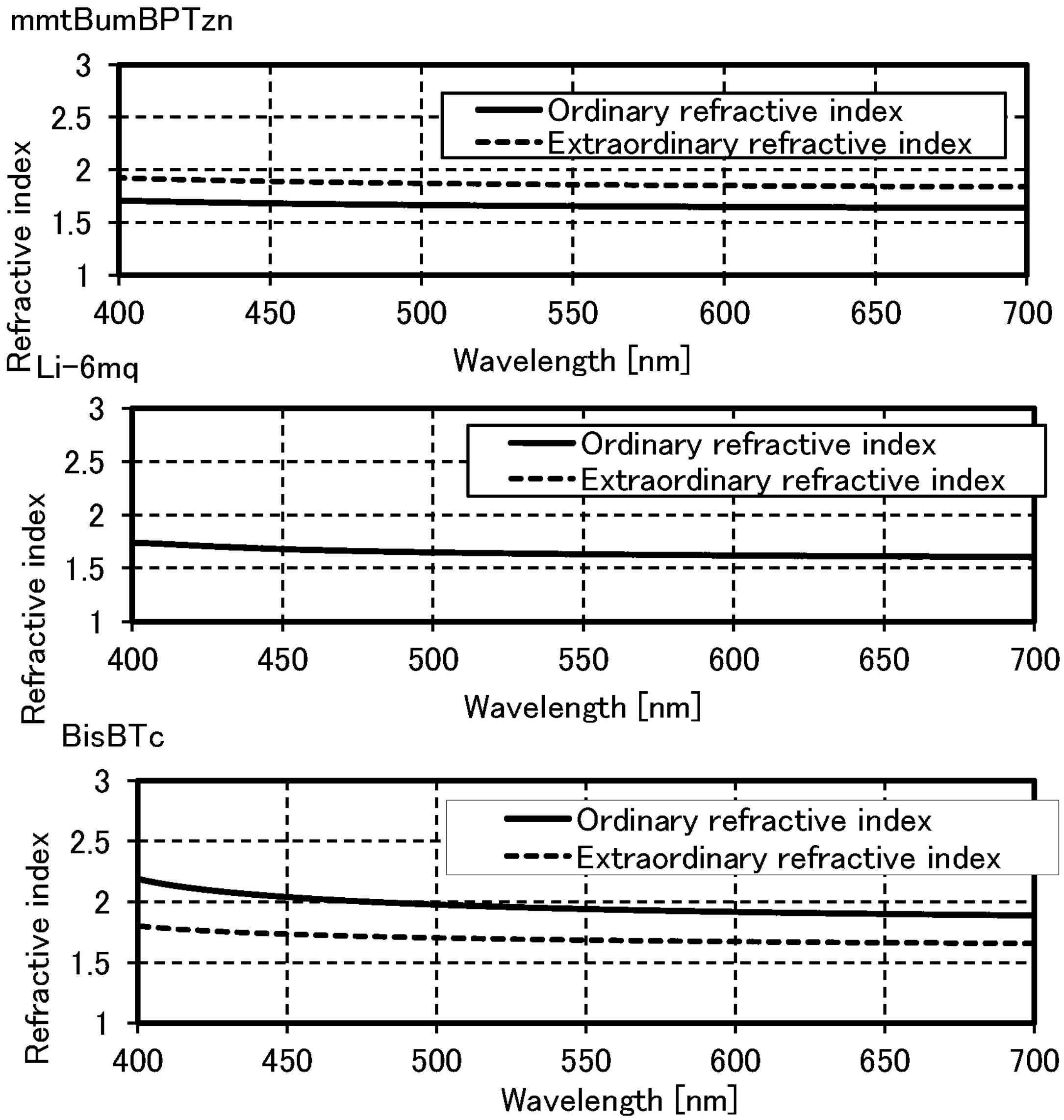
FIG. 31 shows the refractive indices of mmtBumBPTzn, Li-6*mq*, and BisBTc.

FIGS. 30 and 31 show the results of measuring the refractive indices of mmtBumTPoFBi-04, BBA(βN2)B-03, mmtBuBioFBi, mmtBumBPTzn, Li-6*mq*, and BisBTc. The measurement was performed with an M-2000U spectroscopic ellipsometer manufactured by J. A. Woollam Japan Corp. To obtain films used as measurement samples, the material for each layer was deposited to a thickness of approximately 50 nm over a quartz substrate by a vacuum evaporation method.

From FIGS. 30 and 31, mmtBumTPoFBi-04, mmtBuBioFBi, mmtBumBPTzn, and Li-6*mq* are low refractive index materials having an ordinary refractive index greater than or equal to 1.50 and less than or equal to 1.75 in the entire wavelength range of 455 nm to 465 nm, and BBAβN2)B-03 and BisBTc are high refractive index materials having an ordinary refractive index greater than or equal to 1.90 and less than or equal to 2.40 in the entire wavelength range of 455 nm to 465 nm. Note that the light-emitting device 2 and the comparative light-emitting device 2 emit blue light.

FIG. 22 shows emission spectra of DPhA-tBu4DABNA and 3,10PCA2Nbf(IV)-02, which are light-emitting substances, in toluene solutions. According to FIG. 22, the half width of the emission spectrum of DPhA-tBu4DABNA is 22 nm, the spectral width at the intensity 1/e times the maximum peak intensity is 29 nm, and the values obtained by converting these widths into energy are respectively 0.13 eV and 0.17 eV, which means that DPhA-tBu4DABNA is a light-emitting substance that emits light with a narrow spectral width. In addition, the half width of the emission spectrum of 3,10PCA2Nbf(IV)-02 is 26 nm, the spectral width at the intensity 1/e times the maximum peak intensity is 49 nm, and the values obtained by converting these widths into energy are respectively 0.16 eV and 0.29 eV.

The light-emitting device 2 and the comparative light-emitting device 2 were sealed using a glass substrate in a glove box containing a nitrogen atmosphere so as not to be exposed to the air. Specifically, a UV curable sealing material was applied to surround the devices, only the sealing material was irradiated with UV while the light-emitting devices were not irradiated with the UV, and heat treatment was performed at 80° C. under an atmospheric pressure for one hour. Then, the initial characteristics of the light-emitting devices were measured.

Figure 32:
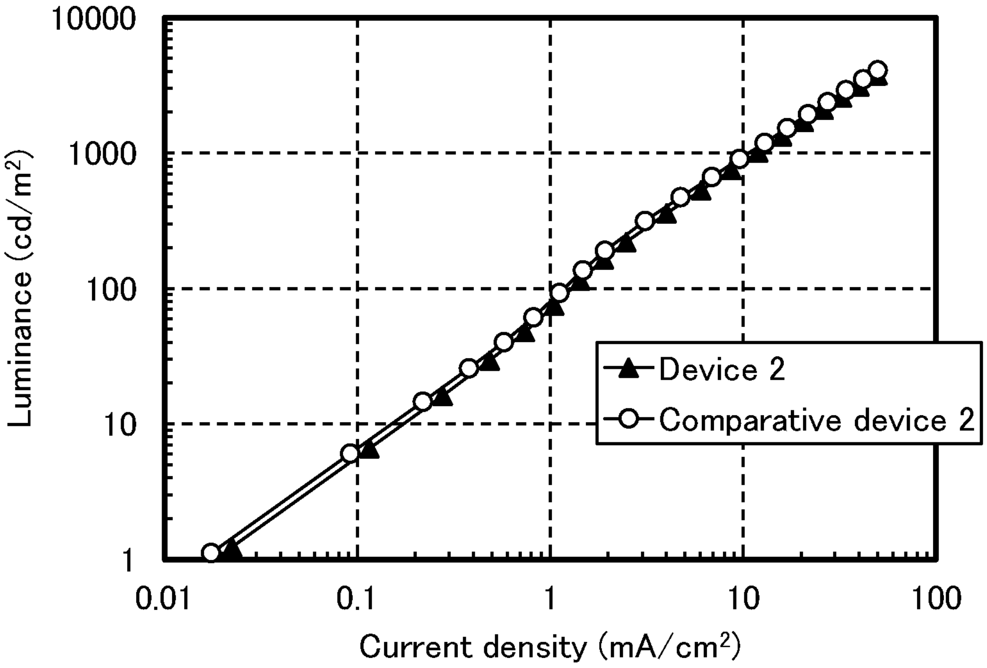
FIG. 32 shows the luminance—current density characteristics of a light-emitting device 2 and a comparative light-emitting device 2.
Figure 33:
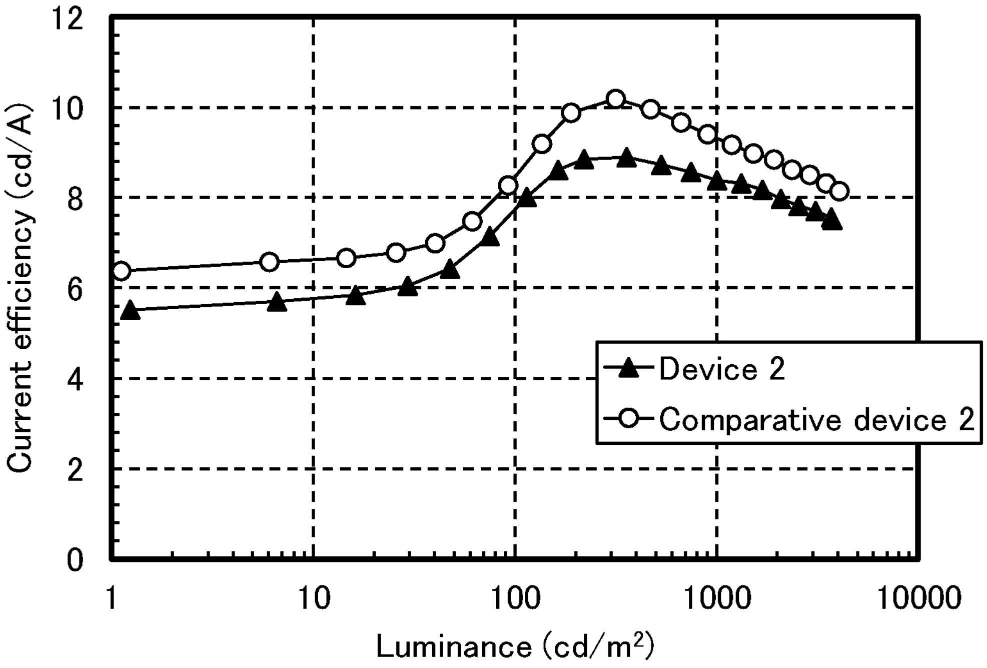
FIG. 33 shows the current efficiency—luminance characteristics of the light-emitting device 2 and the comparative light-emitting device 2.
Figure 34:
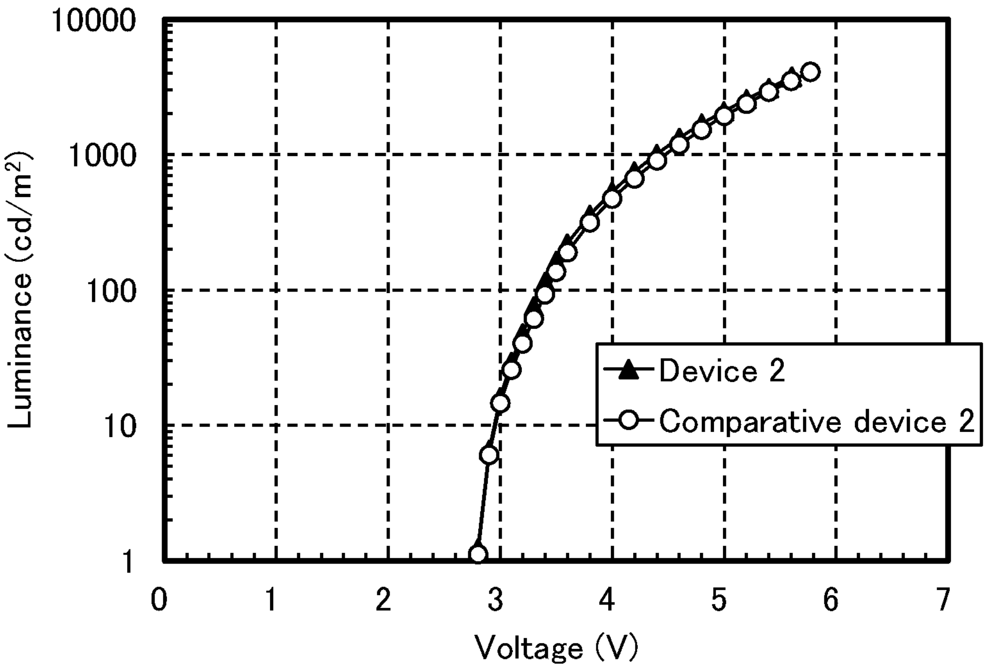
FIG. 34 shows the luminance—voltage characteristics of the light-emitting device 2 and the comparative light-emitting device 2.
Figure 35:
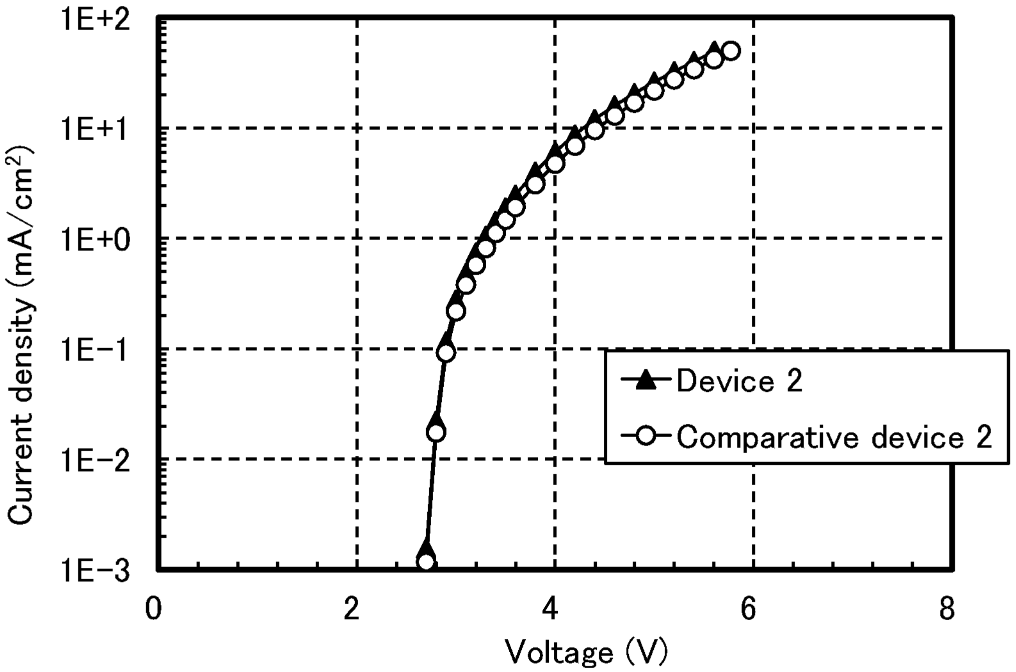
FIG. 35 shows the current density—voltage characteristics of the light-emitting device 2 and the comparative light-emitting device 2.
Figure 36:
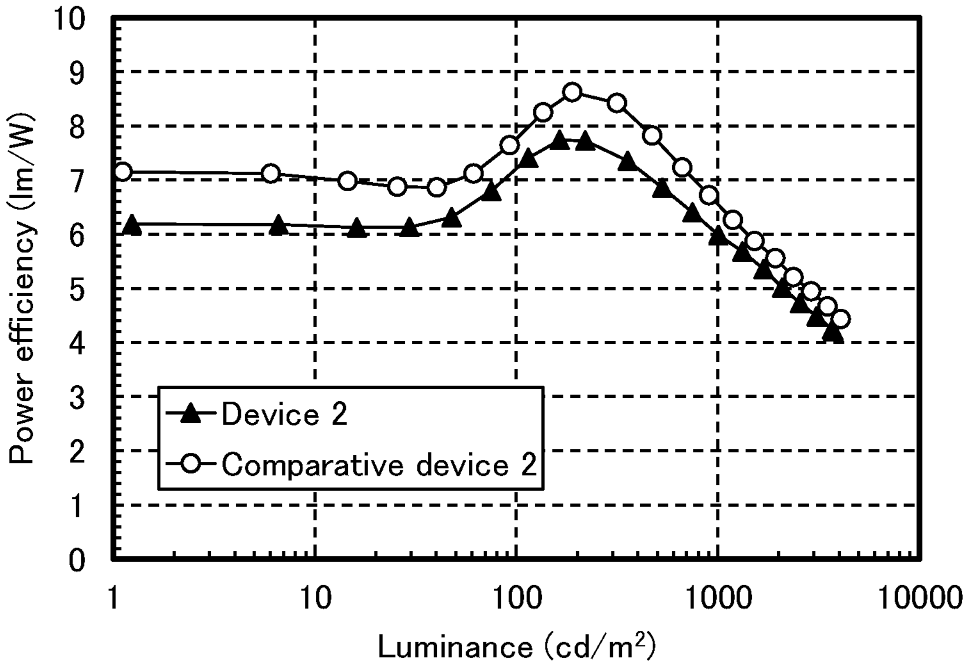
FIG. 36 shows the power efficiency—luminance characteristics of the light-emitting device 2 and the comparative light-emitting device 2.
Figure 37:
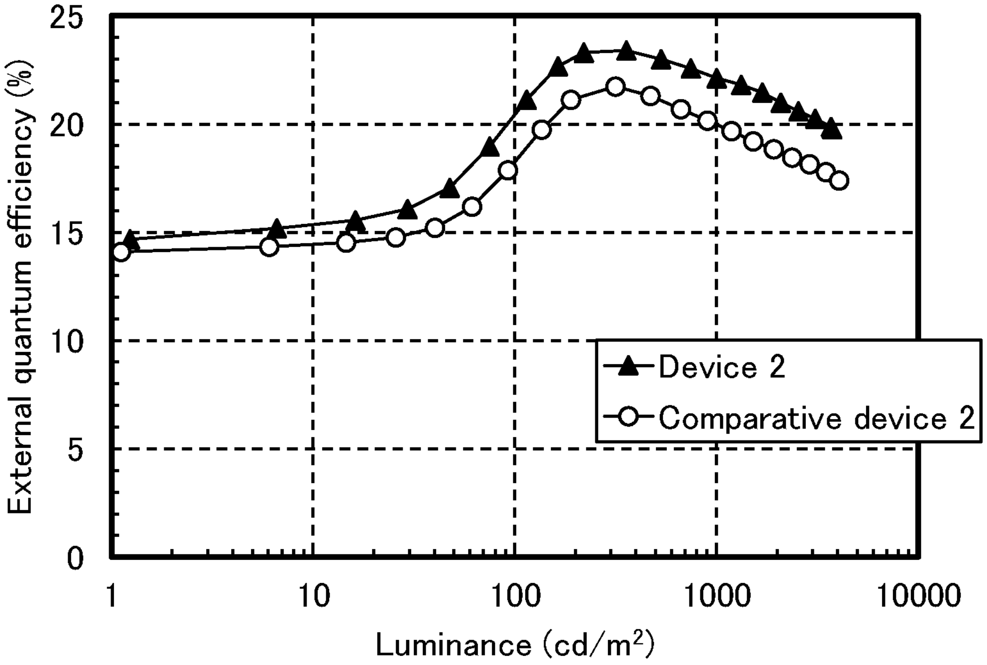
FIG. 37 shows the external quantum efficiency—luminance characteristics of the light-emitting device 2 and the comparative light-emitting device 2.
Figure 38:
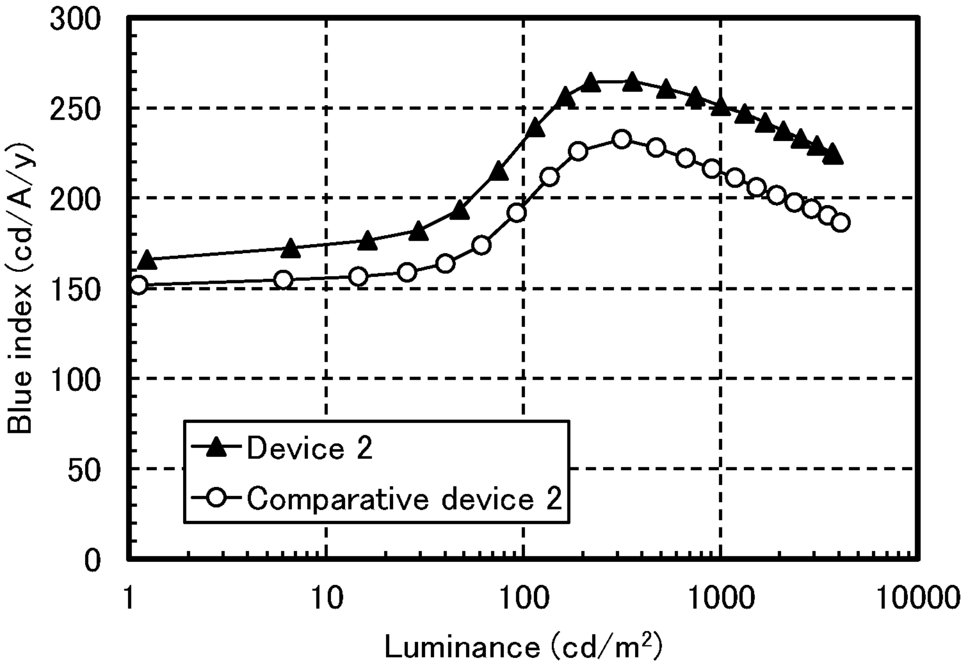
FIG. 38 shows the blue index—luminance characteristics of the light-emitting device 2 and the comparative light-emitting device 2.
Figure 39:
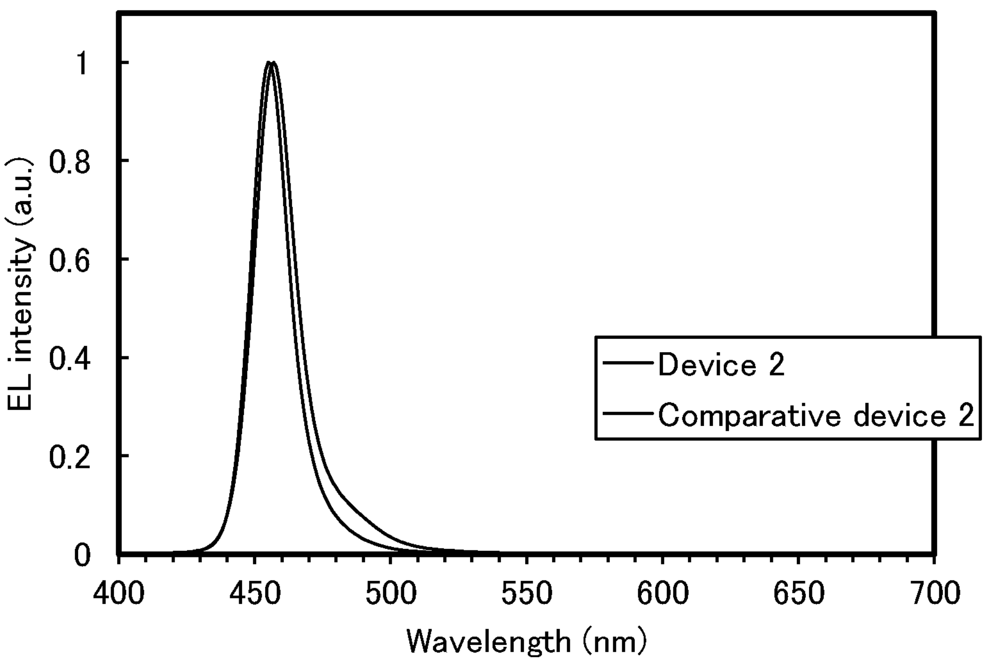
FIG. 39 shows the emission spectra of the light-emitting device 2 and the comparative light-emitting device 2.

FIG. 32 shows the luminance—current density characteristics of the light-emitting device 2 and the comparative light-emitting device 2. FIG. 33 shows the current efficiency—luminance characteristics thereof. FIG. 34 shows the luminance-voltage characteristics thereof. FIG. 35 shows the current density—voltage characteristics thereof. FIG. 36 shows the power efficiency—luminance characteristics thereof. FIG. 37 shows the external quantum efficiency—luminance characteristics thereof. FIG. 38 shows the blue index—luminance characteristics thereof. FIG. 39 shows emission spectra thereof. Table 5 shows the main characteristics of the light-emitting devices at a current density of about 10 $mA/m^2$. Luminance, CIE chromaticity, and emission spectra were measured at normal temperature with a spectroradiometer (SR-UL1R manufactured by TOPCON TECHNOHOUSE CORPORATION).

TABLE 5

| | Voltage (V) | Current (mA) | Current density ($mA/cm^2$) | Chromaticity x | Chromaticity y | Current efficiency (cd/A) | External quantum efficiency (%) | BI (cd/A/y) |
|---|---|---|---|---|---|---|---|---|
| Device 2 | 4.2 | 0.35 | 8.7 | 0.15 | 0.03 | 8.6 | 23 | 256 |
| Comparative device 2 | 4.4 | 0.38 | 9.6 | 0.14 | 0.04 | 9.4 | 20 | 216 |

From FIGS. 32 to 39 and Table 5, both the light-emitting device 2 and the comparative light-emitting device 2 exhibit an extremely high blue index (BI). In particular, the light-emitting device 2 exhibits an extremely high blue index (BI) of 250 (cd/A/y) or more, with a maximum BI of 265 (cd/A/y), and thus is regarded as having an especially favorable BI. Thus, one embodiment of the present invention is particularly suitable for a light-emitting device used in a display.

FIG. 37 and Table 5 show that the external quantum efficiency around a current density of 10 mA/$cm^2$ of the light-emitting device 2 is higher than that of the comparative light-emitting device 2 by more than 10%. One of the reasons is that the width of the emission spectrum, particularly the spectral width at the intensity 1/e times the maximum peak intensity, of DPhA-tBu4DABNA is 29 nm, which is significantly smaller than 49 nm of 3,10PCA2Nbf(IV)-02. In other words, although the microcavity structure intensifies light with a certain wavelength and attenuates light with other wavelengths, the use of DPhA-tBu4DABNA, whose emission spectrum is sharp, reduces the amount of light to be attenuated and obtains a more effective amplification effect.

As a result, the emission spectrum of the light-emitting device 2 is sharper than that of the comparative light-emitting device 2, and the y coordinate of the CIE chromaticity, which is often used as the evaluation criterion for blue light emission, is smaller in the light-emitting device 2 by approximately 0.01 than in the comparative light-emitting device 2. Consequently, as for the blue index (cd/A/y), which is used as the indicator of the efficiency of blue light emission and obtained by dividing the current efficiency by the y coordinate of the CIE chromaticity, the light-emitting device 2 has a more favorable value than the comparative light-emitting device 2 in excess of the difference in external quantum efficiency.

As described above, when a light-emitting device having different refractive indices contains a light-emitting substance with a narrow emission spectrum (particularly at the intensity 1/e times the maximum peak intensity), large synergistic effects are obtained.

Example 3

In this example, a light-emitting device 3 of one embodiment of the present invention will be described. Note that the light-emitting device 3 is a tandem light-emitting device including a plurality of light-emitting layers with a charge-generation layer therebetween. Structural formulae of organic compounds used in this example are shown below.

[Chemical Formula 6]

(i)

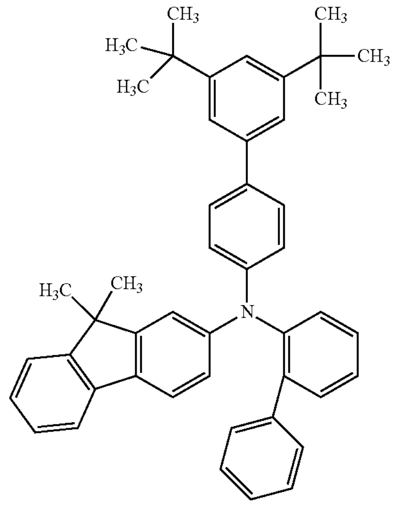

mmtBuBioFBi (ii)

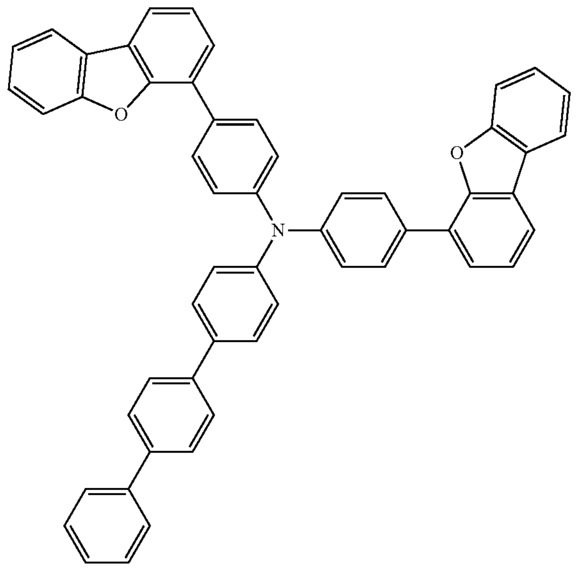

DBfBB1TP

-continued
(iii)
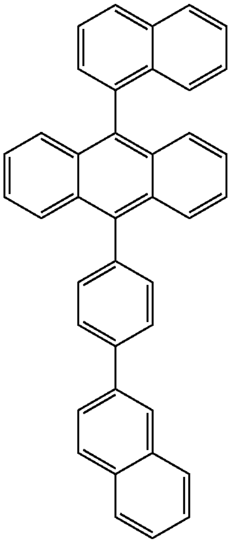
αN-βNPAnth
(iv)
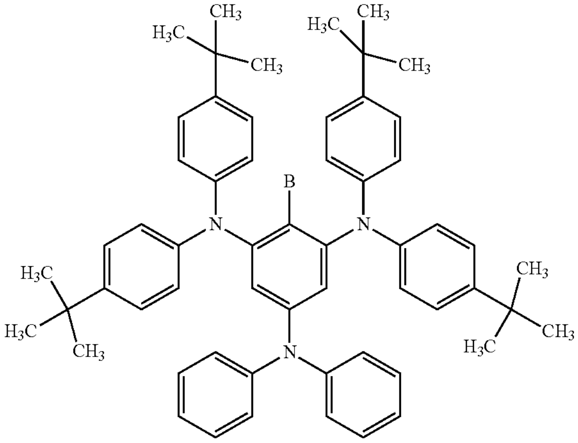
DPhA-tBu4DABNA
(v)
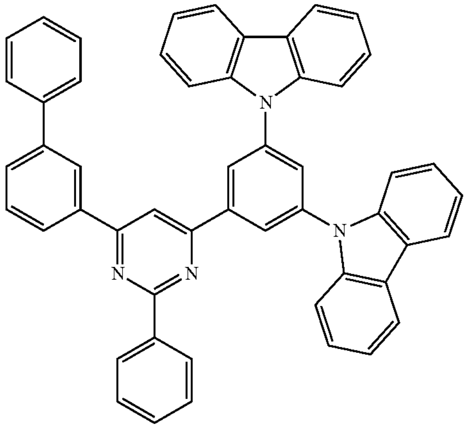
6mBP-4Cz2PPm
-continued
(vi)
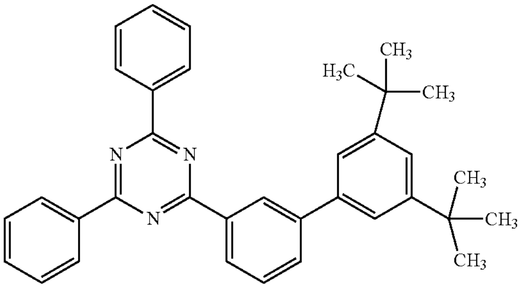
mmtBumBPTzn
(vii)
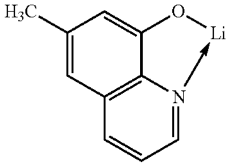
Li-6mq
(viii)
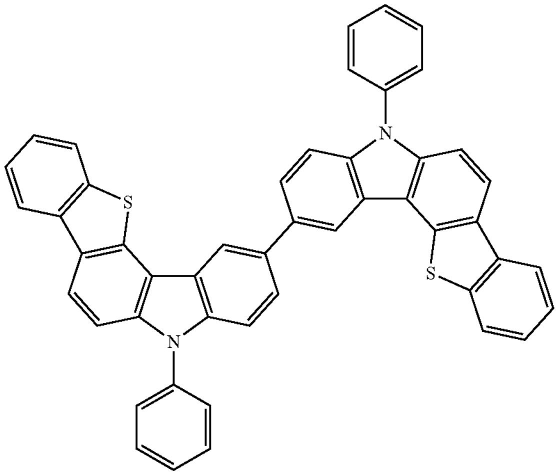
BisBTc -continued (x)

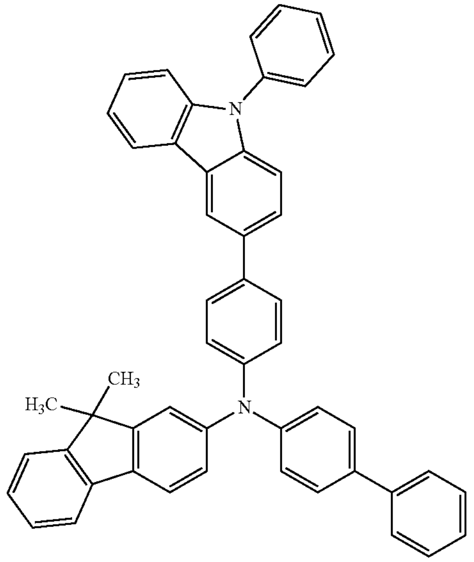

PCBBiF (xiv)

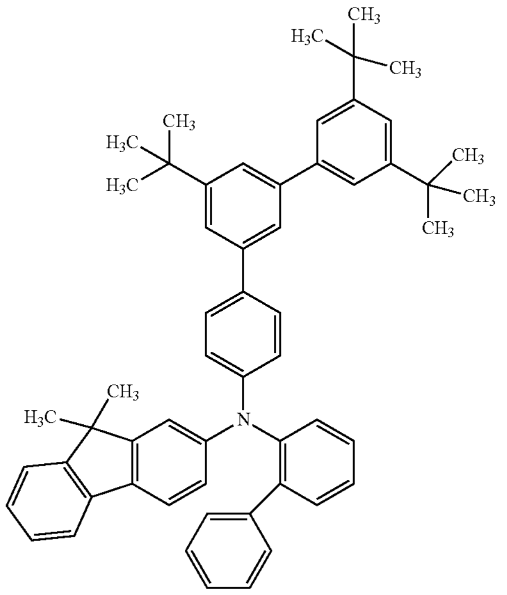

mmtBumTPoFBi-04

(xvi)

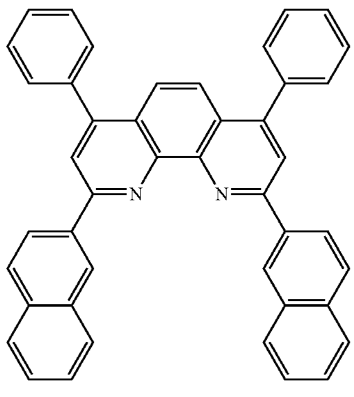

NBPhen (Method for Fabricating Light-Emitting Device 3)

First, as a reflective electrode, silver (Ag) was deposited over a glass substrate to a thickness of 100 nm by a sputtering method, and then, as a transparent electrode, indium tin oxide containing silicon oxide (ITSO) was deposited to a thickness of 5 nm by a sputtering method, whereby the first electrode 101 was formed. The electrode area was set to 4 $mm^2$ (2 mm×2 mm). Note that the transparent electrode functions as the anode, and the transparent electrode and the reflective electrode can be collectively regarded as the first electrode 101.

Next, in pretreatment for forming the light-emitting device over a substrate, a surface of the substrate was washed with water, baking was performed at 200° C. for one hour, and then UV ozone treatment was performed for 370 seconds.

After that, the substrate was transferred into a vacuum evaporation apparatus where the pressure was reduced to approximately $10^{-4}$ Pa, vacuum baking was performed at 170° C. for 30 minutes in a heating chamber of the vacuum evaporation apparatus, and then the substrate was cooled down for approximately 30 minutes.

Next, the substrate provided with the first electrode 101 was fixed to a substrate holder provided in the vacuum evaporation apparatus such that the surface on which the first electrode 101 was formed faced downward. Then, N-(3",5',5"-tri-tert-butyl-1,1': 3',1"-terphenyl-4-yl)-N-(1,-biphenyl-2-yl)-9,9-dimethyl-9H-fluoren-2-amine (abbreviation: mmtBumTPoFBi-04) represented by Structural Formula (xiv) and a fluorine-containing electron acceptor material with a molecular weight of 672 (OCHD-003) were deposited on the first electrode 101 to a thickness of 10 nm by co-evaporation such that the weight ratio of mmtBumTPoFBi-04 to OCHD-003 was 1:0.1, whereby a hole-injection layer 111 was formed.

Over the hole-injection layer 111, mmtBumTPoFBi-04 was deposited by evaporation to a thickness of 35 nm as a first layer, N,N-bis[4-(dibenzofuran-4-yl)phenyl]-4-amino-p-terphenyl (abbreviation: DBfBB1TP) represented by Structural Formula (ii) was deposited by evaporation to a thickness of 50 nm as a second layer, and N-3',5'-ditertiarybutyl-1,1'-biphenyl-4-yl-N-1,1'-biphenyl-2-yl-9,9-dimethyl-9H-fluoren-2-amine (abbreviation: mmtBuBioFBi) was deposited by evaporation to a thickness of 40 nm as a third layer, whereby a hole-transport layer A was formed.

After that, over the hole-transport layer A, DBfBB1TP was deposited by evaporation to a thickness of 10 nm, whereby an electron-blocking layer A was formed.

Then, 9-(1-naphthyl)-10-[4-(2-naphthyl)phenyl]anthracene (abbreviation: aN-βNPAnth) represented by Structural Formula (iii) and 2,12-di(tert-butyl)-5,9-di(4-tert-butylphenyl)-N,N-diphenyl-5H,9H-[1,4]benzazaborino[2,3,4-kl]phenazaborin-7-amine (abbreviation: DPhA-tBu4DABNA) represented by Structural Formula (iv) were deposited to a thickness of 20 nm by co-evaporation such that the weight ratio of aN-βNPAnth to DPhA-tBu4DABNA was 1:0.015, whereby a light-emitting layer A was formed.

After that, 6-(1,1'-biphenyl-3-yl)-4-[3,5-bis(9H-carbazol-9-yl)phenyl]-2-phenylpyrimidine (abbreviation: 6mBP-4Cz2PPm) represented by Structural Formula (v) was deposited by evaporation to a thickness of 10 nm, whereby a hole-blocking layer A was formed. Then, 2,9-di(naphthalen-2-yl)-4,7-diphenyl-1,10-phenanthroline (abbreviation: NBPhen) represented by Structural Formula (xvi) was deposited by evaporation to a thickness of 20 nm, whereby an electron-transport layer A was formed.

After the electron-transport layer A was formed, lithium oxide ($Li_2O$) was deposited by evaporation to a thickness of 0.1 nm, and N-(1,1'-biphenyl-4-yl)-N-[4-(9-phenyl-9H-carbazol-3-yl)phenyl]-9,9-dimethyl-9H-fluoren-2-amine (abbreviation: PCBBiF) represented by Structural Formula (x) and OCHD-003 were deposited to a thickness of 10 nm by co-evaporation such that the weight ratio of PCBBiF to OCHD-003 was 1:0.1, whereby a charge-generation layer was formed.

Over the charge-generation layer, PCBBiF was deposited by evaporation to a thickness of 40 nm, whereby a hole-transport layer B was formed.

After that, over the hole-transport layer B, DBfBB1TP was deposited by evaporation to a thickness of 10 nm, whereby an electron-blocking layer B was formed.

Then, αN-βNPAnth and DPhA-tBu4DABNA were deposited to a thickness of 20 nm by co-evaporation such that the weight ratio of αN-βNPAnth to DPhA-tBu4DABNA was 1:0.015, whereby a light-emitting layer B was formed.

After that, 6mBP-4Cz2PPm was deposited by evaporation to a thickness of 10 nm, whereby a hole-blocking layer B was formed. Then, 2-{(3',5'-di-tert-butyl)-1,1'-biphenyl-3-yl}-4,6-diphenyl-1,3,5-triazine (abbreviation: mmtBumBPTzn) represented by Structural Formula (vi) and 6-methyl-8-quinolinolato-lithium (abbreviation: Li-6mq) represented by Structural Formula (vii) were deposited to a thickness of 20 nm by co-evaporation such that the weight ratio of mmtBumBPTzn to Li-6mq was 1:1, whereby an electron-transport layer B was formed.

After the electron-transport layer B was formed, lithium fluoride (LiF) was deposited to a thickness of 2 nm to form the electron-injection layer 115, and lastly silver (Ag) and magnesium (Mg) were deposited to a thickness of 15 nm by co-evaporation such that the volume ratio of Ag to Mg was 1:0.1 to form the second electrode 102, whereby the light-emitting device 3 was fabricated.

The second electrode 102 is a transflective electrode having a function of reflecting light and a function of transmitting light; thus, the light-emitting device of this example is a top-emission tandem device in which light is extracted through the second electrode 102. Over the second electrode 102, 5,5'-diphenyl-2,2'-di-5H-[1]benzothieno[3,2-c]carbazole (abbreviation: BisBTc) represented by Structural Formula (viii) was deposited by evaporation to a thickness of 65 nm as a cap layer so that outcoupling efficiency can be improved.

The structures of the light-emitting device 3 are listed in the following table.

TABLE 6

| | | Thickness | Device 3 |
|---|---|---|---|
| Cap layer | | 65 nm | BisBTc |
| Cathode | | 15 nm | Ag:Mg |
| Electron-injection layer | | 2 nm | LiF |
| Electron-transport layer B | | 20 nm | mmtBumBPTzn:Li-6mq (1:1) |
| Hole-blocking layer B | | 10 nm | 6mBP-4CzP2Pm |
| Light-emitting layer B | | 20 nm | αN-βNPAnth:DhA-tBu4DABNA |
| Electron-blocking layer B | | 10 nm | DBfBB1TP |
| Hole-transport layer B | | 40 nm | PCBBiF |
| Charge-generation layer | | 10 nm | PCBBiF:OCHD-003 |
| | | 0.1 nm | $Li_2O$ |
| Electron-transport layer A | | 20 nm | NBPhen |
| Hole-blocking layer A | | 10 nm | 6mBP-4CzP2Pm |
| Light-emitting layer A | | 20 nm | αN-βNPAnth:DhA-tBu4DABNA |
| Electron-blocking layer A | | 10 nm | DBfBB1TP |
| Hole- | 3 | 40 nm | mmtBuBioFBi |
| transport | 2 | 50 nm | DBfBB1TP |
| layer A | 1 | 35 nm | mmtBumTPoFBi-04 |
| Hole-injection layer | | 10 nm | mmtBumTPoFBi-04:OCHD-003 |
| Anode | | 5 nm | ITSO |
| Reflective electrode | | 100 nm | Ag |

Figure 47:
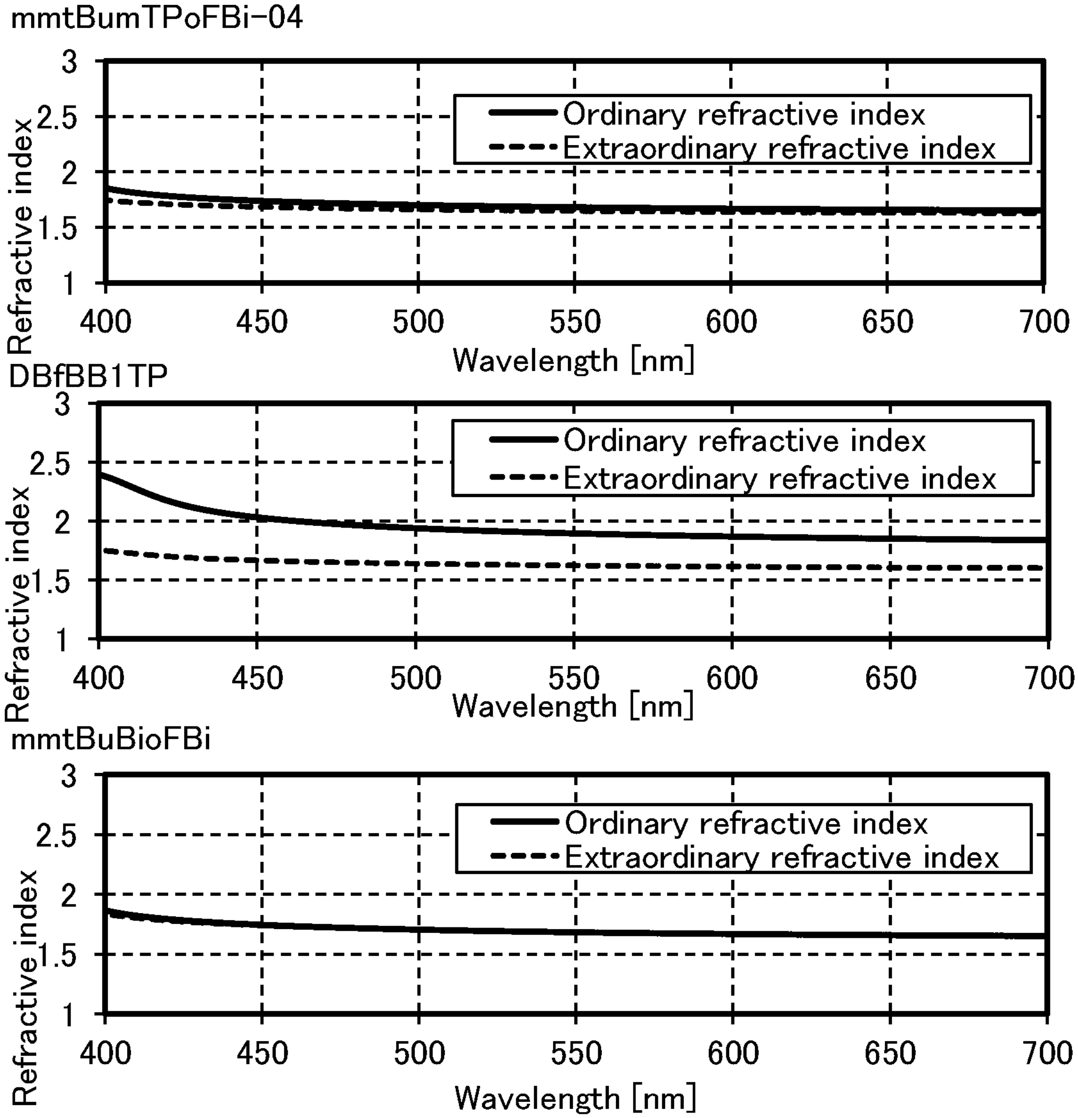
FIG. 47 shows the refractive indices of mmtBumTPoFBi-04, DBfBB1TP, and mmtBuBioFBi.

FIG. 47 and FIG. 31 show the results of measuring the refractive indices of mmtBumTPoFBi-04, DBfBB1TP, mmtBuBioFBi, mmtBumBPTzn, Li-6mq, and BisBTc. The measurement was performed with an M-2000U spectroscopic ellipsometer manufactured by J. A. Woollam Japan Corp. To obtain films used as measurement samples, the material for each layer was deposited to a thickness of approximately 50 nm over a quartz substrate by a vacuum evaporation method.

From FIG. 47 and FIG. 31, mmtBumTPoFBi-04, mmtBuBioFBi, mmtBumBPTzn, and Li-6mq are low refractive index materials having an ordinary refractive index greater than or equal to 1.50 and less than or equal to 1.75 in the entire wavelength range of 455 nm to 465 nm, and DBfBB1TP and BisBTc are high refractive index materials having an ordinary refractive index greater than or equal to 1.90 and less than or equal to 2.40 in the entire wavelength range of 455 nm to 465 nm. Note that the light-emitting device 3 is a blue light-emitting device.

Figure 48:
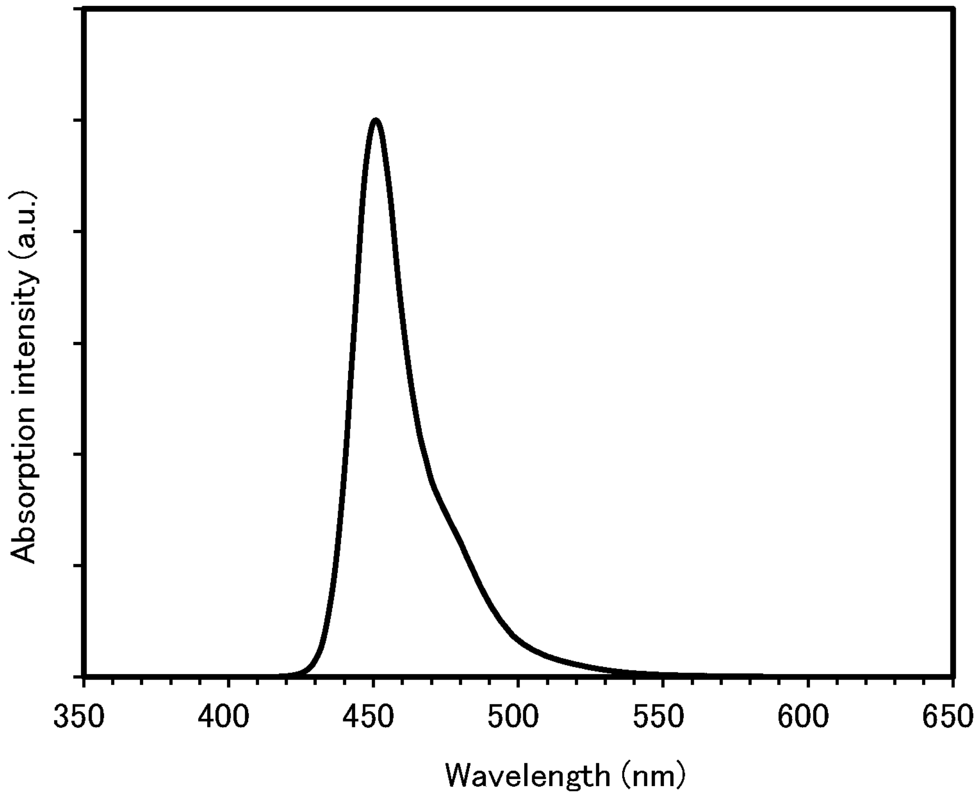
FIG. 48 shows the emission spectrum of DPhA-tBu4DABNA in a toluene solution.

FIG. 48 shows the emission spectrum of DPhA-tBu4DABNA, which is a light-emitting substance, in a toluene solution. According to FIG. 48, the half width of the emission spectrum of DPhA-tBu4DABNA is 22 nm, the spectral width at the intensity 1/e times the maximum peak intensity is 29 nm, and the values obtained by converting these widths into energy are respectively 0.13 eV and 0.17 eV, which means that DPhA-tBu4DABNA is a light-emitting substance that emits light with a narrow spectral width.

The light-emitting device 3 was sealed using a glass substrate in a glove box containing a nitrogen atmosphere so as not to be exposed to the air. Specifically, a UV curable sealing material was applied to surround the device, only the sealing material was irradiated with UV while the light-emitting device was not irradiated with the UV, and heat treatment was performed at 80° C. under an atmospheric pressure for one hour.

Then, the initial characteristics of the light-emitting device were measured.

Figure 41:
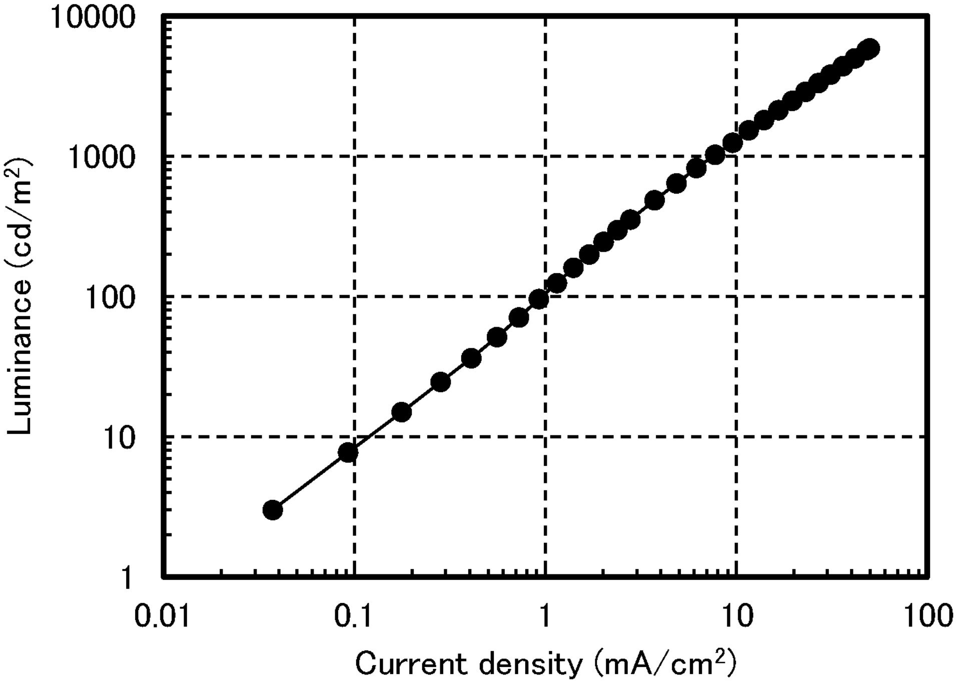
FIG. 41 shows the luminance—current density characteristics of a light-emitting device 3.
Figure 42:
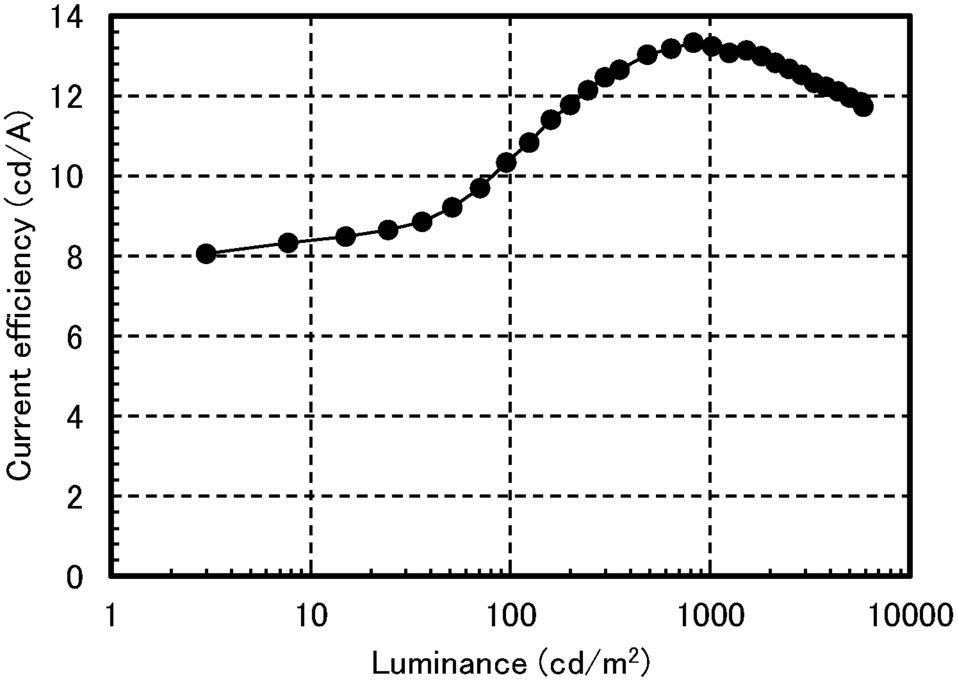
FIG. 42 shows the current efficiency—luminance characteristics of the light-emitting device 3.
Figure 43:
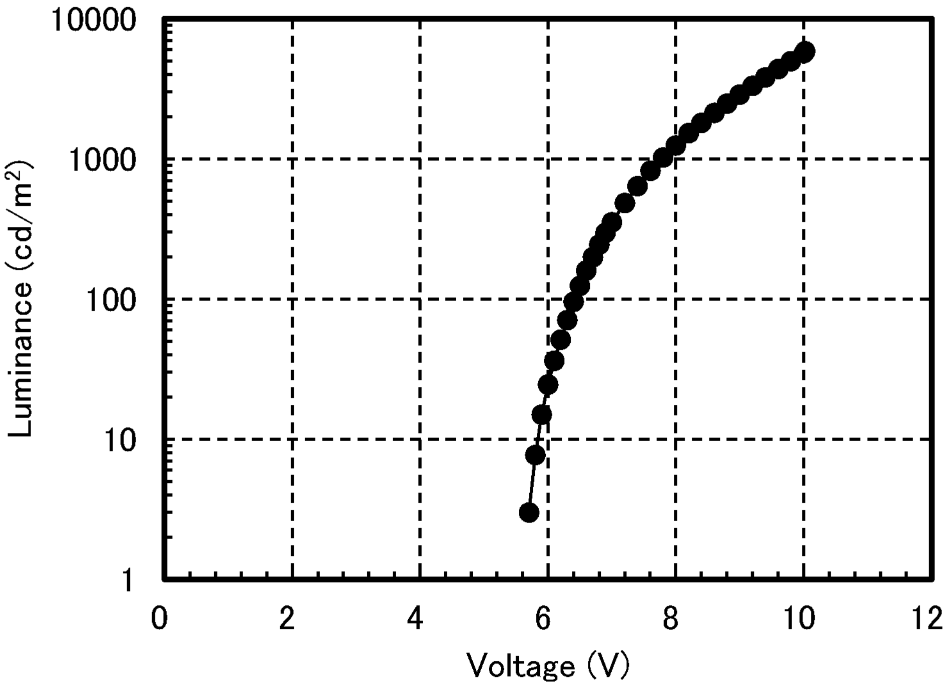
FIG. 43 shows the luminance—voltage characteristics of the light-emitting device 3.
Figure 44:
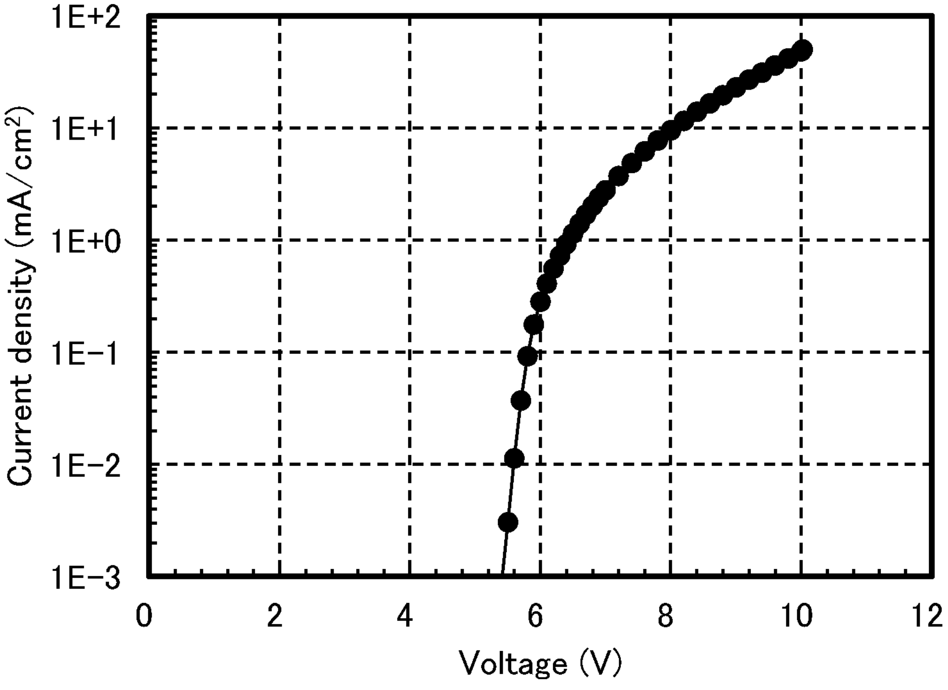
FIG. 44 shows the current density—voltage characteristics of the light-emitting device 3.
Figure 45:
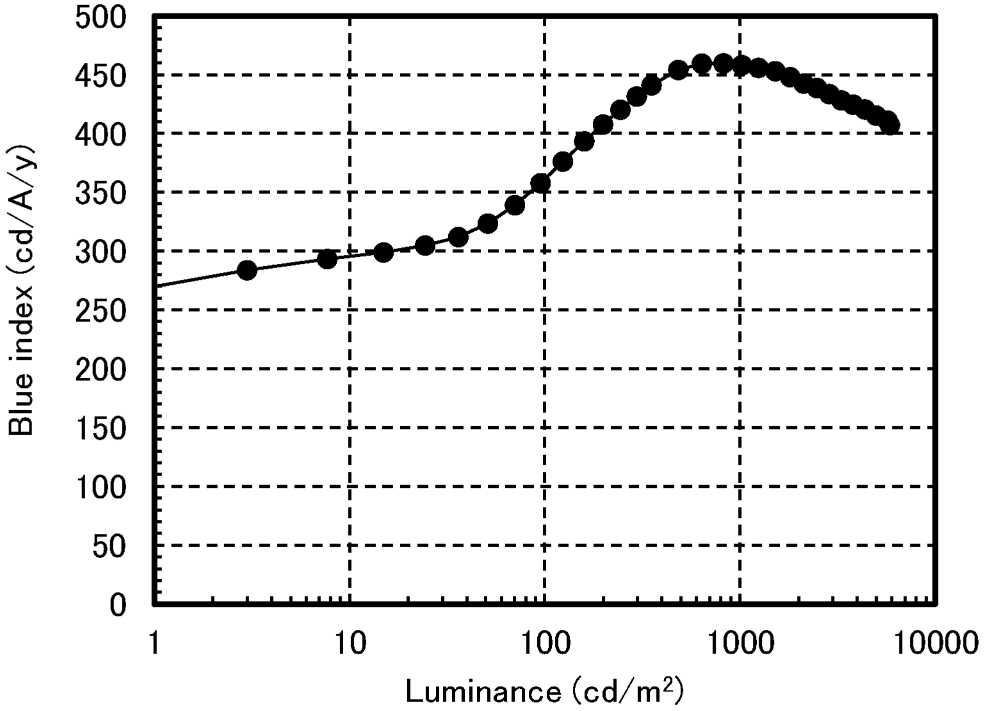
FIG. 45 shows the blue index—luminance characteristics of the light-emitting device 3.
Figure 46:
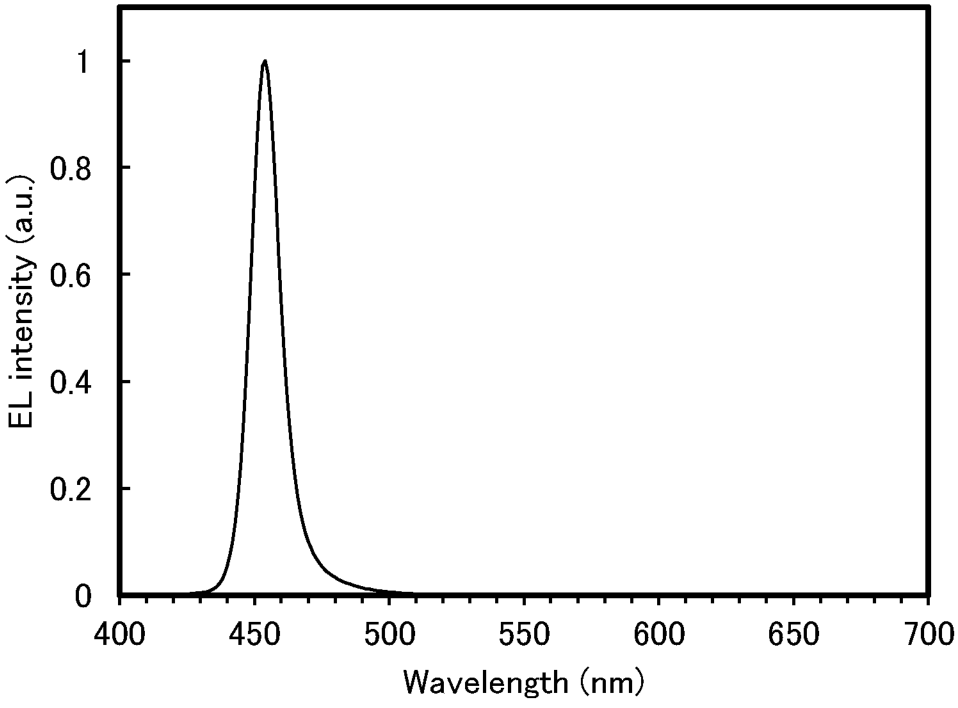
FIG. 46 shows the emission spectrum of the light-emitting device 3.

FIG. 41 shows the luminance—current density characteristics of the light-emitting device 3. FIG. 42 shows the current efficiency—luminance characteristics thereof. FIG. 43 shows the luminance—voltage characteristics thereof. FIG. 44 shows the current density—voltage characteristics thereof. FIG. 45 shows the blue index—luminance characteristics thereof. FIG. 46 shows the emission spectrum thereof. Table 7 shows the main characteristics of the light-emitting device 3 at a current density of about 10 mA/m$^2$. Luminance, CIE chromaticity, and emission spectra were measured at normal temperature with a spectroradiometer (SR-UL1R manufactured by TOPCON TECHNOHOUSE CORPORATION).

[Chemical Formula 7]

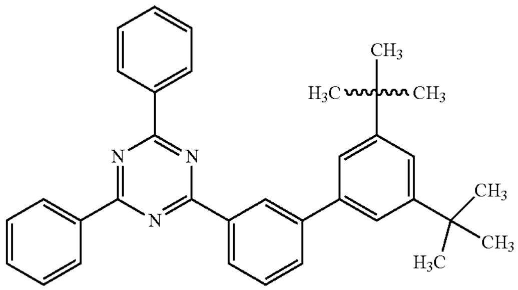

mmtBumBPTzn

TABLE 7

| | Voltage (V) | Current (mA) | Current density (mA/cm$^2$) | Chromaticity x | Chromaticity y | Current efficiency (cd/A) | BI (cd/A/y) | BI MAX (cd/A/y) |
|---|---|---|---|---|---|---|---|---|
| Device 3 | 7.8 | 0.31 | 7.7 | 0.15 | 0.03 | 13.2 | 458 | 460 |

FIGS. 41 to 46 and Table 7 show that the light-emitting device 3 has an extremely high BI of 458 (cd/A/y) or more, and the maximum BI thereof is 460 (cd/A/y). Thus, one embodiment of the present invention is particularly suitable for a light-emitting device used in a display.

The microcavity structure intensifies light with a certain wavelength and attenuates light with other wavelengths; however, by using DPhA-tBu4DABNA with a narrow emission spectrum (particularly a narrow spectral width at the intensity 1/e times the maximum peak intensity of 29 nm), the light-emitting device 3 can reduce the amount of light to be attenuated and obtains a more effective amplification effect.

In addition, in the light-emitting device 3 employing the microcavity structure, the emission spectrum is sharper than the original spectrum of DPhA-tBu4DABNA, and the y coordinate of the CIE chromaticity, which is often used as the evaluation criterion for blue light emission, is as small as 0.03. As a result, the light-emitting device 3 exhibits an extremely high blue index (cd/A/y).

As described above, when a light-emitting device having different refractive indices contains a light-emitting substance with a narrow emission spectrum (particularly at the intensity 1/e times the maximum peak intensity), large synergistic effects are obtained.

<<Reference Synthesis Example 1>>

Described in this synthesis example is a method for synthesizing 2-{(3',5'-di-tert-butyl)-1,1'-biphenyl-3-yl}-4,6-diphenyl-1,3,5-triazine (abbreviation: mmtBumBPTzn) used in Example 1. The structure of mmtBumBPTzn is shown below.

<Step 1: Synthesis of 3-Bromo-3',5'-Di-Tert-Butylbiphenyl>

First, 1.0 g (4.3 mmol) of 3,5-di-t-butylphenylboronic acid, 1.5 g (5.2 mmol) of 1-bromo-3-iodobenzene, 4.5 mL of 2 mol/L aqueous solution of potassium carbonate, 20 mL of toluene, and 3 mL of ethanol were put into a three-neck flask and stirred under reduced pressure to be degassed. To this mixture were added 52 mg (0.17 mmol) of tris(2-methylphenyl)phosphine and 10 mg (0.043 mmol) of palladium(II) acetate, and reaction was caused under a nitrogen atmosphere at 80° C. for 14 hours. After the reaction, extraction with toluene was performed and the resulting organic layer was dried with magnesium sulfate. This mixture was subjected to gravity filtration and the filtrate was purified by silica gel column chromatography (the developing solvent: hexane) to give 1.0 g of a target white solid (yield: 68%). The synthesis scheme of Step 1 is shown below.

[Chemical Formula 8]

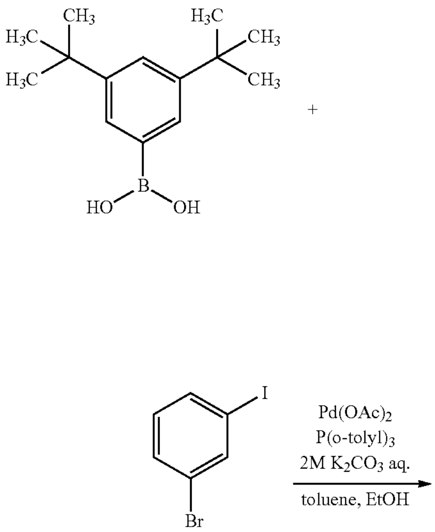

-continued

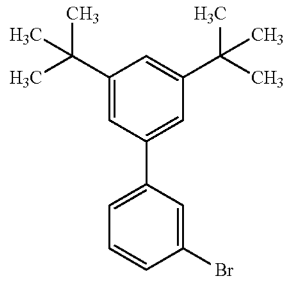

<Step 2: Synthesis of 2-(3',5'-Di-Tert-Butylbiphenyl-3-Yl)-4,4,5,5-Tetramethyl-1,3,2-Dioxaborolane>

First, 1.0 g (2.9 mmol) of 3-bromo-3',5'-di-tert-butylbiphenyl, 0.96 g (3.8 mmol) of bis(pinacolato)diboron, 0.94 g (9.6 mmol) of potassium acetate, and 30 mL of 1,4-dioxane were put into a three-neck flask and stirred under reduced pressure to be degassed. To this mixture were added 0.12 g (0.30 mmol) of 2-dicyclohexylphosphino-2',6'-dimethoxybiphenyl and 0.12 g (0.15 mmol) of [1,1'-bis(diphenylphosphino)ferrocene]palladium(II) dichloride dichloromethane adduct, and reaction was caused under a nitrogen atmosphere at 110° C. for 24 hours. After the reaction, extraction with toluene was performed and the resulting organic layer was dried with magnesium sulfate. This mixture was subjected to gravity filtration. The filtrate was purified by silica gel column chromatography (the developing solvent: toluene) to give 0.89 g of a target yellow oil (yield: 78%). The synthesis scheme of Step 2 is shown below.

[Chemical Formula 9]

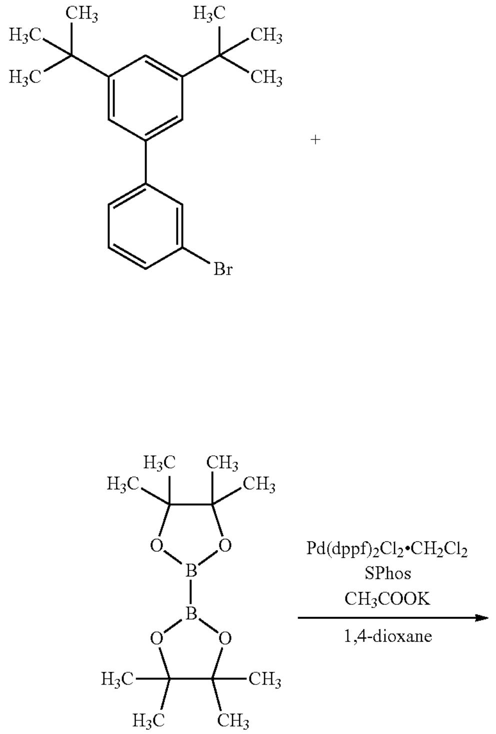

-continued

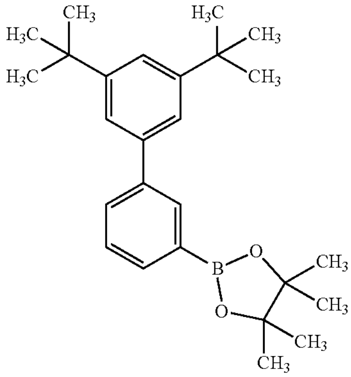

<Step 3: Synthesis of mmtBumBPTzn>

First, 1.5 g (5.6 mmol) of 4,6-diphenyl-2-chloro-1,3,5-triazine, 2.4 g (6.2 mmol) of 2-(3',5'-di-tert-butylphenyl-3-yl)-4,4,5,5-tetramethyl-1,3,2-dioxaborolane, 2.4 g (11 mmol) of tripotassium phosphate, 10 mL of water, 28 mL of toluene, and 10 mL of 1,4-dioxane were put into a three-neck flask and stirred under reduced pressure to be degassed. Furthermore, 13 mg (0.056 mmol) of palladium(II) acetate and 34 mg (0.11 mmol) of tris(2-methylphenyl)phosphine were added to this mixture, and heated and refluxed under a nitrogen atmosphere for 14 hours. After the reaction, extraction with ethyl acetate was performed and the resulting organic layer was removed with magnesium sulfate. This mixture was subjected to gravity filtration and the filtrate was purified by silica gel column chromatography (the developing solvent, chloroform: hexane=1:5 changed to 1:3). The obtained solid was recrystallized with hexane to give 2.0 g of a target white solid (yield: 51%). The synthesis scheme of Step 3 is shown below.

[Chemical Formula 10]

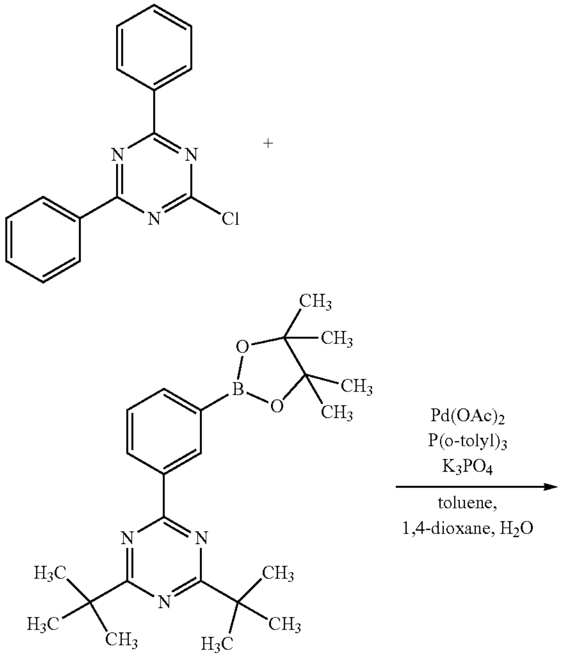

-continued

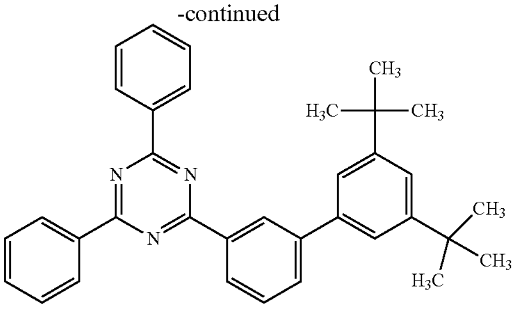

mmtBumBPTzn

By a train sublimation method, 2.0 g of the obtained white solid was purified by sublimation under an argon gas stream at a pressure of 3.4 Pa and a temperature of 220° C. The solid was heated. After the sublimation purification, 1.8 g of a target white solid was obtained at a collection rate of 80%.

Analysis results by nuclear magnetic resonance spectroscopy ($^1$H-NMR) of the white solid obtained in Step 3 are shown below. The results reveal that mmtBumBPTzn was obtained in this example.

$^1$H NMR ($CDCl_3$, 300 MHz): δ=1.44 (s, 18H), 7.51-7.68 (m, 10H), 7.83 (d, 1H), 8.73-8.81 (m, 5H), 9.01 (s, 1H).

<<Reference Synthesis Example 2>>

Described in this example is a method for synthesizing 6-methyl-8-quinolinolato-lithium (abbreviation: Li-6mq) used in Example 1. The structural formula of Li-6mq is shown below.

[Chemical Formula 11]

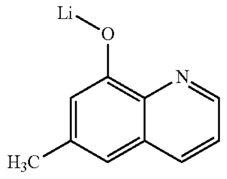

Li-6mq

First, 2.0 g (12.6 mmol) of 8-hydroxy-6-methylquinoline and 130 mL of dehydrated tetrahydrofuran (abbreviation: THF) were put into a three-neck flask and stirred. Then, 10.1 mL (10.1 mmol) of 1M THF solution of lithium tert-butoxide (abbreviation: tBuOLi) was added to this solution and stirred at room temperature for 47 hours. The reacted solution was concentrated to give a yellow solid. Acetonitrile was added to this solid and subjected to ultrasonic irradiation and filtration, so that a pale yellow solid was obtained. This washing step was performed twice. The obtained residue was 1.6 g of pale yellow solid of Li-6mq (yield: 95%). This synthesis scheme is shown below.

[Chemical Formula 12]

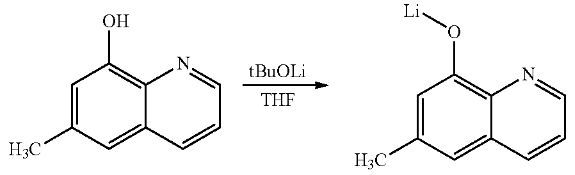

Next, the absorption and emission spectra of Li-6mq in a dehydrated acetone solution were measured. The absorption spectrum was measured with an ultraviolet-visible light spectrophotometer (V550, manufactured by JASCO Corporation), and the spectrum of dehydrated acetone alone in a quartz cell was subtracted. The emission spectrum was measured with a fluorescence spectrophotometer (FP-8600, manufactured by JASCO Corporation).

As a result, Li-6mq in the dehydrated acetone solution has an absorption peak at 390 nm, and an emission wavelength peak at 540 nm (excitation wavelength: 385 nm).

<<Reference Synthesis Example 3>>

Described in this example is a method for synthesizing N-(3",5',5"-tri-tert-butyl-1,1': 3',1"-terphenyl-4-yl)-N-(1,-biphenyl-2-yl)-9,9-dimethyl-9H-fluoren-2-amine (abbreviation: mmtBumTPoFBi-04). The structure of mmtBumTPoFBi-04 is shown below.

[Chemical Formula 13]

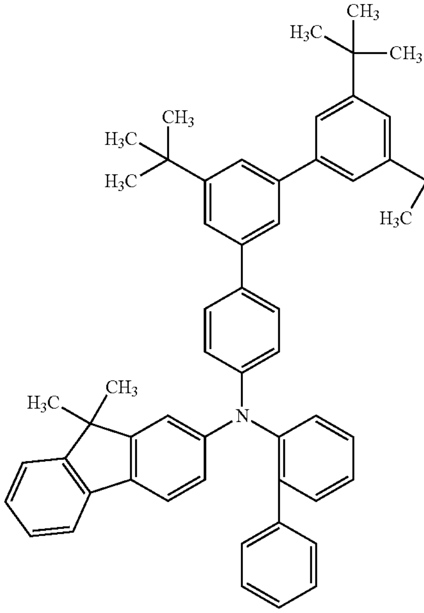

<Step 1: Synthesis of 4-Bromo-3",5',5"-Tri-Tert-Butyl-1,1': 3',1"-Terphenyl>

In a three-neck flask were put 9.0 g (20.1 mmol) of 2-(3',5,5'-tri-tert-butyl[1,1'-biphenyl]-3-yl)-4,4,5,5-tetramethyl-1,3,2-dioxaborolane, 6.8 g (24.1 mmol) of 1-bromo-4-iodobenzene, 8.3 g (60.3 mmol) of potassium carbonate, 100 mL of toluene, 40 mL of ethanol, and 30 mL of tap water. The mixture was degassed under reduced pressure, and then the air in the flask was replaced with nitrogen. Then, 91 mg (0.40 mmol) of palladium acetate and 211 mg (0.80 mmol) of triphenylphosphine were added, and the mixture was heated at 80° C. for approximately 4 hours. After that, the temperature of the flask was lowered to room temperature, and the mixture was separated into an organic layer and an aqueous layer. Magnesium sulfate was added to this solution to eliminate moisture, whereby the organic layer was concentrated. A hexane solution of the obtained solution was purified by silica gel column chromatography, whereby 6.0 g of a target white solid was obtained in a yield of 62.5%. The synthesis scheme of Step 1 is shown below.

[Chemical Formula 14]

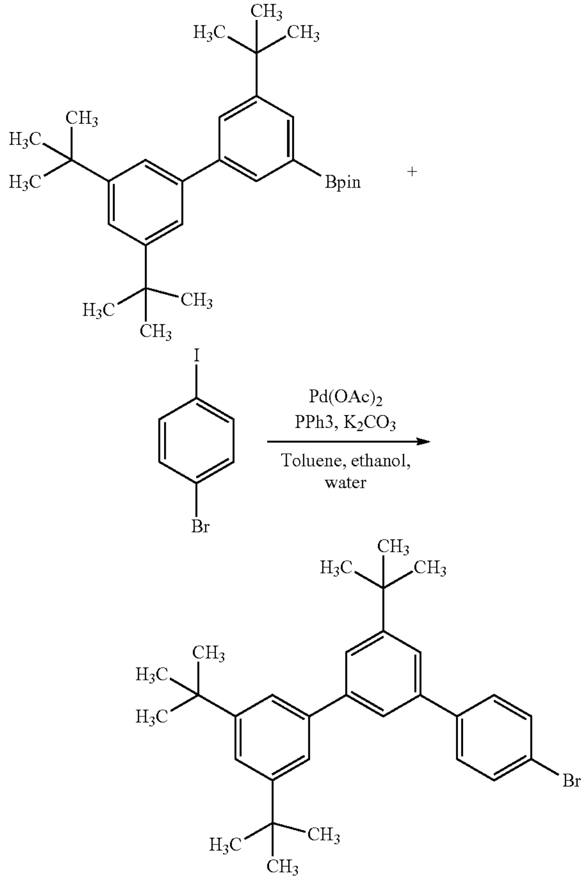

<Step 2: Synthesis of mmtBumTPoFBi-04>

In a three-neck flask were put 3.0 g (6.3 mmol) of 4-bromo-3",5',5"-tri-tert-butyl-1,1': 3',1"-terphenyl, 2.3 g (6.3 mmol) of N-(1,1'-biphenyl-4-yl)-N-phenyl-9,9-dimethyl-9H-fluoren-2-amine, 1.8 g (18.9 mmol) of sodium-tert-butoxide, and 32 mL of toluene. The mixture was degassed under reduced pressure, the air in the flask was replaced with nitrogen, 72 mg (0.13 mmol) of bis(dibenzylideneacetone)palladium(0) and 76 mg (0.38 mmol) of tri-tert-butylphosphine were added thereto, and the mixture was heated at 120° C. for approximately 8 hours. After that, the temperature of the mixture was lowered to approximately 60° C., approximately 1 mL of water was added, a precipitated solid was separated by filtration, and the solid was washed with toluene. The filtrate was concentrated, and the obtained toluene solution was purified by silica gel column chromatography. The obtained solution was concentrated to give a condensed toluene solution. Ethanol was added to this toluene solution and the toluene solution was concentrated under reduced pressure, whereby an ethanol suspension was obtained. The precipitate was filtrated at approximately 20° C., and the obtained solid was dried at approximately 80° C. under reduced pressure, whereby 3.6 g of a target white solid was obtained in a yield of 75%. The synthesis scheme of Step 2 is shown below.

[Chemical Formula 15]

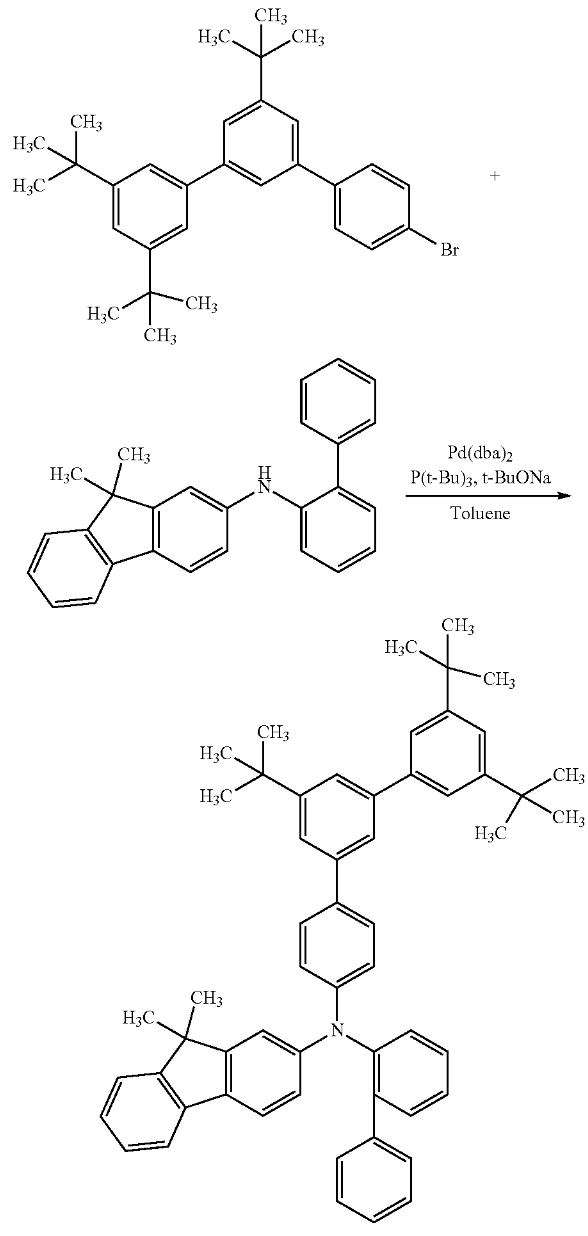

Analysis results by nuclear magnetic resonance spectroscopy ($^1$H-NMR) of the white solid obtained in Step 2 are shown below. The results reveal that mmtBumTPoFBi-04 was synthesized in this example.

$^1$H-NMR. δ ($CDCl_3$): 7.54-7.56 (m, 1H), 7.53 (dd, 1H, J=1.7 Hz), 7.50 (dd, 1H, J=1.7 Hz), 7.27-7.47 (m, 13H), 7.23 (dd, 1H, J=6.3 Hz, 1.2 Hz), 7.18-7.19 (m, 2H), 7.08-7.00 (m, 5H), 6.88 (d, 1H, J=1.7 Hz) 6.77 (dd, 1H, J=8.0 Hz, 2.3 Hz), 1.42 (s, 9H), 1.39 (s, 18H), 1.29 (s, 6H).

This application is based on Japanese Patent Application Serial No. 2021-105846 filed with Japan Patent Office on Jun. 25, 2021 and Japanese Patent Application Serial No. 2021-170422 filed with Japan Patent Office on Oct. 18, 2021, the entire contents of which are hereby incorporated by reference.

What is claimed is:

1. A light-emitting device comprising:

a first electrode;

a second electrode; and an EL layer between the first electrode and the second electrode, the EL layer comprising a low refractive index layer and a light-emitting layer, wherein the low refractive index layer comprises a first organic compound, wherein the first organic compound has an ordinary refractive index greater than or equal to 1.50 and less than or equal to 1.75 with respect to light at 455 nm to 465 nm, or an ordinary refractive index greater than or equal to 1.45 and less than or equal to 1.70 with respect to light at 633 nm, wherein the light-emitting layer comprises a light-emitting substance, wherein given that a maximum peak wavelength of the light-emitting substance is $\lambda_{max}$, a wavelength corresponding to an intensity 1/e times a maximum peak intensity in an emission spectrum of the light-emitting substance is $\lambda_n$, a shortest $\lambda_n$ in a range of wavelengths longer than $\lambda_{max}$ is $\lambda_1$, and a longest $\lambda_n$ in a range of wavelengths shorter than $\lambda_{max}$ is $\lambda_2$, a difference between $\lambda_1$ and $\lambda_2$ is greater than or equal to 5 nm and less than or equal to 45 nm, wherein the EL layer further comprises a high refractive index layer, wherein the high refractive index layer comprises a second organic compound, wherein an ordinary refractive index of the second organic compound with respect to light at a given wavelength is higher than an ordinary refractive index of the first organic compound with respect to light at the given wavelength, and wherein the second organic compound has an ordinary refractive index greater than or equal to 2.00 and less than or equal to 2.50 with respect to light at 455 nm to 465 nm, or an ordinary refractive index greater than or equal to 1.95 and less than or equal to 2.45 with respect to light at 633 nm.

2. The light-emitting device according to claim 1, wherein the low refractive index layer is positioned between the first electrode and the light-emitting layer.

3. A display apparatus comprising the light-emitting device according to claim 1.

4. An electronic appliance comprising:

the display apparatus according to claim 3;

a sensor;

an operation button; and at least one of a speaker and a microphone.

5. An electronic appliance comprising:

the light-emitting device according to claim 1;

a sensor;

an operation button; and at least one of a speaker and a microphone.

6. A light-emitting apparatus comprising:

the light-emitting device according to claim 1; and at least one of a transistor and a substrate.

7. A lighting apparatus comprising:

the light-emitting device according to claim 1; and a housing.

8. A light-emitting device comprising:

a first electrode;

a second electrode; and an EL layer between the first electrode and the second electrode, the EL layer comprising a high refractive index layer, a low refractive index layer, and a light-emitting layer, wherein the low refractive index layer comprises a first organic compound, wherein the high refractive index layer comprises a second organic compound, wherein the first organic compound has an ordinary refractive index greater than or equal to 1.50 and less than or equal to 1.75 with respect to light at 455 nm to 465 nm, or an ordinary refractive index greater than or equal to 1.45 and less than or equal to 1.70 with respect to light at 633 nm, wherein the light-emitting layer comprises a light-emitting substance, wherein given that a wavelength corresponding to an intensity 1/e times a maximum peak intensity in an emission spectrum of the light-emitting substance is $\lambda_n$, a shortest $\lambda_n$ in a range of wavelengths longer than a maximum peak wavelength $\lambda_{max}$ of the light-emitting substance is $\lambda_1$, and a longest $\lambda_n$ in a range of wavelengths shorter than $\lambda_{max}$ is $\lambda_2$, an energy at a wavelength corresponding to a difference between $\lambda_1$ and $\lambda_2$ is greater than or equal to 0.03 eV and less than or equal to 0.27 eV, and wherein the second organic compound has an ordinary refractive index greater than or equal to 2.00 and less than or equal to 2.50 with respect to light at 455 nm to 465 nm, or an ordinary refractive index greater than or equal to 1.95 and less than or equal to 2.45 with respect to light at 633 nm.

9. The light-emitting device according to claim 8, wherein the low refractive index layer is positioned between the first electrode and the light-emitting layer.

10. A light-emitting device comprising:

a first electrode;

a second electrode; and an EL layer between the first electrode and the second electrode, the EL layer comprising a low refractive index layer and a light-emitting layer, wherein the low refractive index layer comprises a first organic compound, wherein the first organic compound has an ordinary refractive index greater than or equal to 1.50 and less than or equal to 1.75 with respect to light at 455 nm to 465 nm, and an ordinary refractive index greater than or equal to 1.45 and less than or equal to 1.70 with respect to light at 633 nm, wherein the light-emitting layer comprises a light-emitting substance, wherein the light-emitting substance comprises a condensed heteroaromatic ring comprising nitrogen in a molecular structure, wherein the condensed heteroaromatic ring comprising nitrogen is a condensed ring with four or more rings, and wherein the condensed heteroaromatic ring comprising nitrogen comprises an indolocarbazole skeleton.

* * * * *